US012733401B2

(12) United States Patent
Hayano

(10) Patent No.: US 12,733,401 B2
(45) Date of Patent: Sep. 8, 2026

(54) LIGHT EMITTING ELEMENT AND POLYCYCLIC COMPOUND FOR LIGHT EMITTING ELEMENT

(71) Applicant: Samsung Display Co., Ltd., Yongin-si (KR)

(72) Inventor: Tetsuji Hayano, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 926 days.

(21) Appl. No.: 17/968,643

(22) Filed: Oct. 18, 2022

(65) Prior Publication Data

US 2023/0225183 A1 Jul. 13, 2023

(30) Foreign Application Priority Data

Jan. 10, 2022 (KR) ........................ 10-2022-0003648

(51) Int. Cl.

*H10K 85/60* (2023.01)
*C07F 5/02* (2006.01)
*H10K 50/11* (2023.01)

(52) U.S. Cl.

CPC ........... *H10K 85/658* (2023.02); *C07F 5/027* (2013.01); *H10K 50/11* (2023.02); *C07B 2200/05* (2013.01)

(58) Field of Classification Search

None

See application file for complete search history.

(56) References Cited

U.S. PATENT DOCUMENTS

| | | | | |
|---|---|---|---|---|
| 10,998,506 B2 * | 5/2021 | Xia | ........................... | C07F 5/02 |
| 2018/0351102 A1 * | 12/2018 | Wolohan | ................. | C07F 5/027 |
| 2021/0104682 A1 | 4/2021 | Shin et al. | | |
| 2021/0242404 A1 | 8/2021 | Baek et al. | | |

FOREIGN PATENT DOCUMENTS

| | | | | |
|---|---|---|---|---|
| CN | 108586508 A | * 9/2018 | .......... | C07F 9/65848 |
| CN | 108912151 A | * 11/2018 | .............. | C07F 5/069 |
| CN | 111471062 A | 7/2020 | | |
| CN | 111471064 A | 7/2020 | | |
| CN | 111471449 A | 7/2020 | | |
| CN | 113292584 A | 8/2021 | | |
| JP | 2021-95342 A | 6/2021 | | |
| KR | 10-2021-0099678 A | 8/2021 | | |
| KR | 10-2021-0041167 A | 4/2022 | | |

OTHER PUBLICATIONS

Nam, Sungho, et al. "Improved efficiency and lifetime of deep-blue hyperfluorescent organic light-emitting diode using Pt (II) complex as phosphorescent sensitizer." Advanced Science 8.16 (2021): 2100586. (Year: 2021).*

Lee, Hakjun, et al. "Effects of the phosphorescent sensitizer on charge dynamics in deep blue phosphor-sensitized-fluorescent organic light-emitting diodes." Journal of Information Display 23.1 (2022): 97-103. (Year: 2022).*

Lee, Kyung Hyung, and Jun Yeob Lee. "Phosphor sensitized thermally activated delayed fluorescence organic light-emitting diodes with ideal deep blue device performances." Journal of Materials Chemistry C 7.28 (2019): 8562-8568. (Year: 2019).*

Machine translation of CN-111471449-A, translation generated Nov. 2025, 16 pages. (Year: 2025).*

Machine translation of JP-2021095342-A, translation generated Nov. 2025, 213 pages. (Year: 2025).*

* cited by examiner

*Primary Examiner* — Robert S Loewe

(74) *Attorney, Agent, or Firm* — Womble Bond Dickinson (US) LLP

(57) ABSTRACT

A light emitting element includes a polycyclic compound having a B-N-B structure and including a specific substituent in an emission layer, thereby showing high efficiency and long-life characteristics.

20 Claims, 8 Drawing Sheets

LIGHT EMITTING ELEMENT AND POLYCYCLIC COMPOUND FOR LIGHT EMITTING ELEMENT

CROSS-REFERENCE TO RELATED APPLICATIONS

This application claims priority to and the benefit of Korean Patent Application No. 10-2022-0003648, filed on Jan. 10, 2022, the entire content of which is hereby incorporated by reference.

BACKGROUND

1. Field

The present disclosure herein relates to a light emitting element and a polycyclic compound for a light emitting element, and for example, to a light emitting element including multiple materials as well as a novel polycyclic compound utilized as a light emitting material in an emission layer.

2. Description of the Related Art

Recently, the development of an organic electroluminescence display device as an image display device is being actively conducted. The organic electroluminescence display device is a so-called self-luminescent type or kind in which holes and electrons injected from a first electrode and a second electrode recombine in an emission layer so that a light emitting material in the emission layer emits light to achieve display (e.g., to display an image).

In the application of a light emitting element to a display device, there is a desire (e.g., a requirement) for a light emitting element having a decreased driving voltage and an increased emission efficiency and lifetime, and development on materials for a light emitting element capable of stably attaining such characteristics is being continuously pursued (e.g., required).

For example, recently, in order to provide (e.g., accomplish) a light emitting element with a relatively high efficiency, techniques on phosphorescence emission which utilizes energy in a triplet state or delayed fluorescence emission which utilizes the generating phenomenon of singlet excitons by the collision of triplet excitons (triplet-triplet annihilation, TTA) are being developed, and development on a material for thermally activated delayed fluorescence (TADF) utilizing delayed fluorescence phenomenon is being pursued.

SUMMARY

Aspects according to embodiments of the present disclosure are directed toward a light emitting element having excellent or suitable emission efficiency and element lifetime.

Aspects according to embodiments of the present disclosure are directed toward a polycyclic compound utilized as a material for a light emitting element having excellent or suitable emission efficiency and element lifetime.

Additional aspects will be set forth in part in the description which follows and, in part, will be apparent from the description, or may be learned by practice of the presented embodiments of the disclosure.

According to an embodiment of the present disclosure, a light emitting element includes: a first electrode; a second electrode on the first electrode; and an emission layer between the first electrode and the second electrode, wherein the emission layer includes: a first compound represented by Formula 1; and at least one from among a second compound represented by Formula HT, a third compound represented by Formula ET, and a fourth compound represented by Formula D-1.

[Formula 1]

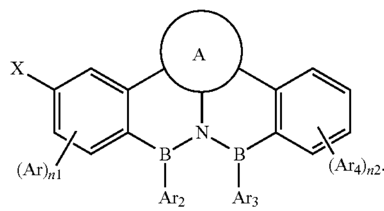

In Formula 1, X may be represented by Formula 2, A may be a substituted or unsubstituted aromatic hydrocarbon ring (e.g., a substituted or unsubstituted aryl group), or a substituted or unsubstituted aromatic heterocycle (e.g., a substituted or unsubstituted heteroaryl group), $Ar_1$ is a hydrogen atom, a deuterium atom, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, $Ar_2$ and $Ar_3$ may each independently be a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, and a case where $Ar_2$ and $Ar_3$ are combined to form a ring is excluded, $Ar_4$ may be a hydrogen atom, a deuterium atom, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, or represented by Formula 2, n1 may be an integer of 0 to 3, and n2 may be an integer of 0 to 4.

[Formula 2]

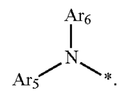

In Formula 2, $Ar_5$ and $Ar_6$ may each independently be a substituted or unsubstituted aryl group of 6 to 30 ring-forming carbon atoms, or a substituted or unsubstituted heteroaryl group of 2 to 30 ring-forming carbon atoms, and/or $Ar_5$ and $Ar_6$ are combined with each other to form a ring.

[Formula HT]

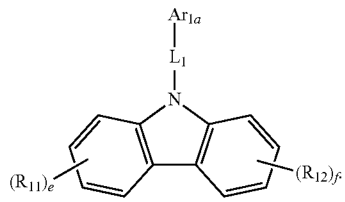

In Formula HT, $L_1$ may be a direct linkage, a substituted or unsubstituted arylene group of 6 to 30 ring-forming carbon atoms, or a substituted or unsubstituted heteroarylene group of 2 to 30 ring-forming carbon atoms, $Ar_{1a}$ may be a substituted or unsubstituted aryl group of 6 to 30 ring-forming carbon atoms, or a substituted or unsubstituted heteroaryl group of 2 to 30 ring-forming carbon atoms, $R_{11}$ and $R_{12}$ may each independently be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and "e" and "f" may each independently be an integer of 0 to 4.

[Formula ET]

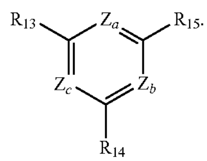

In Formula ET, at least one from among $Z_a$ to $Z_c$ may be N, and any remainder from among $Z_a$ to $Z_c$ may be $CR_{16}$, and $R_{13}$ to $R_{16}$ may each independently be a hydrogen atom, a deuterium atom, a cyano group, a substituted or unsubstituted silyl group, a substituted or unsubstituted aryl group of 6 to 30 ring-forming carbon atoms, or a substituted or unsubstituted heteroaryl group of 2 to 30 ring-forming carbon atoms.

[Formula D-1]

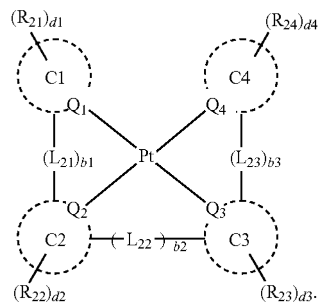

In Formula D-1, $Q_1$ to $Q_4$ may each independently be C or N, C1 to C4 may each independently be a substituted or unsubstituted hydrocarbon ring of 5 to 30 ring-forming carbon atoms, or a substituted or unsubstituted heterocycle of 2 to 30 ring-forming carbon atoms, $L_{21}$ to $L_{23}$ may each independently be a direct linkage,

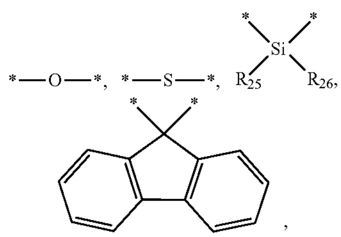

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms, b1 to b3 may each independently be 0 or 1, $R_{21}$ to $R_{26}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 1 to 30 ring-forming carbon atoms, and/or combined with an adjacent group to form a ring, and d1 to d4 may each independently be an integer of 0 to 4.

In an embodiment, n2 may be an integer of 2 to 4, and at least one from among multiple $Ar_4$ may be represented by Formula 2.

In an embodiment, X and/or $Ar_4$ represented by Formula 2 may be represented by Formula 2-1 or Formula 2-2.

[Formula 2-1]

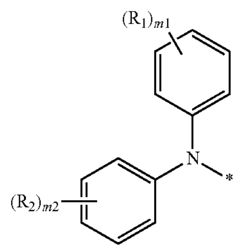

[Formula 2-1]

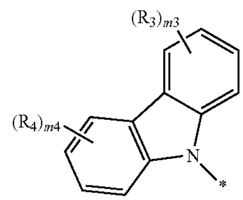

In Formula 2-1 and Formula 2-2, $R_1$ to $R_4$ may each independently be a hydrogen atom, a deuterium atom, a substituted or unsubstituted alkyl group of 1 to 20 carbon atoms, or a substituted or unsubstituted aryl group of 6 to 30 ring-forming carbon atoms, m1 and m2 may each independently be an integer of 0 to 5, and m3 and m4 may each independently be an integer of 0 to 4.

In an embodiment, $R_1$ to $R_4$ may each independently be a hydrogen atom, a deuterium atom, a substituted or unsubstituted t-butyl group, or a substituted or unsubstituted phenyl group.

In an embodiment, the first compound represented by Formula 1 may be represented by Formula 3.

[Formula 3]

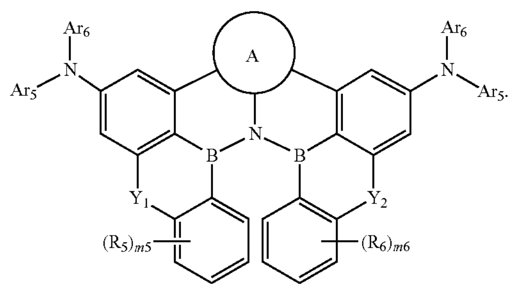

In Formula 3, $Y_1$ and $Y_2$ may each independently be O, S, or $NAr_7$, $Ar_7$ may be a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, $R_5$ and $R_6$ may each independently be a hydrogen atom, a deuterium atom, or a substituted or unsubstituted aryl group of 6 to 30 ring-forming carbon atoms, and/or combined with an adjacent group to form a ring, m5 and m6 may each independently be an integer of 0 to 4, A may be the same as defined in Formula 1, and $Ar_5$ and $Ar_6$ may each independently be the same as defined in Formula 2.

In an embodiment, at least one from among $Y_1$ and $Y_2$ may be $NAr_7$.

In an embodiment, the first compound represented by Formula 3 may be represented by any one from among Formula 3-1 to Formula 3-3.

[Formula 3-1]

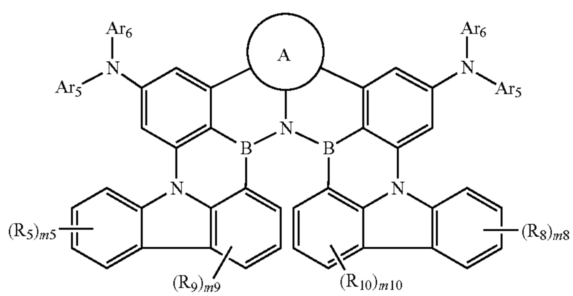

[Formula 3-2]

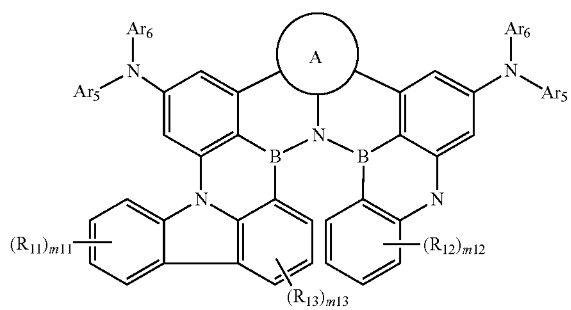

-continued

[Formula 3-3]

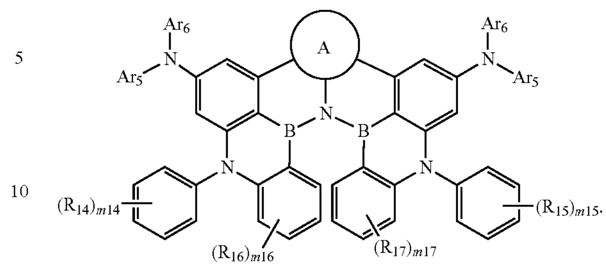

In Formula 3-1 to Formula 3-3, $R_7$ to $R_{17}$ may each independently be a hydrogen atom, a deuterium atom, a substituted or unsubstituted alkyl group of 1 to 10 carbon atoms, or a substituted or unsubstituted aryl group of 6 to 15 ring-forming carbon atoms, m7, m8, m11, m12, m16 and m17 may each independently be an integer of 0 to 4, m9, m10 and m13 may each independently be an integer of 0 to 3, m14 and m15 may each independently be an integer of 0 to 5, when any of m7 to m17 are each independently an integer of 2 or more, each of respective multiple $R_7$ to $R_{17}$ may independently be the same or different, A may be the same as defined in Formula 1, and $Ar_5$ and $Ar_6$ may each independently be the same as defined in Formula 2, and in Formula 3-2, $Y_{2a}$ may be S or O.

In an embodiment, the first compound represented by Formula 3 may be represented by Formula 4.

[Formula 4]

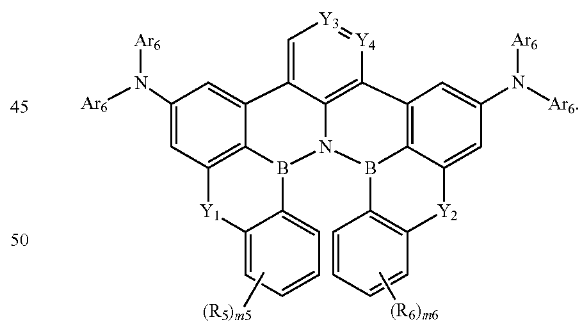

In Formula 4, $Y_3$ and $Y_4$ may each independently be $CR_a$ or N, $R_a$ may be a hydrogen atom, a deuterium atom, a substituted or unsubstituted aryl group of 6 to 20 ring-forming carbon atoms, or a substituted or unsubstituted heteroaryl group of 2 to 20 ring-forming carbon atoms, and/or combined with an adjacent group to form a ring, $Ar_5$ and $Ar_6$ may each independently be the same as defined in Formula 2, and $R_5$, $R_6$, m5, m6, $Y_1$ and $Y_2$ may each independently be the same as defined in Formula 3.

In an embodiment, the first compound represented by Formula 4 may be represented by Formula 4-1 or Formula 4-2.

[Formula 4-1]

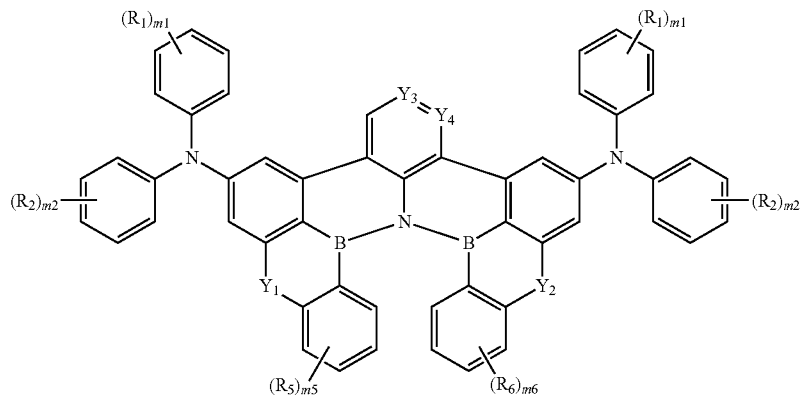

[Formula 4-2]

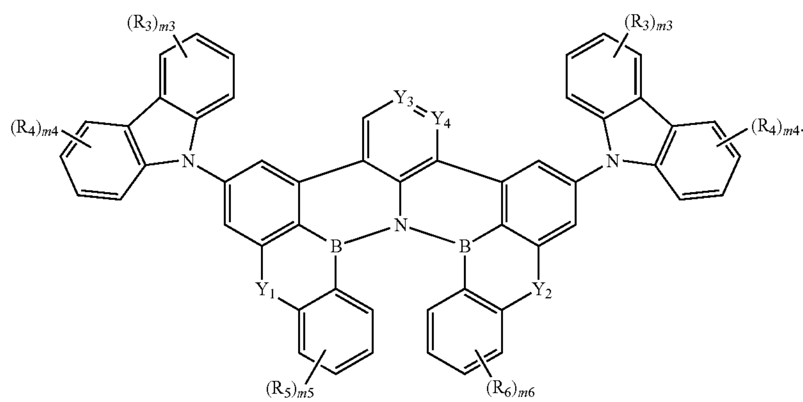

In Formula 4-1 and Formula 4-2, $R_1$ to $R_4$ may each independently be a hydrogen atom, a deuterium atom, a substituted or unsubstituted alkyl group of 1 to 20 carbon atoms, or a substituted or unsubstituted aryl group of 6 to 30 ring-forming carbon atoms, m1 and m2 may each independently be an integer of 0 to 5, m3 and m4 may each independently be an integer of 0 to 4, $R_5$, $R_6$, m5, m6, $Y_1$ and $Y_2$ may each independently be the same as defined in Formula 3, and $Y_3$ and $Y_4$ may each independently be the same as defined in Formula 4.

In an embodiment, the emission layer may be to emit delayed fluorescence.

In an embodiment, the emission layer may include the first compound, the second compound, and the third compound. In some embodiments, the emission layer may include the first compound, the second compound, the third compound, and the fourth compound.

BRIEF DESCRIPTION OF THE DRAWINGS

The accompanying drawings are included to provide a further understanding of the present disclosure and are incorporated in and constitute a part of this specification. The drawings illustrate embodiments of the present disclosure and, together with the description, serve to explain principles of the present disclosure. In the drawings.

DETAILED DESCRIPTION

Figure 1:
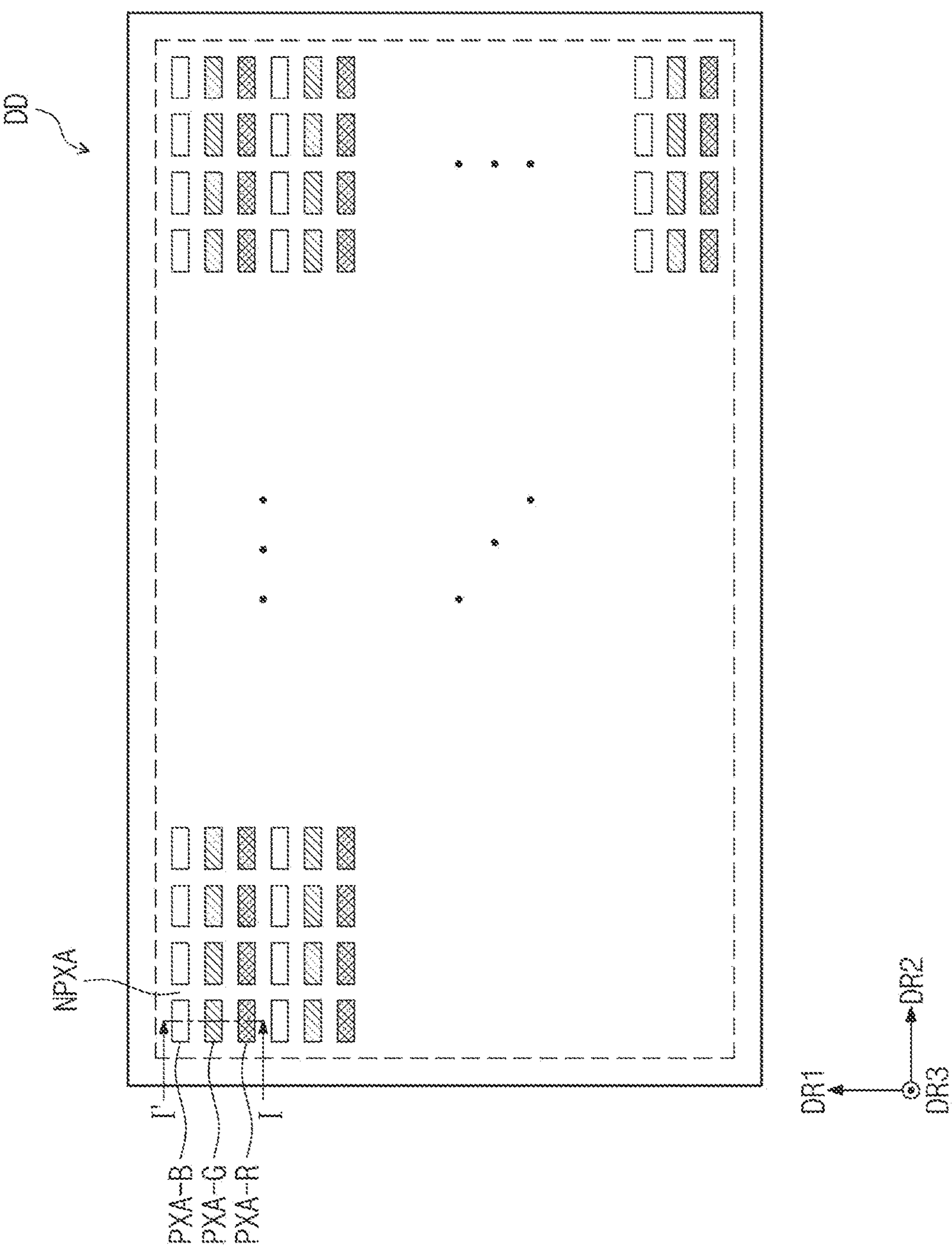
FIG. 1 is a plan view showing a display apparatus according to an embodiment.

The subject matter of the present disclosure may have various modifications and may be embodied in different forms, and example embodiments will be explained in more detail with reference to the accompany drawings. The subject matter of the present disclosure may, however, be embodied in different forms and should not be construed as limited to the embodiments set forth herein. Rather, all modifications, equivalents, and substituents are included in the spirit and technical scope of the present disclosure.

In the description, it will be understood that when an element (or region, layer, part, etc.) is referred to as being "on", "connected to" or "coupled to" another element, it can be directly on, connected or coupled to the other element or one or more third intervening elements may be present.

Like reference numerals refer to like elements throughout, and duplicative descriptions thereof may not be provided. In addition, in the drawings, the thickness, the ratio, and the dimensions of constituent elements may be exaggerated for effective explanation of technical contents. The term "and/or" includes one or more combinations which may be defined by relevant elements.

It will be understood that, although the terms "first," "second," etc. may be used herein to describe various elements, these elements should not be limited by these terms. These terms are only used to distinguish one element from another element. Thus, a first element could be termed a second element without departing from the teachings of the present disclosure. Similarly, a second element could be termed a first element. As used herein, the singular forms are intended to include the plural forms as well, unless the context clearly indicates otherwise.

In some embodiments, the terms "below", "beneath", "on" and "above" are used for explaining the relationship of elements shown in the drawings. The terms are relative concept and are explained based on the direction shown in the drawing.

In the description, it will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof. As used herein, the singular forms "a", "an" and "the" are intended to include the plural forms as well, unless the context clearly indicates otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the description, when a layer, a film, a region, a plate, etc. is referred to as being "on" or "above" another part, it can be "directly on" the other part, or intervening layer(s) may also be present. In contrast, when a layer, a film, a region, a plate, etc. is referred to as being "under" or "below" another part, it can be "directly under" the other part, or intervening layer(s) may also be present. Also, when an element is referred to as being disposed "on" another element, it can be disposed on or under the other element.

In the description, the term "substituted or unsubstituted" corresponds to a functional group that is substituted or unsubstituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, a hydrocarbon ring group, an aryl group, and a heterocyclic group. In addition, each of the example substituents may be substituted or unsubstituted. For example, a biphenyl group may be interpreted as an aryl group or a phenyl group substituted with a phenyl group.

In the description, the term "forming a ring via the combination with an adjacent group" may refer to a group forming a substituted or unsubstituted hydrocarbon ring, or a substituted or unsubstituted heterocycle via the combination with an adjacent group. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocycles or polycycles. In addition, the ring formed via the combination with an adjacent group may be combined with another ring to form a spiro structure.

In the description, the term "adjacent group" may refer to a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other. In addition, in 4,5-dimethylphenanthrene, two methyl groups may be interpreted as "adjacent groups" to each other.

In the description, a halogen atom may be a fluorine atom, a chlorine atom, a bromine atom or an iodine atom.

In the description, an alkyl group may be a linear, branched, or cyclic alkyl group. The carbon number of the alkyl group may be 1 to 60, 1 to 50, 1 to 30, 1 to 20, 1 to 10, or 1 to 6. Non-limiting examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, a n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, a n-hexadecyl group, a 2-ethylhexadecyl group, a 2-butylhexadecyl group, a 2-hexylhexadecyl group, a 2-octylhexadecyl group, a n-heptadecyl group, a n-octadecyl group, an n-nonadecyl group, an n-eicosyl group, a 2-ethyleicosyl group, a 2-butyleicosyl group, a 2-hexyleicosyl group, a 2-octyleicosyl group, an n-heneicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl, etc.

In the description, a hydrocarbon ring group refers to an optional functional group or substituent derived from an aliphatic hydrocarbon ring or a fused ring of an aliphatic hydrocarbon ring group and an aromatic hydrocarbon ring group. The number of the ring-forming carbon of the hydrocarbon ring group may be 5 to 60, 5 to 30, or 6 to 30.

In the description, an aryl group refers to an optional functional group or substituent derived from an aromatic hydrocarbon ring. The aryl group may be a monocyclic aryl group or a polycyclic aryl group. The carbon number for forming rings in the aryl group may be 6 to 30, 6 to 20, or 6 to 15. Non-limiting examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc.

In the description, a heterocyclic group refers to an optional functional group or substituent derived from a ring including one or more from among B, O, N, P, Se, Si, and S as heteroatoms. The heterocyclic group includes an aliphatic heterocyclic group and an aromatic heterocyclic group. The aromatic heterocyclic group may be a heteroaryl group. The aliphatic heterocyclic group and the aromatic heterocyclic group may be a monocycle or a polycycle.

When the heterocyclic group includes two or more heteroatoms, the two or more heteroatoms may be the same or different. The heterocyclic group may be a monocyclic heterocyclic group or a polycyclic heterocyclic group, and may include a heteroaryl group. The carbon number for forming rings of the heterocyclic group may be 2 to 60, 2 to 30, 2 to 20, or 2 to 10.

In the description, an aliphatic heterocyclic group may include one or more from among B, O, N, P, Se, Si, and S as heteroatoms. The number of ring-forming carbon atoms of the aliphatic heterocyclic group may be 2 to 30, 2 to 20, or 2 to 10. Non-limiting examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc.

In the description, a heteroaryl group may include one or more from among B, O, N, P, Se, Si, and S as heteroatoms. When the heteroaryl group includes two or more heteroatoms, the two or more heteroatoms may be the same or different. The heteroaryl group may be a monocyclic heterocyclic group or polycyclic heterocyclic group. The carbon number for forming rings of the heteroaryl group may be 2 to 30, 2 to 20, or 2 to 10. Non-limiting examples of the heteroaryl group may include a thiophene group, a furan group, a pyrrole group, an imidazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzimidazole group, a benzothiazole group, a benzocarbazole group, a benzothiophene group, a dibenzothiophene group, a thienothiophene group, a benzofuran group, a phenanthroline group, a thiazole group, an isooxazole group, an oxazole group, an oxadiazole group, a thiadiazole group, a phenothiazine group, a dibenzosilole group, a dibenzofuran group, etc.

In the description, the same explanation on the above-described aryl group may be applied to an arylene group except that the arylene group is a divalent group. The same explanation on the above-described heteroaryl group may be applied to a heteroarylene group except that the heteroarylene group is a divalent group.

In the description, a fluorenyl group may be substituted, and two substituents may be combined with each other to form a spiro structure. Examples of a substituted fluorenyl group are as follows, but an embodiment of the present disclosure is not limited thereto.

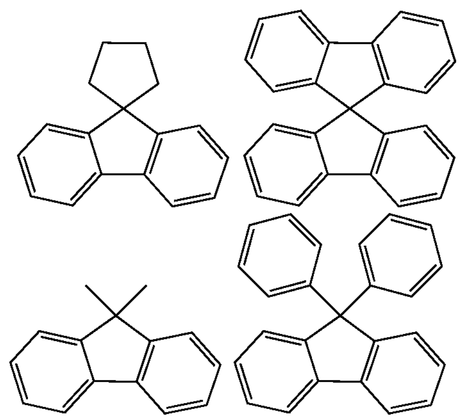

In the description, a silyl group includes an alkyl silyl group and an aryl silyl group. Non-limiting examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc.

In the description, a thio group may include an alkyl thio group and an aryl thio group. The thio group may refer to the above-defined alkyl group or aryl group combined with a sulfur atom. Non-limiting examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc.

In the description, an oxy group may refer to the above-defined alkyl group or aryl group which is combined with an oxygen atom. The oxy group may include an alkoxy group and an aryl oxy group. The alkoxy group may be a linear, branched or cyclic chain. The carbon number of the alkoxy group is not specifically limited but may be, for example, 1 to 60, 1 to 20 or 1 to 10. The number of ring-forming carbon atoms of the aryl oxy group is not specifically limited, but may be, for example, 6 to 60, 6 to 30, or 6 to 20. Examples of the oxy group may include a methoxy group, an ethoxy group, an n-propoxy group, an isopropoxy group, a butoxy group, a pentyloxy group, a hexyloxy group, an octyloxy group, a nonyloxy group, a decyloxy group, a benzyloxy group, etc. However, an embodiment of the present disclosure is not limited thereto.

In the description, a boron group may refer to the above-defined alkyl group or aryl group, combined with a boron atom. The boron group includes an alkyl boron group and an aryl boron group. Non-limiting examples of the boron group may include a dimethylboron group, a diethylboron group, a t-butylmethylboron group, a diphenylboron group, a phenylboron group, etc.

In the description, the carbon number of an amine group is not specifically limited, but may be 1 to 30. The amine group may include an alkyl amine group and an aryl amine group. Non-limiting examples of the amine group may include a methylamine group, a dimethylamine group, a phenylamine group, a diphenylamine group, a naphthylamine group, a 9-methyl-anthracenylamine group, a triphenylamine group, etc.

In the description, the alkyl group in an alkylthio group, an alkylsulfoxy group, an alkylaryl group, an alkylamino group, an alkylboron group, an alkyl silyl group, and an alkyl amine group may be the same as the examples of the above-described alkyl group.

In the description, the aryl group in an aryloxy group, an arylthio group, an arylsulfoxy group, an aryl amino group, an arylboron group, and an aryl silyl group may be the same as the examples of the above-described aryl group.

In the description, a direct linkage may refer to a single bond. Meanwhile, in the description, "", and "-*" each refer to a position to be connected.

Hereinafter, the light emitting element of an embodiment will be explained referring to the drawings.

Figure 2:
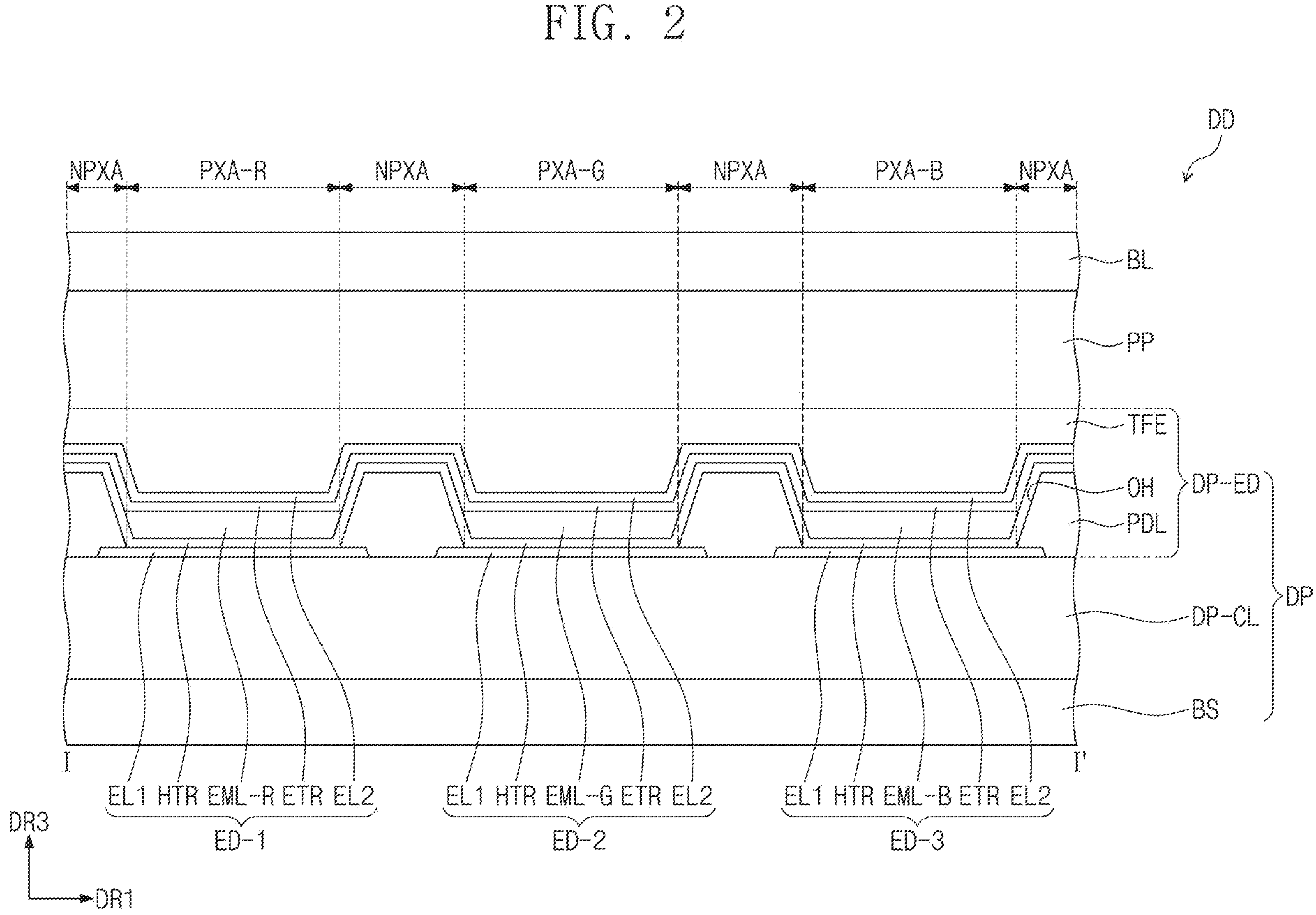
FIG. 2 is a cross-sectional view showing a part corresponding to the line I-I' in FIG. 1.

FIG. 1 is a plan view showing an embodiment of a display apparatus DD. FIG. 2 is a cross-sectional view of a display apparatus DD of an embodiment. FIG. 2 is a cross-sectional view showing a part corresponding to the line I-I' of FIG. 1.

The display apparatus DD may include a display panel DP and an optical layer PP disposed on the display panel DP. The display panel DP may include light emitting elements ED-1, ED-2 and ED-3. The display apparatus DD may include multiple light emitting elements ED-1, ED-2 and ED-3. The optical layer PP may be disposed on the display panel DP and control reflection of external light at the display panel DP. The optical layer PP may include, for example, a polarization layer and/or a color filter layer. In some embodiments, different from the drawings, the optical layer PP may not be provided in the display apparatus DD of an embodiment.

On the optical layer PP, a base substrate BL may be disposed. The base substrate BL may be a member providing a base surface on which the optical layer PP is disposed. The base substrate BL may be a glass substrate, a metal substrate, a plastic substrate, etc. However, an embodiment of the present disclosure is not limited thereto, and the base substrate BL may be an inorganic layer, an organic layer or a composite material layer. In some embodiments, different from the drawings, the base substrate BL may not be provided in an embodiment.

The display apparatus DD according to an embodiment may further include a plugging layer (e.g., filling layer). The plugging layer may be disposed between a display element layer DP-ED and the base substrate BL. The plugging layer may be an organic layer. The plugging layer may include at least one from among an acrylic resin, a silicon-based resin and an epoxy-based resin.

The display panel DP may include a base layer BS, a circuit layer DP-CL provided on the base layer BS and a display element layer DP-ED. The display element layer DP-ED may include a pixel definition layer PDL, light emitting elements ED-1, ED-2 and ED-3 disposed in the pixel definition layer PDL, and an encapsulating layer TFE disposed on the light emitting elements ED-1, ED-2 and ED-3.

The base layer BS may be a member providing a base surface where the display element layer DP-ED is disposed. The base layer BS may be a glass substrate, a metal substrate, a plastic substrate, etc. However, an embodiment of the present disclosure is not limited thereto, and the base layer BS may be an inorganic layer, an organic layer or a composite material layer.

In an embodiment, the circuit layer DP-CL is disposed on the base layer BS, and the circuit layer DP-CL may include multiple transistors. Each of the transistors may include a control electrode, an input electrode, and an output electrode. For example, the circuit layer DP-CL may include switching transistors and driving transistors for driving the light emitting elements ED-1, ED-2 and ED-3 of the display element layer DP-ED.

Each of the light emitting elements ED-1, ED-2 and ED-3 may have the structures of the light emitting elements ED of embodiments according to FIG. 3 to FIG. 6, which will be explained in more detail later. Each of the light emitting elements ED-1, ED-2 and ED-3 may include a first electrode EL1, a hole transport region HTR, emission layers EML-R, EML-G and EML-B (e.g., a corresponding one of the emission layer EML-R, the emission layer EML-G, or the emission layer EML-B), an electron transport region ETR, and a second electrode EL2.

FIG. 2 shows an embodiment where the emission layers EML-R, EML-G and EML-B of light emitting elements ED-1, ED-2 and ED-3 are disposed in opening portions OH defined in a pixel definition layer PDL, and a hole transport region HTR, an electron transport region ETR and a second electrode EL2 are provided as common layers in all light emitting elements ED-1, ED-2 and ED-3. However, an embodiment of the present disclosure is not limited thereto. Different from FIG. 2, in an embodiment, the hole transport region HTR and the electron transport region ETR may be patterned and provided in the opening portions OH defined in the pixel definition layer PDL. For example, in an embodiment, the hole transport region HTR, the emission layers EML-R, EML-G and EML-B, and the electron transport region ETR of the light emitting elements ED-1, ED-2 and ED-3 may be provided and patterned through an ink jet printing method.

An encapsulating layer TFE may cover the light emitting elements ED-1, ED-2 and ED-3. The encapsulating layer TFE may encapsulate the display element layer DP-ED. The encapsulating layer TFE may be a thin film encapsulating layer. The encapsulating layer TFE may be one layer or a stacked layer of multiple layers. The encapsulating layer TFE includes at least one insulating layer. The encapsulating layer TFE according to an embodiment may include at least one inorganic layer (hereinafter, an encapsulating inorganic layer). In some embodiments, the encapsulating layer TFE according to an embodiment may include at least one organic layer (hereinafter, an encapsulating organic layer) and at least one encapsulating inorganic layer.

The encapsulating inorganic layer protects the display element layer DP-ED from moisture/oxygen, and the encapsulating organic layer protects the display element layer DP-ED from foreign materials such as dust particles. The encapsulating inorganic layer may include silicon nitride, silicon oxy nitride, silicon oxide, titanium oxide, and/or aluminum oxide, without being limited thereto. The encapsulating organic layer may include an acrylic compound, an epoxy-based compound, etc. The encapsulating organic layer may include a photopolymerizable organic material, but the embodiment of the present disclosure is not particularly limited thereto.

The encapsulating layer TFE may be disposed on the second electrode EL2 and may be disposed to fill the opening portion OH.

Referring to FIG. 1 and FIG. 2, the display apparatus DD may include a non-luminous (e.g., non-light emitting) area NPXA and luminous (e.g., light emitting) areas PXA-R, PXA-G and PXA-B. The luminous areas PXA-R, PXA-G and PXA-B may be areas emitting light produced from the light emitting elements ED-1, ED-2 and ED-3, respectively. The luminous areas PXA-R, PXA-G and PXA-B may be separated from each other on a plane (e.g., in a plan view).

Each of the luminous areas PXA-R, PXA-G and PXA-B may be areas separated by the pixel definition layer PDL. The non-luminous areas NPXA may be areas between neighboring luminous areas PXA-R, PXA-G and PXA-B and may be areas corresponding to the pixel definition layer PDL. In some embodiments, in the disclosure, each of the luminous areas PXA-R, PXA-G and PXA-B may correspond to a pixel. The pixel definition layer PDL may divide the light emitting elements ED-1, ED-2 and ED-3. The emission layers EML-R, EML-G and EML-B of the light emitting elements ED-1, ED-2 and ED-3 may be disposed and divided in the opening portions OH defined in the pixel definition layer PDL.

The luminous areas PXA-R, PXA-G and PXA-B may be divided into multiple groups according to the color of light produced from the light emitting elements ED-1, ED-2 and ED-3. In the display apparatus DD of an embodiment, shown in FIG. 1 and FIG. 2, three luminous areas PXA-R, PXA-G and PXA-B emitting red light, green light and blue light, respectively, are illustrated as an embodiment. For example, the display apparatus DD of an embodiment may include a red luminous area PXA-R, a green luminous area PXA-G and a blue luminous area PXA-B, which are separated from each other.

In the display apparatus DD according to an embodiment, multiple light emitting elements ED-1, ED-2 and ED-3 may be to emit light having different wavelength regions. For example, in an embodiment, the display apparatus DD may include a first light emitting element ED-1 emitting red light, a second light emitting element ED-2 emitting green light, and a third light emitting element ED-3 emitting blue light. For example, the red luminous area PXA-R, the green luminous area PXA-G, and the blue luminous area PXA-B of the display apparatus DD may correspond to the first light emitting element ED-1, the second light emitting element ED-2, and the third light emitting element ED-3, respectively.

However, an embodiment of the present disclosure is not limited thereto, and the first to third light emitting elements ED-1, ED-2 and ED-3 may be to emit light in substantially the same wavelength region, or at least one thereof may be to emit light in a different wavelength region. For example, the first to third light emitting elements ED-1, ED-2 and ED-3 may all emit blue light (e.g., may each light in blue wavelength region).

The luminous areas PXA-R, PXA-G and PXA-B in the display apparatus DD according to an embodiment may be arranged in a stripe shape. Referring to FIG. 1, multiple red luminous areas PXA-R may be arranged with each other along a second directional axis DR2, multiple green luminous areas PXA-G may be arranged with each other along the second directional axis DR2, and multiple blue luminous areas PXA-B may be arranged with each other along the second directional axis DR2. In some embodiments, the red luminous area PXA-R, the green luminous area PXA-G and the blue luminous area PXA-B may be alternately arranged in this stated order along a first directional axis DR1.

In FIG. 1 and FIG. 2, the areas of the luminous areas PXA-R, PXA-G and PXA-B are shown as similar in size, but an embodiment of the present disclosure is not limited thereto. The areas of the luminous areas PXA-R, PXA-G and PXA-B may be different from each other according to the wavelength region of light emitted. Meanwhile, the areas of the luminous areas PXA-R, PXA-G and PXA-B may refer to areas when viewed on a plane defined by the first directional axis DR1 and the second directional axis DR2 (e.g., in a plan view).

In some embodiments, the arrangement of the luminous areas PXA-R, PXA-G and PXA-B is not limited to the configuration shown in FIG. 1, and the arrangement order of the red luminous areas PXA-R, the green luminous areas PXA-G and the blue luminous areas PXA-B may be provided in one or more suitable combinations according to the properties of display quality desired or required for the display apparatus DD. For example, the luminous areas PXA-R, PXA-G and PXA-B may be arranged in a PENTILE® arrangement form, or a Diamond Pixel™ arrangement form. PENTILE® and Diamond Pixel™ are trademarks of Samsung Display Co., Ltd.

In some embodiments, the areas of the luminous areas PXA-R, PXA-G and PXA-B may be different from each other. For example, in an embodiment, the area of the green luminous area PXA-G may be smaller than the area of the blue luminous area PXA-B, but an embodiment of the present disclosure is not limited thereto.

Hereinafter, FIG. 3 to FIG. 6 are cross-sectional views schematically showing light emitting elements according to embodiments. The light emitting element ED according to an embodiment may include a first electrode EL1, a second electrode EL2 oppositely disposed to the first electrode EL1, and an emission layer EML disposed between the first electrode EL1 and the second electrode EL2. The light emitting element ED of an embodiment may include a first compound of an embodiment, which will be explained in more detail later, in the emission layer EML.

The light emitting element ED may include a hole transport region HTR, an emission layer EML, an electron transport region ETR, and/or the like, stacked in the stated order. For example, the light emitting element ED of an embodiment may include a first electrode EL1, a hole transport region HTR, an emission layer EML, an electron transport region ETR, and a second electrode EL2, stacked in the stated order.

Figure 3:
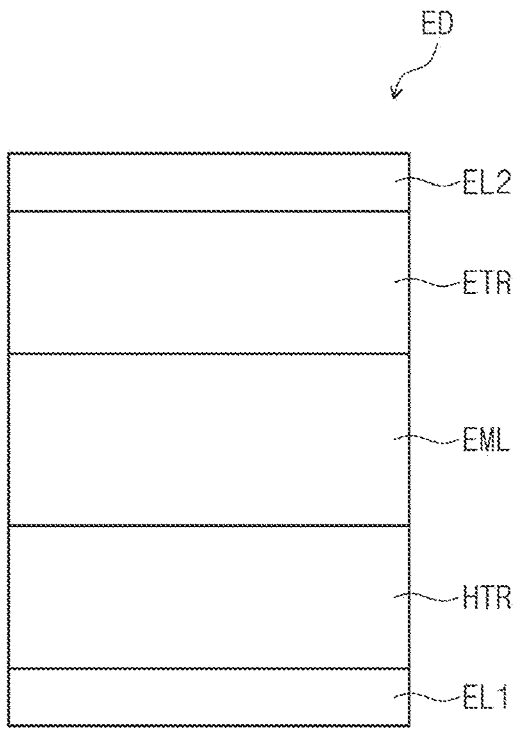
FIG. 3 is a cross-sectional view schematically showing a light emitting element according to an embodiment.
Figure 4:
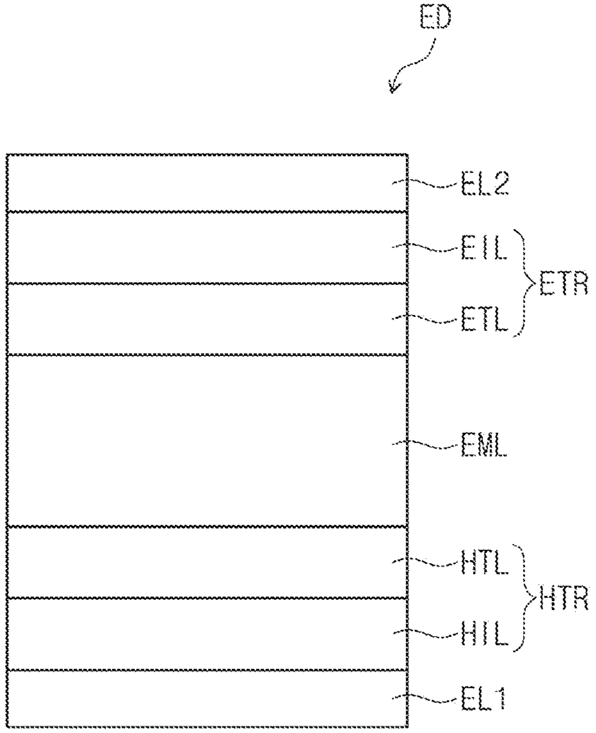
FIG. 4 is a cross-sectional view schematically showing a light emitting element according to an embodiment.
Figure 5:
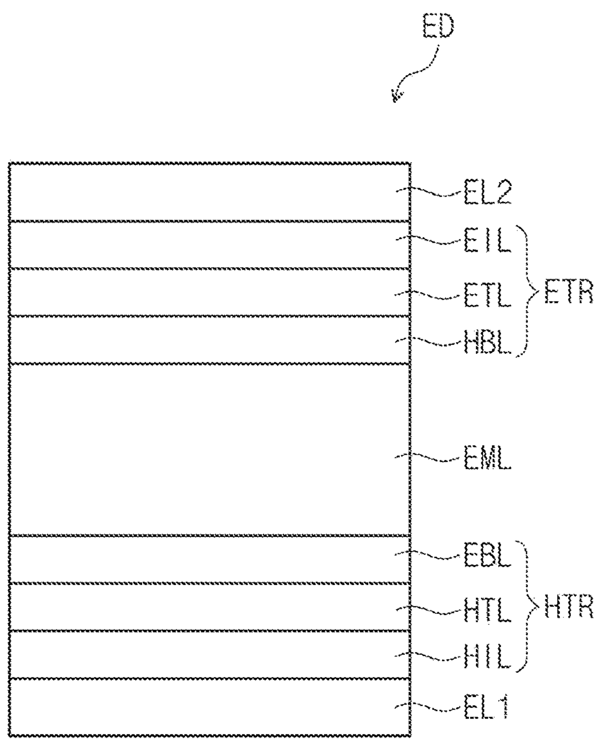
FIG. 5 is a cross-sectional view schematically showing a light emitting element according to an embodiment.
Figure 6:
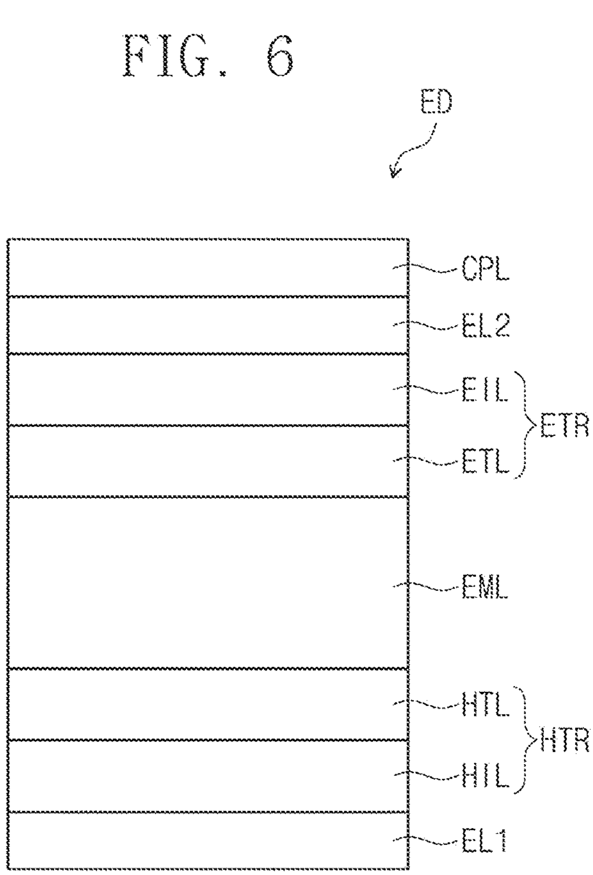
FIG. 6 is a cross-sectional view schematically showing a light emitting element according to an embodiment.

When compared with FIG. 3, FIG. 4 shows the cross-sectional view of a light emitting element ED of an embodiment, in which a hole transport region HTR includes a hole injection layer HIL and a hole transport layer HTL, and an electron transport region ETR includes an electron injection layer EIL and an electron transport layer ETL. In addition, when compared with FIG. 3, FIG. 5 shows the cross-sectional view of a light emitting element ED of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. When compared with FIG. 4, FIG. 6 shows the cross-sectional view of a light emitting element ED of an embodiment, further including a capping layer CPL disposed on the second electrode EL2.

The light emitting element ED of an embodiment may include a first compound of an embodiment, which will be explained in more detail later, in an emission layer EML. The first compound may be a polycyclic compound. In some embodiments, in a display apparatus DD (FIG. 2) of an embodiment, including multiple emission regions, a polycyclic compound of an embodiment, which will be explained in more detail later, may be included in an emission layer EML forming at least one emission region.

In the light emitting element ED according to an embodiment, the first electrode EL1 has conductivity (e.g., is a conductor). The first electrode EL1 may be formed utilizing a metal material, a metal alloy or a conductive compound. The first electrode EL1 may be an anode or a cathode.

However, an embodiment of the present disclosure is not limited thereto. In some embodiments, the first electrode EL1 may be a pixel electrode. The first electrode EL1 may be a transmissive electrode, a transflective electrode, or a reflective electrode. The first electrode EL1 may include at least one selected from among Ag, Mg, Cu, Al, Pt, Pd, Au, Ni, Nd, Ir, Cr, Li, Ca, LiF, Mo, Ti, W, In, Sn, Zn, a compound of two or more selected therefrom, a mixture of two or more selected therefrom, and/or an oxide thereof.

When the first electrode EL1 is the transmissive electrode, the first electrode EL1 may include a transparent metal oxide such as indium tin oxide (ITO), indium zinc oxide (IZO), zinc oxide (ZnO), and/or indium tin zinc oxide (ITZO). When the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca (a stacked structure of LiF and Ca), LiF/Al (a stacked structure of LiF and Al), Mo, Ti, W, a compound thereof, and/or a mixture thereof (for example, a mixture of Ag and Mg). Also, the first electrode EL1 may have a structure including multiple layers including a reflective layer or a transflective layer formed utilizing the above materials, and a transmissive conductive layer formed utilizing ITO, IZO, ZnO, and/or ITZO. For example, the first electrode EU may have a three-layer structure of ITO/Ag/ITO. However, an embodiment of the present disclosure is not limited thereto. The first electrode EL1 may include one or more of the above-described metal materials, combinations of two or more metal materials selected from the above-described metal materials, and/or one or more of oxides of the above-described metal materials. The thickness of the first electrode EU may be from about 700 Å to about 10,000 Å. For example, the thickness of the first electrode EL1 may be from about 1,000 Å to about 3,000 Å.

The hole transport region HTR is provided on the first electrode EL1. The hole transport region HTR may include at least one of a hole injection layer HIL, a hole transport layer HTL, a buffer layer or an emission auxiliary layer, or an emission blocking layer EBL. The thickness of the hole transport region HTR may be, for example, about 50 Å to about 15,000 Å.

The hole transport region HTR may have a single layer formed utilizing a single material, a single layer formed utilizing multiple different materials, or a multilayer structure including multiple layers formed utilizing multiple different materials.

For example, the hole transport region HTR may have the structure of a single layer of a hole injection layer HIL or a hole transport layer HTL, or may have a structure of a single layer formed utilizing a hole injection material and a hole transport material. In some embodiments, the hole transport region HTR may have a structure of a single layer formed utilizing multiple different materials, or a structure in which a hole injection layer HIL/hole transport layer HTL, hole injection layer HIL/hole transport layer HTL/buffer layer, hole injection layer HIL/buffer layer, hole transport layer HTL/buffer layer, or hole injection layer HIL/hole transport layer HTL/electron blocking layer EBL are stacked in the respective stated order from the first electrode EL1, but the embodiment of the present disclosure is not limited thereto.

The hole transport region HTR may be formed utilizing one or more suitable methods such as a vacuum deposition method, a spin coating method, a cast method, a Langmuir-Blodgett (LB) method, an inkjet printing method, a laser printing method, and/or a laser induced thermal imaging (LITI) method.

The hole transport region HTR may include a compound represented by Formula H-1.

[Formula H-1]

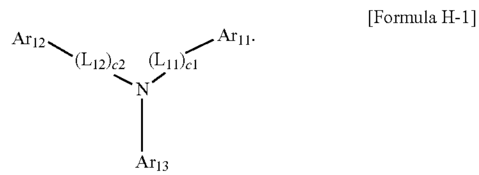

In Formula H-1 above, $L_{11}$ and $L_{12}$ may each independently be a direct linkage, a substituted or unsubstituted arylene group of 6 to 30 ring-forming carbon atoms, or a substituted or unsubstituted heteroarylene group of 2 to 30 ring-forming carbon atoms. c1 and c2 may each independently be an integer of 0 to 10. In some embodiments, when c1 and/or c2 is an integer of 2 or more, multiple $L_{11}$ and/or $L_{12}$ may each independently be a substituted or unsubstituted arylene group of 6 to 30 ring-forming carbon atoms, or a substituted or unsubstituted heteroarylene group of 2 to 30 ring-forming carbon atoms.

In Formula H-1, $Ar_{11}$ and $Ar_{12}$ may each independently be a substituted or unsubstituted aryl group of 6 to 30 ring-forming carbon atoms, or a substituted or unsubstituted heteroaryl group of 2 to 30 ring-forming carbon atoms. In some embodiments, in Formula H-1, $Ar_{13}$ may be a substituted or unsubstituted aryl group of 6 to 30 ring-forming carbon atoms.

The compound represented by Formula H-1 may be a monoamine compound (e.g., a compound including a single amine group). In some embodiments, the compound represented by Formula H-1 may be a diamine compound in which at least one among $Ar_{11}$ to $Ar_{13}$ includes an amine group as a substituent. In some embodiments, the compound represented by Formula H-1 may be a carbazole-based compound in which $Ar_{11}$ and/or $Ar_{12}$ includes a substituted or unsubstituted carbazole group, or a fluorene-based compound in which $Ar_{11}$ and/or $Ar_{12}$ includes a substituted or unsubstituted fluorene group.

The compound represented by Formula H-1 may be represented by any one from among the compounds in Compound Group H. However, the compounds shown in Compound Group H are only illustrations, and the compound represented by Formula H-1 is not limited to the compounds represented in Compound Group H.

[Compound Group H]

H-1-1

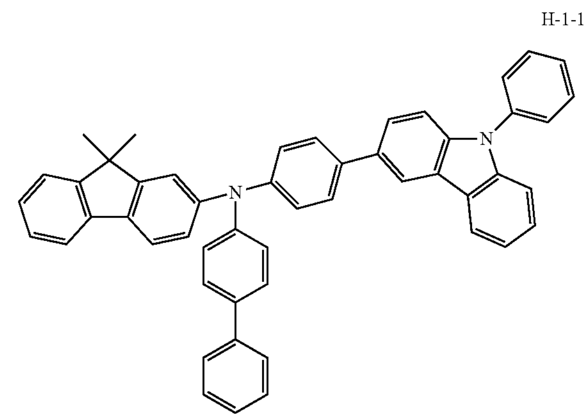

-continued
H-1-2
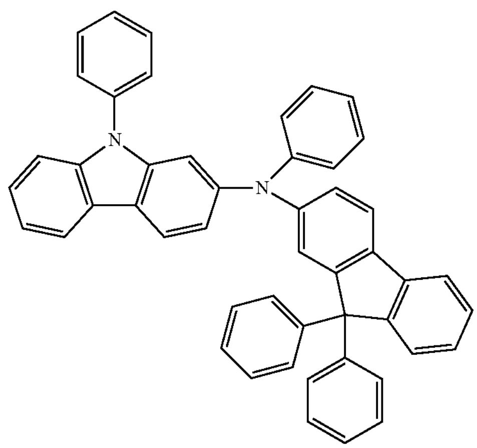
H-1-3
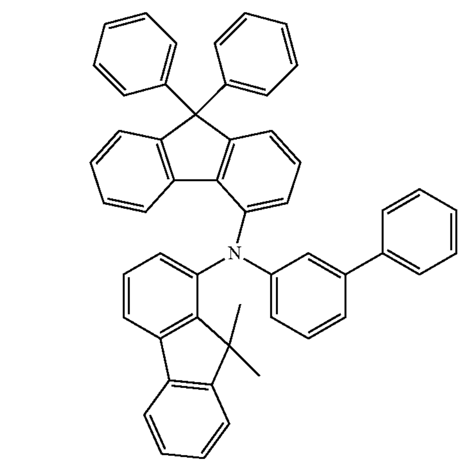
H-1-4
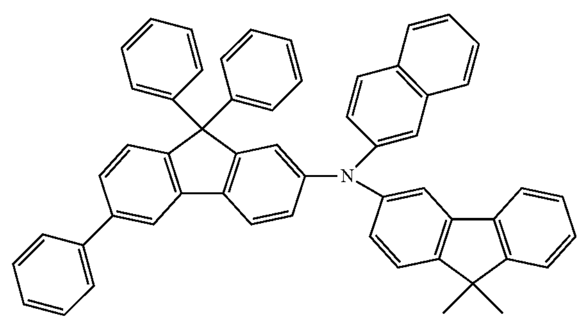
H-1-5
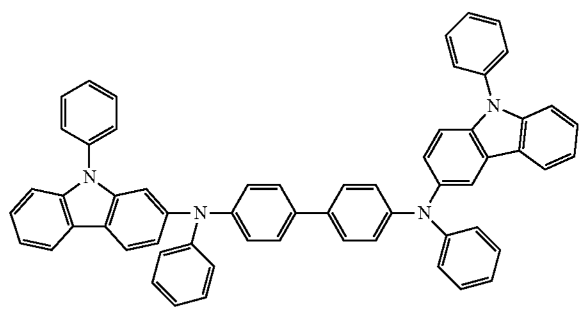
-continued
H-1-6
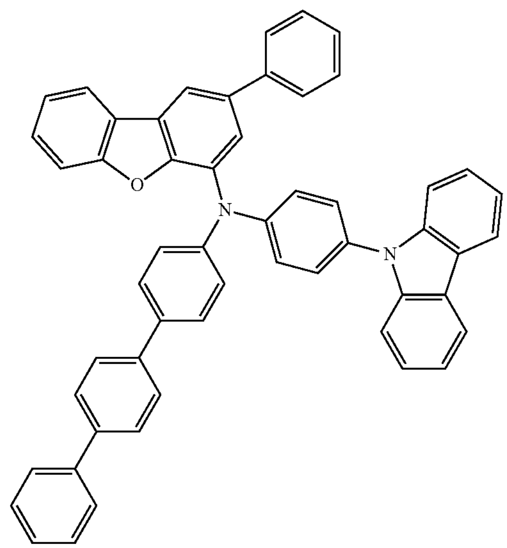
H-1-7
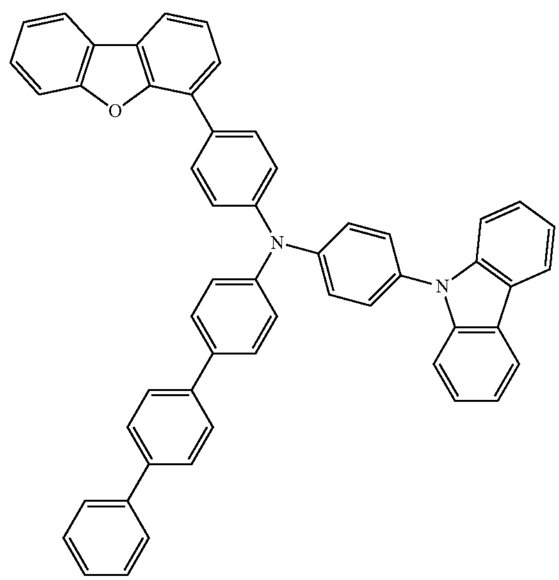
H-1-8
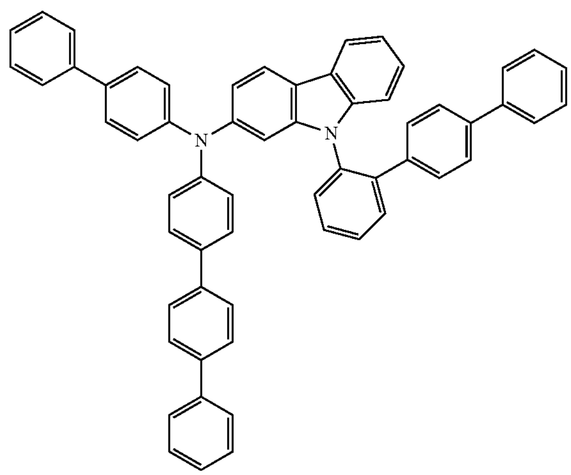

-continued
H-1-9
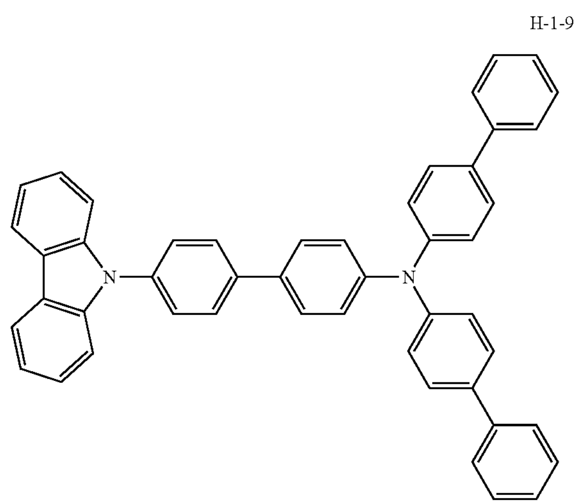
H-1-10
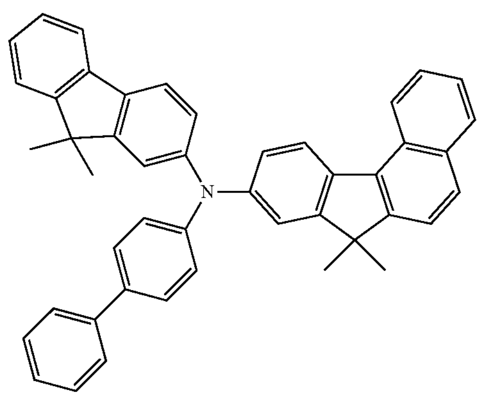
H-1-11
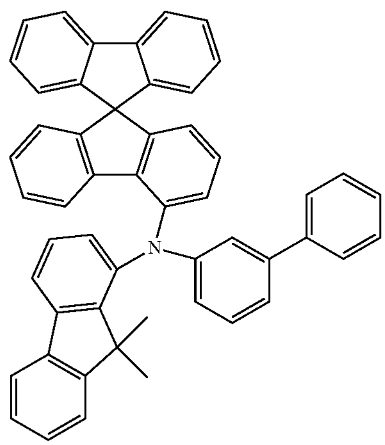
-continued
H-1-12
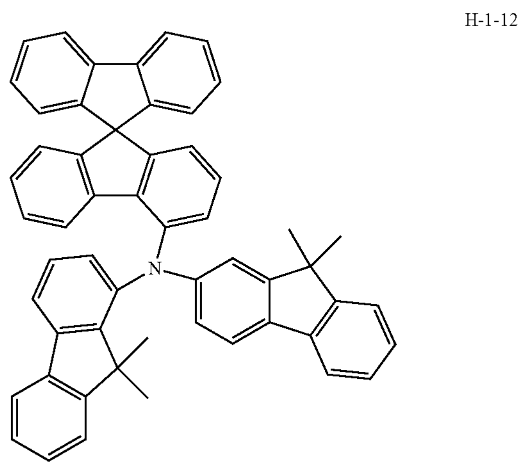
H-1-13
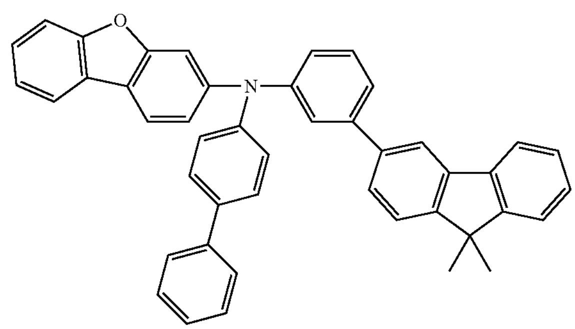
H-1-14
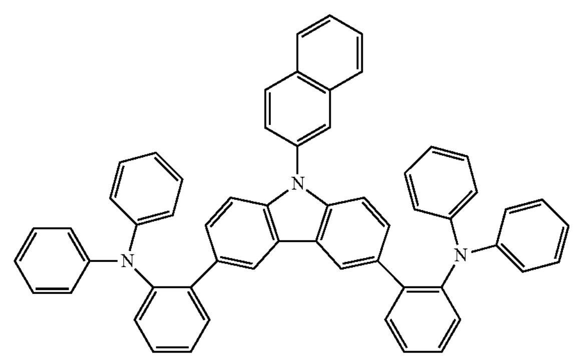
H-1-15
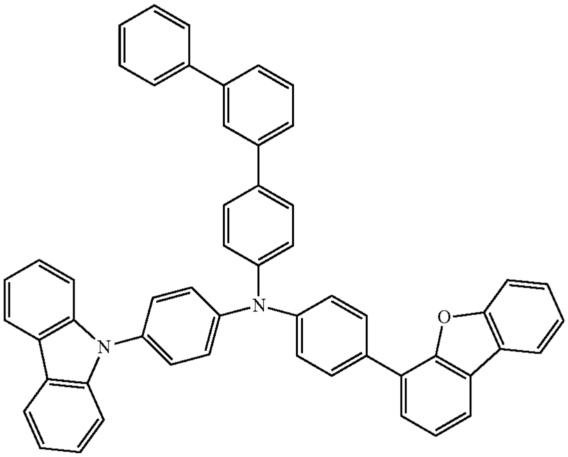

-continued

H-1-16

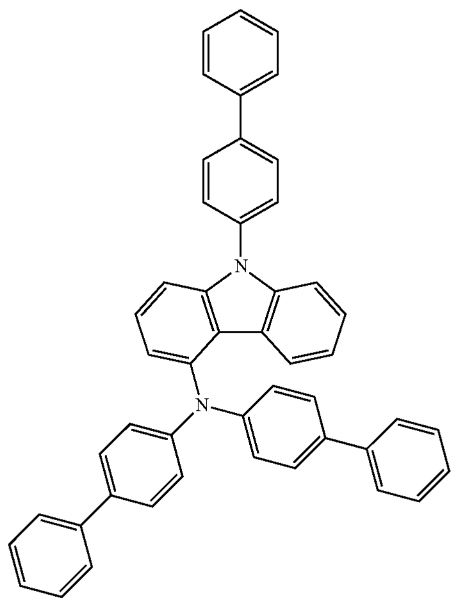

H-1-17

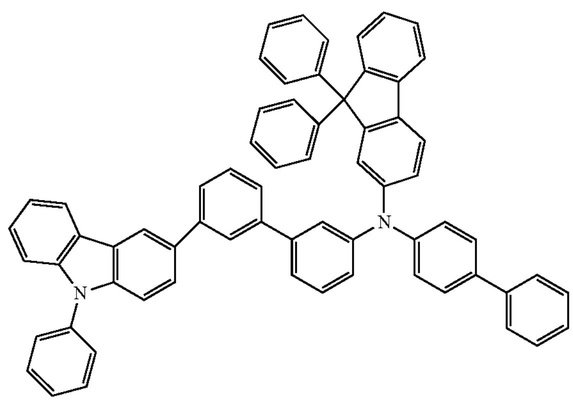

H-1-18

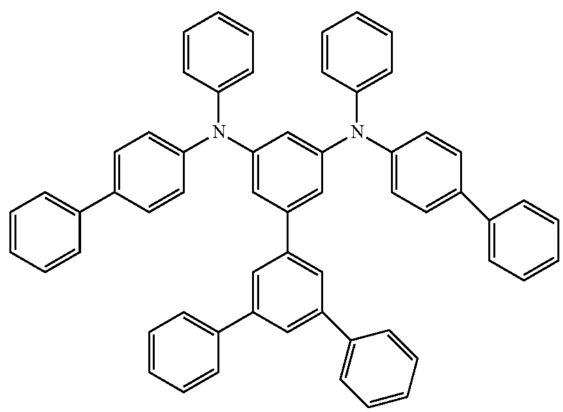

-continued

H-1-19

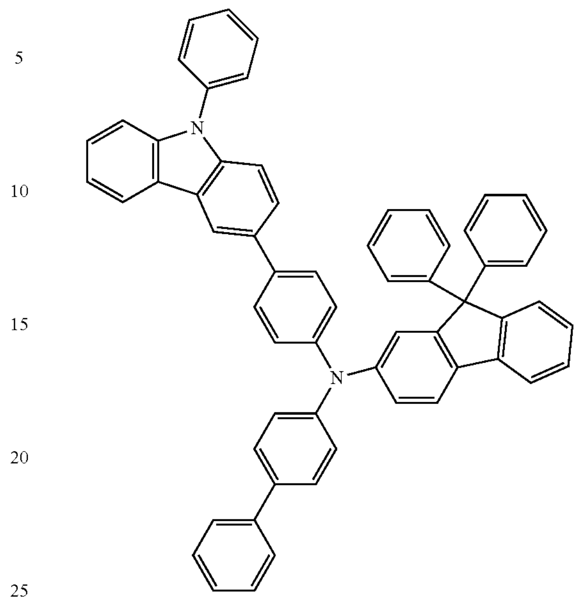

H-1-20

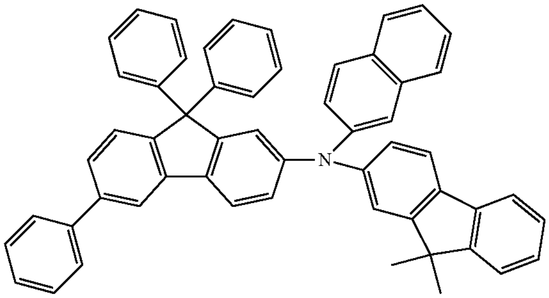

The hole transport region HTR may include a phthalocyanine compound such as copper phthalocyanine, $N^1$,$N^{1'}$-([1,1'-biphenyl]-4,4'-diyl)bis($N^1$-phenyl-$N^4$,$N^4$-di-m-tolyl-benzene-1,4-diamine) (DNTPD), 4,4',4"-[tris(3-methylphenyl)phenylamino] triphenylamine (m-MTDATA), 4,4',4"-tris(N,N-diphenylamino)triphenylamine (TDATA), 4,4',4"-tris[N-(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalen-1-yl)-N,N'-diphenyl-benzidine (NPB) (or NPD, α-NPD), triphenylamine-containing polyetherketone (TPAPEK), 4-isopropyl-4'-methyldiphenyliodonium [tetrakis(pentafluorophenyl)borate], and/or dipyrazino[2,3-f:2',3'-h] quinoxaline-2,3,6,7,10,11-hexacarbonitrile (HAT-CN).

The hole transport region HTR may include one or more carbazole derivatives such as N-phenylcarbazole and/or polyvinylcarbazole, fluorene-based derivatives, triphenylamine-based derivatives such as 4,4',4"-tris(N-carbazolyl)triphenylamine (TCTA), N,N'-bis(3-methylphenyl)-N,N'-diphenyl-[1,1'-biphenyl]-4,4'-diamine (TPD), N,N'-di(naphthalen-1-yl)-N,N'-diphenyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 1,3-bis(N-carbazolyl)benzene (mCP), and/or the like.

In some embodiments, the hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the compounds of the hole transport region in at least one from among the hole injection layer HIL, the hole transport layer HTL, and the electron blocking layer EBL.

The thickness of the hole transport region HTR may be from about 100 Å to about 10,000 Å, for example, from about 100 Å to about 5,000 Å. When the hole transport region HTR includes a hole injection layer HIL, the thickness of the hole injection region HIL may be, for example, from about 30 Å to about 1,000 Å. When the hole transport region HTR includes a hole transport layer HTL, the thickness of the hole transport layer HTL may be from about 30 Å to about 1,000 Å. For example, when the hole transport region HTR includes an electron blocking layer EBL, the thickness of the electron blocking layer EBL may be from about 10 Å to about 1,000 Å. When the thicknesses of the hole transport region HTR, the hole injection layer HIL, the hole transport layer HTL and the electron blocking layer EBL satisfy the above-described ranges, satisfactory hole transport properties may be achieved without substantial increase of a driving voltage.

The hole transport region HTR may further include a charge generating material to increase conductivity in addition to the above-described materials. The charge generating material may be dispersed uniformly or non-uniformly in the hole transport region HTR. The charge generating material may be, for example, a p-dopant. The p-dopant may include one or more metal halide compounds, quinone derivatives, metal oxides, and cyano group-containing compounds, but the embodiment of the present disclosure is not limited thereto. For example, the p-dopant may include one or more metal halide compounds such as CuI and/or RbI, quinone derivatives such as tetracyanoquinodimethane (TCNQ) and/or 2,3,5,6-tetrafluoro-7,7',8,8-tetracyanoquinodimethane (F4-TCNQ), metal oxides such as tungsten oxide and/or molybdenum oxide, cyano group-containing compounds such as dipyrazino[2,3-f:2',3'-h] quinoxaline-2,3,6,7,10,11-hexacarbonitrile (HATCN) and/or 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), etc., but the embodiment of the present disclosure is not limited thereto.

As described above, the hole transport region HTR may further include at least one from among a buffer layer and an electron blocking layer EBL in addition to the hole injection layer HIL and the hole transport layer HTL. The buffer layer may compensate for a resonance distance according to the wavelength of light emitted from an emission layer EML and may thus increase emission efficiency. As materials included in the buffer layer, materials which may be included in the hole transport region HTR may be utilized. The electron blocking layer EBL is a layer playing the role of blocking the injection of electrons from the electron transport region ETR to the hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed utilizing a single material, a single layer formed utilizing multiple different materials, or a multilayer structure having multiple layers formed utilizing multiple different materials.

In the light emitting element ED of an embodiment, the emission layer EML may include multiple light emitting materials. In an embodiment, the emission layer EML may include a first compound, and at least one from among a second compound, a third compound, and a fourth compound. In the light emitting element ED of an embodiment, the emission layer EML may include at least one host and at least one dopant. For example, the emission layer EML of an embodiment may include a first dopant, and a first host and a second host, which are different from each other. In some embodiments, the emission layer EML of an embodiment may include a first host and a second host, which are different from each other, and a first dopant and a second dopant, which are different from each other.

The first compound included in the emission layer EML of an embodiment may include a polycyclic compound having a B-N-B structure in which two boron atoms are bonded to one nitrogen atom.

The first compound of an embodiment may include a polycyclic compound represented by Formula 1.

[Formula 1]

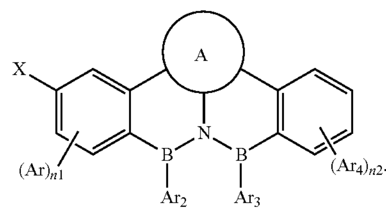

In Formula 1, X may be a substituted amine group and may be represented by Formula 2.

In Formula 1, A may be a substituted or unsubstituted aromatic hydrocarbon ring (e.g., a substituted or unsubstituted aryl group), or a substituted or unsubstituted aromatic heterocycle (e.g., a substituted or unsubstituted heteroaryl group). In an embodiment, A may be a substituted or unsubstituted aromatic hydrocarbon ring of 6 to 30 ring-forming carbon atoms, or a substituted or unsubstituted aromatic heterocycle of 2 to 30 ring-forming carbon atoms. For example, A may be a substituted or unsubstituted benzene ring, a substituted or unsubstituted pyridine ring, a substituted or unsubstituted carbazole ring, a substituted or unsubstituted dibenzofuran ring, or a substituted or unsubstituted dibenzothiophene ring. In some embodiments, when A is a substituted aromatic hydrocarbon ring or a substituted aromatic heterocycle, a substituent may be a phenyl group, a pyridine group, and/or the like.

In Formula 1, n1 may be an integer of 0 to 3. $Ar_1$ may be a hydrogen atom, a deuterium atom, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring. In an embodiment, $Ar_1$ may be combined with $Ar_2$ to form a hydrocarbon ring or a heterocycle containing N, O, S, and/or the like as a ring-forming atom.

In an embodiment, when n1 is an integer of 2 or more, multiple $Ar_1$ may all be the same, or at least one may be different from the remainder thereof. For example, any one from among multiple $Ar_1$ may be a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, and any remainder thereof may be hydrogen atom(s) and/or deuterium atom(s).

In Formula 1, $Ar_2$ and $Ar_3$ may each independently be a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring. In an embodiment, $Ar_2$ and $Ar_3$ may each independently be a substituted or unsubstituted aryl group of 6 to 15 ring-forming carbon atoms, or a substituted or unsubstituted heteroaryl group of 2 to 15 ring-forming carbon atoms, and/or $Ar_2$ may be combined with $Ar_1$, and/or $Ar_3$ may be combined with $Ar_4$ to form hydrocarbon rings or heterocycles containing N, O, S, and/or the like as a ring-forming atom. Meanwhile, a case where $Ar_2$ and $Ar_3$ are combined with each other to form a ring is excluded.

In Formula 1, n2 may be an integer of 0 to 4. $Ar_4$ may be a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, or represented by Formula 2. In an embodiment, when n2 is an integer of 2 or more, multiple $Ar_2$ may all be the same, or at least one may be different from the remainder thereof. For example, at least one from among multiple $Ar_2$ may be represented by Formula 2.

[Formula 2]

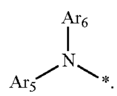

In Formula 2, $Ar_5$ and $Ar_6$ may each independently be a substituted or unsubstituted aryl group of 6 to 30 ring-forming carbon atoms, or a substituted or unsubstituted heteroaryl group of 2 to 30 ring-forming carbon atoms, and/or $Ar_5$ and $Ar_6$ may be combined with each other to form a ring. For example, $Ar_5$ and $Ar_6$ may each independently be a substituted or unsubstituted phenyl group, a substituted or unsubstituted biphenyl group, or a substituted or unsubstituted terphenyl group, and/or $Ar_5$ and $Ar_6$ may be combined with each other to form a substituted or unsubstituted carbazole ring. However, an embodiment of the present disclosure is not limited thereto.

In an embodiment, Formula 2 may be represented by Formula 2-1 or Formula 2-2.

[Formula 2-1]

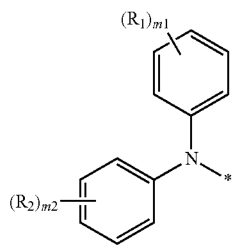

-continued

[Formula 2-1]

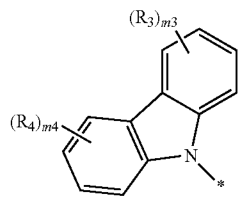

In Formula 2-1 and Formula 2-2, $R_1$ to $R_4$ may each independently be a hydrogen atom, a deuterium atom, a substituted or unsubstituted alkyl group of 1 to 20 carbon atoms, or a substituted or unsubstituted aryl group of 6 to 30 ring-forming carbon atoms. For example, $R_1$ to $R_4$ may each independently be a hydrogen atom, a deuterium atom, a substituted or unsubstituted t-butyl group, or a substituted or unsubstituted phenyl group. However, an embodiment of the present disclosure is not limited thereto.

In Formula 2-1 and Formula 2-2, m1 and m2 may each independently be an integer of 0 to 5, and m3 and m4 may each independently be an integer of 0 to 4. In an embodiment, when any of m1 to m4 are each independently an integer of 2 or more, respective multiple $R_1$ to $R_4$ may all be the same, or at least one may be different from the respective remainder thereof.

In an embodiment, the polycyclic compound represented by Formula 1 may be represented by Formula 3. Formula 3 corresponds to Formula 1 where $Ar_1$ to $Ar_4$ are embodied. In Formula 3, A may be the same as defined in Formula 1, and $Ar_5$ and $Ar_6$ may be the same as defined in Formula 2.

[Formula 3]

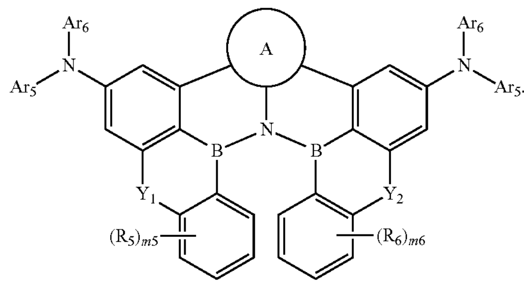

In Formula 3, $Y_1$ and $Y_2$ may each independently be O, S, or $NAr_7$. In an embodiment, at least one from among $Y_1$ and $Y_2$ may be $NAr_7$.

In Formula 3, $Ar_7$ may be a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring. In an embodiment, $Ar_7$ may be a substituted or unsubstituted phenyl group, or may form a heterocycle with adjacent $R_5$ or $R_6$, containing N as a ring-forming atom.

In Formula 3, m5 and m6 may each independently be an integer of 0 to 4. $R_5$ and $R_6$ may each independently be a hydrogen atom, a deuterium atom, or a substituted or unsubstituted aryl group of 6 to 30 ring-forming carbon atoms, and/or combined with an adjacent group to form a ring. For example, $R_5$ and $R_6$ may each independently be a hydrogen atom, a deuterium atom, or a substituted or unsubstituted phenyl group, and/or combined with adjacent $Y_1$ or $Y_2$ to form a ring. In some embodiments, when m5 and m6 are each independently an integer of 2 or more, multiple $R_5$ may all be the same, or at least one may be different from the remainder thereof, and multiple $R_6$ may all be the same, or at least one may be different from the remainder thereof.

In an embodiment, the polycyclic compound represented by Formula 3 may be represented by any one among Formula 3-1 to Formula 3-3. Formula 3-1 to Formula 3-3 correspond to Formula 3 where $Y_1$, $Y_2$, $R_5$ and $R_6$ are embodied. In Formula 3-1 to Formula 3-3, the same explanation on A, $Ar_5$ and $Ar_6$ referring to Formula 3 may be applied. Accordingly, in Formula 3-1 to Formula 3-3, the same explanation on A referring to Formula 1 may be applied, and the same explanation on $Ar_5$ and $Ar_6$ referring to Formula 2 may be applied.

[Formula 3-1]

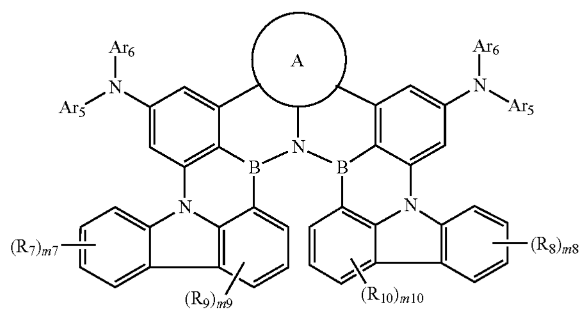

[Formula 3-2]

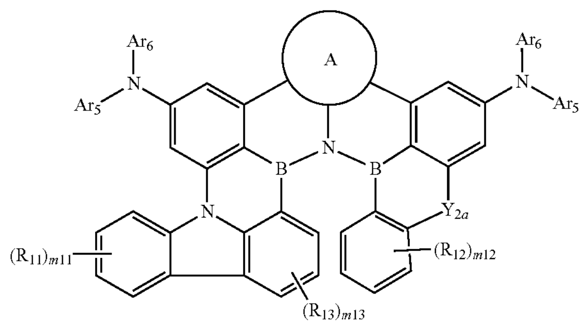

[Formula 3-3]

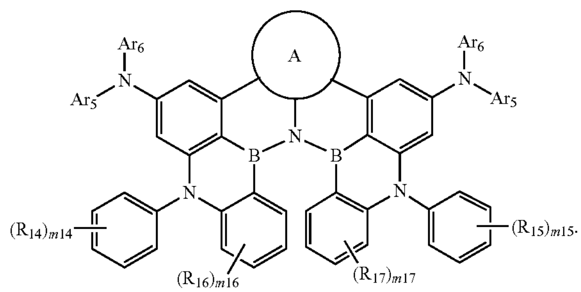

In Formula 3-1 to Formula 3-3, $R_7$ to $R_{17}$ may each independently be a hydrogen atom, a deuterium atom, a substituted or unsubstituted alkyl group of 1 to 10 carbon atoms, or a substituted or unsubstituted aryl group of 6 to 15 ring-forming carbon atoms. For example, $R_9$, $R_{10}$, $R_{12}$, $R_{13}$, $R_{16}$ and $R_{17}$ may each independently be a hydrogen atom or a deuterium atom, and $R_7$, $R_8$, $R_{11}$, $R_{14}$ and $R_{15}$ may each independently be a hydrogen atom, a deuterium atom, a substituted or unsubstituted t-butyl group, or a substituted or unsubstituted phenyl group. However, an embodiment of the present disclosure is not limited thereto.

In Formula 3-1 to Formula 3-3, m7, m8, m11, m12, m16 and m17 may each independently be an integer of 0 to 4, m9, m10 and m13 may each independently be an integer of 0 to 3, and m14 and m15 may each independently be an integer of 0 to 5. In an embodiment, when any of m7 to m17 are each independently an integer of 2 or more, each of respective multiple $R_7$ to $R_{17}$ may be the same or different. In Formula 3-2, $Y_{2a}$ may be S or O.

In an embodiment, the polycyclic compound represented by Formula 3 may be represented by Formula 4. Formula 4 corresponds to Formula 3 where A is a substituted or unsubstituted aromatic hydrocarbon ring or a substituted or unsubstituted aromatic heterocycle. In Formula 4, the same explanation on $Ar_5$, $Ar_6$, $R_5$, $R_6$, m5, m6, $Y_1$ and $Y_2$ referring to Formula 3 may be applied. In some embodiments, $Ar_5$ and $Ar_6$ may each independently be the same as defined in Formula 2.

[Formula 4]

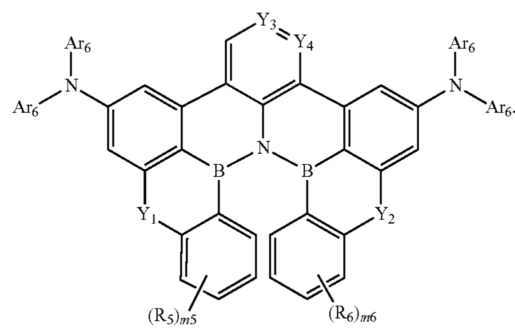

In Formula 4, $Y_3$ and $Y_4$ may each independently be $CR_a$ or N. For example, $Y_3$ and $Y_4$ may both be $CR_a$, or $Y_3$ may be N, and $Y_4$ may be $CR_a$.

In Formula 4, $R_a$ may be a hydrogen atom, a deuterium atom, a substituted or unsubstituted aryl group of 6 to 20 ring-forming carbon atoms, or a substituted or unsubstituted heteroaryl group of 2 to 20 ring-forming carbon atoms, and/or combined with an adjacent group to form a ring. For example, $R_a$'s may be a hydrogen atom, a deuterium atom, or a substituted or unsubstituted phenyl group, and/or adjacent $R_a$ may be combined with each other to form a heterocycle containing N, O, S, and/or the like as a ring-forming atom. In some embodiments, when adjacent $R_a$'s are combined with each other to form a heterocycle containing N as a ring-forming atom, N may be unsubstituted or substituted with a phenyl group.

In an embodiment, the polycyclic compound represented by Formula 4 may be represented by any one from among Formula 4-1 or Formula 4-2. Formula 4-1 and Formula 4 correspond to Formula 4 where $Y_1$, $Y_2$, $Ar_5$ and $Ar_6$ are embodied. In Formula 4-1 and Formula 4-2, the same explanation on $R_5$, $R_6$, m5, m6, $Y_1$ and $Y_2$ referring to Formula 3 may be applied, and the same explanation on $Y_3$ and $Y_4$ referring to Formula 4 may be applied. Formula 4-1 and Formula 4-2 may correspond to Formula 4 where Formula 2-1 and Formula 2-2 are introduced into symmetric structures. Accordingly, the same explanation on $R_1$ to $R_4$, and m1 to m4 referring to Formula 2-1 and Formula 2-2 may be applied.

[Formula 4-1]

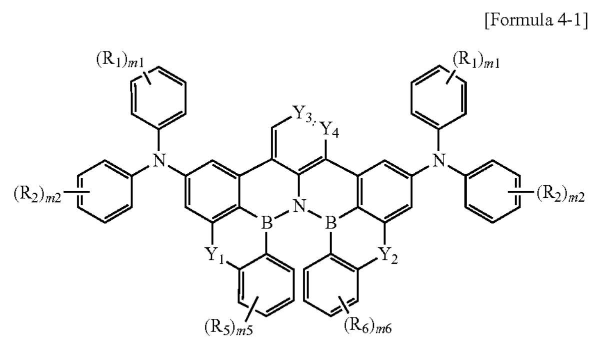

-continued

[Formula 4-2]

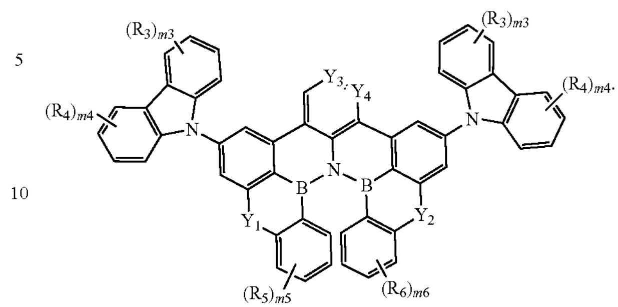

The first compound of an embodiment may be any one from among the compounds represented in Compound Group 1. The light emitting element ED of an embodiment may include at least one from among the compounds represented in Compound Group 1 as the first compound in an emission layer EML.

[Compound Group 1]

A-1

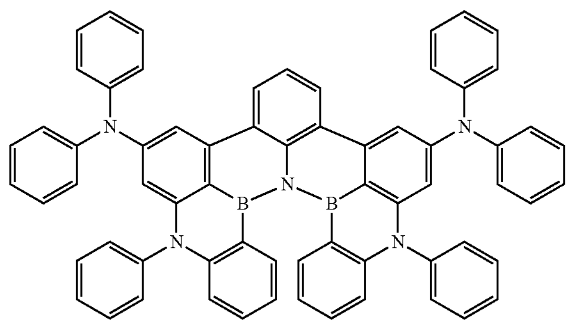

A-2

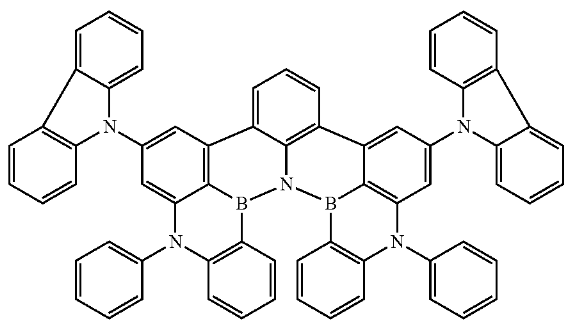

A-3

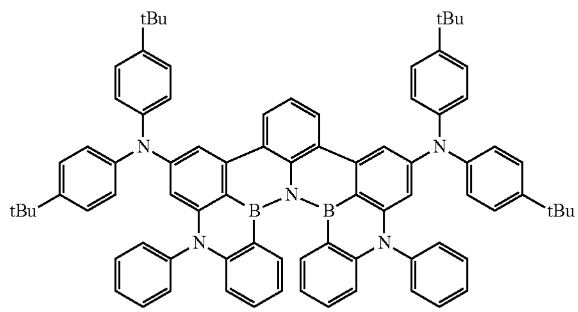

A-4

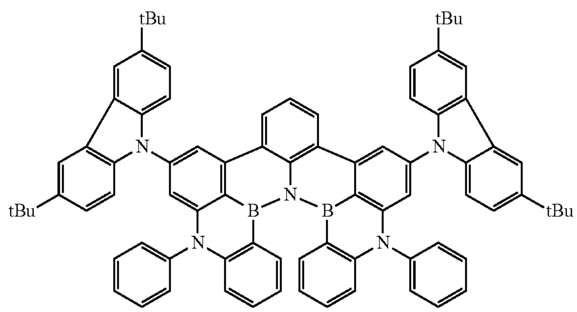

-continued
A-5
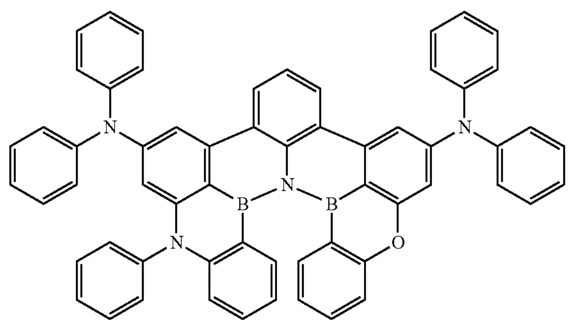
A-6
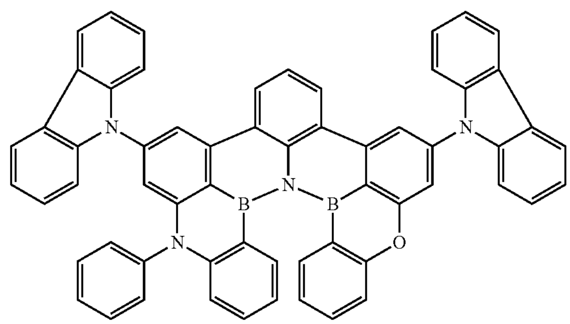
A-7
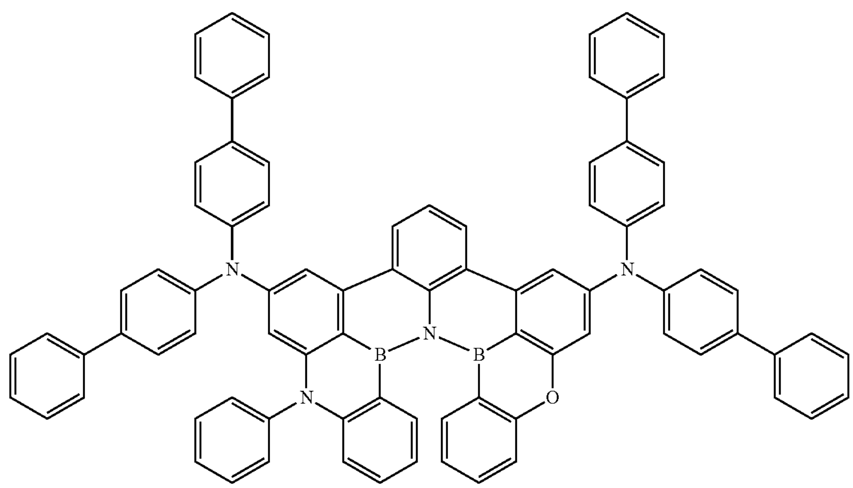
A-8
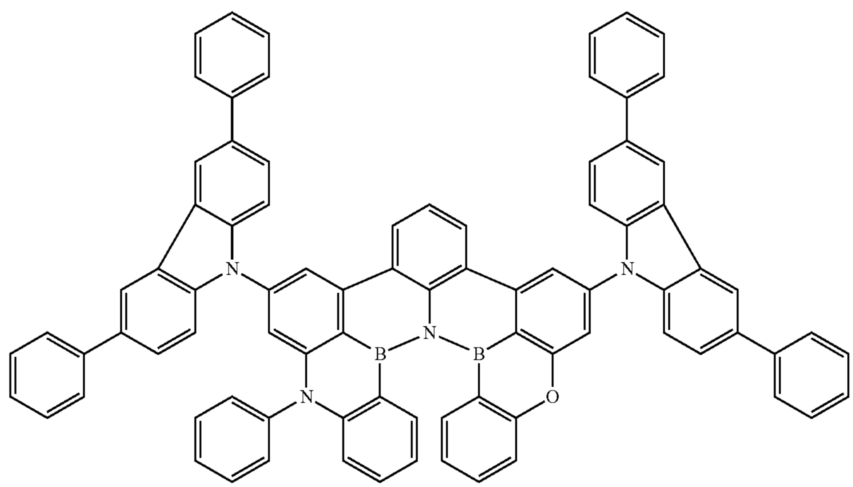

-continued
A-9
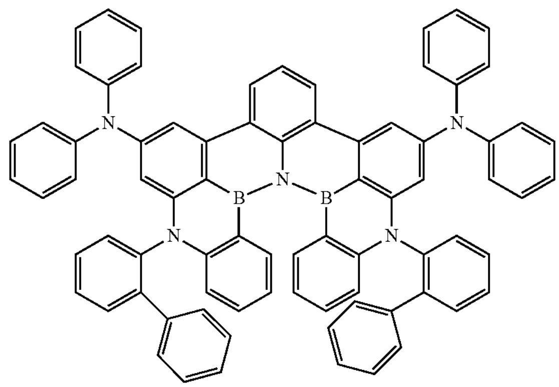
A-10
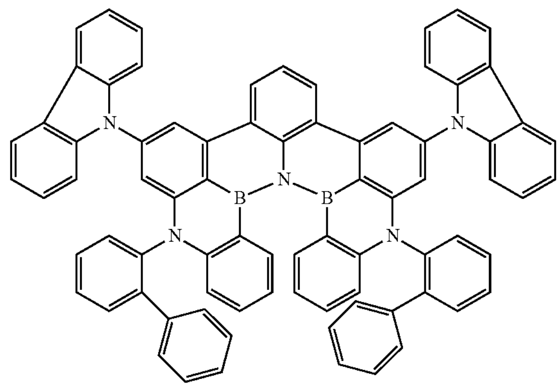
A-11
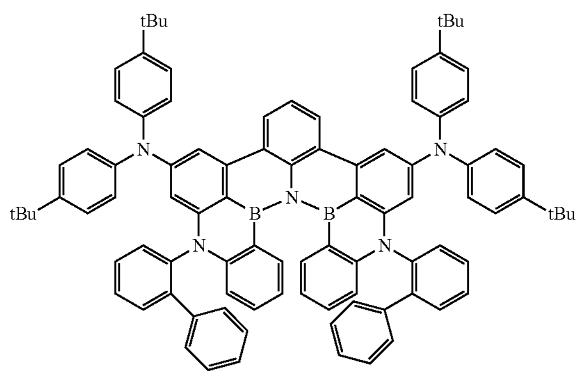
A-12
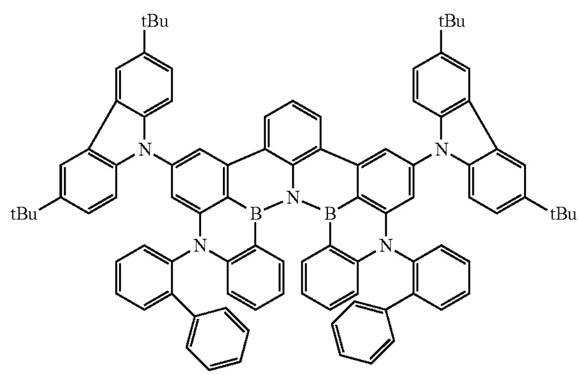
A-13
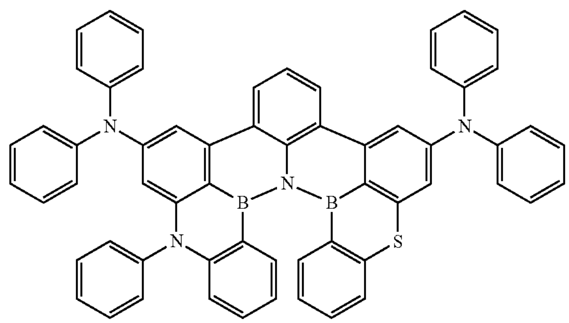
A-14
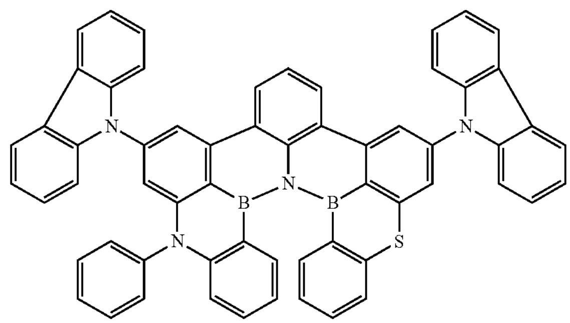
A-15
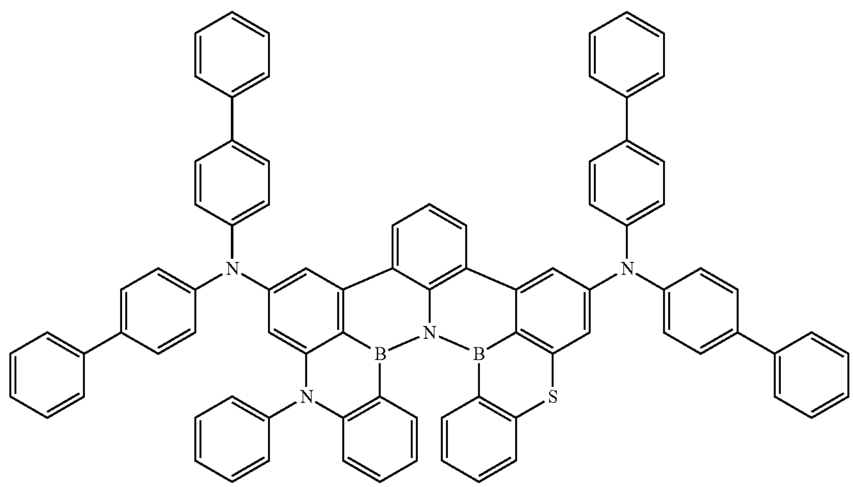

-continued
A-16
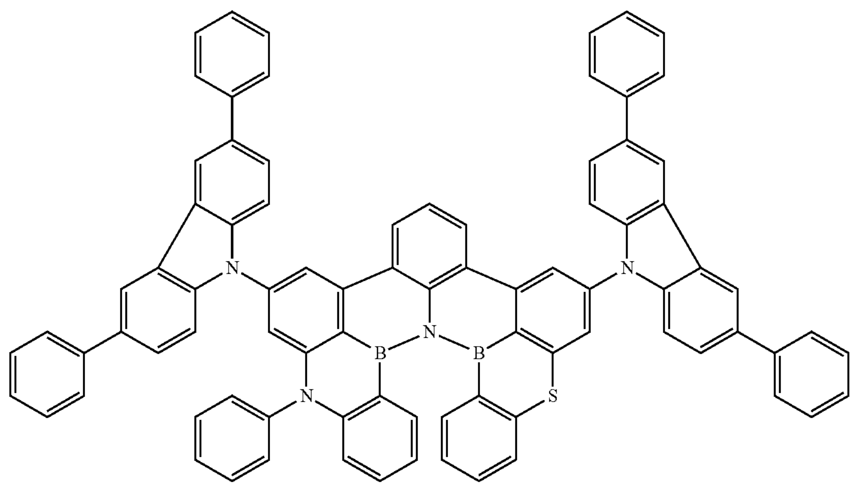
A-17
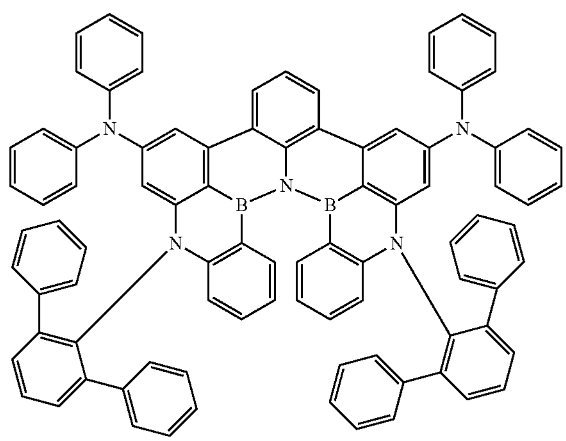
A-18
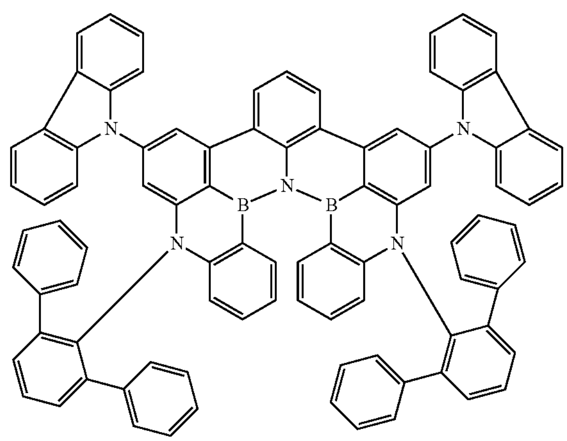
A-19
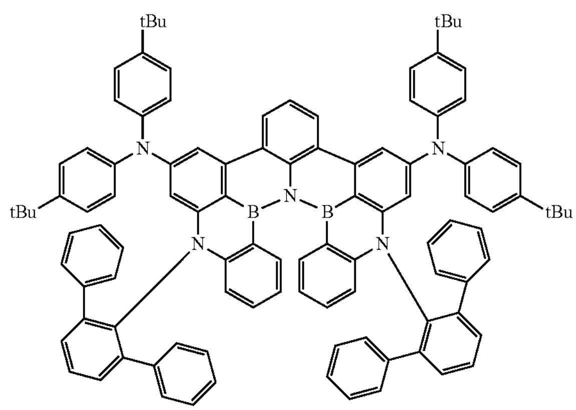
A-20
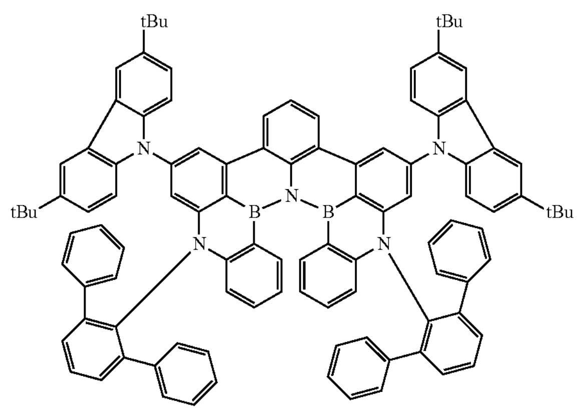

-continued
A-21
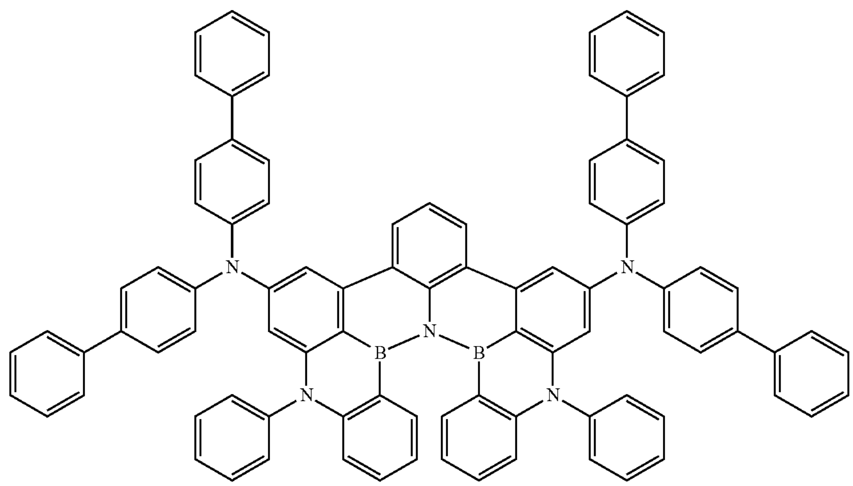
A-22
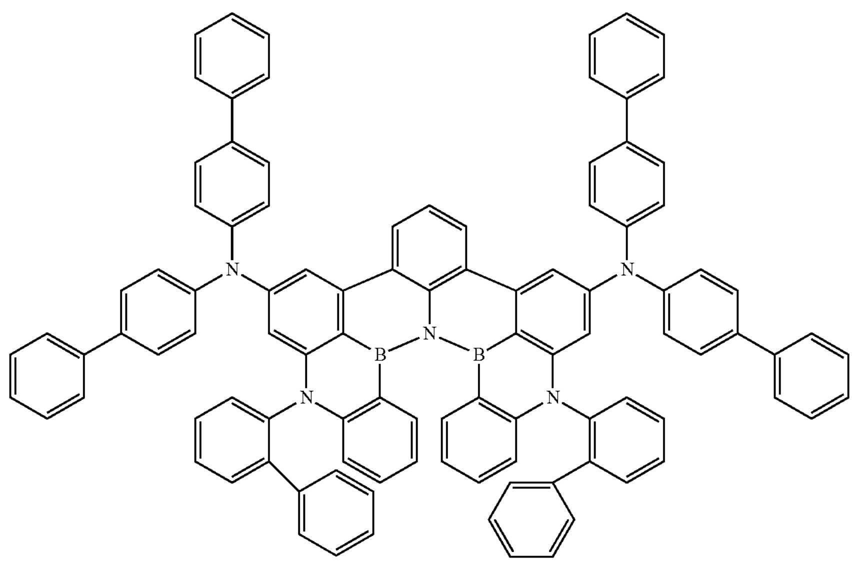
A-23
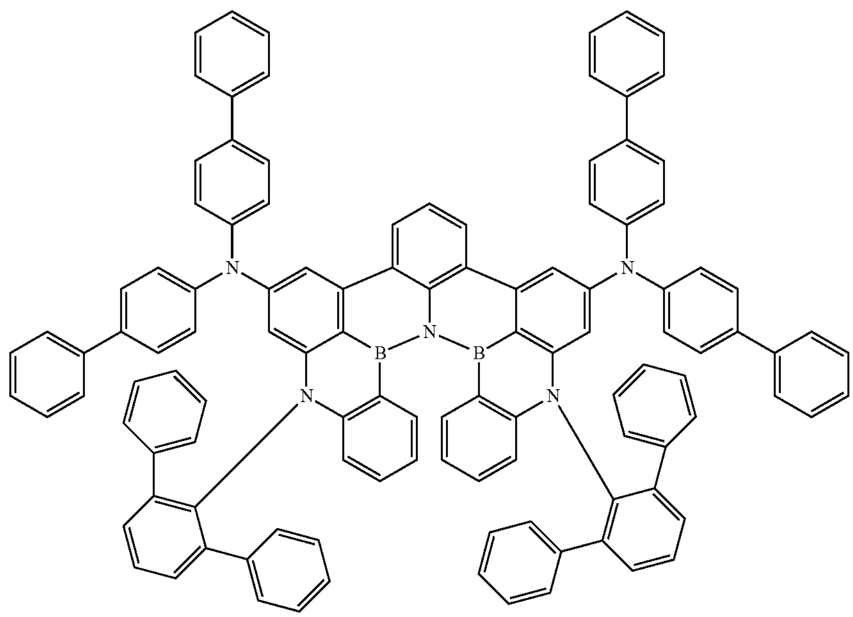

-continued
A-24
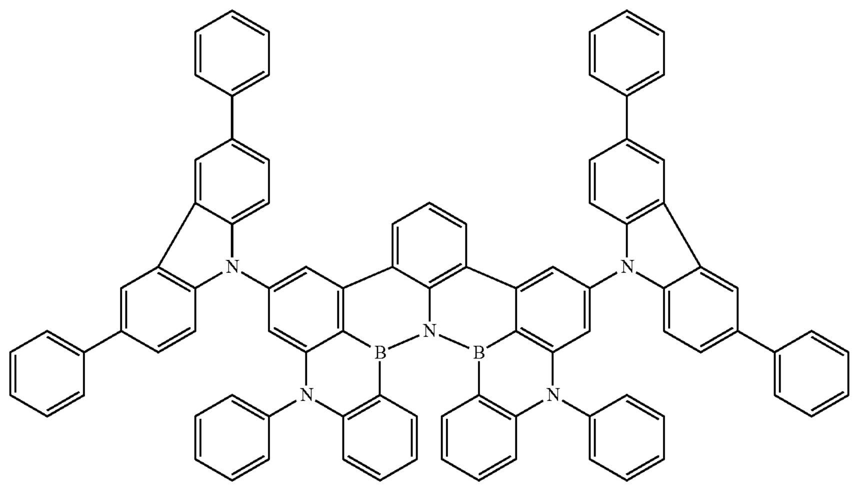
A-25
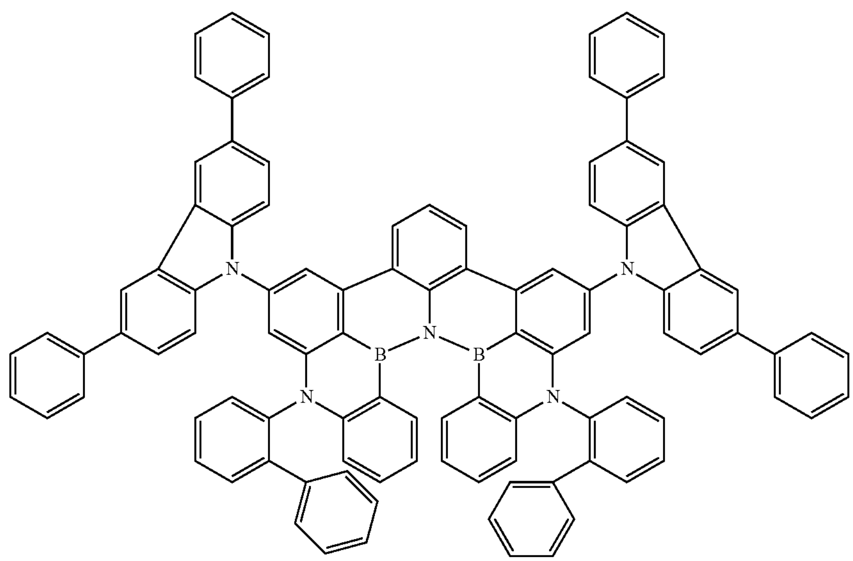
A-26
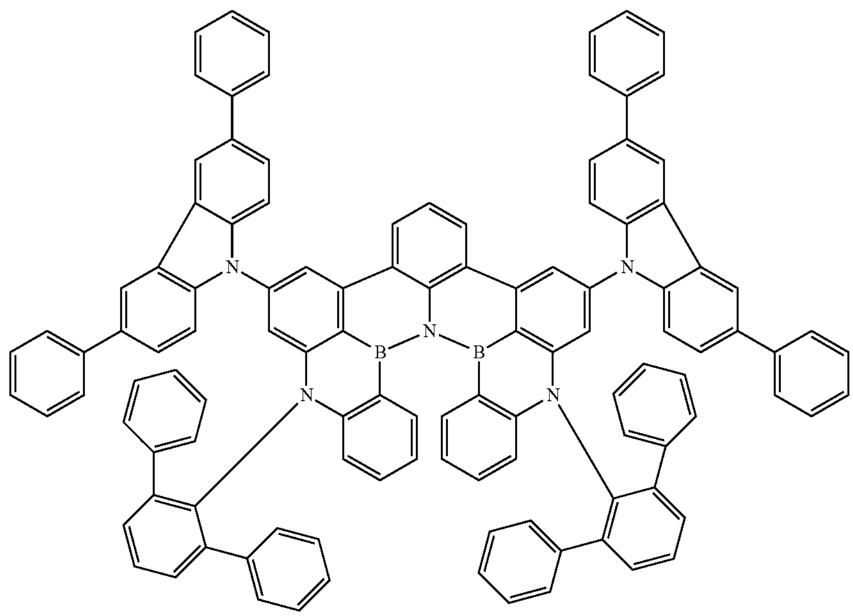

-continued
A-27
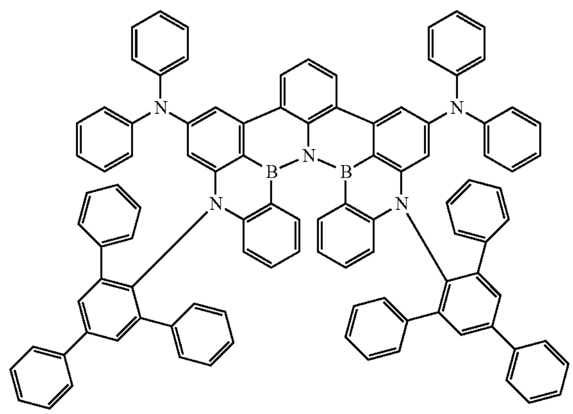
A-28
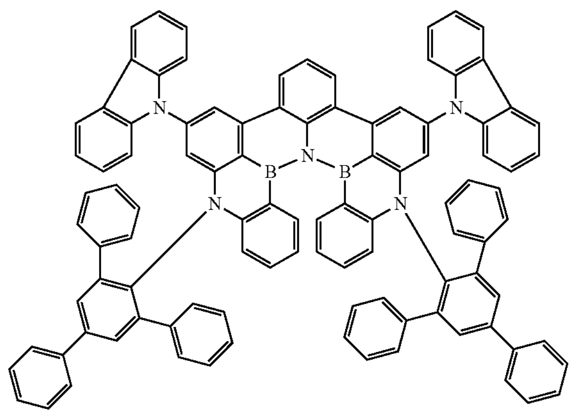
A-29
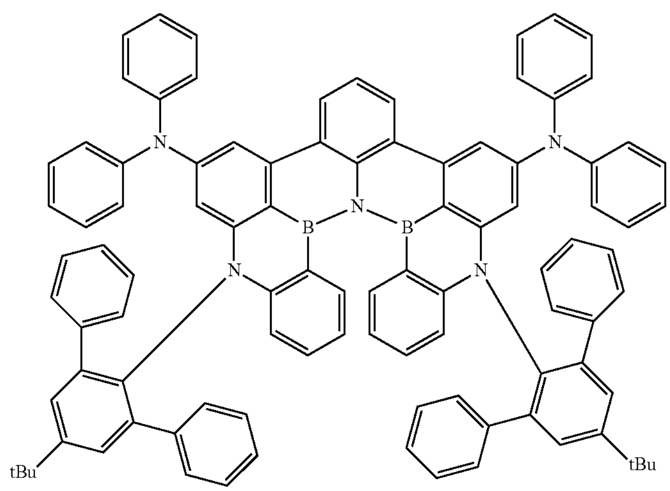
B-1
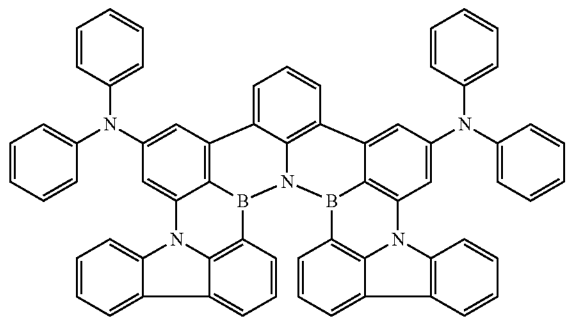
B-2
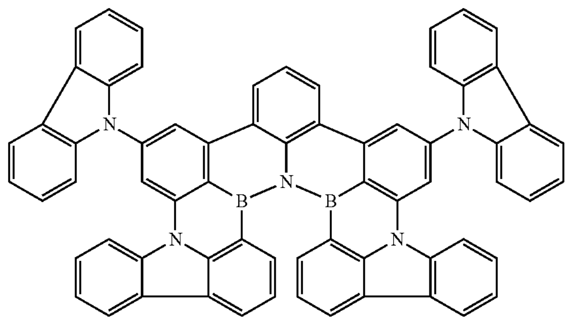

-continued
B-3
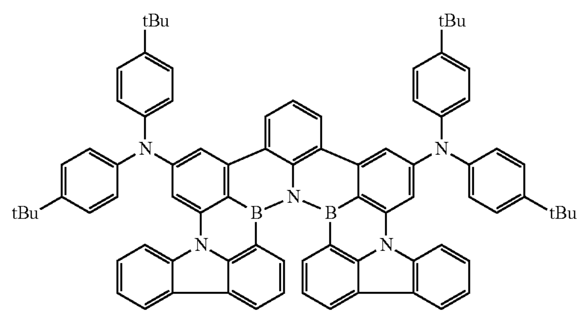
B-4
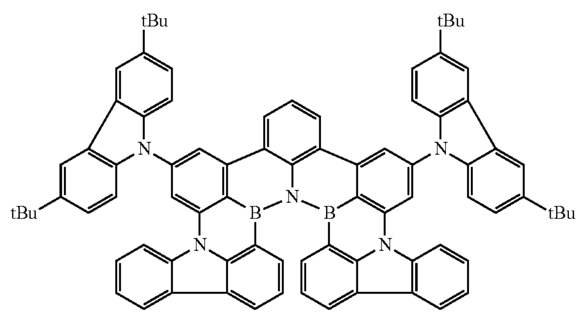
B-5
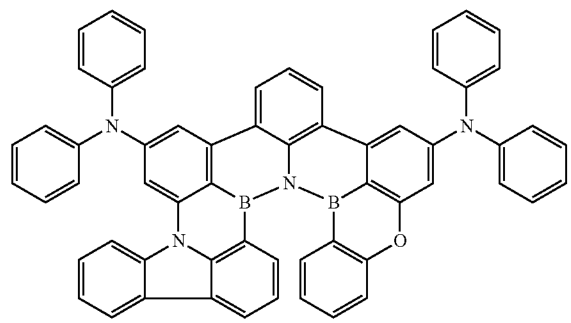
B-6
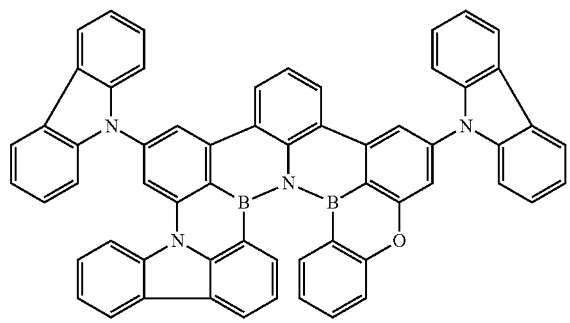
B-7
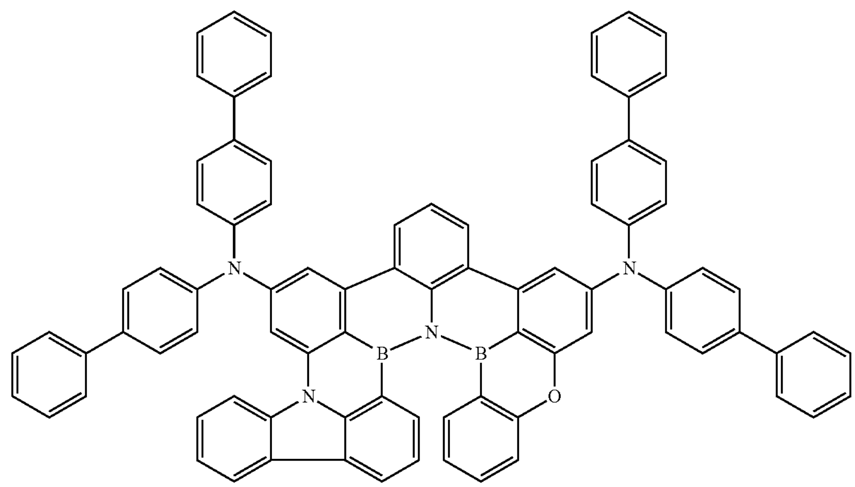
B-8
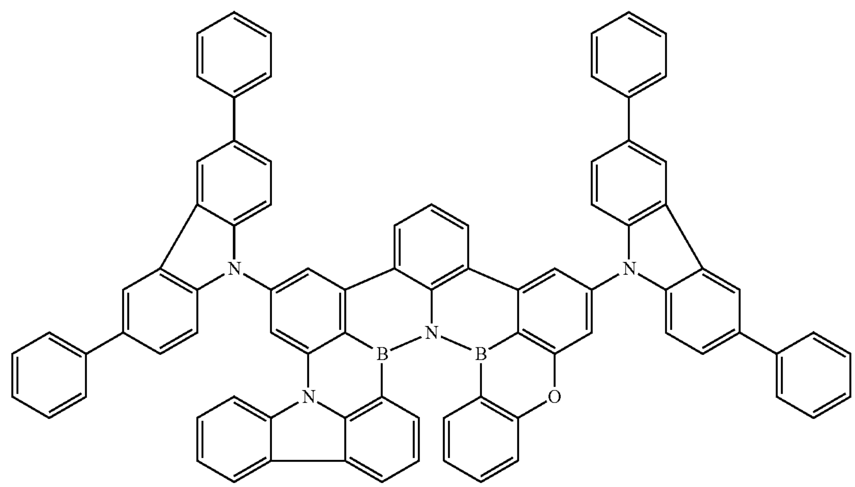

-continued
B-9
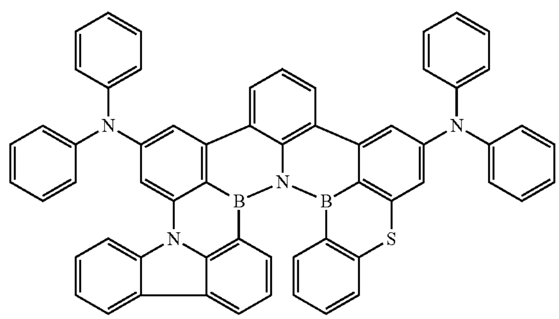
B-10
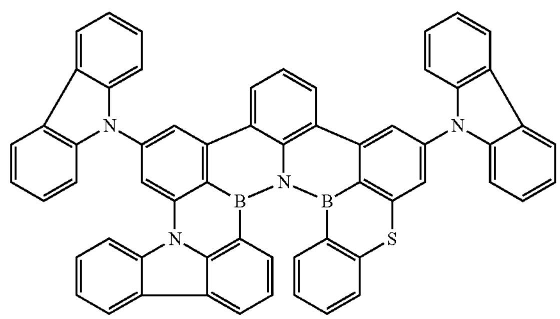
B-11
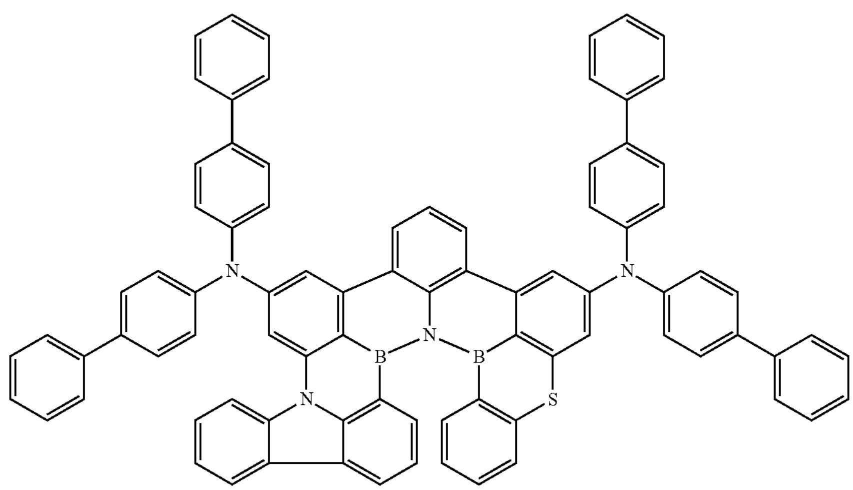
B-12
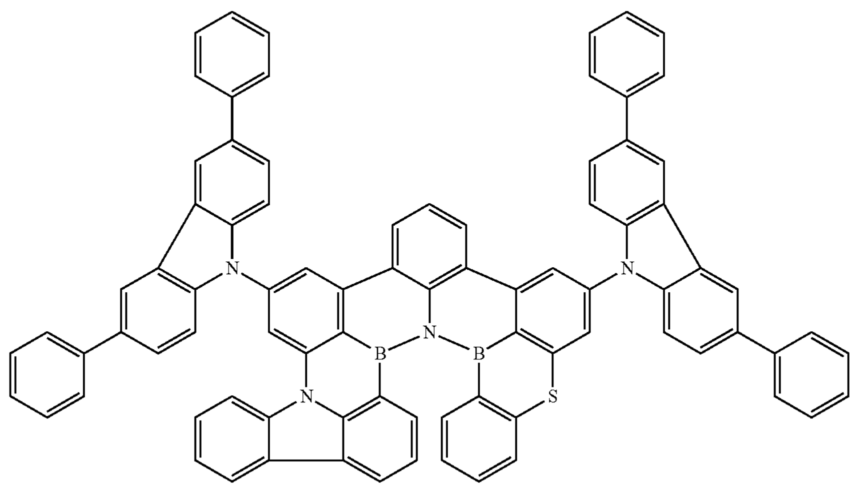

-continued
B-13
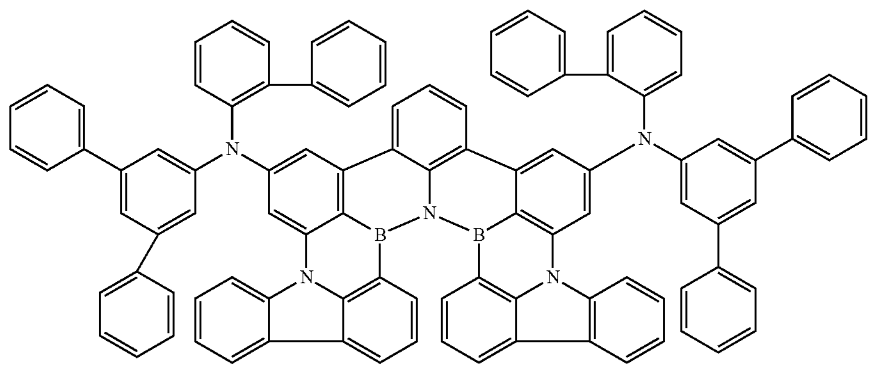
B-14
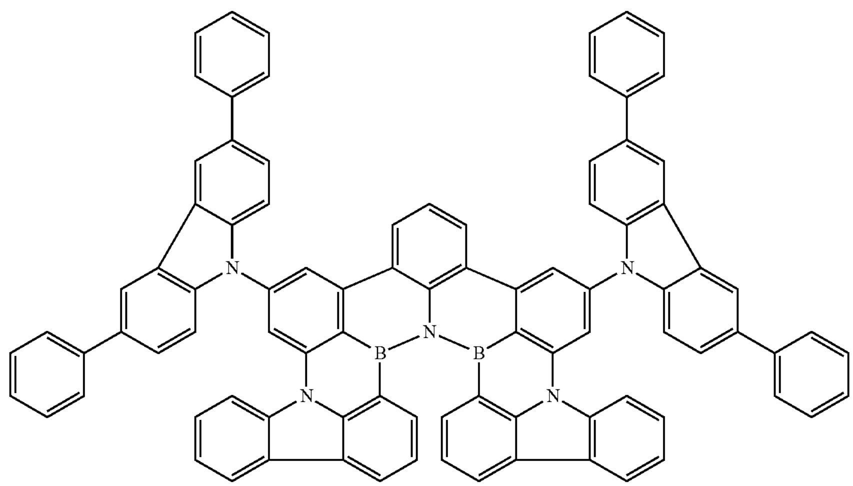
B-15
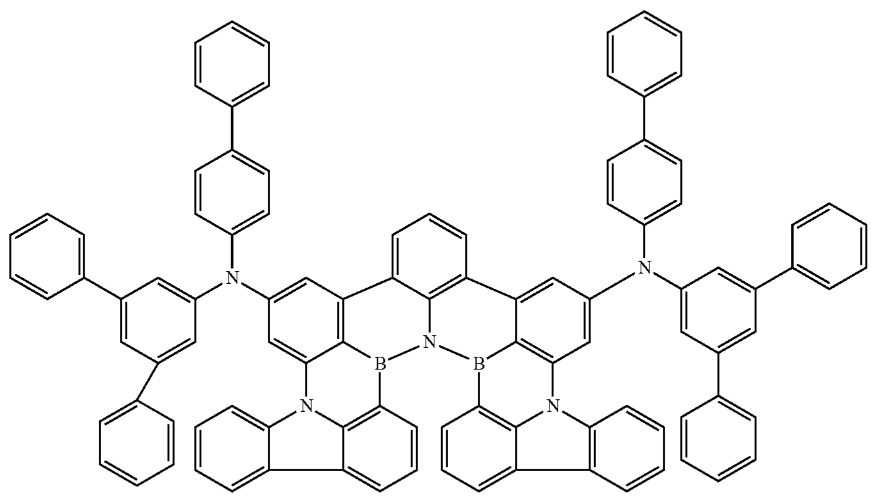

-continued
B-16
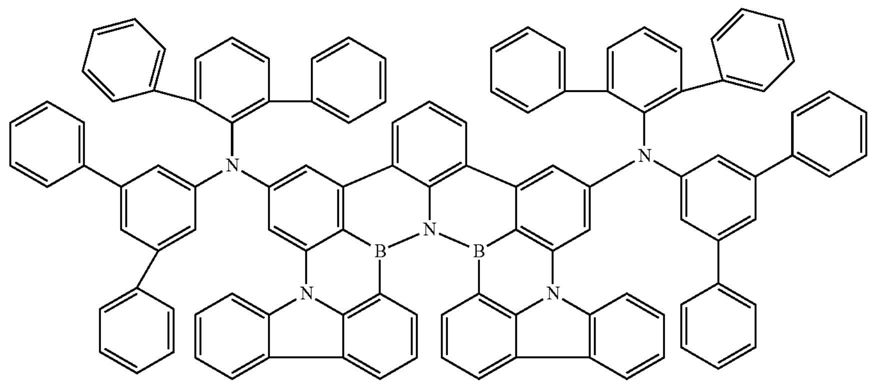
B-17
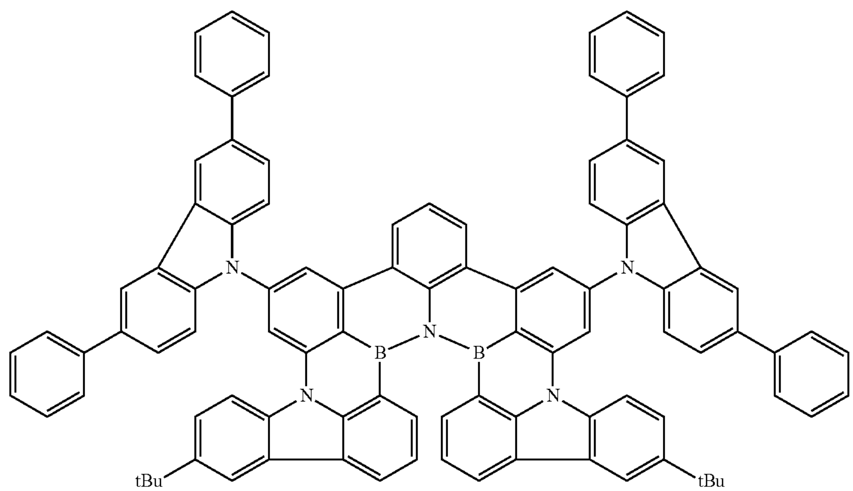
B-18
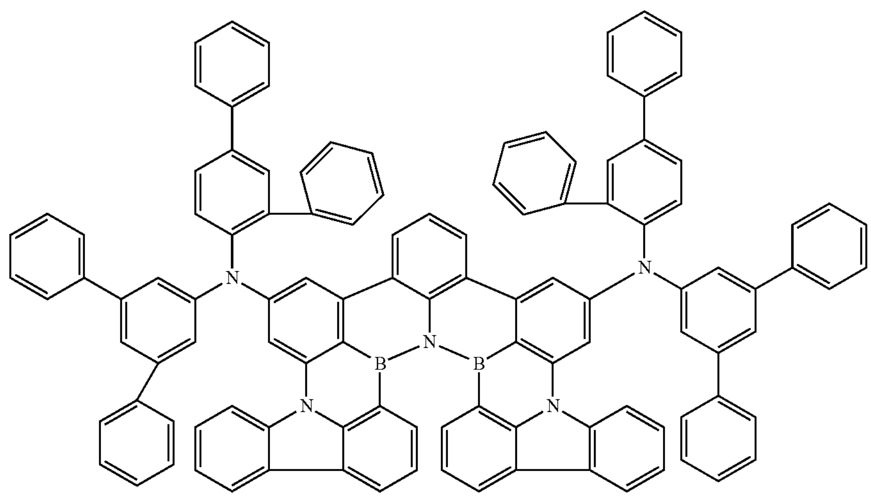

-continued
B-19
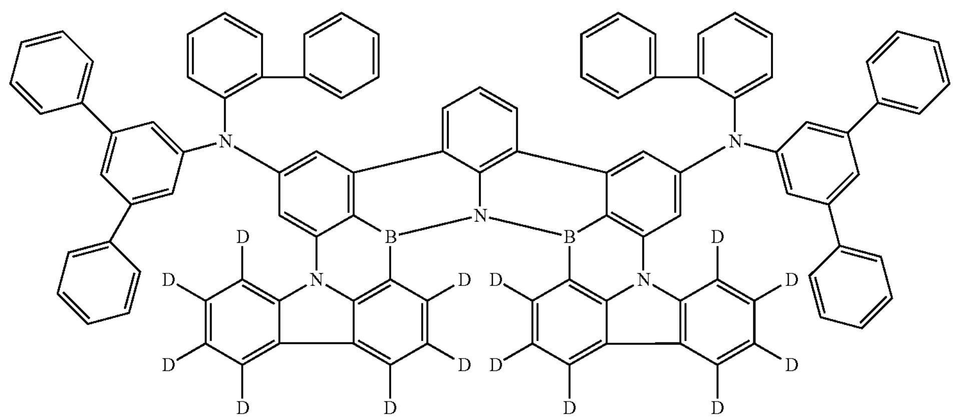
B-20
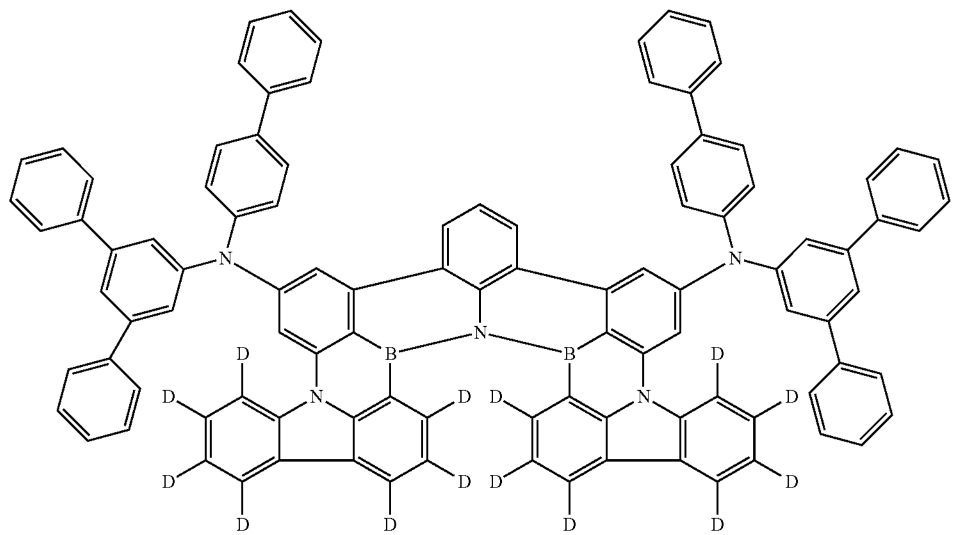
B-21
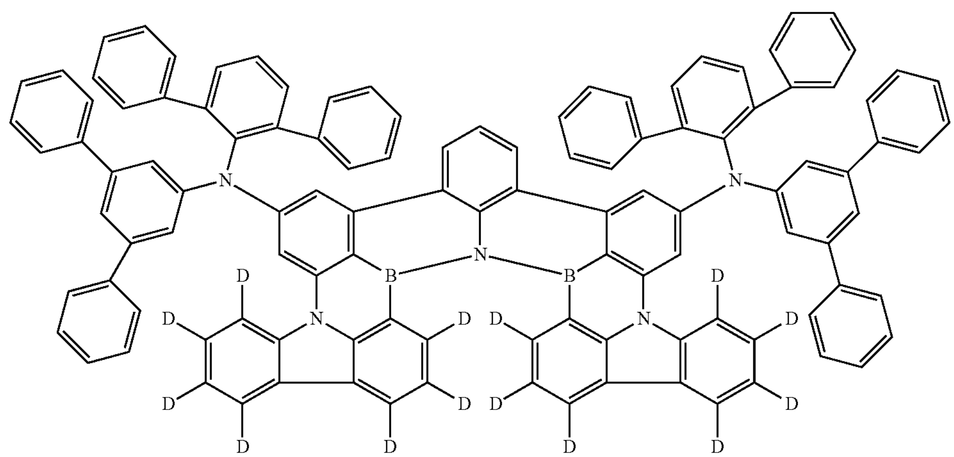

C-1
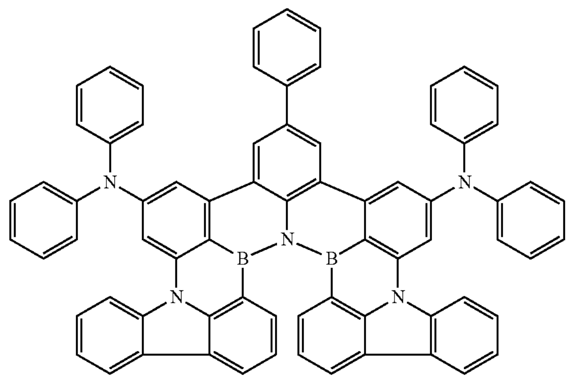
C-2
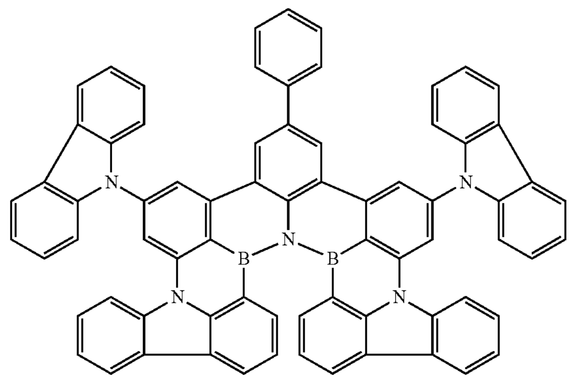
C-3
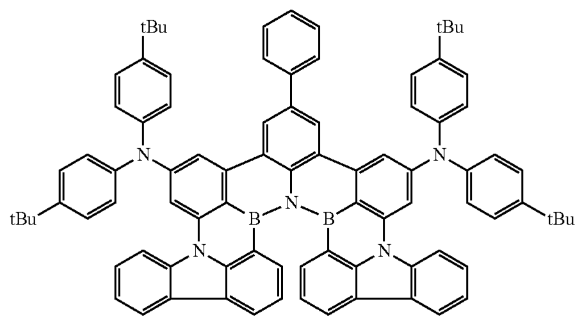
C-4
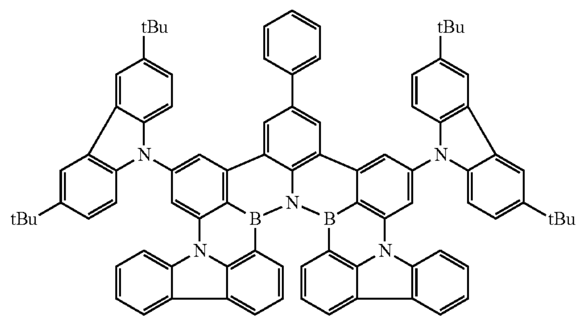
C-5
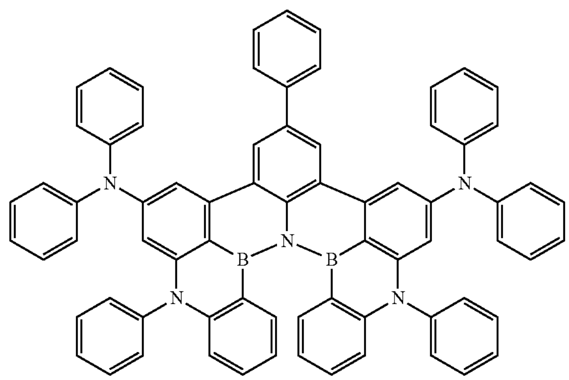
C-6
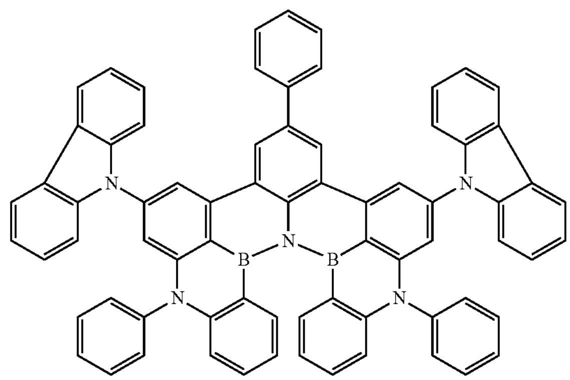
C-7
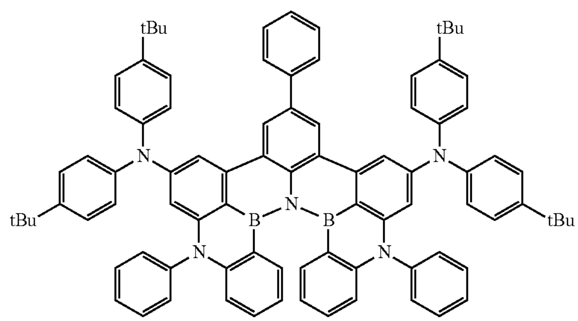
C-8
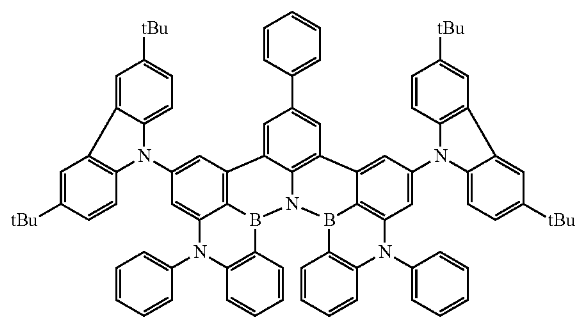

-continued
C-9
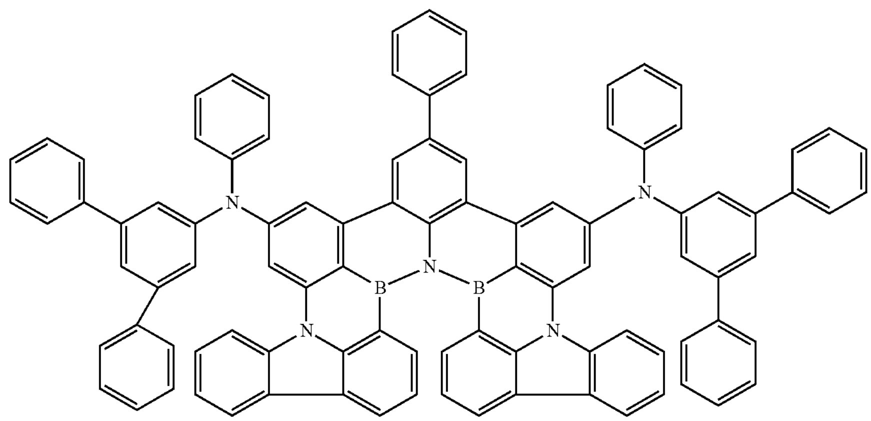
C-10
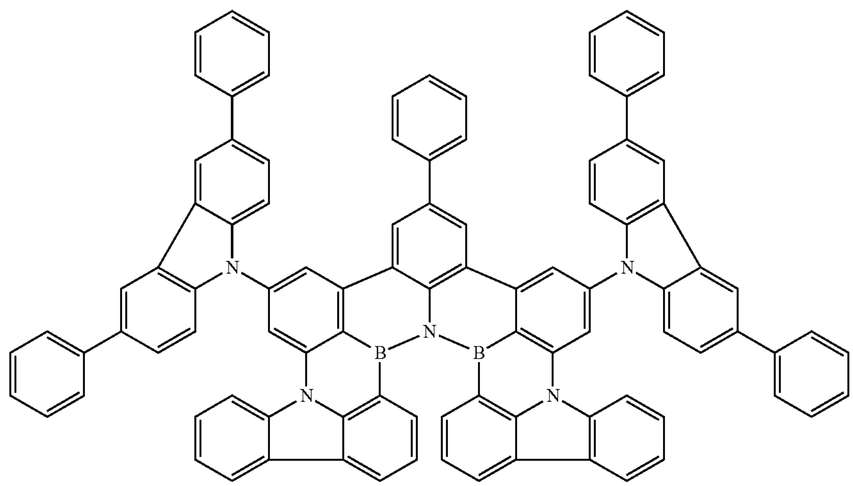
C-11
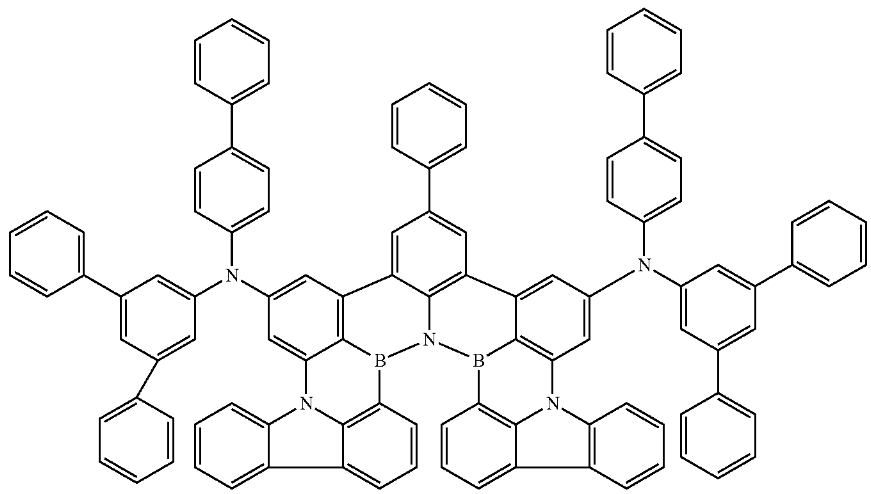

-continued
C-12
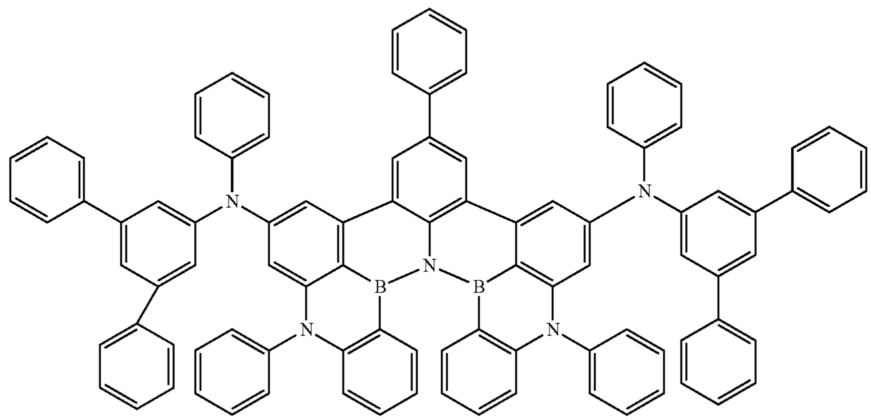
C-13
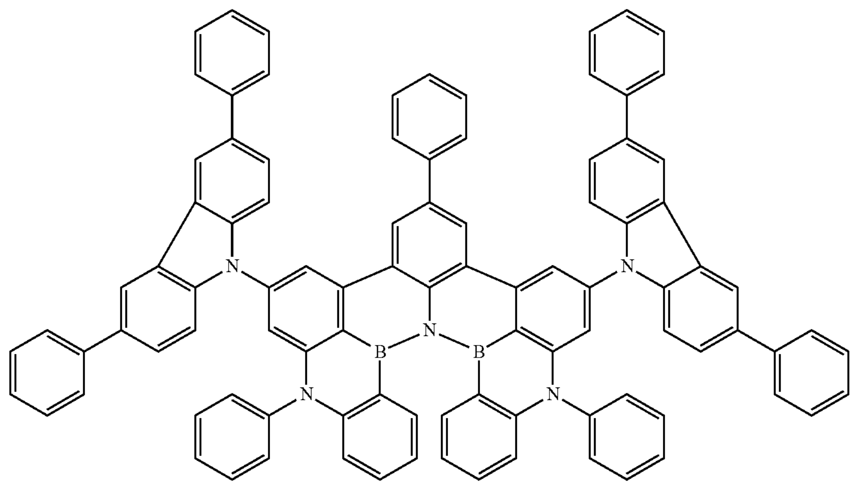
C-14
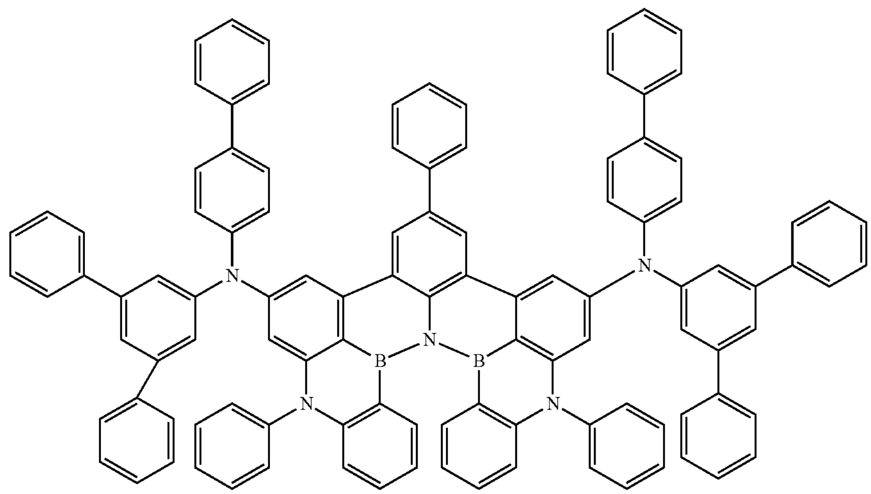

-continued
C-15
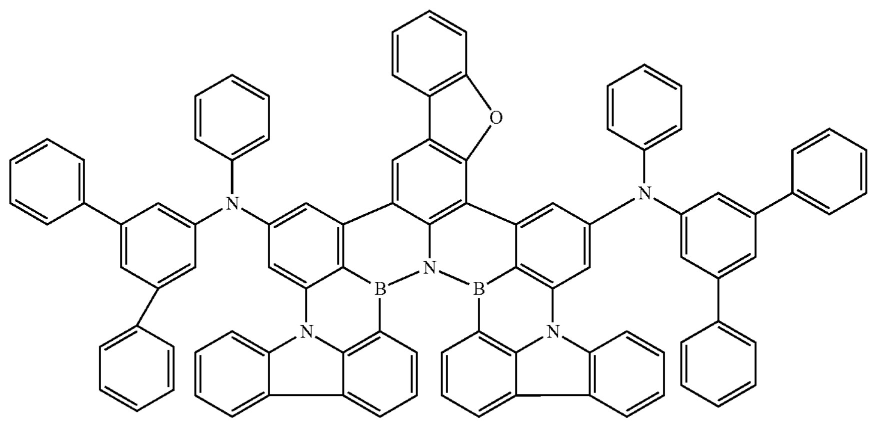
C-16
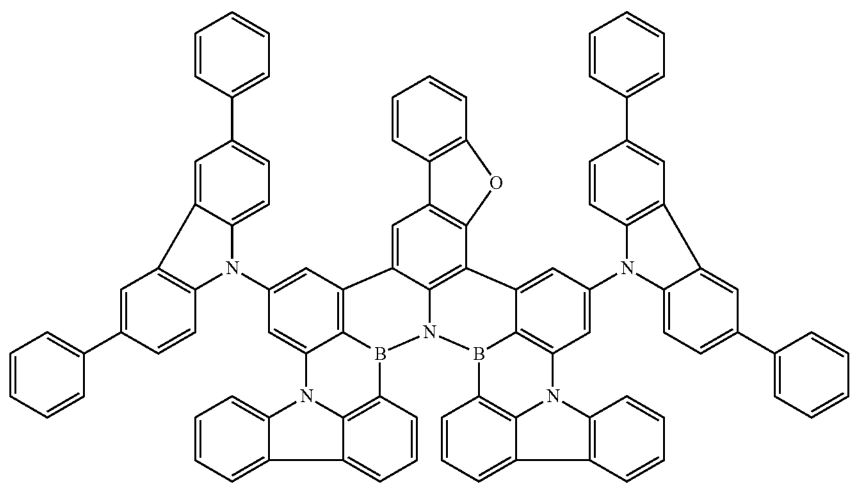
C-17
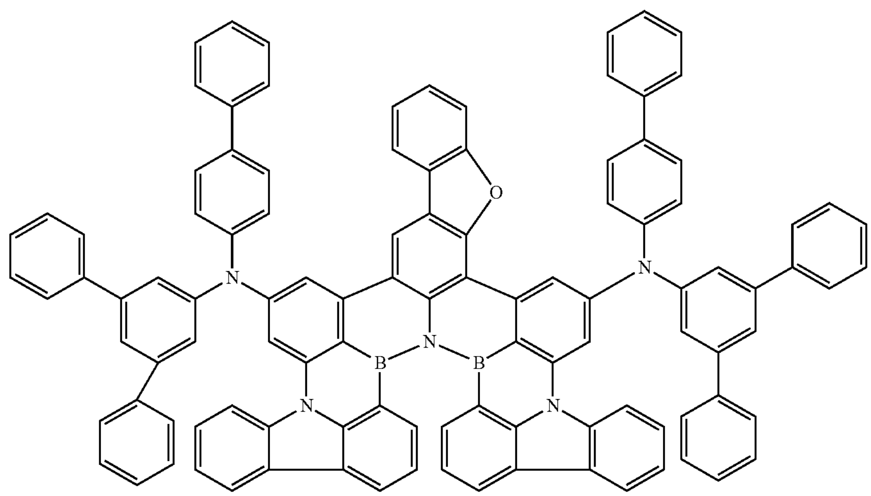

-continued
C-18
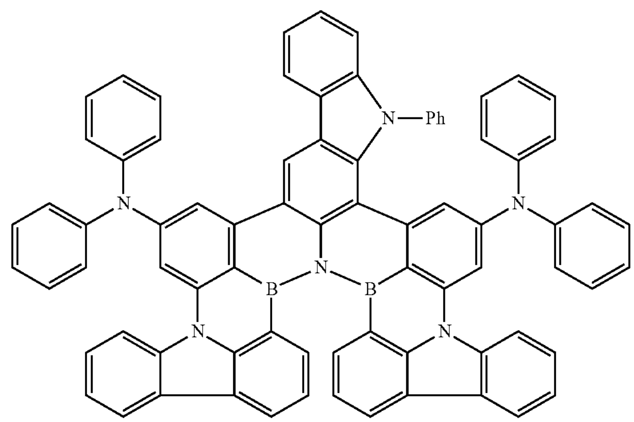
C-19
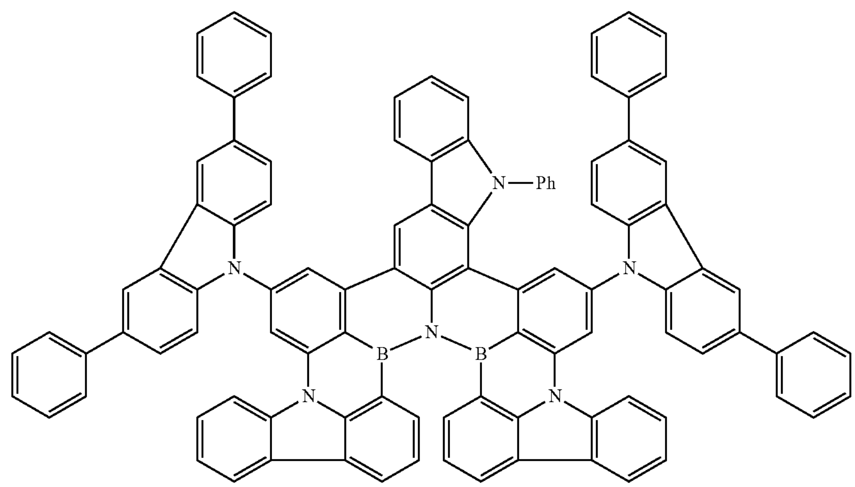
C-20
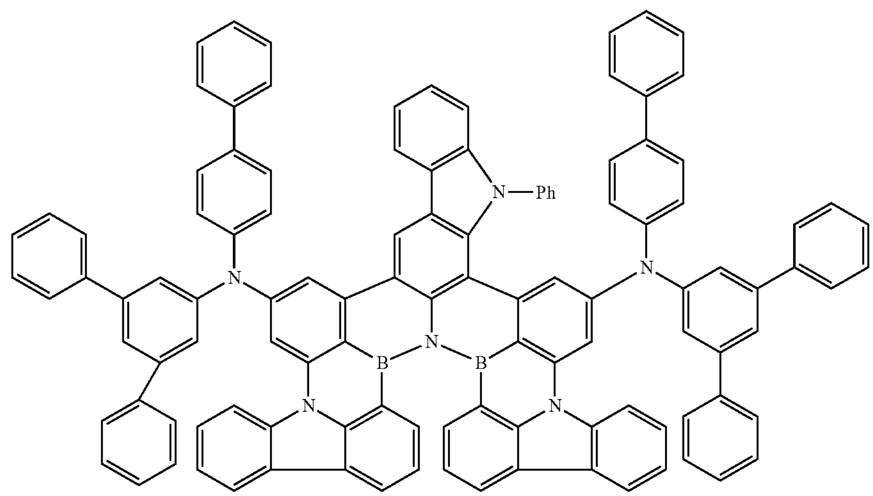

-continued

C-21

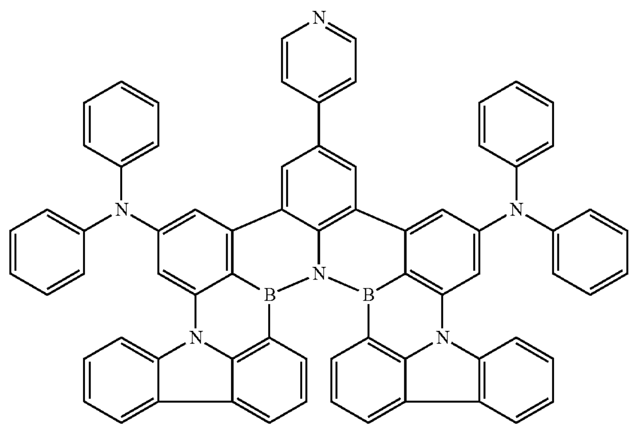

C-22

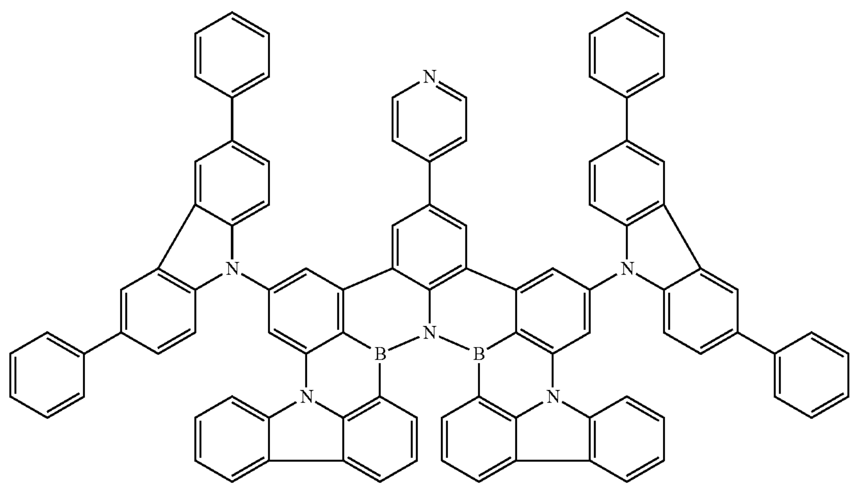

C-23

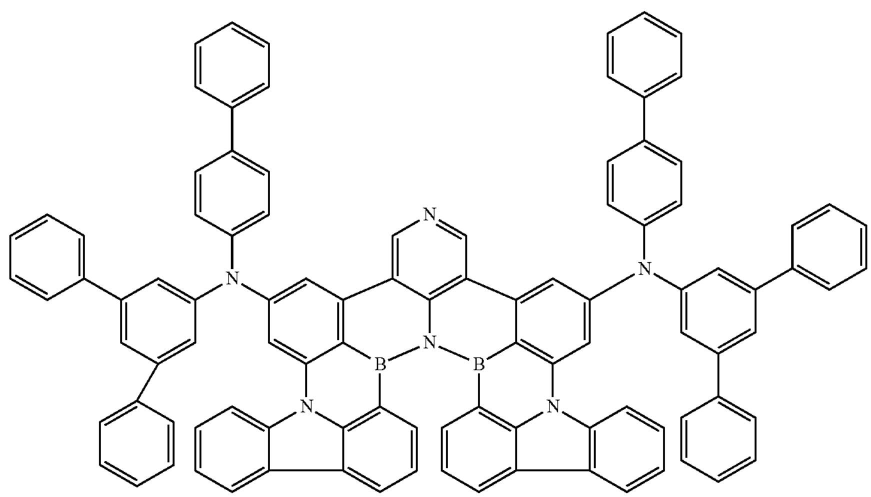

.

In the structure of the compounds of Compound Group 1, D represents a deuterium atom, and Ph represents a phenyl group.

The light emitting spectrum of the first compound of an embodiment, represented by Formula 1, may have a full width at half maximum of about 20-60 nm. Because the light emitting spectrum of the first compound of an embodiment, represented by Formula 1, has the full width at half maximum in the above range, when applied to an element (e.g., light emitting element), emission efficiency may be improved. In some embodiments, when the first compound is utilized as a material for a blue light emitting element, the element lifetime (e.g., lifespan) may be improved.

The first compound of an embodiment, represented by Formula 1, may be a material emitting thermally activated delayed fluorescence. In some embodiments, the first compound of an embodiment, represented by Formula 1, may be a thermally activated delayed fluorescence dopant having a difference ($\Delta E_{ST}$) between the lowest triplet excitation energy level (T1 level) and the lowest singlet excitation energy level (S1 level) of about 0.2 eV or less.

The first compound of an embodiment, represented by Formula 1, may be a light emitting material having a light emitting central wavelength in a wavelength region of about 440 nm to about 480 nm. For example, the first compound of an embodiment, represented by Formula 1, may be a blue thermally activated delayed fluorescence (TADF) dopant. However, an embodiment of the present disclosure is not limited thereto. In case of utilizing the first compound of an embodiment as a light emitting material, the first compound may be utilized as a dopant material emitting light in one or more suitable wavelength regions as a red light emitting dopant, a green light emitting dopant, etc.

In the light emitting element ED of an embodiment, an emission layer EML may be to emit delayed fluorescence. For example, the emission layer EML may be to emit thermally activated delayed fluorescence (TADF).

In some embodiments, the emission layer EML of the light emitting element ED may be to emit blue light. For example, the emission layer EML of the light emitting element ED of an embodiment may be to emit blue light having a central wavelength of about 440 nm to about 480 nm. However, an embodiment of the present disclosure is not limited thereto. The emission layer EML may be to emit blue light having a central wavelength of greater than about 480 nm, or emit green light or red light.

In the light emitting element ED of an embodiment, the emission layer EML may include a host for emitting delayed fluorescence and a dopant for emitting delayed fluorescence and may include the first compound as a dopant for emitting delayed fluorescence. The emission layer EML may include at least one from among the polycyclic compounds represented in Compound Group 1 as a thermally activated delayed fluorescence dopant.

As described above, in the light emitting element ED of an embodiment, the emission layer EML may include a host. The host may play the role of not emitting light but transferring energy to a dopant in the light emitting element ED. The emission layer EML may include one or more types (kinds) of hosts. For example, the emission layer EML may include two different types (kinds) of hosts. In the case where the emission layer EML includes two types (kinds) of hosts, the two types (kinds) of hosts may include a hole transport host and an electron transport host. However, an embodiment of the present disclosure is not limited thereto, and the emission layer EML may include one type or kind of a host or a mixture of two or more different types (kinds) of hosts.

In an embodiment, the emission layer EML may include two different hosts. The host may include a second compound and a third compound which is different from the second compound. The host may include a second compound having a hole transport moiety and a third compound having an electron transport moiety. In the light emitting element ED of an embodiment, the second compound and the third compound of the host may form an exciplex.

In an embodiment, the emission layer EML may include a second compound represented by Formula HT. For example, the second compound may also be utilized as a hole transport host material.

[Formula HT]

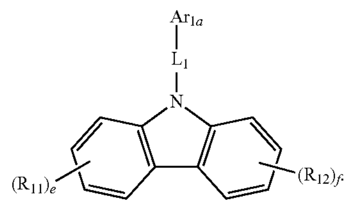

In Formula HT, $L_1$ may be a direct linkage, a substituted or unsubstituted arylene group of 6 to 30 ring-forming carbon atoms, or a substituted or unsubstituted heteroarylene group of 2 to 30 ring-forming carbon atoms. $Ar_{1a}$ may be a substituted or unsubstituted aryl group of 6 to 30 ring-forming carbon atoms, or a substituted or unsubstituted heteroaryl group of 2 to 30 ring-forming carbon atoms.

In Formula HT, $R_{11}$ and $R_{12}$ may each independently be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. For example, $R_{11}$ and $R_{12}$ may each independently be a hydrogen atom or a deuterium atom.

In Formula HT, "e" and "f" may each independently be an integer of 0 to 4. In some embodiments, when each of "e" and "f" is an integer of 2 or more, multiple $R_{11}$ may be the same, or at least one thereof may be different from a remainder thereof, and multiple $R_{12}$ may be the same, or at least one thereof may be different from a remainder thereof. For example, in Formula HT, "e" and "f" may both be 0. In this case, the carbazole group of Formula HT is unsubstituted.

In Formula HT, $L_1$ may be a direct linkage, a phenylene group, a divalent biphenyl group, a divalent carbazole group, and/or the like, but an embodiment of the present disclosure is not limited thereto. In some embodiments, $Ar_{1a}$ may be a substituted or unsubstituted carbazole group, a substituted or unsubstituted dibenzofuran group, a substituted or unsubstituted dibenzothiophene group, a substituted or unsubstituted biphenyl group, and/or the like, but an embodiment of the present disclosure is not limited thereto.

In the light emitting element ED of an embodiment, the emission layer EML may include a compound represented by Formula ET as the third compound.

[Formula ET]

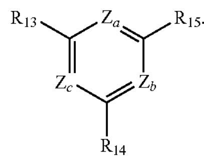

In Formula ET, at least one from among $Z_a$ to $Z_c$ may be N. Any remainder from among $Z_a$ to $Z_c$ may be $CR_{16}$. For example, the third compound represented by Formula ET may include a pyridine moiety, a pyrimidine moiety, or a triazine moiety.

In Formula ET, $R_{13}$ to $R_{15}$ may each independently be a hydrogen atom, a deuterium atom, a cyano group, a substituted or unsubstituted silyl group, a substituted or unsubstituted aryl group of 6 to 30 ring-forming carbon atoms, or a substituted or unsubstituted heteroaryl group of 2 to 30 ring-forming carbon atoms.

In Formula ET, $R_{13}$ to $R_{15}$ may each independently be a substituted or unsubstituted phenyl group, a substituted or unsubstituted carbazole group, and/or the like, but an embodiment of the present disclosure is not limited thereto.

When the emission layer EML of the light emitting element ED of an embodiment includes the second compound represented by Formula HT and the third compound represented by Formula ET concurrently (e.g., simultaneously), excellent or suitable long-lifetime characteristics may be obtained. For example, in the emission layer EML of the light emitting element ED of an embodiment, the host may include an exciplex formed by the second compound represented by Formula HT and the third compound represented by Formula ET.

Among two host materials included in the emission layer EML concurrently (e.g., simultaneously), the second compound may be a hole transport host, and the third compound may be an electron transport host. The light emitting element ED of an embodiment includes both (e.g., simultaneously) the second compound having excellent or suitable hole transport properties and the third compound having excellent or suitable electron transport properties, and efficient energy transfer (e.g., improved energy transfer) to dopant compounds which will be explained in more detail later, may be possible (e.g., may be realized).

The light emitting element ED of an embodiment may further include a fourth compound in addition to the first compound represented by Formula 1. The emission layer EML may include an organometallic complex including platinum (Pt) as a central metal element and ligands bonded to the central metal element, as the fourth compound. In the light emitting element ED of an embodiment, the emission layer EML may include a compound represented by Formula D-1 as the fourth compound.

[Formula D-1]

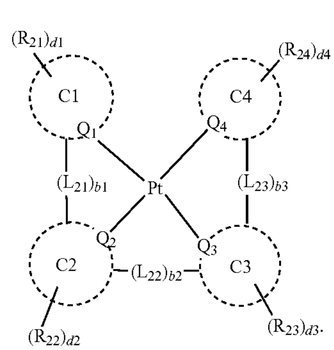

In Formula D-1, $Q_1$ to $Q_4$ may each independently be C or N.

In Formula D-1, C1 to C4 may each independently be a substituted or unsubstituted hydrocarbon ring of 5 to 30 ring-forming carbon atoms, or a substituted or unsubstituted heterocycle of 2 to 30 ring-forming carbon atoms.

In Formula D-1, $L_{21}$ to $L_{23}$ may each independently be a direct linkage,

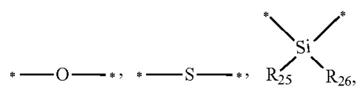

-continued

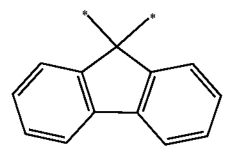

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms. In $L_{21}$ to $L_{23}$, "-*" may refer to a part connected with C1 to C4.

In Formula D-1, b1 to b3 may each independently be 0 or 1. When b1 is 0, C1 and C2 may not be connected with each other. When b2 is 0, C2 and C3 may not be connected with each other. When b3 is 0, C3 and C4 may not be connected with each other.

In Formula D-1, $R_{21}$ to $R_{26}$ may each independently be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 1 to 30 ring-forming carbon atoms, and/or combined with an adjacent group to form a ring. For example, $R_{21}$ to $R_{26}$ may each independently be a methyl group or a t-butyl group.

In Formula D-1, d1 to d4 may each independently be an integer of 0 to 4. In some embodiments, when each of d1 to d4 is an integer of 2 or more, respective multiple $R_{21}$ to $R_{24}$ may all be the same, or at least one thereof may be different.

In Formula D-1, C1 to C4 may each independently be a substituted or unsubstituted hydrocarbon ring or a substituted or unsubstituted heterocycle, represented by any one from among Formulae C-1 to C-3.

C-1

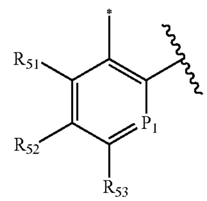

C-2

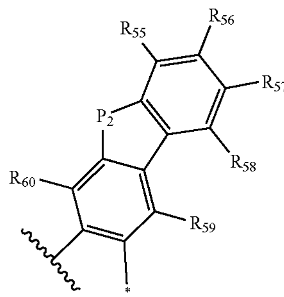

C-3

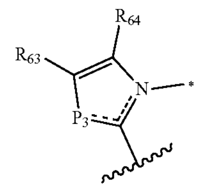

In Formulae C-1 to C-3, $P_1$ may be "C—*" or $CR_{54}$, $P_2$ may be "N—*" or $NR_{61}$, and $P_3$ may be "N—*" or $NR_{62}$. $R_{51}$ to $R_{64}$ may each independently be a substituted or unsubstituted alkyl group of 1 to 20 carbon atoms, a substituted or unsubstituted aryl group of 6 to 30 ring-forming carbon atoms, or a substituted or unsubstituted heteroaryl group of 6 to 30 ring-forming carbon atoms, and/or combined with an adjacent group to form a ring.

In some embodiments, in Formulae C-1 to C-3, " " is a part connected with the Pt central metal element, and "-*" is a part connected with a neighboring ring group (C1 to C4) or a linker ($L_{21}$ to $L_{24}$).

The fourth compound represented by Formula D-1 may be a phosphorescence dopant.

In an embodiment, the first compound may be a light emitting dopant to emit blue light, and the emission layer EML may be to emit fluorescence. In some embodiments, for example, the emission layer EML may be to emit blue light of delayed fluorescence.

In an embodiment, the fourth compound included in the emission layer EML may be a sensitizer. In the light emitting element ED of an embodiment, the fourth compound included in the emission layer EML may play the role of a sensitizer and transferring energy from the host to the first compound, which is a light emitting dopant. For example, the fourth compound, which plays the role of an auxiliary dopant, may accelerate energy transfer to the first compound, which is a light emitting dopant, to increase the light emitting ratio of the first compound. Accordingly, the emission efficiency of the emission layer EML of an embodiment may be improved. In some embodiments, when the energy transfer to the first compound increases, excitons formed in the emission layer EML may not be accumulated in the emission layer EML but may emit light rapidly, thereby reducing the deterioration of a light emitting element. Accordingly, the lifetime of the light emitting element ED of an embodiment may increase.

In an embodiment, the weight ratio between the second compound and the third compound in the light emitting element ED may be about 4:6 to about 7:3, or about 5:5 to about 7:3. For example, the weight ratio between the second compound and the third compound may be about 4:6, about 5:5, about 6:4, or about 7:3. However, an embodiment of the present disclosure is not limited thereto. When the amounts of the second compound and third compound satisfy the above-described ratios, charge balance properties in the emission layer EML may be improved, and the emission efficiency and element lifetime may increase. When the amounts of the second compound and third compound deviate from the above-described ratio ranges, charge balance in the emission layer EML may be broken, emission efficiency may be degraded, and the element may be easily deteriorated.

The light emitting element ED of an embodiment includes all of the first compound, the second compound, the third compound, and the fourth compound, and the emission layer EML may include a combination of two host materials and two dopant materials. In the light emitting element ED of an embodiment, the emission layer EML may include two different hosts, a first compound to emit delayed fluorescence, and a fourth compound including an organometallic complex, concurrently (e.g., simultaneously), and excellent or suitable emission efficiency properties may be shown (e.g., obtained).

In an embodiment, the second compound represented by Formula HT may be any one of the compounds represented in Compound Group 2. The emission layer EML may include at least one from among the compounds represented in Compound Group 2 as a hole transport host material.

[Compound Group 2]

HT-1

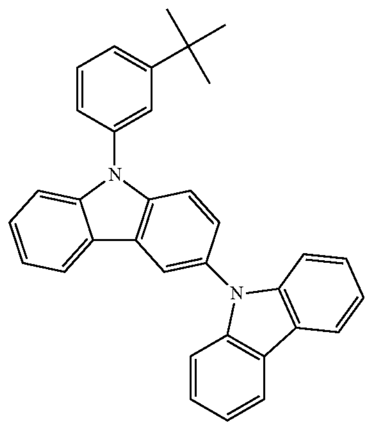

HT-2

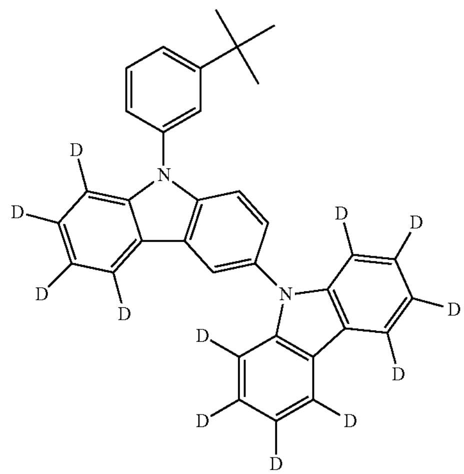

HT-3

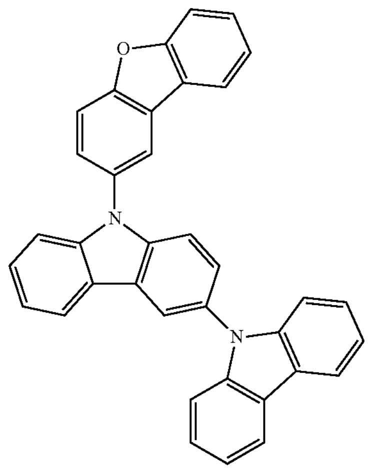

-continued
HT-4
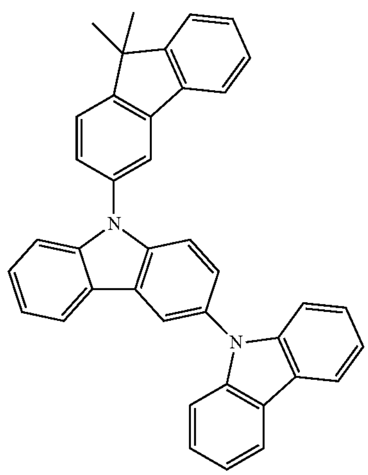
HT-5
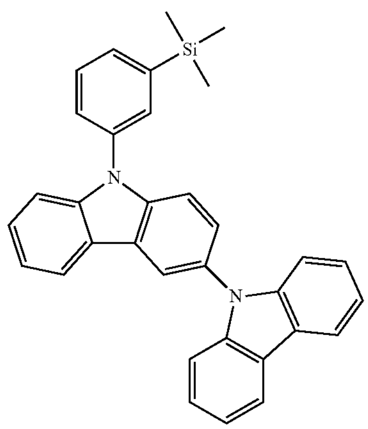
HT-6
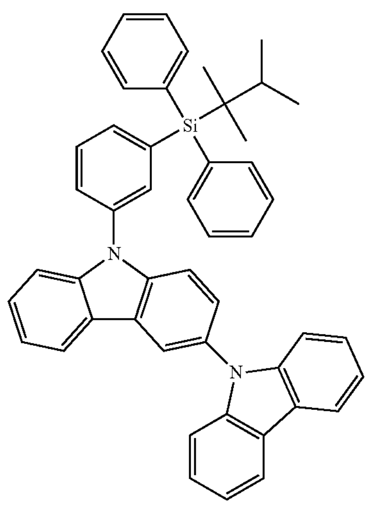
-continued
HT-7
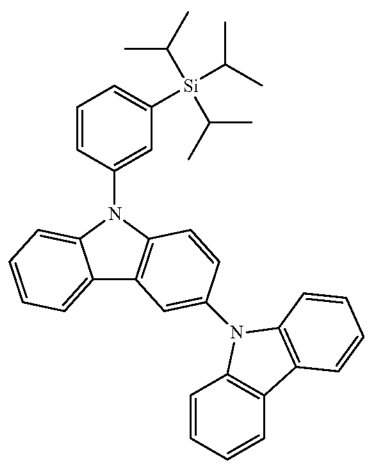
HT-8
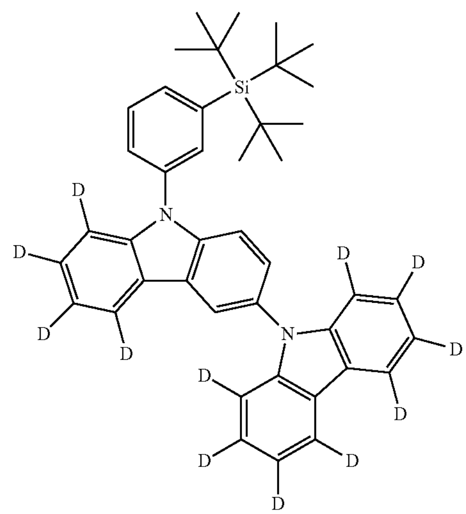
HT-9
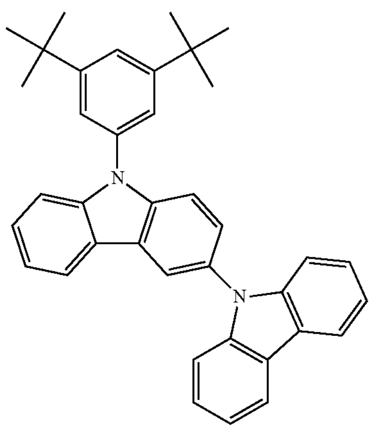

-continued
HT-10
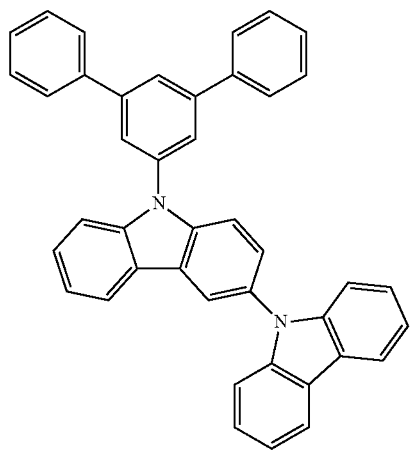
HT-11
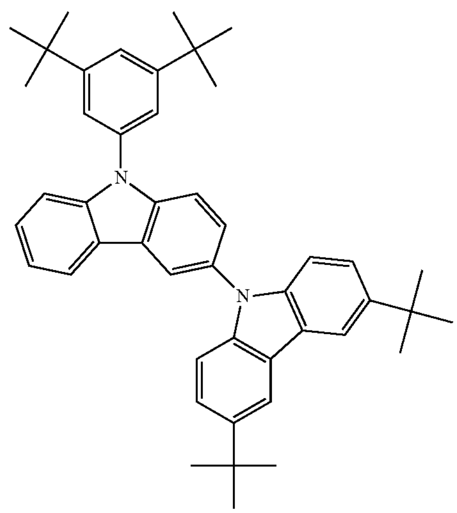
HT-12
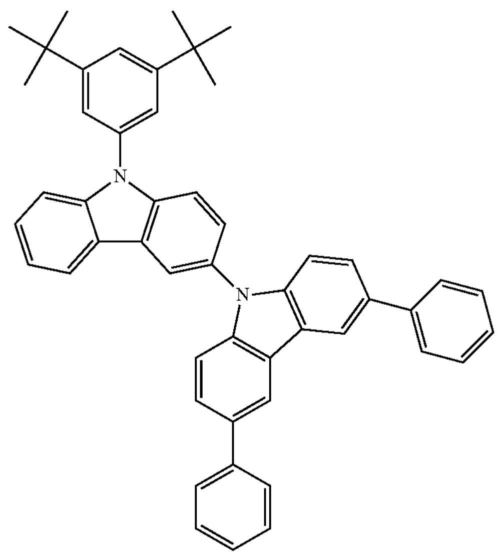
-continued
HT-13
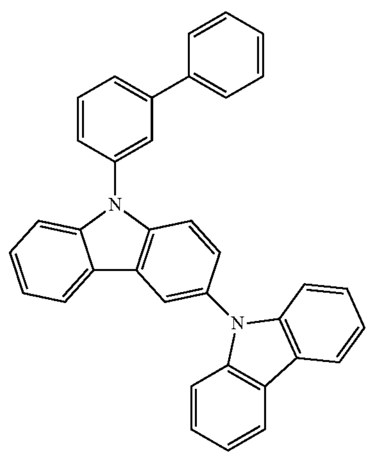
HT-14
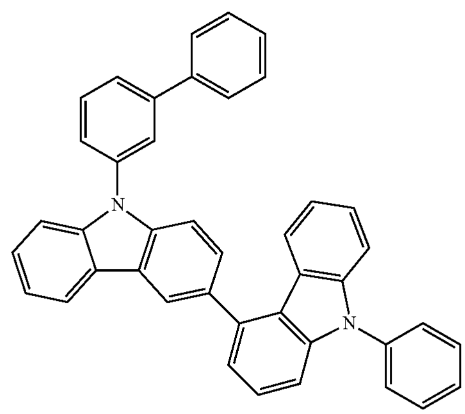
HT-15
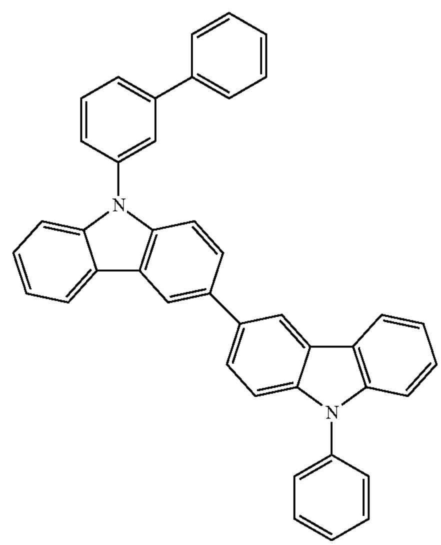

-continued
HT-16
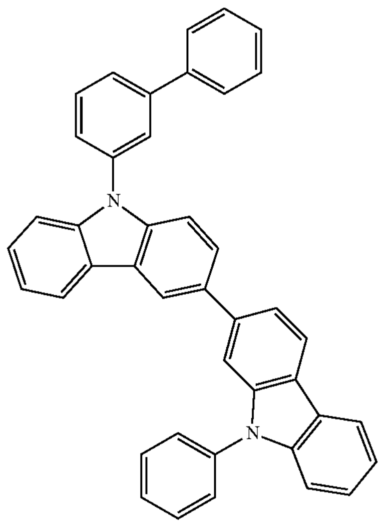
HT-17
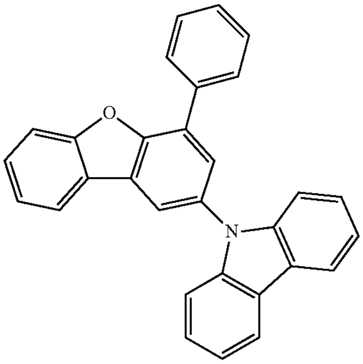
HT-18
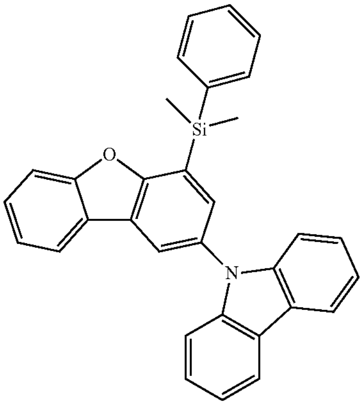
HT-19
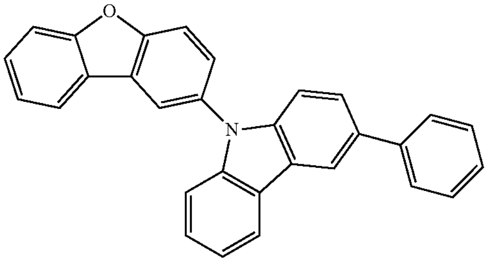
-continued
HT-20
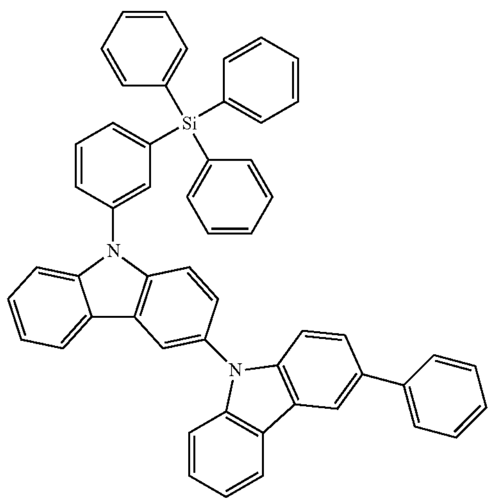
HT-21
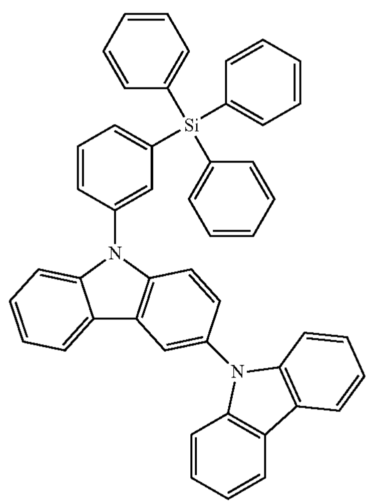
HT-22
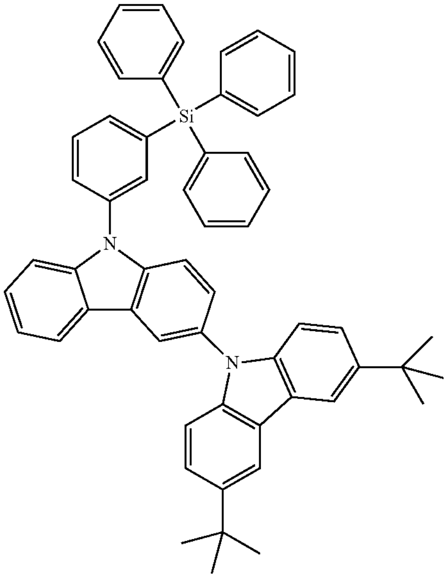

-continued
HT-23
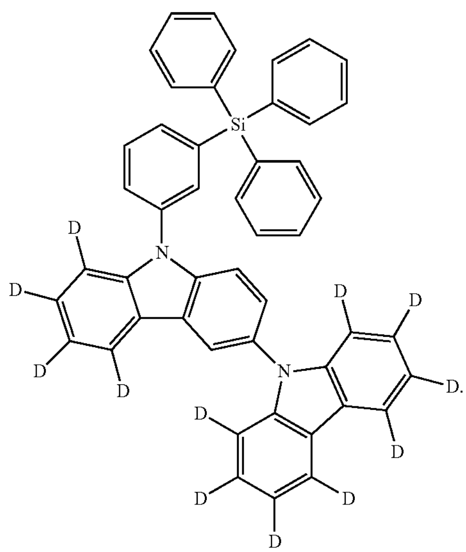
In an embodiment, the third compound represented by Formula ET may be any one of the compounds represented in Compound Group 3. The emission layer EML may include at least one from among the compounds represented in Compound Group 3 as an electron transport host material.
[Compound Group 3]
ET-1
ET-2
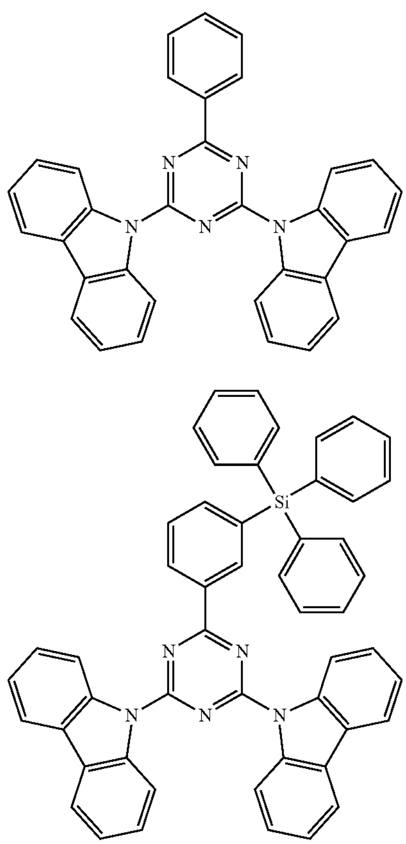
-continued
ET-3
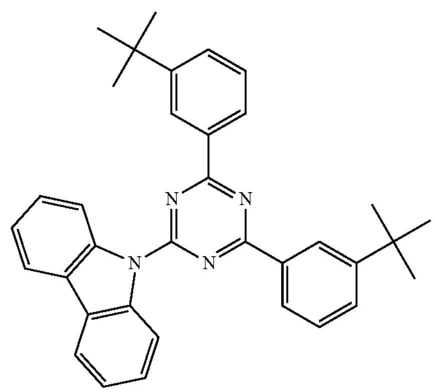
ET-4
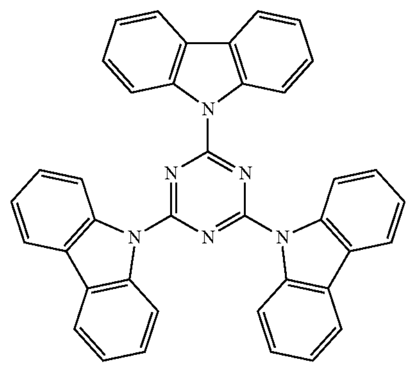
ET-5
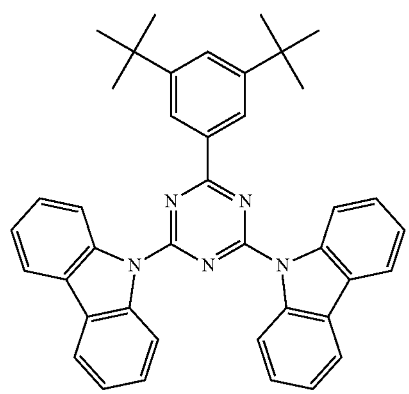
ET-6
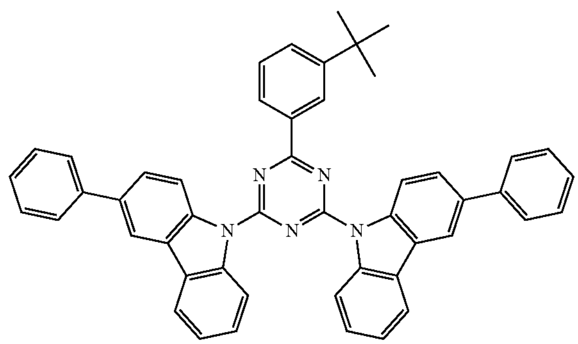

-continued
ET-7
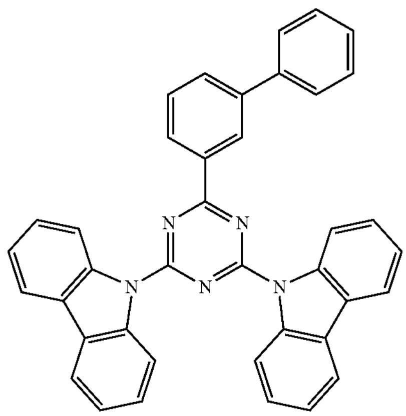
ET-8
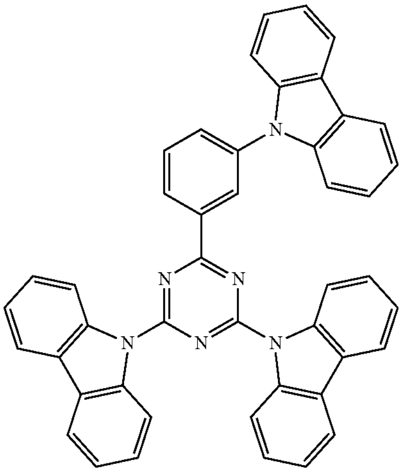
ET-9
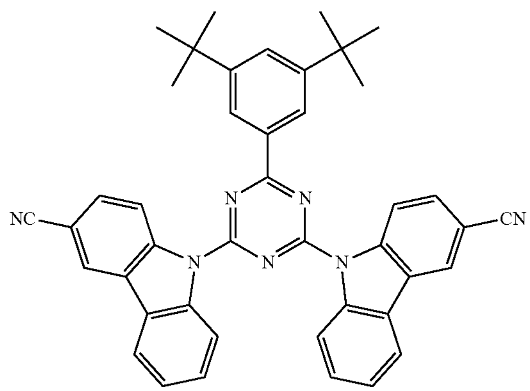
-continued
ET-10
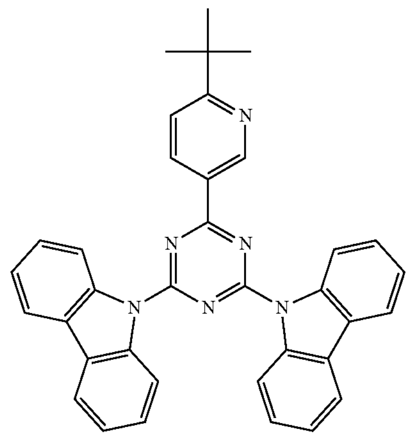
ET-11
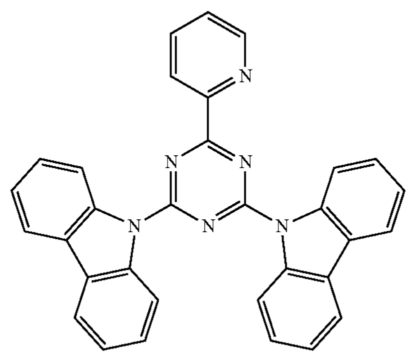
ET-12
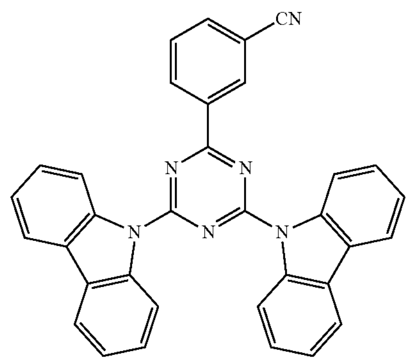
ET-13
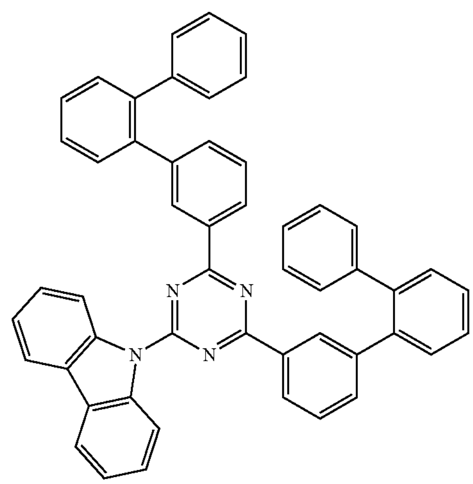

-continued
ET-14
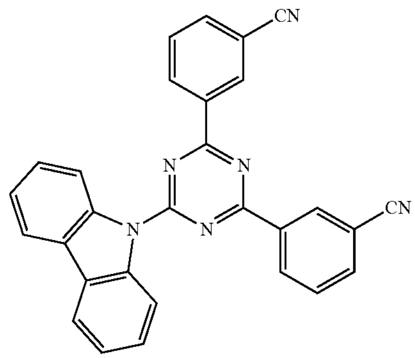
ET-15
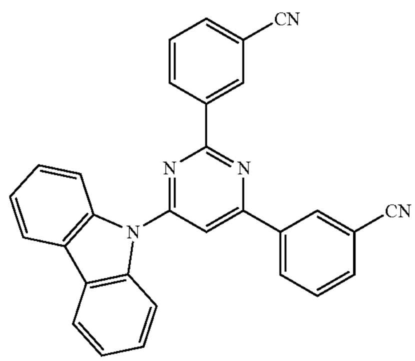
ET-16
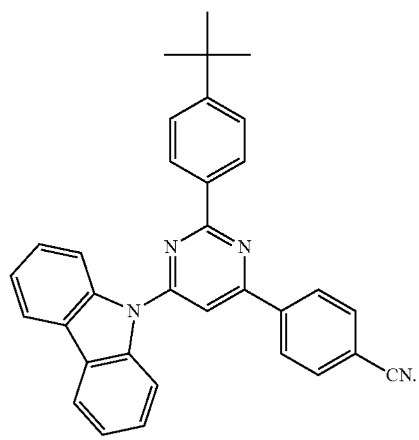
In an embodiment, the fourth compound represented by Formula D-1 may include at least one from among the compounds represented in Compound Group 4. The emission layer EML may include at least one from among the compounds represented in Compound Group 4 as a sensitizer material.
[Compound Group 4]
PS1
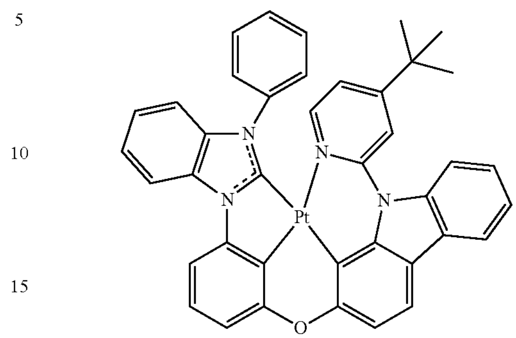
PS2
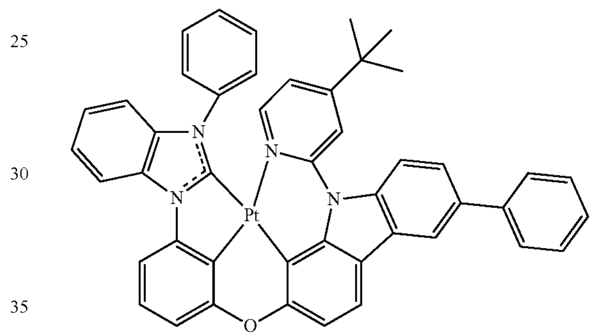
PS3
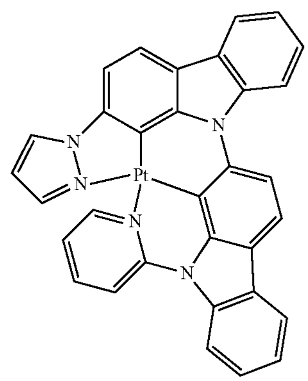
PS4
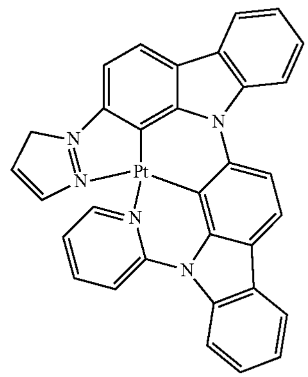

-continued
PS5
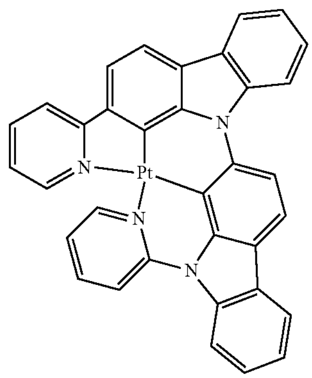
PS6
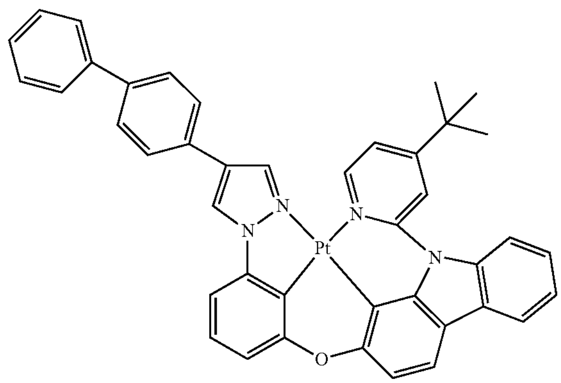
PS7
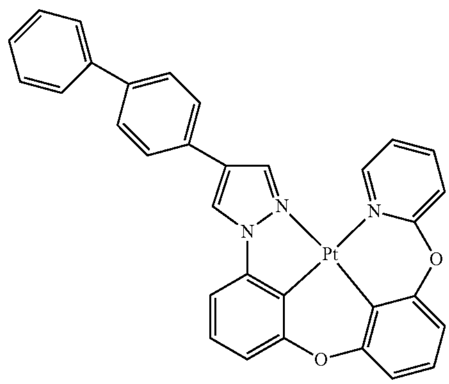
PS8
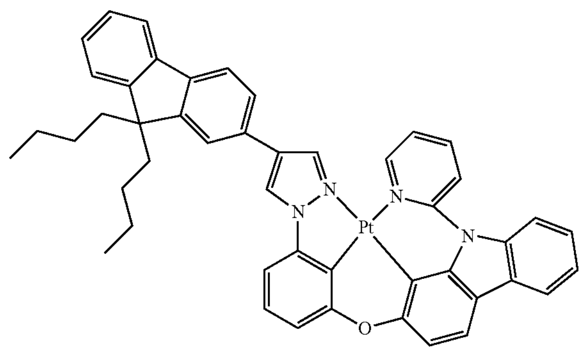
-continued
PS9
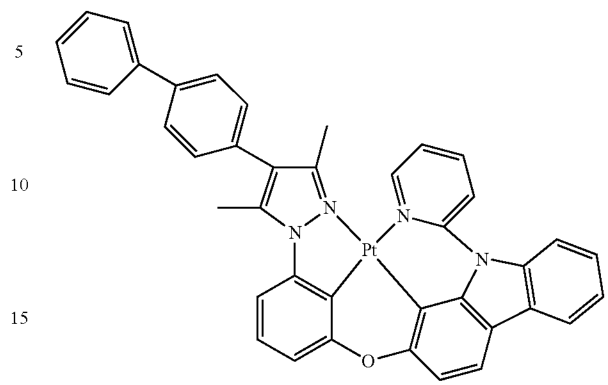
PS10
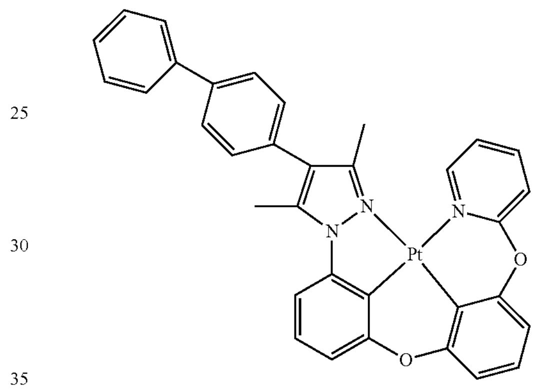
PS11
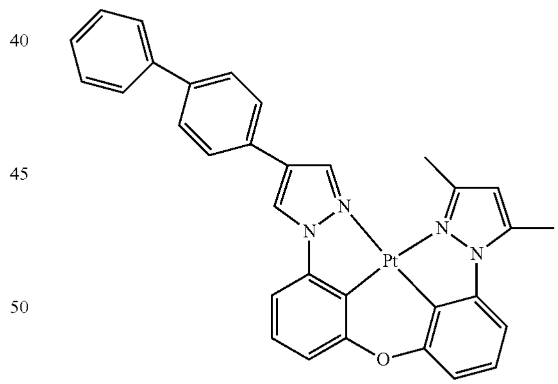
PS12
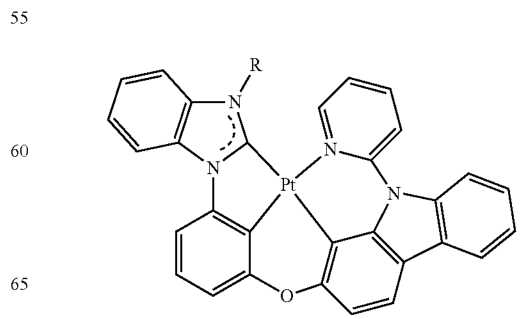

-continued
PS13
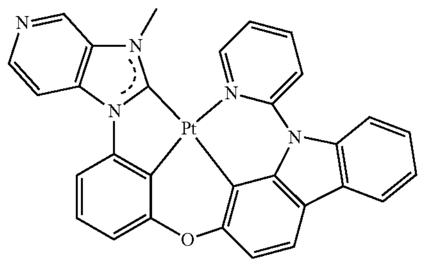
PS14
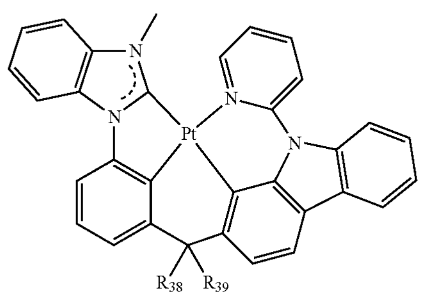
PS15
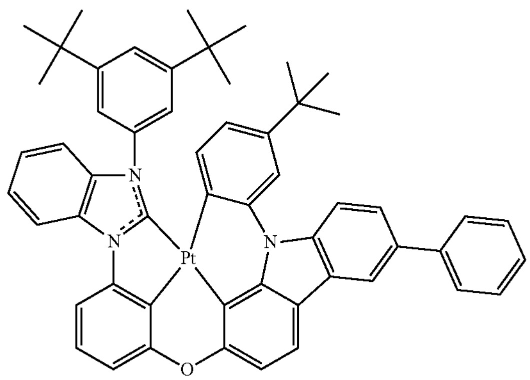
PS16
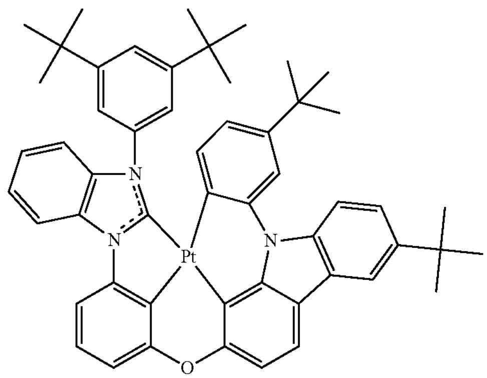
-continued
PS17
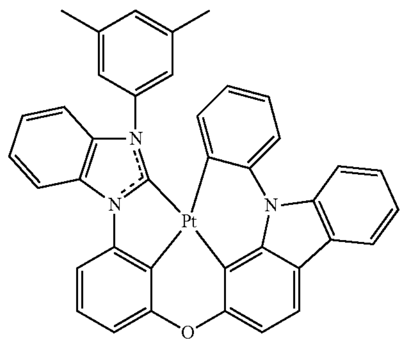
PS18
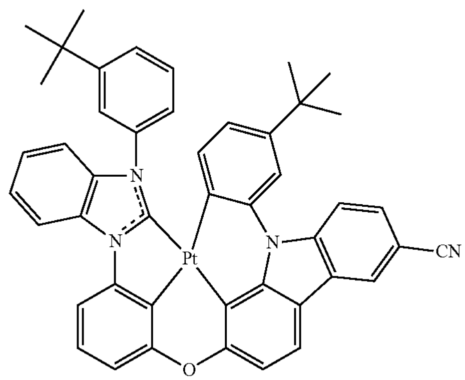
PS19
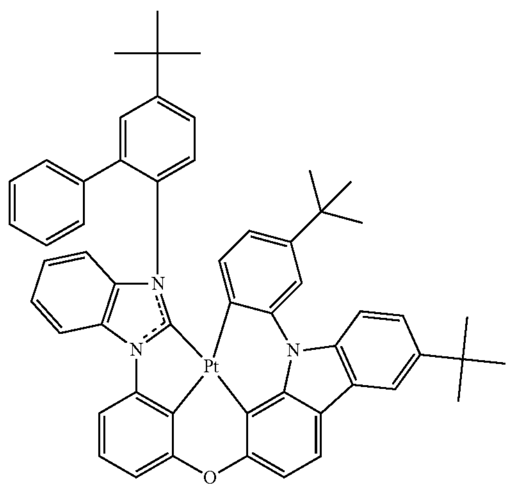
PS20
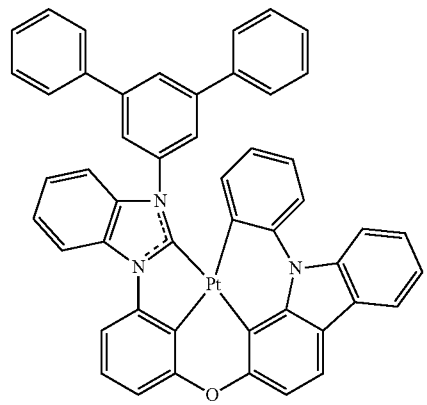

-continued

PS21

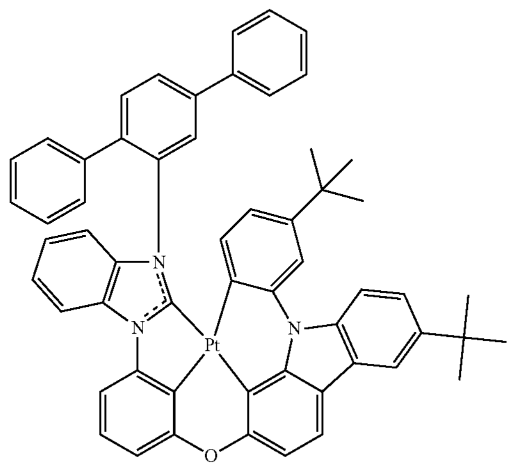

PS22

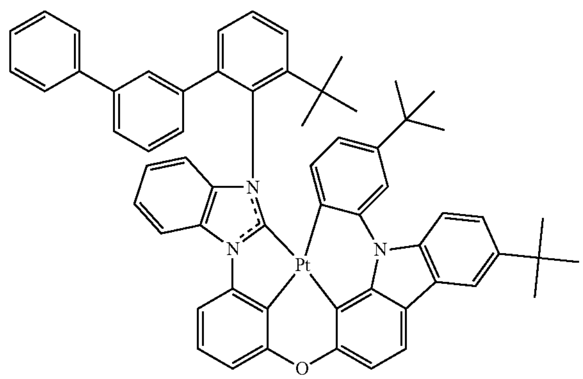

PS23

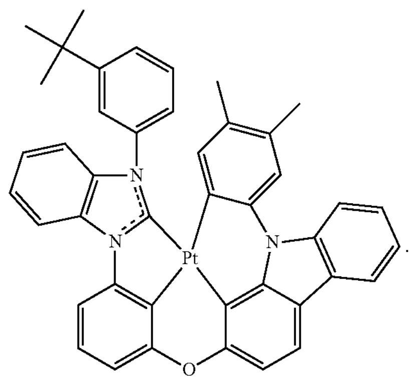

In the compounds included in Compound Group 4, R, $R_{38}$ and $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In some embodiments, though not shown in the drawings, the light emitting element ED of an embodiment may include multiple emission layers. The multiple emission layers may be provided, for example, by stacking over one another, and the light emitting element ED including the multiple emission layers may be to emit white light. The light emitting element including the multiple emission layers may be a light emitting element with a tandem structure. When the light emitting element ED includes multiple emission layers, at least one emission layer EML may include all of the first compound, the second compound, the third compound and the fourth compound as described above.

In the light emitting element ED of an embodiment, the emission layer EML may include one or more anthracene derivatives, pyrene derivatives, fluoranthene derivatives, chrysene derivatives, dihydrobenzanthracene derivatives, and/or triphenylene derivatives. For example, the emission layer EML may include one or more anthracene derivatives and/or pyrene derivatives.

In the light emitting elements ED of embodiments, shown in FIG. 3 to FIG. 6, the emission layer EML may further include one or more suitable hosts and dopants in addition to the above-described hosts and dopants, and the emission layer EML may include a compound represented by Formula E-1. The compound represented by Formula E-1 may be utilized as a fluorescence host material.

[Formula E-1]

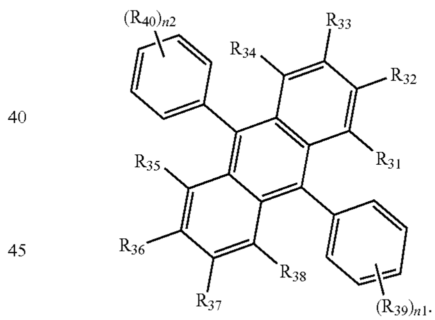

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group of 1 to 10 carbon atoms, a substituted or unsubstituted alkenyl group of 2 to 10 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In some embodiments, $R_{31}$ to $R_{40}$ may be combined with an adjacent group to form a saturated hydrocarbon ring, an unsaturated hydrocarbon ring, a saturated heterocycle, or an unsaturated heterocycle.

In Formula E-1, n1 and n2 may each independently be an integer of 0 to 5.

The compound represented by Formula E-1 may be any one of Compound E1 to Compound E20.

E1
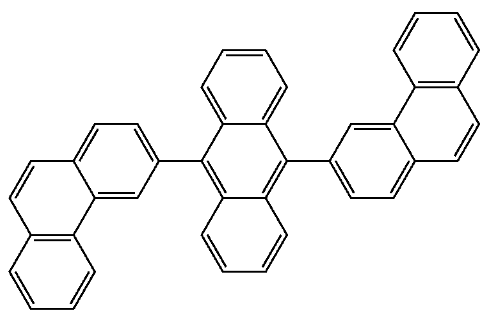
E2
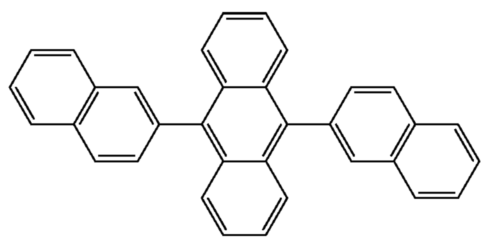
E3
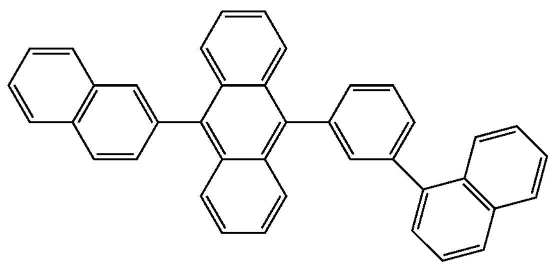
E4
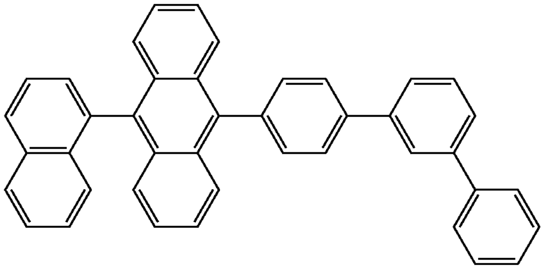
E5
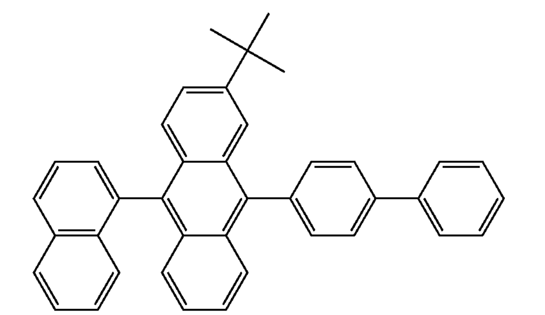
-continued
E6
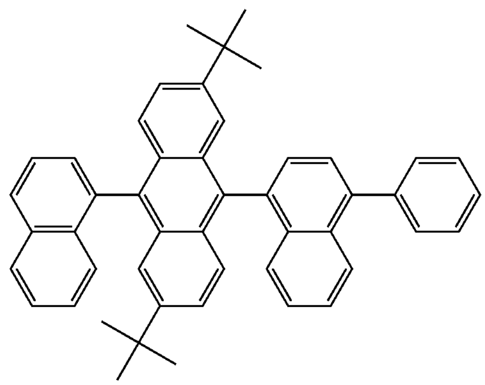
E7
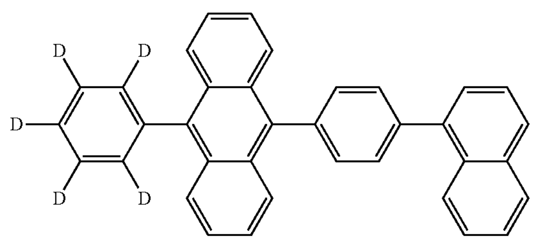
E8
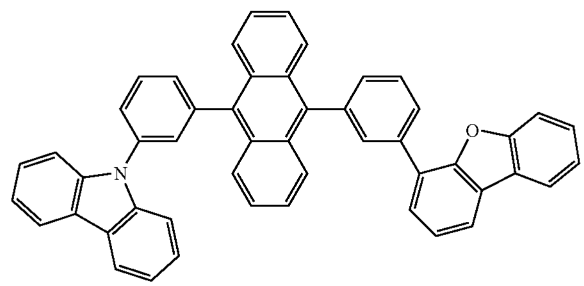
E9
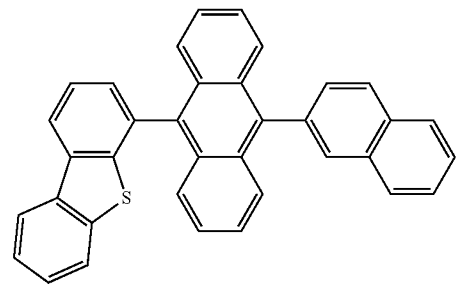
E10
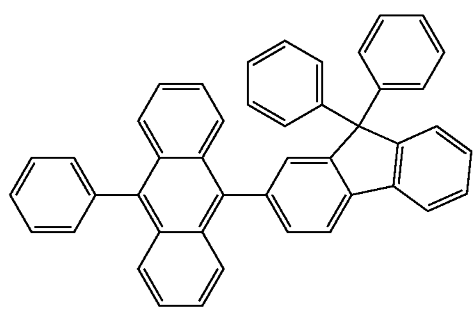

-continued
E11
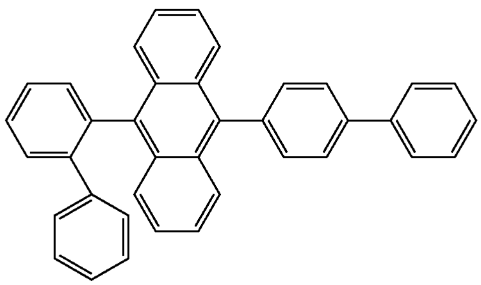
E12
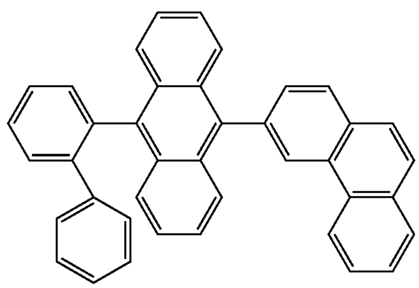
E13
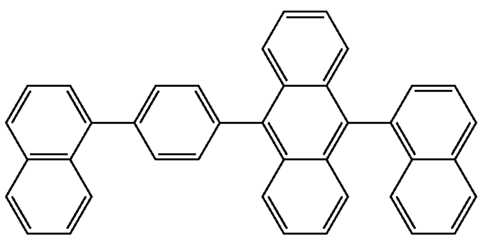
E14
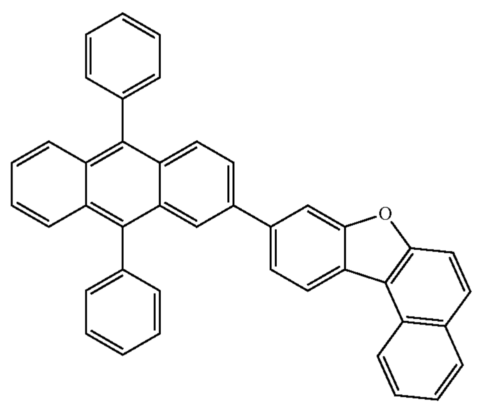
-continued
E15
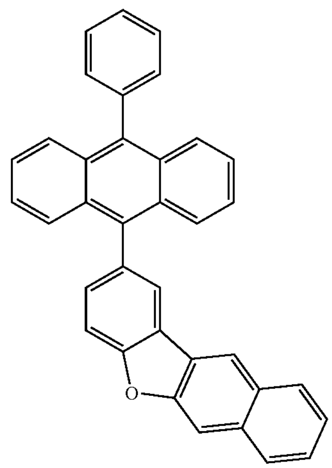
E16
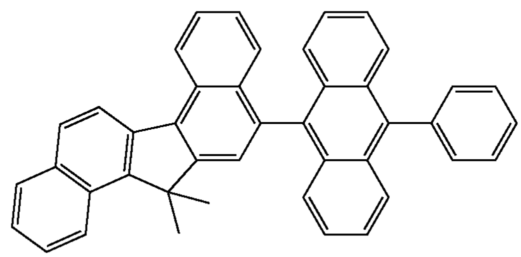
E17
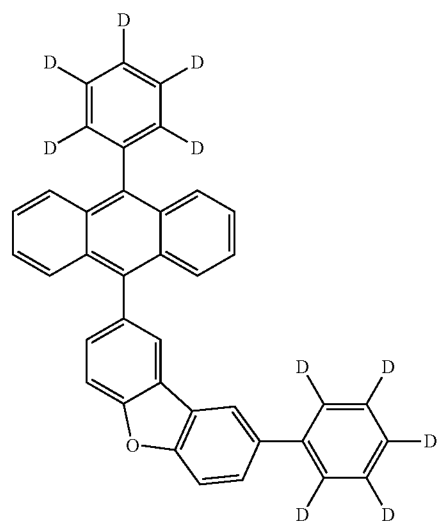
E18
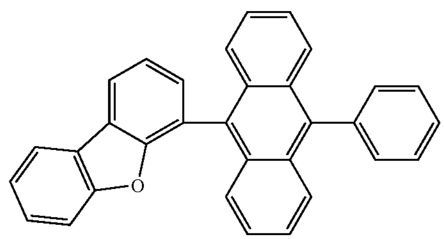

-continued

E19

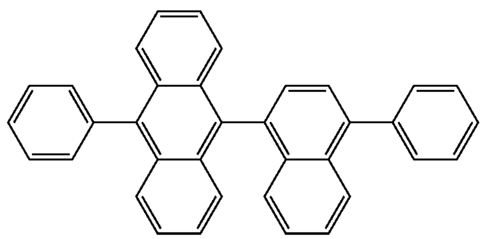

E20

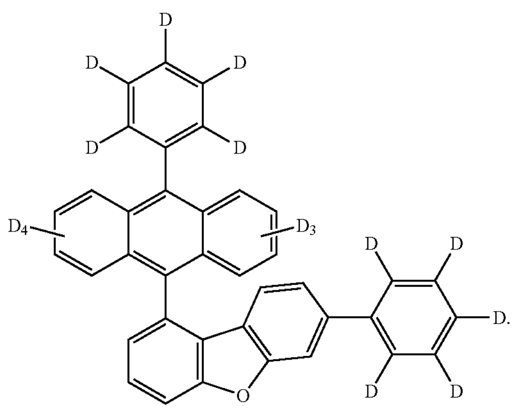

In an embodiment, the emission layer EML may further include a compound represented by Formula E-2b. The compound represented by Formula E-2b may be utilized as a phosphorescence host material.

[Formula E-2b]

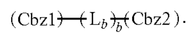

In Formula E-2b, Cbz1 and Cbz2 may each independently be an unsubstituted carbazole group, or a carbazole group substituted with an aryl group of 6 to 30 ring-forming carbon atoms. $L_b$ may be a direct linkage, a substituted or unsubstituted arylene group of 6 to 30 ring-forming carbon atoms, or a substituted or unsubstituted heteroarylene group of 2 to 30 ring-forming carbon atoms. "b" may be an integer of 0 to 10, and when "b" is an integer of 2 or more, multiple $L_b$ may each independently be a substituted or unsubstituted arylene group of 6 to 30 ring-forming carbon atoms, or a substituted or unsubstituted heteroarylene group of 2 to 30 ring-forming carbon atoms.

The compound represented by Formula E-2b may be any one of the compounds in Compound Group E-2. However, the compounds shown in Compound Group E-2 are only provided as examples, and the compound represented by Formula E-2b is not limited to the compounds represented in Compound Group E-2.

[Compound Group E-2]

E-2-1

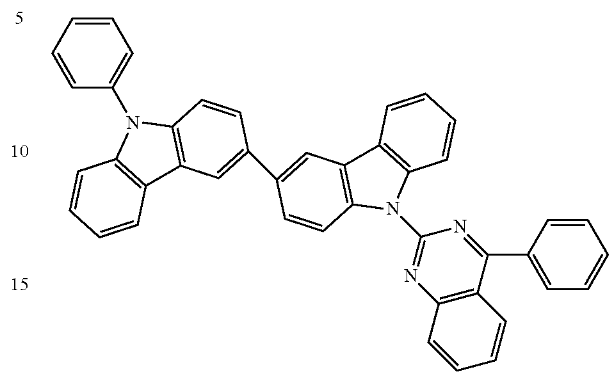

E-2-2

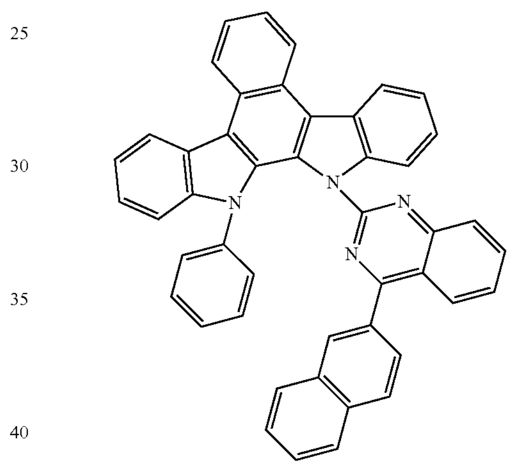

E-2-3

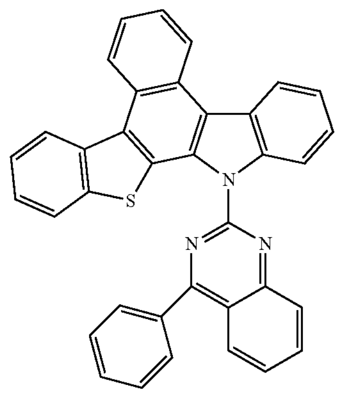

-continued
E-2-4
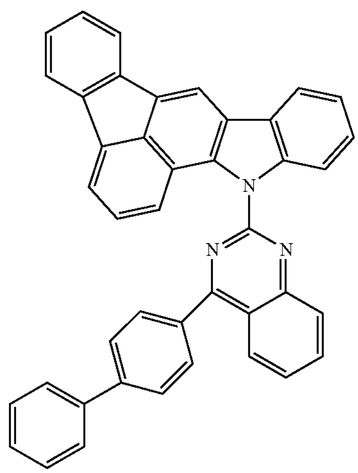
E-2-5
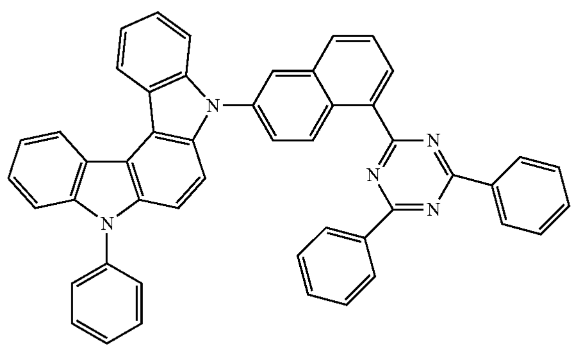
E-2-6
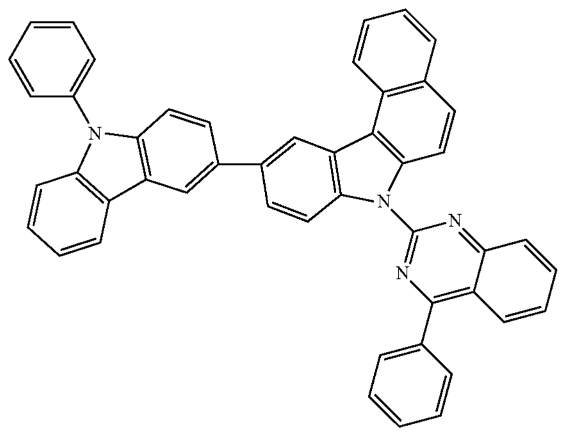
-continued
E-2-7
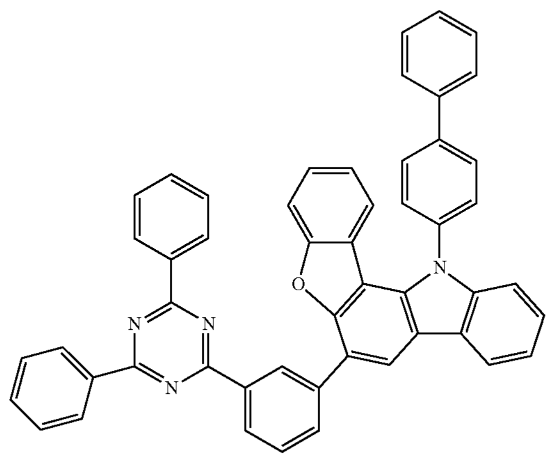
E-2-8
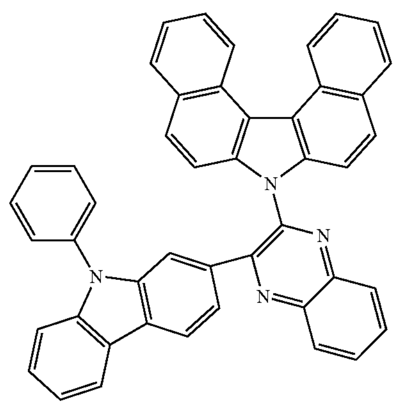
E-2-9
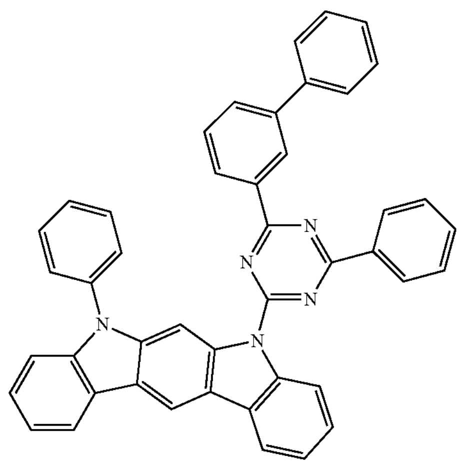

-continued
E-2-10
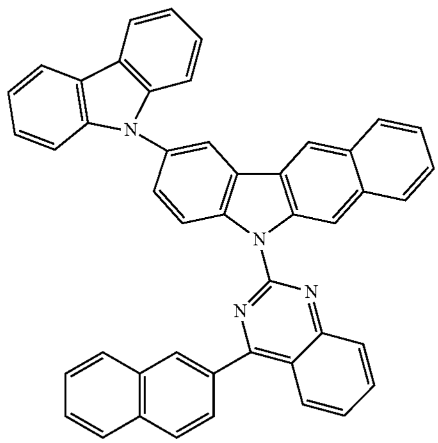
E-2-11
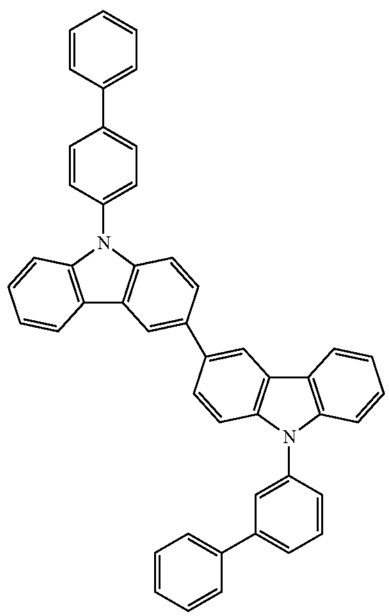
E-2-12
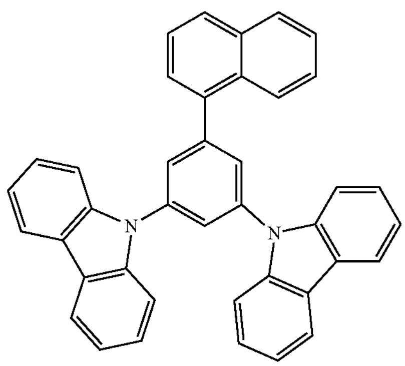
-continued
E-2-13
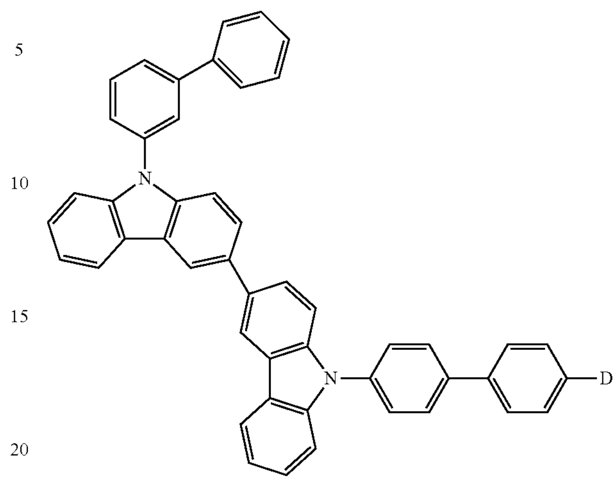
E-2-14
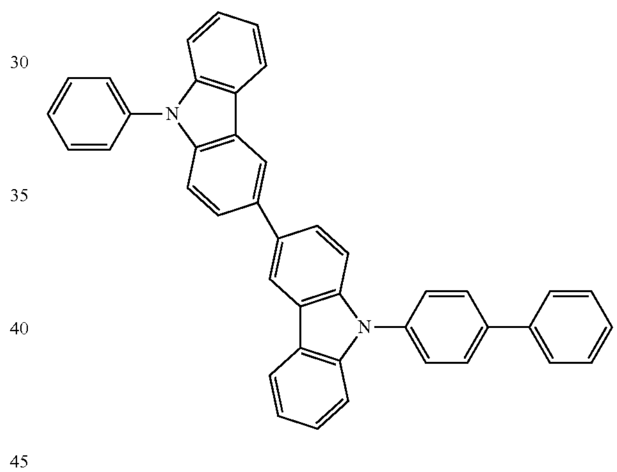
E-2-15
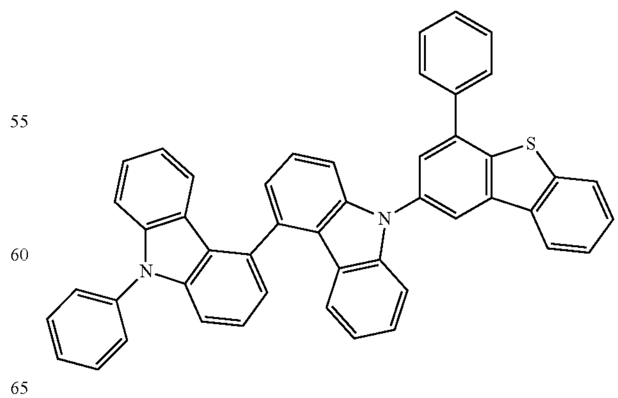

-continued
E-2-16
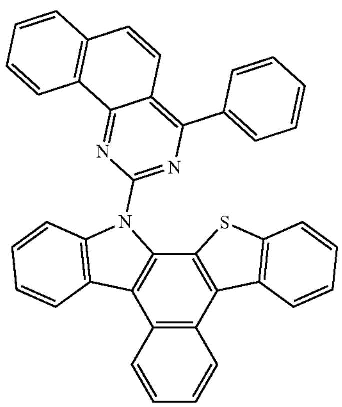
E-2-17
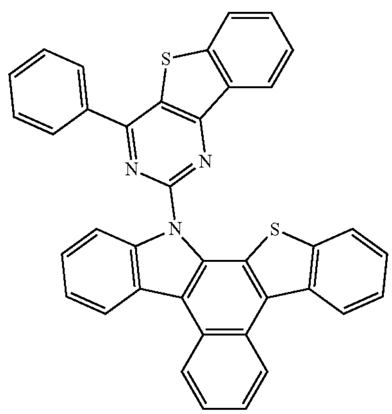
E-2-18
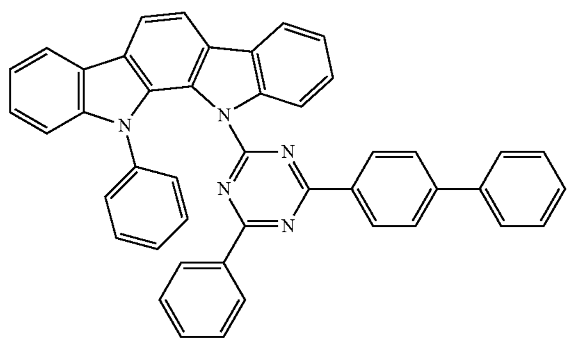
E-2-19
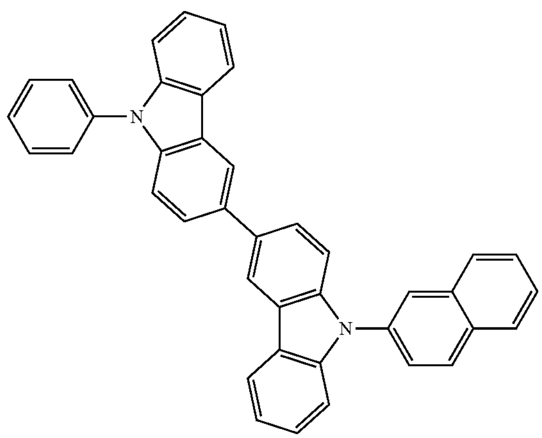
-continued
E-2-20
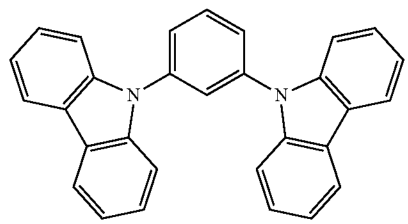
E-2-21
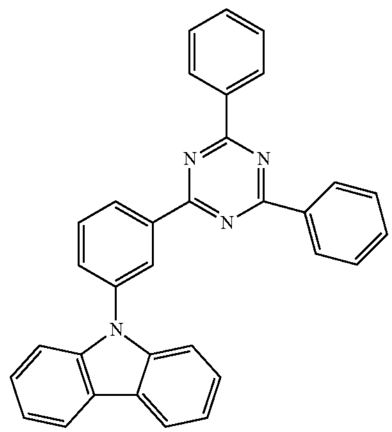
E-2-22
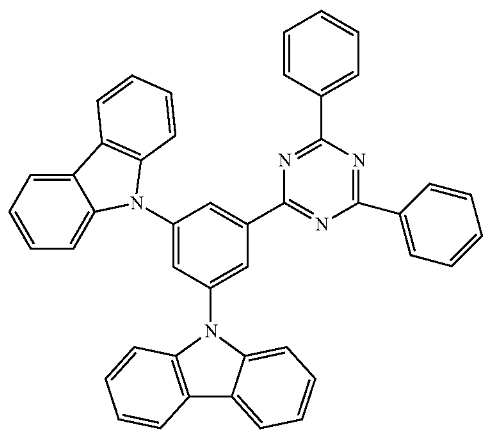
E-2-23
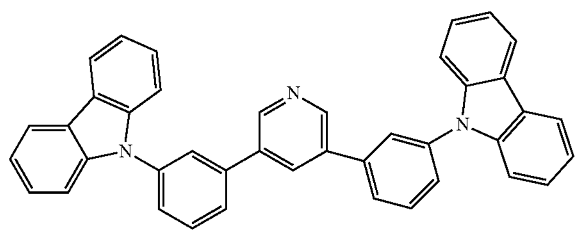

-continued

E-2-24

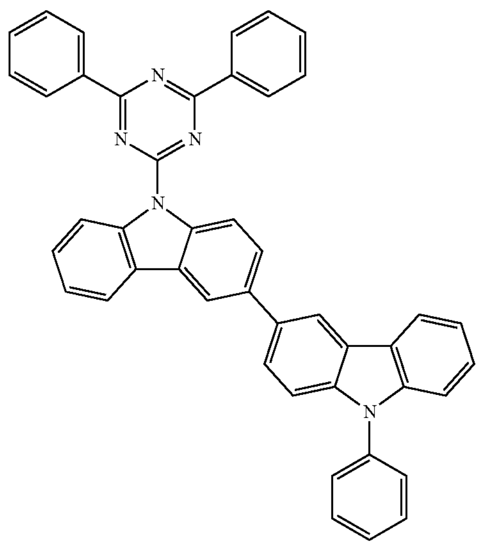

The emission layer EML may further include a suitable material in the art as a host material. For example, the emission layer EML may include as a host material, at least one of bis (4-(9H-carbazol-9-yl) phenyl) diphenylsilane (BCPDS), (4-(1-(4-(diphenylamino) phenyl) cyclohexyl) phenyl) diphenyl-phosphine oxide (POPCPA), bis[2-(diphenylphosphino)phenyl] ether oxide (DPEPO), 4,4'-bis(carbazol-9-yl)biphenyl (CBP), 3,3'-di(9H-carbazol-9-yl)-1,1'-biphenyl (mCBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), or 1,3,5-tris(1-phenyl-1H-benzo[d]imidazole-2-yl)benzene (TPBi). However, an embodiment of the present disclosure is not limited thereto. For example, tris(8-hydroxyquinolino)aluminum ($Alq_3$), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be utilized as the host material.

The emission layer EML may include a compound represented by Formula M-a. The compound represented by Formula M-a may be utilized as a phosphorescence dopant material. In some embodiments, the compound represented by Formula M-a may be utilized as an auxiliary dopant material.

[Formula M-a]

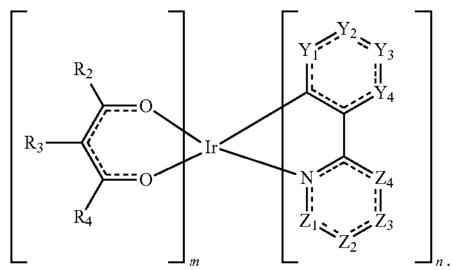

In Formula M-a, $Y_1$ to $Y_4$, and $Z_1$ to $Z_4$ may each independently be $CR_1$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring. In Formula M-a, "m" may be 0 or 1, and "n" may be 2 or 3. In Formula M-a, when "m" is 0, "n" is 3, and when "m" is 1, "n" is 2.

The compound represented by Formula M-a may be utilized as a phosphorescence dopant.

The compound represented by Formula M-a may be any one of Compounds M-a1 to M-a25. However, Compounds M-a1 to M-a25 are provided as examples, and the compound represented by Formula M-a is not limited to the compounds represented by Compounds M-a1 to M-a25.

M-a1

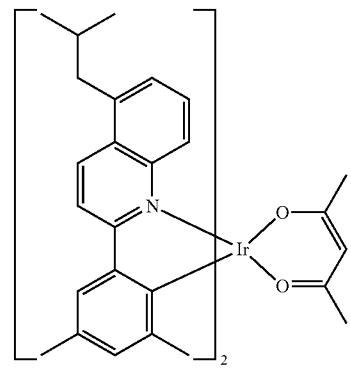

M-a2

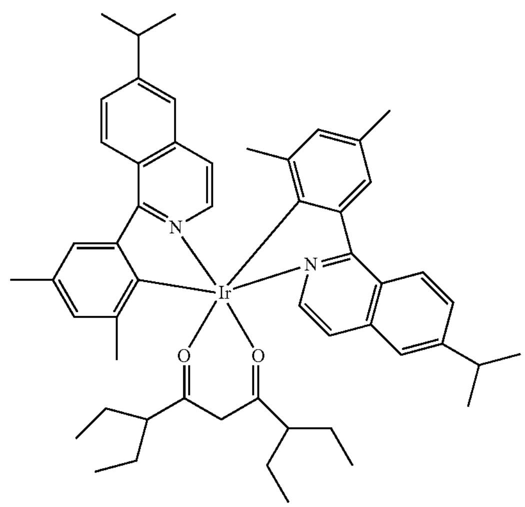

-continued
M-a3
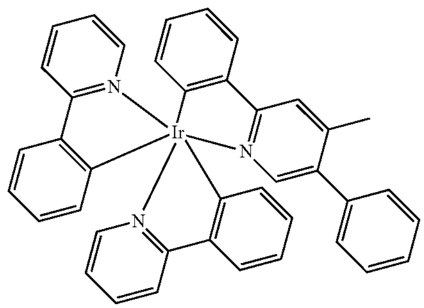
M-a4
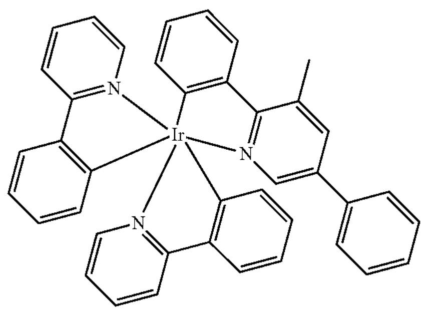
M-a5
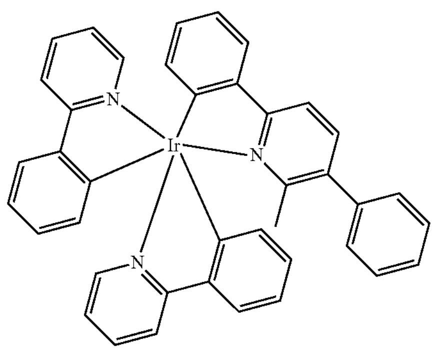
M-a6
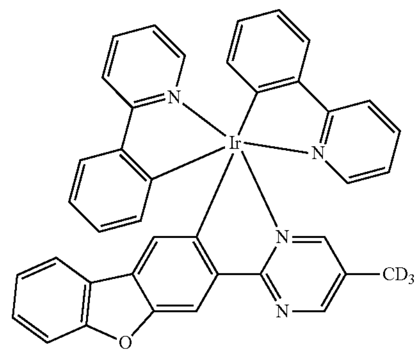
-continued
M-a7
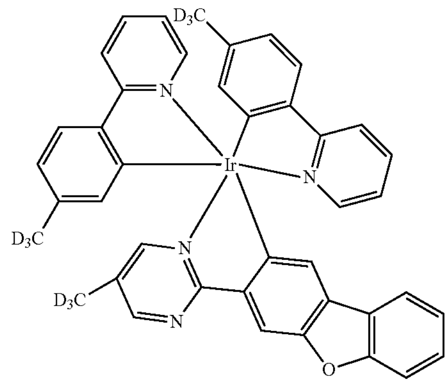
M-a8
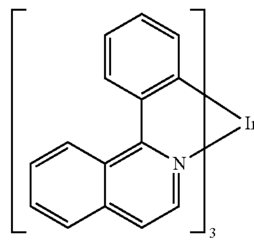
M-a9
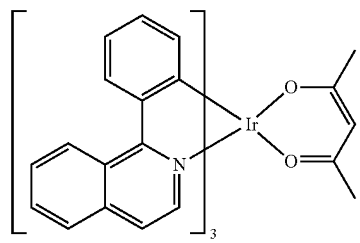
M-a10
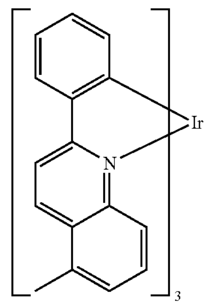
M-a11
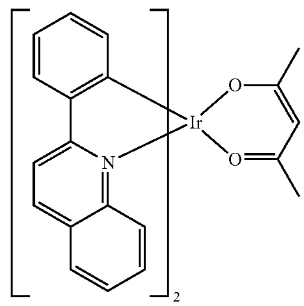

-continued
M-a12
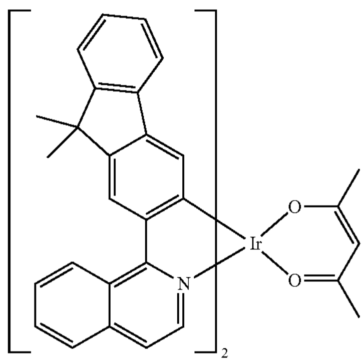
M-a13
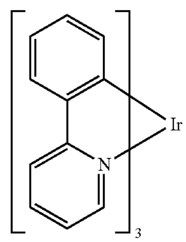
M-a14
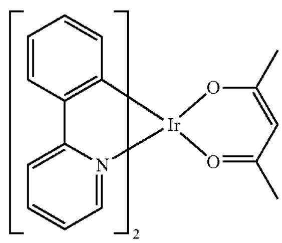
M-a15
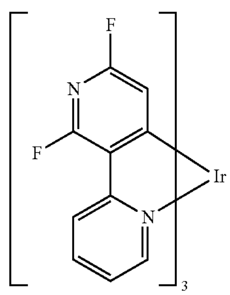
M-a16
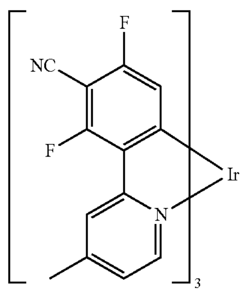
-continued
M-a17
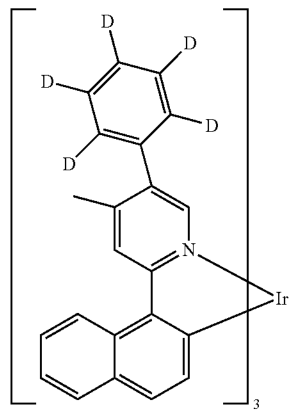
M-a18
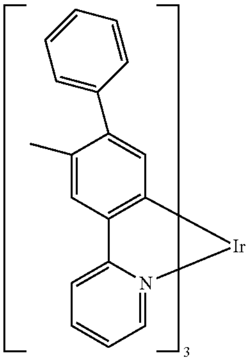
M-a19
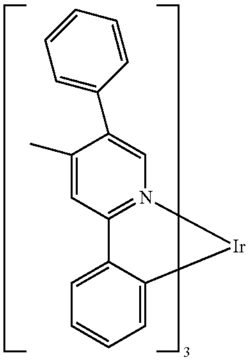
M-a20
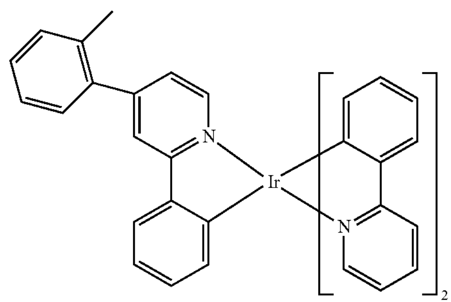

-continued

M-a21

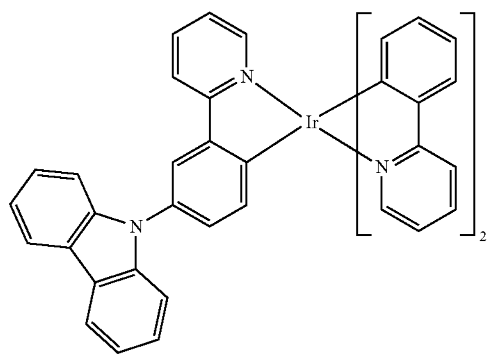

M-a122

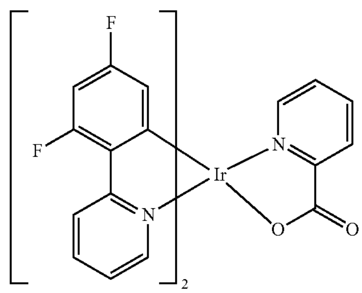

M-a23

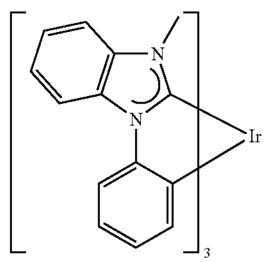

M-a24

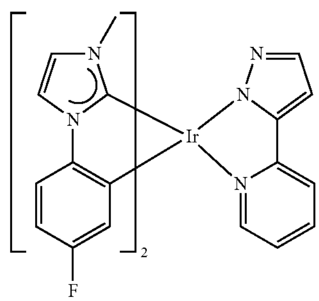

M-a25

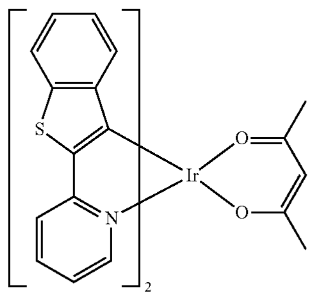

Compound M-a1 and Compound M-a2 may be utilized as red dopant materials, and Compound M-a3 to Compound M-a7 may be utilized as green dopant materials.

The emission layer EML may include a compound represented by any one from among Formula F-a to Formula F-c. The compounds represented by Formula F-a to Formula F-c may be utilized as fluorescence dopant materials.

[Formula F-a]

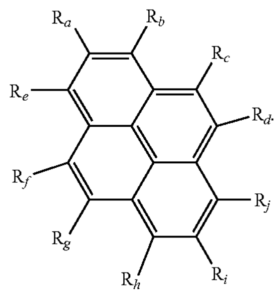

In Formula F-a, two selected from among $R_a$ to $R_j$ may each independently be substituted with *—$NAr_1Ar_2$. Any remainder not substituted with *—$NAr_1Ar_2$ from among $R_a$ to $R_j$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In *—$NAr_1Ar_2$, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. For example, $Ar_1$ and/or $Ar_2$ may be a heteroaryl group including O or S as a ring-forming atom.

[Formula F-b]

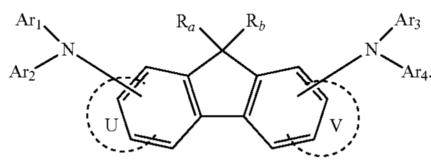

In Formula F-b, $R_a$ and $R_b$ may each independently be a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring. $Ar_1$ to $Ar_4$ may each independently be a substituted or unsubstituted aryl group of 6 to 30 ring-forming carbon atoms, or a substituted or unsubstituted heteroaryl group of 2 to 30 ring-forming carbon atoms.

In Formula F-b, U and V may each independently be a substituted or unsubstituted hydrocarbon ring of 5 to 30 ring-forming carbon atoms, or a substituted or unsubstituted heterocycle of 2 to 30 ring-forming carbon atoms.

In Formula F-b, the number of rings represented by U and V may each independently be 0 or 1. For example, in Formula F-b, when the number of U or V is 1, one ring indicated by U or V forms a fused ring at the designated part (e.g., a portion indicated by U or V), and when the number of U or V is 0, a ring indicated by U or V does not exist. For example, when the number of U is 0, and the number of V is 1, or when the number of U is 1, and the number of V is 0, a fused ring having the fluorene core of Formula F-b may be a ring compound with four rings. In some embodiments, when the number of U and the number of V are both 0, the fused ring of Formula F-b may be a ring compound with three rings. In some embodiments, when the number of U and the number of V are both 1, a fused ring having the fluorene core of Formula F-b may be a ring compound with five rings.

[Formula F-c]

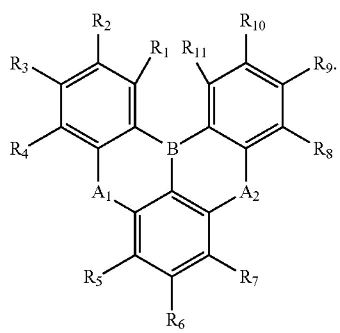

In Formula F-c, $A_1$ and $A_2$ may each independently be O, S, Se, or $NR_m$, and $R_m$ may be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring.

In Formula F-c, $A_1$ and $A_2$ may each independently be combined with the substituents of an adjacent ring to form a fused ring. For example, when $A_1$ and $A_2$ are each independently $NR_m$, $A_1$ may be combined with $R_4$ or $R_5$ to form a ring. In some embodiments, $A_2$ may be combined with $R_7$ or $R_8$ to form a ring.

In an embodiment, the emission layer EML may include as a suitable dopant material, one or more styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi), and 4,4'-bis[2-(4-(N,N-diphenylamino)phenyl)vinyl]biphenyl (DPAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, and 1,4-bis(N,N-diphenylamino)pyrene), etc.

When multiple emission layers EML are included in an embodiment, at least one emission layer EML may include a suitable phosphorescence dopant material. For example, the phosphorescence dopant may utilize a metal complex including iridium (Ir), platinum (Pt), osmium (Os), gold (Au), titanium (Ti), zirconium (Zr), hafnium (Hf), europium (Eu), terbium (Tb) and/or thulium (Tm). For example, iridium(III) bis(4,6-difluorophenylpyridinato-N,C2')picolinate (Flrpic), bis(2,4-difluorophenylpyridinato)-tetrakis(1-pyrazolyl)borate iridium(III) (Fir6), and/or platinum octaethyl porphyrin (PtOEP) may be utilized as the phosphorescence dopant. However, an embodiment of the present disclosure is not limited thereto.

In some embodiments, at least one emission layer EML may include a quantum dot material. The core of the quantum dot may be selected from a II-VI group compound, a III-VI group compound, a group compound, a III-V group compound, a III-II-V group compound, a IV-VI group compound, a IV group element, a IV group compound, and combinations thereof.

The II-VI group compound may be selected from the group consisting of: a binary compound selected from the group consisting of CdSe, CdTe, CdS, ZnS, ZnSe, ZnTe, ZnO, HgS, HgSe, HgTe, MgSe, MgS, and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The III-VI group compound may include a binary compound such as $In_2S_3$, and/or $In_2Se_3$, a ternary compound such as $InGaS_3$, and/or $InGaSe_3$, or one or more combinations thereof.

The group compound may be selected from a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$ and mixtures thereof, and a quaternary compound such as $AgInGaS_2$, and/or $CuInGaS_2$.

The III-V group compound may be selected from the group consisting of a binary compound selected from the group consisting of GaN, GaP, GaAs, GaSb, AlN, AlP, AlAs, AlSb, InN, InP, InAs, InSb, and mixtures thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. In some embodiments, the III-V group compound may further include a II group metal. For example, InZnP, etc. may be selected as a III-II-V group compound.

The IV-VI group compound may be selected from the group consisting of a binary compound selected from the group consisting of SnS, SnSe, SnTe, PbS, PbSe, PbTe, and mixtures thereof, a ternary compound selected from the group consisting of SnSeS, SnSeTe, SnSTe, PbSeS, PbSeTe, PbSTe, SnPbS, SnPbSe, SnPbTe, and mixtures thereof, and a quaternary compound selected from the group consisting of SnPbSSe, SnPbSeTe, SnPbSTe, and mixtures thereof. The IV group element may be selected from the group consisting of Si, Ge, and a mixture thereof. The IV group compound may be a binary compound selected from the group consisting of SiC, SiGe, and a mixture thereof.

In this case, the binary compound, the ternary compound and/or the quaternary compound may be present at a substantially uniform concentration in a particle or may be present at a partially different concentration distribution state in the same particle. In some embodiments, the quantum dot may have a core/shell structure in which one quantum dot is around (e.g., wraps) another quantum dot. The interface between the core and the shell may have a concentration gradient in which the concentration of an element present in the shell is decreased toward the center of the core.

In some embodiments, the quantum dot may have the above-described core-shell structure including a core including a nanocrystal and a shell around (e.g., wrapping) the core. The shell of the quantum dot may play the role of a protection layer for preventing or reducing the chemical deformation of the core to maintain semiconductor properties and/or a charging layer for imparting the quantum dot with electrophoretic properties. The shell may be a single layer or a multilayer. Examples of the shell of the quantum dot may include a metal or non-metal oxide, a semiconductor compound, or any combinations thereof.

For example, the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and/or NiO, and/or a ternary compound such as $MgAl_2O_4$, $CoFe_2O_4$, $NiFe_2O_4$ and/or $CoMn_2O_4$, but an embodiment of the present disclosure is not limited thereto.

Also, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but an embodiment of the present disclosure is not limited thereto.

The quantum dot may have a full width of half maximum (FWHM) of emission wavelength spectrum of about 45 nm or less, about 40 nm or less, or, about 30 nm or less. Within these ranges, color purity and/or color reproducibility may be improved. In addition, light emitted via such quantum dot is emitted in all directions, and light view angle properties may be improved (e.g., a wider viewing angle may be obtained).

In some embodiments, the shape of the quantum dot may be any suitable generally utilized shapes in the art, without specific limitation. For example, the quantum dot may have the shape of spherical, pyramidal, multi-arm, or cubic nanoparticle, nanotube, nanowire, nanofiber, nanoplate particle, etc.

The quantum dot may control the color of light emitted according to the particle size, and accordingly, the quantum dot may have one or more suitable emission colors such as blue, red and/or green.

In the light emitting elements ED of embodiments, as shown in FIG. 3 to FIG. 6, the electron transport region ETR is provided on the emission layer EML. The electron transport region ETR may include at least one of an hole blocking layer HBL, an electron transport layer ETL or an electron injection layer EIL. However, an embodiment of the present disclosure is not limited thereto.

The electron transport region ETR may have a single layer formed utilizing a single material, a single layer formed utilizing multiple different materials, or a multilayer structure having multiple layers formed utilizing multiple different materials.

For example, the electron transport region ETR may have a single layer structure of an electron injection layer EIL or an electron transport layer ETL, or a single layer structure formed utilizing an electron injection material and an electron transport material. In some embodiments, the electron transport region ETR may have a single layer structure formed utilizing multiple different materials, or a structure in which electron transport layer ETL/electron injection layer EIL, hole blocking layer HBL/electron transport layer ETL/electron injection layer EIL, electron transport layer ETL/buffer layer/electron injection layer EIL, and/or the like, are stacked from the emission layer EML in the respective stated order, but the embodiment of the present disclosure is not limited thereto. The thickness of the electron transport region ETR may be, for example, from about 1,000 Å to about 1,500 Å.

The electron transport region ETR may be formed utilizing one or more suitable methods such as a vacuum deposition method, a spin coating method, a cast method, a Langmuir-Blodgett (LB) method, an inkjet printing method, a laser printing method, and/or a laser induced thermal imaging (LITI) method.

The electron transport region ETR may include a compound represented by Formula ET-2.

[Formula ET-2]

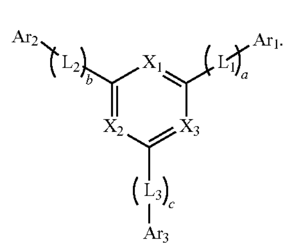

In Formula ET-2, at least one from among $X_1$ to $X_3$ may be N, and any remainder thereof may be $CR_a$. $R_a$ may be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. $Ar_1$ to $Ar_3$ may each independently be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula ET-2, "a" to "c" may each independently be an integer of 0 to 10. In Formula ET-2, "$L_1$" to "$L_3$" may each independently be a direct linkage, a substituted or unsubstituted arylene group of 6 to 30 ring-forming carbon atoms, or a substituted or unsubstituted heteroarylene group of 2 to 30 ring-forming carbon atoms. In some embodiments, when "a" to "c" are each an integer of 2 or more, "$L_1$" to "$L_3$" may each independently be a substituted or unsubstituted arylene group of 6 to 30 ring-forming carbon atoms, or a substituted or unsubstituted heteroarylene group of 2 to 30 ring-forming carbon atoms.

The electron transport region ETR may include an anthracene-based compound. However, an embodiment of the present disclosure is not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate (Bebq$_2$), 9,10-di(naphthalene-2-yl)anthracene (ADN), 1,3-bis[3,5-di(pyridin-3-yl)phenyl]benzene (BmPyPhB), diphenyl(4-(triphenylsilyl)phenyl)phosphine oxide (TSPO1), and mixtures thereof, but an embodiment of the present disclosure is not limited thereto.
The electron transport region ETR may include at least one from among Compounds ET1 to ET36.
ET1
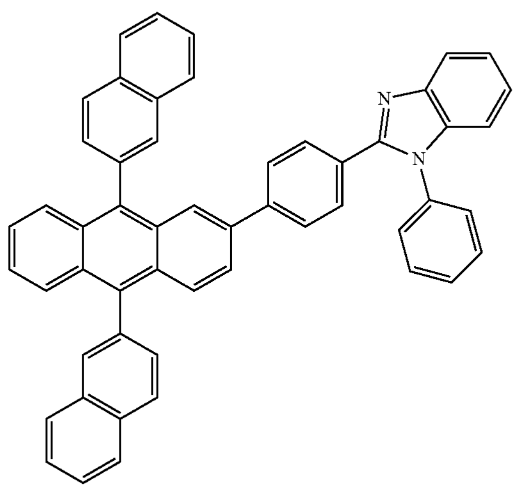
ET2
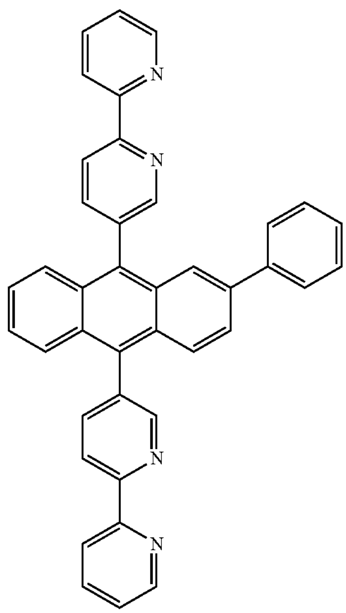
-continued
ET3
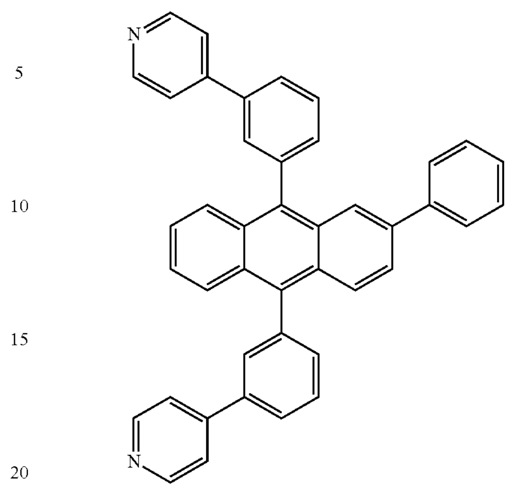
ET4
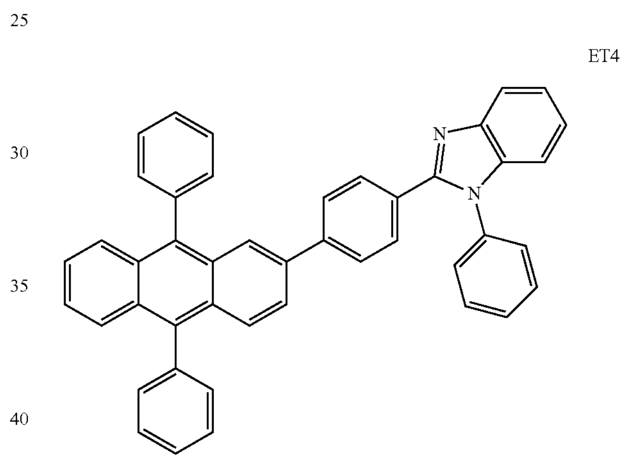
ET5
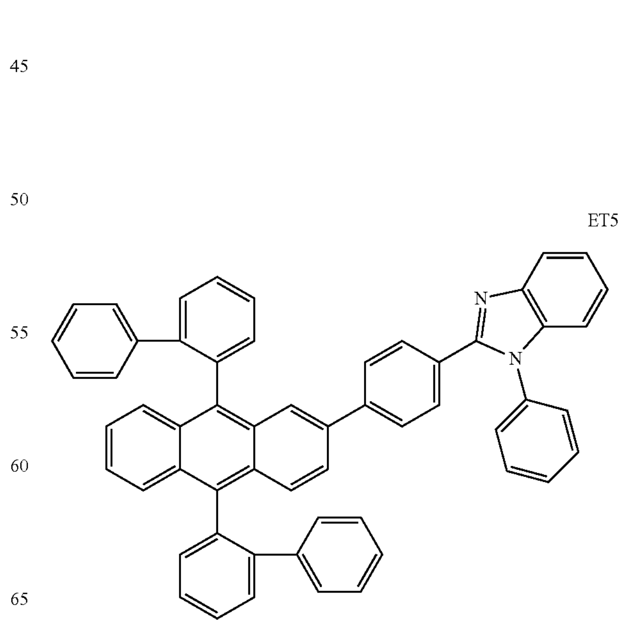

-continued
ET6
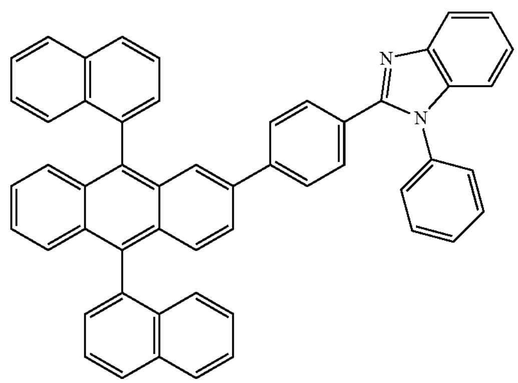
ET7
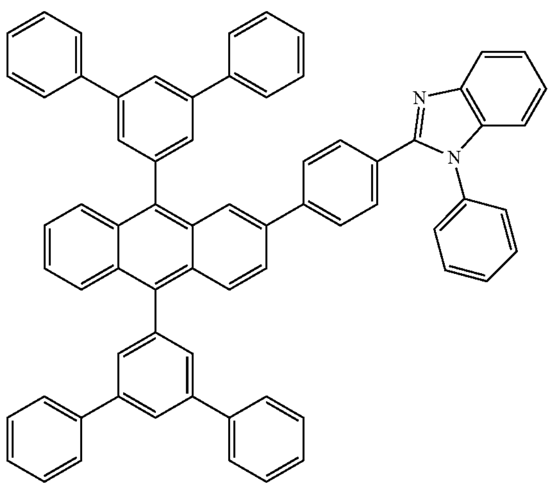
ET8
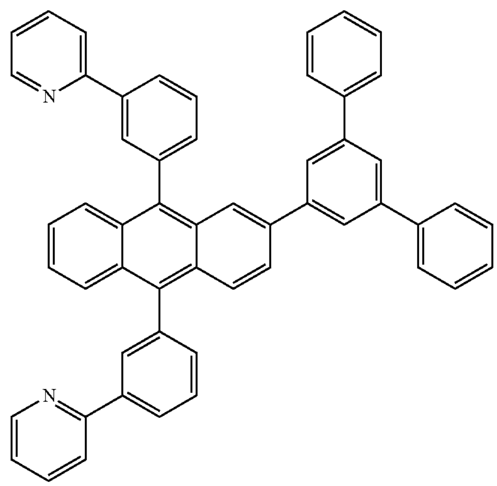
-continued
ET9
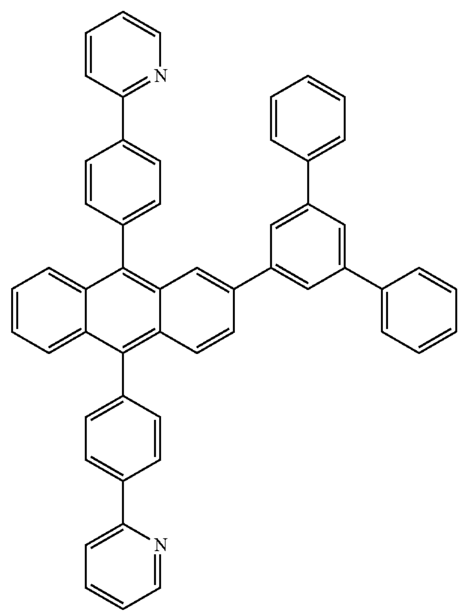
ET10
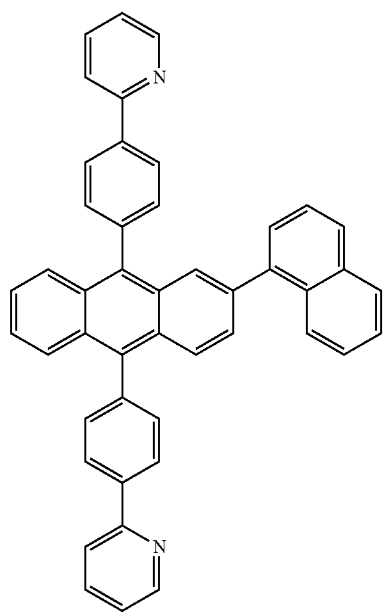

-continued
ET11
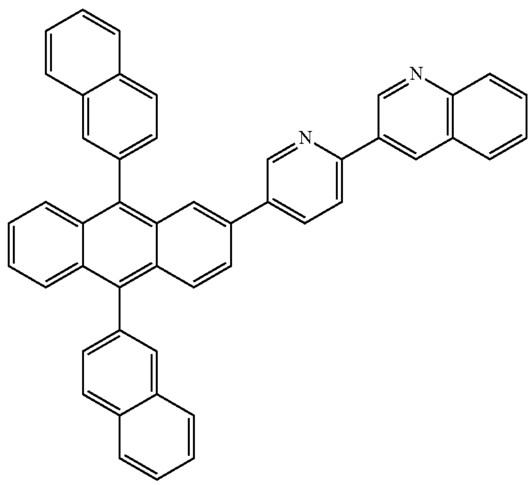
ET12
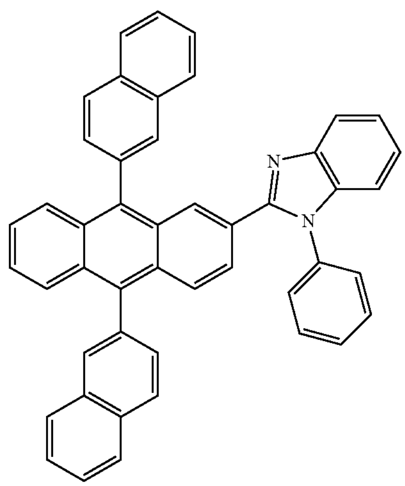
ET13
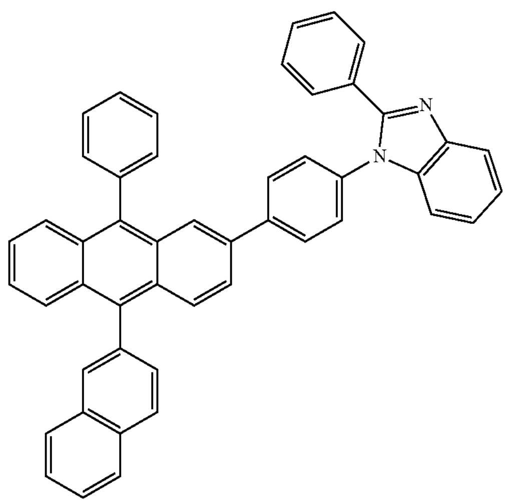
-continued
ET14
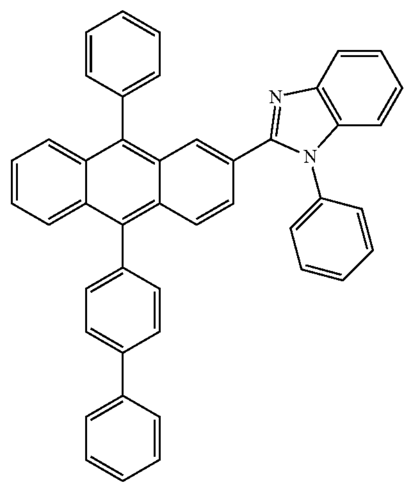
ET15
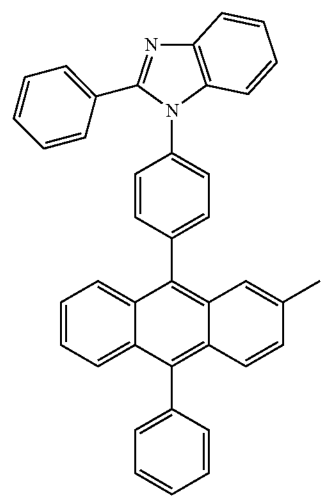
ET16
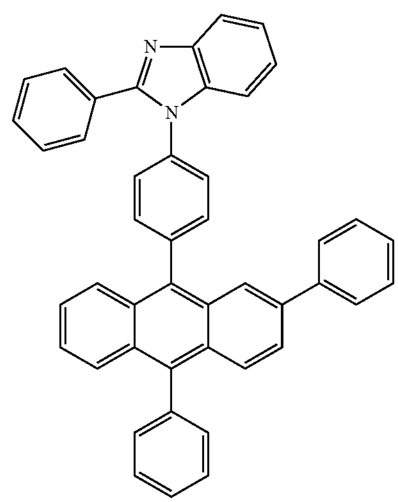

-continued
ET17
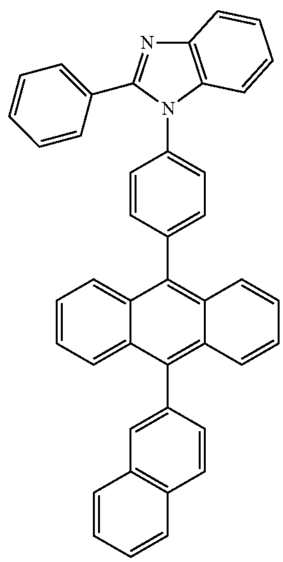
ET18
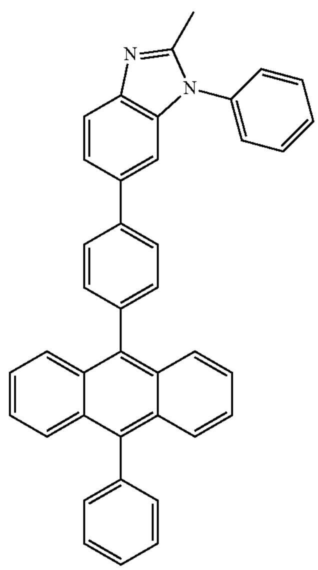
ET19
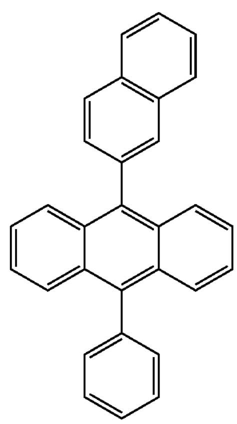
-continued
ET20
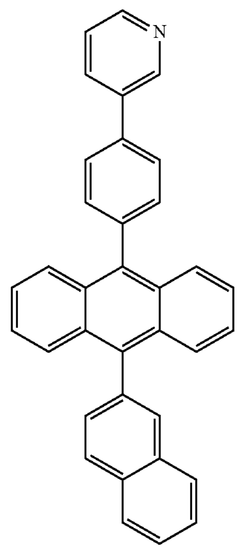
ET21
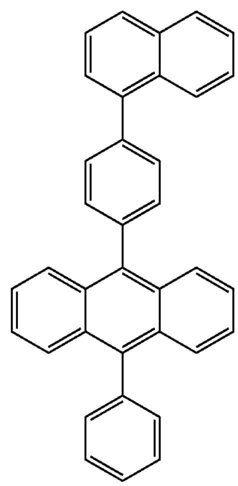
ET22
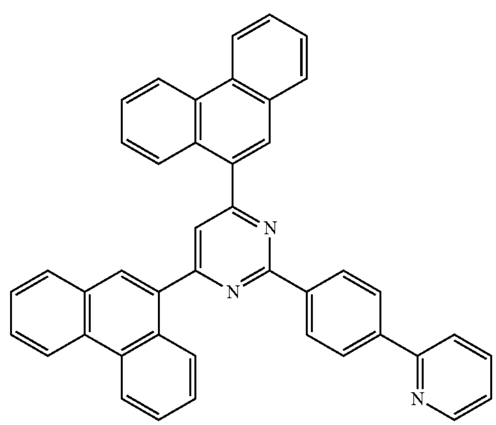

-continued
ET23
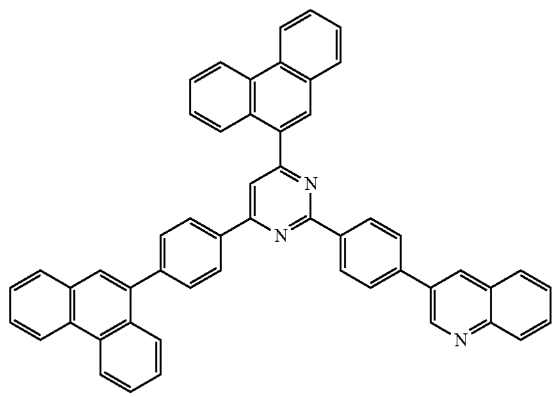
ET24
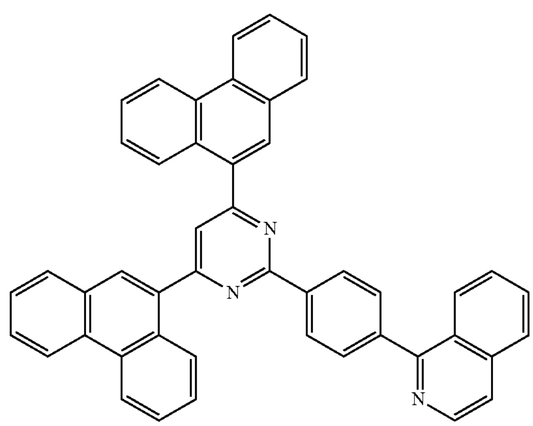
ET25
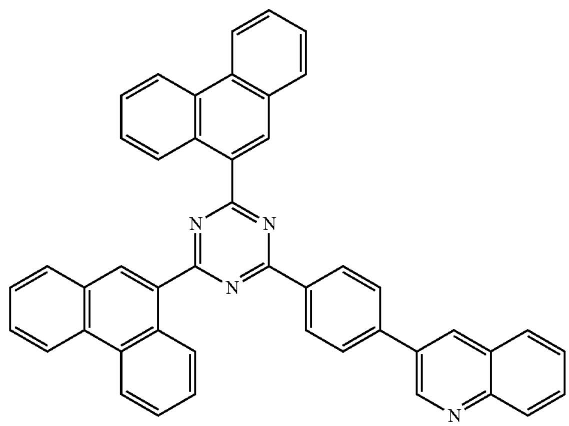
-continued
ET26
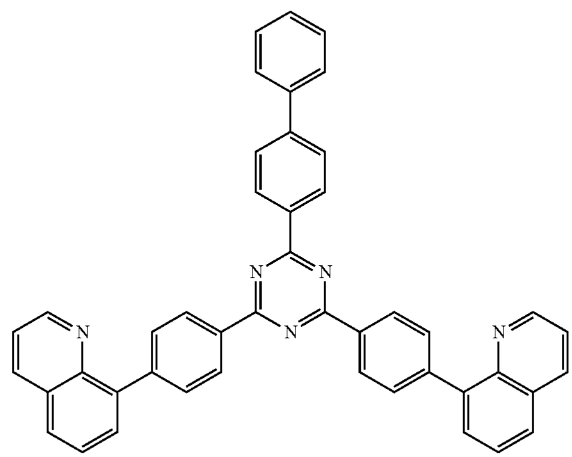
ET27
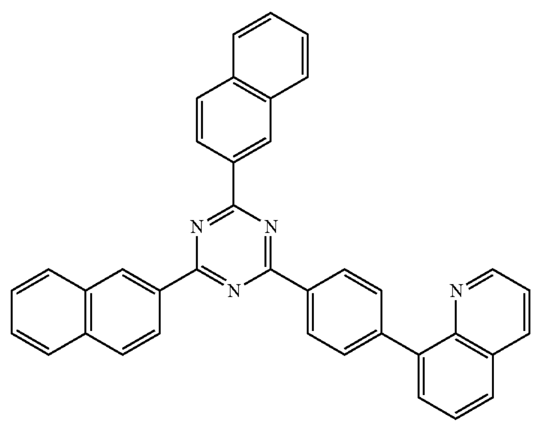
ET28
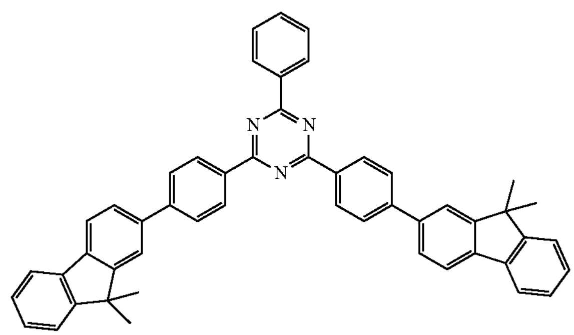

-continued
ET29
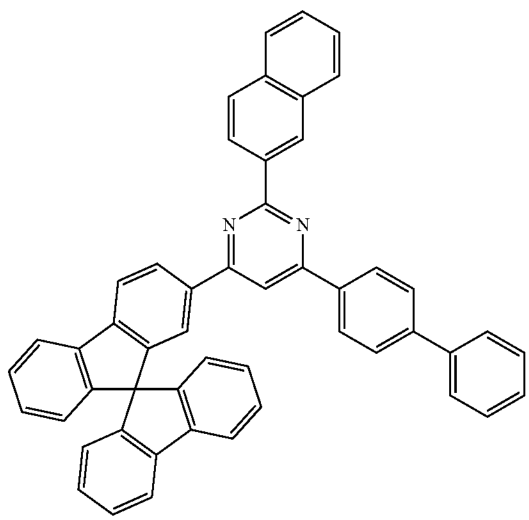
ET30
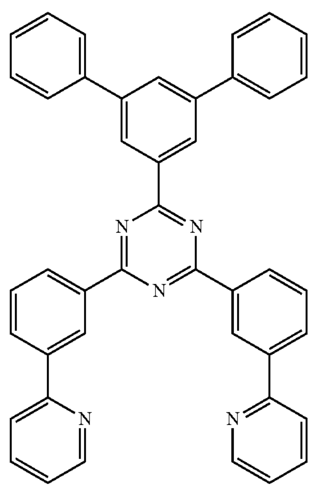
ET31
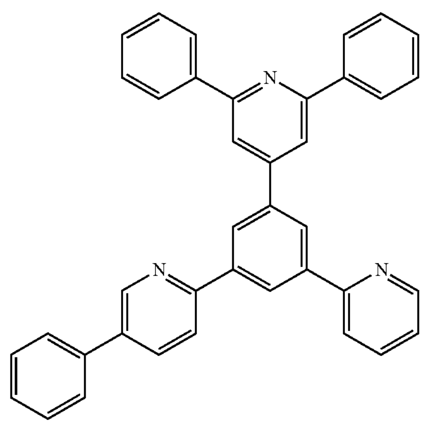
-continued
ET32
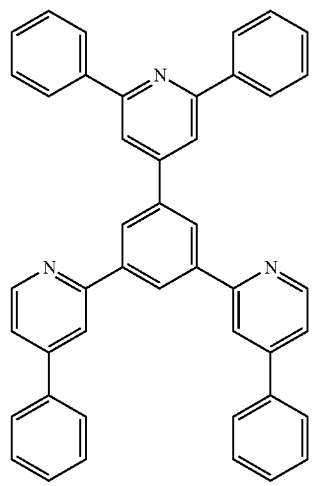
ET33
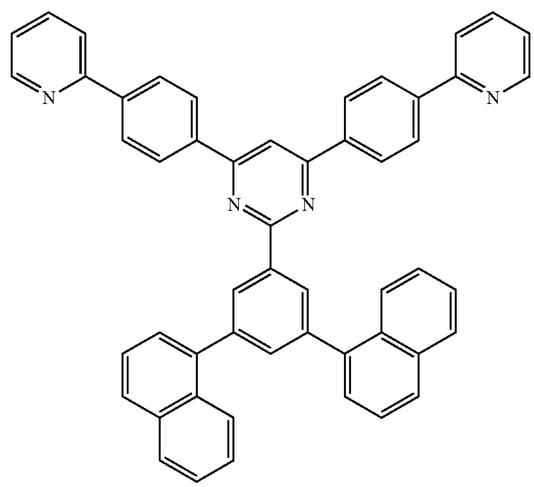
ET34
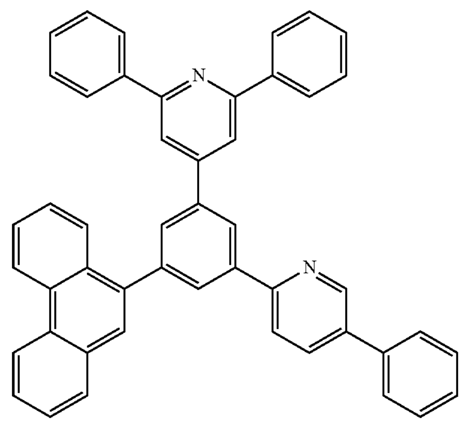

-continued

ET35

ET36

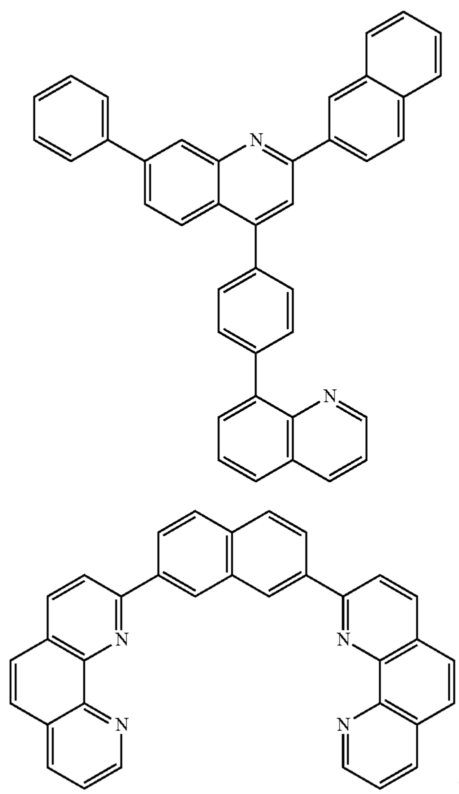

In some embodiments, the electron transport region ETR may include a metal halide such as LiF, NaCl, CsF, RbCl, RbI, CuI and/or KI, a lanthanide metal such as Yb, and/or a co-deposited material of the metal halide and the lanthanide metal. For example, the electron transport region ETR may include KI:Yb, RbI:Yb, LiF:Yb, etc., as the co-deposited material. In some embodiments, the electron transport region ETR may utilize a metal oxide such as $Li_2O$ and/or BaO, and/or 8-hydroxy-lithium quinolate (Liq). However, an embodiment of the present disclosure is not limited thereto. The electron transport region ETR also may be formed utilizing a mixture material of an electron transport material and an insulating organo metal (e.g., organometallic) salt. The organo metal salt may be a material having an energy band gap of about 4 eV or more. For example, the organo metal salt may include, one or more metal acetates, metal benzoates, metal acetoacetates, metal acetylacetonates, and/or metal stearates.

The electron transport region ETR may include at least one of 2,9-dimethyl-4,7-diphenyl-1,10-phenanthroline (BCP), diphenyl(4-(triphenylsilyl)phenyl)phosphine oxide (TSPO1) or 4,7-diphenyl-1,10-phenanthroline (Bphen) in addition to the aforementioned materials. However, an embodiment of the present disclosure is not limited thereto.

The electron transport region ETR may include the above-described compounds of the electron transport region in at least one from among an electron injection layer EIL, an electron transport layer ETL, and a hole blocking layer HBL.

When the electron transport region ETR includes the electron transport layer ETL, the thickness of the electron transport layer ETL may be from about 100 Å to about 1,000 Å, for example, from about 150 Å to about 500 Å. When the thickness of the electron transport layer ETL satisfies the above-described ranges, satisfactory electron transport properties may be obtained without substantial increase of a driving voltage. When the electron transport region ETR includes the electron injection layer EIL, the thickness of the electron injection layer EIL may be from about 1 Å to about 100 Å, or from about 3 Å to about 90 Å. When the thickness of the electron injection layer EIL satisfies the above described range, satisfactory electron injection properties may be obtained without inducing substantial increase of a driving voltage.

The second electrode EL2 is provided on the electron transport region ETR. The second electrode EL2 may be a common electrode. The second electrode EL2 may be a cathode or an anode, but an embodiment of the present disclosure is not limited thereto. For example, when the first electrode EL1 is an anode, the second electrode EL2 may be a cathode, and when the first electrode EL1 is a cathode, the second electrode EL2 may be an anode. The second electrode may include at least one selected among Ag, Mg, Cu, Al, Pt, Pd, Au, Ni, Nd, Ir, Cr, Li, Ca, LiF, Mo, Ti, W, In, Sn, Zn, compounds of two or more selected therefrom, mixtures of two or more selected therefrom, and/or oxides thereof.

The second electrode EL2 may be a transmissive electrode, a transflective electrode or a reflective electrode. When the second electrode EL2 is the transmissive electrode, the second electrode EL2 may include a transparent metal oxide, for example, ITO, IZO, ZnO, ITZO, etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca (stacked structure of LiF and Ca), LiF/Al (stacked structure of LiF and Al), Mo, Ti, Yb, W, compounds thereof, or mixtures thereof (for example, AgMg, AgYb, and/or MgYb). In some embodiments, the second electrode EL2 may have a multilayered structure including a reflective layer or a transflective layer formed utilizing the above-described materials and a transparent conductive layer formed utilizing ITO, IZO, ZnO, ITZO, etc. For example, the second electrode EL2 may include the aforementioned metal materials, combinations of two or more metal materials selected from the aforementioned metal materials, and/or oxides of the aforementioned metal materials.

In some embodiments, the second electrode EL2 may be connected with an auxiliary electrode. When the second electrode EL2 is connected with the auxiliary electrode, the resistance of the second electrode EL2 may decrease.

In some embodiments, on the second electrode EL2 in the light emitting element ED of an embodiment, a capping layer CPL may be further disposed. The capping layer CPL may include a multilayer or a single layer.

In an embodiment, the capping layer CPL may be an organic layer or an inorganic layer. For example, when the capping layer CPL includes an inorganic material, the inorganic material may include an alkali metal compound such as LiF, an alkaline earth metal compound such as $MgF_2$, SiON, SiNx, SiOy, etc.

For example, when the capping layer CPL includes an organic material, the organic material may include α-NPD, NPB, TPD, m-MTDATA, $Alq_3$, CuPc, N4,N4,N4',N4'-tetra (biphenyl-4-yl) biphenyl-4,4'-diamine (TPD15), 4,4',4"-tris (carbazol sol-9-yl) triphenylamine (TCTA), etc., and/or may include an epoxy resin, and/or an acrylate such as methacrylate. In some embodiments, a capping layer CPL may include at least one from among Compounds P1 to P5, but an embodiment of the present disclosure is not limited thereto.

P1

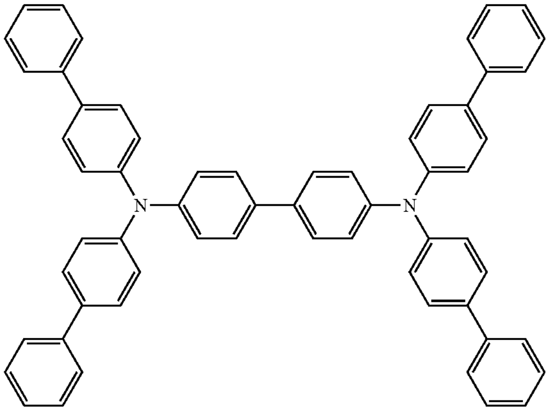

P2

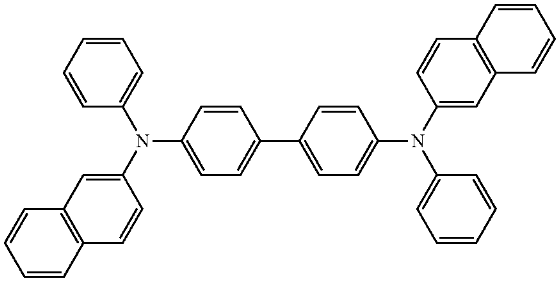

P3

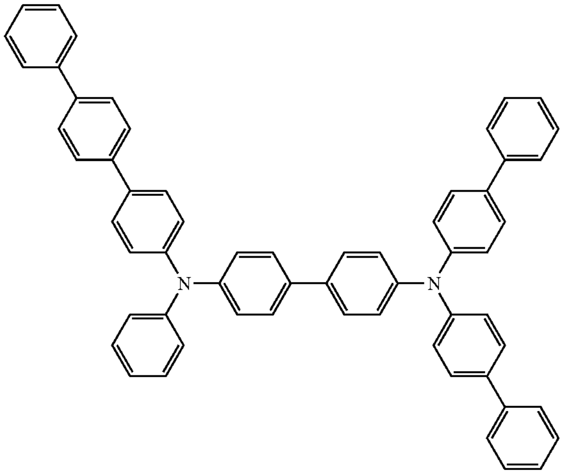

P4

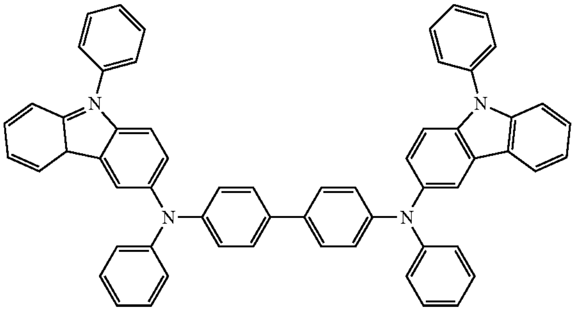

-continued

P5

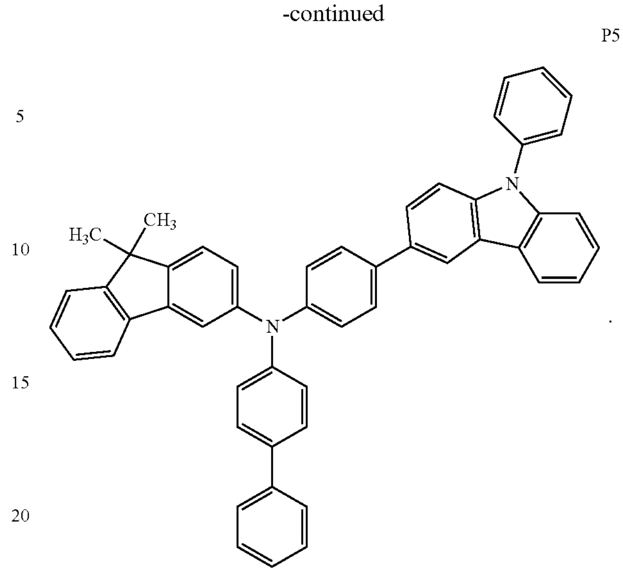

In some embodiments, the refractive index of the capping layer CPL may be about 1.6 or more. For example, the refractive index of the capping layer CPL with respect to light in a wavelength range of about 550 nm to about 660 nm may be about 1.6 or more.

FIG. 7 to FIG. 10 are each a cross-sectional view of display apparatuses according to embodiments. In the explanation on the display apparatuses of embodiments, referring to FIG. 7 to FIG. 10, the overlapping parts with the explanation on FIG. 1 to FIG. 6 will not be explained again, and the different features will be mainly explained.

Figure 7:
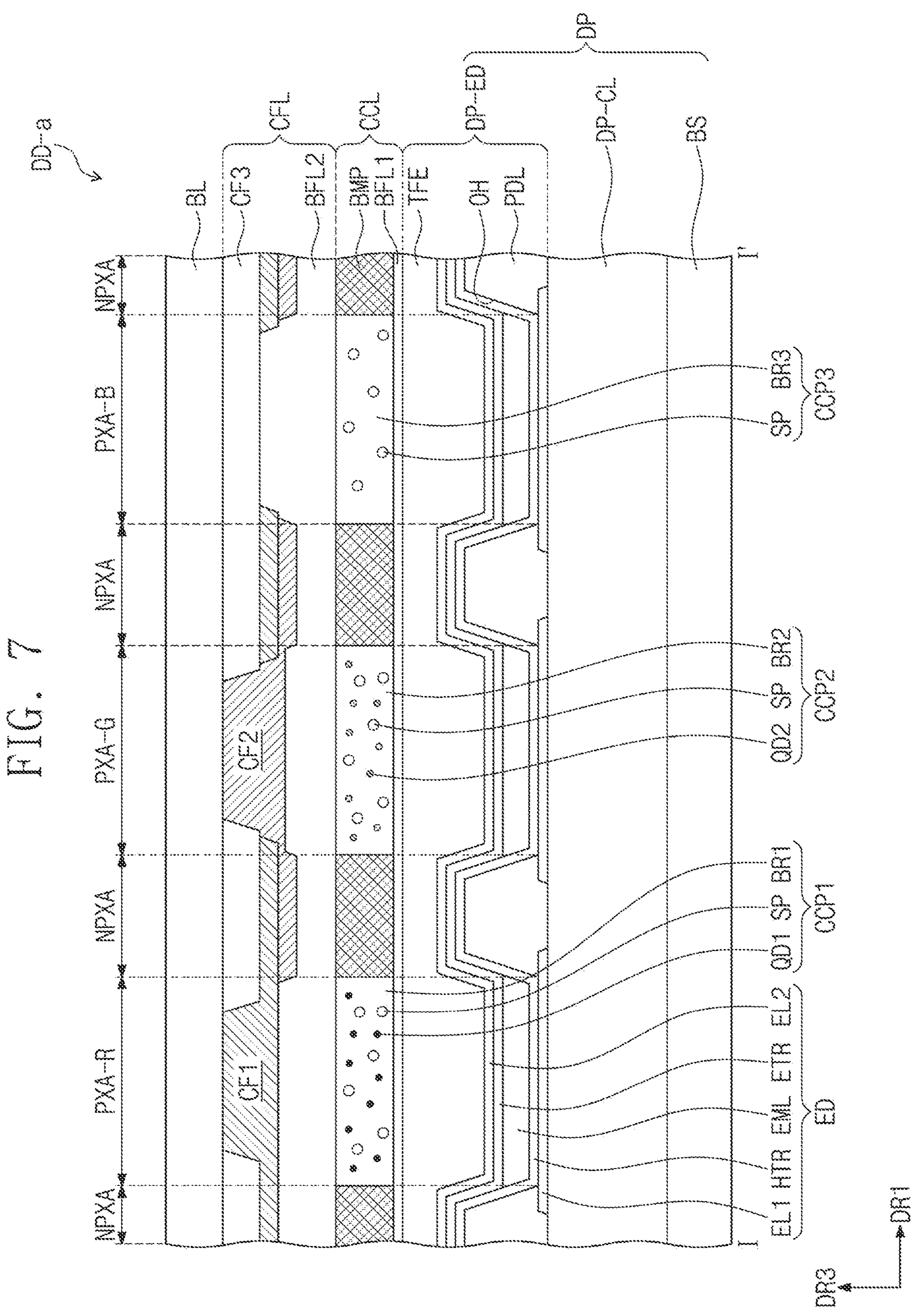
FIG. 7 is a cross-sectional view showing a display apparatus according to an embodiment.

Referring to FIG. 7, a display apparatus DD-a according to an embodiment may include a display panel DP including a display element layer DP-ED, a light controlling layer CCL disposed on the display panel DP, and a color filter layer CFL.

In an embodiment shown in FIG. 7, the display panel DP includes a base layer BS, a circuit layer DP-CL provided on the base layer BS and a display element layer DP-ED, and the display element layer DP-ED may include a light emitting element ED.

The light emitting element ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. In some embodiments, the same structures of the light emitting elements of FIG. 3 to FIG. 6 may be applied to the structure of the light emitting element ED shown in FIG. 7.

The emission layer EML of the light emitting element ED included in the display apparatus DD-a according to an embodiment may include at least one from among the second compound, the third compound and the fourth compound, and the first compound of an embodiment, described above.

Referring to FIG. 7, the emission layer EML may be disposed in an opening part OH defined in a pixel definition layer PDL. For example, the emission layer EML divided by the pixel definition layer PDL and correspondingly provided to each of luminous areas PXA-R, PXA-G and PXA-B may be to emit light in substantially the same wavelength region. In the display apparatus DD-a of an embodiment, the emission layer EML may be to emit blue light. In some embodiments, different from the drawings, in an embodiment, the emission layer EML may be provided as a common layer for all luminous areas PXA-R, PXA-G and PXA-B.

The light controlling layer CCL may be disposed on the display panel DP. The light controlling layer CCL may include a light converter. The light converter may be a quantum dot or a phosphor. The light converter may transform the wavelength of light provided and then emit. For example, the light controlling layer CCL may be a layer including a quantum dot or a layer including a phosphor.

The light controlling layer CCL may include multiple light controlling parts CCP1, CCP2 and CCP3. The light controlling parts CCP1, CCP2 and CCP3 may be separated from one another.

Referring to FIG. 7, a partition pattern BMP may be disposed between the separated light controlling parts CCP1, CCP2 and CCP3, but an embodiment of the present disclosure is not limited thereto. In FIG. 7, the partition pattern BMP is shown to not overlap with the light controlling parts CCP1, CCP2 and CCP3, but in some embodiments, at least a portion of the edge of the light controlling parts CCP1, CCP2 and CCP3 may overlap with the partition pattern BMP.

The light controlling layer CCL may include a first light controlling part CCP1 including a first quantum dot QD1 converting a first color light provided from the light emitting element ED into a second color light, a second light controlling part CCP2 including a second quantum dot QD2 converting the first color light into a third color light, and a third light controlling part CCP3 transmitting the first color light.

In an embodiment, the first light controlling part CCP1 may provide red light which is the second color light, and the second light controlling part CCP2 may provide green light which is the third color light. The third color controlling part CCP3 may be to transmit and provide blue light which is the first color light provided from the light emitting element ED. For example, the first quantum dot QD1 may be a red quantum dot, and the second quantum dot QD2 may be a green quantum dot. The quantum dots QD1 and QD2 may be the same as those described above.

In some embodiments, the light controlling layer CCL may further include a scatterer SP. The first light controlling part CCP1 may include the first quantum dot QD1 and the scatterer SP, the second light controlling part CCP2 may include the second quantum dot QD2 and the scatterer SP, and the third light controlling part CCP3 may not include (e.g., may exclude) any quantum dot but may include the scatterer SP.

The scatterer SP may be an inorganic particle. For example, the scatterer SP may include at least one from among $TiO_2$, ZnO, $Al_2O_3$, $SiO_2$, and hollow silica. The scatterer SP may include at least one from among $TiO_2$, ZnO, $Al_2O_3$, $SiO_2$, and hollow silica, or may be a mixture of two or more materials selected from among $TiO_2$, ZnO, $Al_2O_3$, $SiO_2$, and hollow silica.

Each of the first light controlling part CCP1, the second light controlling part CCP2, and the third light controlling part CCP3 may include a corresponding one of the base resins BR1, BR2 and BR3 for dispersing the quantum dots QD1 and QD2 and the scatterer SP. In an embodiment, the first light controlling part CCP1 may include the first quantum dot QD1 and the scatterer SP dispersed in the first base resin BR1, the second light controlling part CCP2 may include the second quantum dot QD2 and the scatterer SP dispersed in the second base resin BR2, and the third light controlling part CCP3 may include the scatterer particle SP dispersed in the third base resin BR3. The base resins BR1, BR2 and BR3 are mediums in which the quantum dots QD1 and QD2 and the scatterer SP are dispersed, and may be composed of one or more suitable resin compositions, which may be generally referred to as a binder. For example, the base resins BR1, BR2 and BR3 may each independently be one or more of acrylic resins, urethane-based resins, silicone-based resins, epoxy-based resins, etc. The base resins BR1, BR2 and BR3 may each be transparent resins. In an embodiment, the first base resin BR1, the second base resin BR2 and the third base resin BR3 may be the same or different from each other.

The light controlling layer CCL may include a barrier layer BFL1. The barrier layer BFL1 may play the role of blocking the penetration of moisture and/or oxygen (hereinafter, will be referred to as "humidity/oxygen"). The barrier layer BFL1 may be disposed on the light controlling parts CCP1, CCP2 and CCP3 to block or reduce the exposure of the light controlling parts CCP1, CCP2 and CCP3 to humidity/oxygen. In some embodiments, the barrier layer BFL1 may cover the light controlling parts CCP1, CCP2 and CCP3. In some embodiments, the barrier layer BFL2 may be provided between the light controlling parts CCP1, CCP2 and CCP3 and a color filter layer CFL (e.g., along the thickness direction).

The barrier layers BFL1 and BFL2 may include at least one inorganic layer. For example, the barrier layers BFL1 and BFL2 may be formed by including an inorganic material. For example, the barrier layers BFL1 and BFL2 may be formed by including silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, and/or a metal thin film for securing light transmittance. In some embodiments, the barrier layers BFL1 and BFL2 may further include an organic layer. The barrier layers BFL1 and BFL2 may be composed of a single layer or multiple layers.

In the display apparatus DD-a of an embodiment, the color filter layer CFL may be disposed on the light controlling layer CCL. For example, the color filter layer CFL may be disposed directly on the light controlling layer CCL. In this case, the barrier layer BFL2 may not be provided.

The color filter layer CFL may include filters CF1, CF2 and CF3. The color filter layer CFL may include a first filter CF1 for transmitting the second color light, a second filter CF2 for transmitting the third color light, and a third filter CF3 for transmitting the first color light. For example, the first filter CF1 may be a red filter, the second filter CF2 may be a green filter, and the third filter CF3 may be a blue filter. Each of the filters CF1, CF2 and CF3 may include a polymer photosensitive resin and a pigment and/or dye. The first filter CF1 may include a red pigment and/or dye, the second filter CF2 may include a green pigment and/or dye, and the third filter CF3 may include a blue pigment and/or dye. In some embodiments, an embodiment of the present disclosure is not limited thereto, and the third filter CF3 may not include (e.g., may exclude) any pigment or dye. The third filter CF3 may include a polymer photosensitive resin and not include any pigment or dye. The third filter CF3 may be transparent. The third filter CF3 may be formed utilizing a transparent photosensitive resin.

In some embodiments, in an embodiment, the first filter CF1 and the second filter CF2 may be yellow filters. The first filter CF1 and the second filter CF2 may be provided in one body without distinction (e.g., without being separated). In some embodiments, each of the first to third filters CF1, CF2 and CF3 may be disposed corresponding to a respective one selected from among a red luminous area PXA-R, a green luminous area PXA-G, and a blue luminous area PXA-B.

In some embodiments, the color filter layer CFL may include a light blocking part (BM). The color filter layer CFL may include the light blocking part (BM) disposed so as to overlap with the boundaries of the neighboring filters CF1, CF2 and CF3. The light blocking part (BM) may be a black matrix. The light blocking part (BM) may be formed by including an organic light blocking material and/or an inorganic light blocking material, including a black pigment and/or black dye. The light blocking part (BM) may divide the boundaries among adjacent filters CF1, CF2 and CF3. In some embodiments, the light blocking part (BM) may be formed as a blue filter.

On the color filter layer CFL, a base substrate BL may be disposed. The base substrate BL may be a member for providing a base surface on which the color filter layer CFL, the light controlling layer CCL, etc. are disposed. The base substrate BL may be a glass substrate, a metal substrate, a plastic substrate, etc. However, an embodiment of the present disclosure is not limited thereto, and the base substrate BL may be an inorganic layer, an organic layer or a composite material layer. In some embodiments, different from the drawing, the base substrate BL may not be provided.

Figure 8:
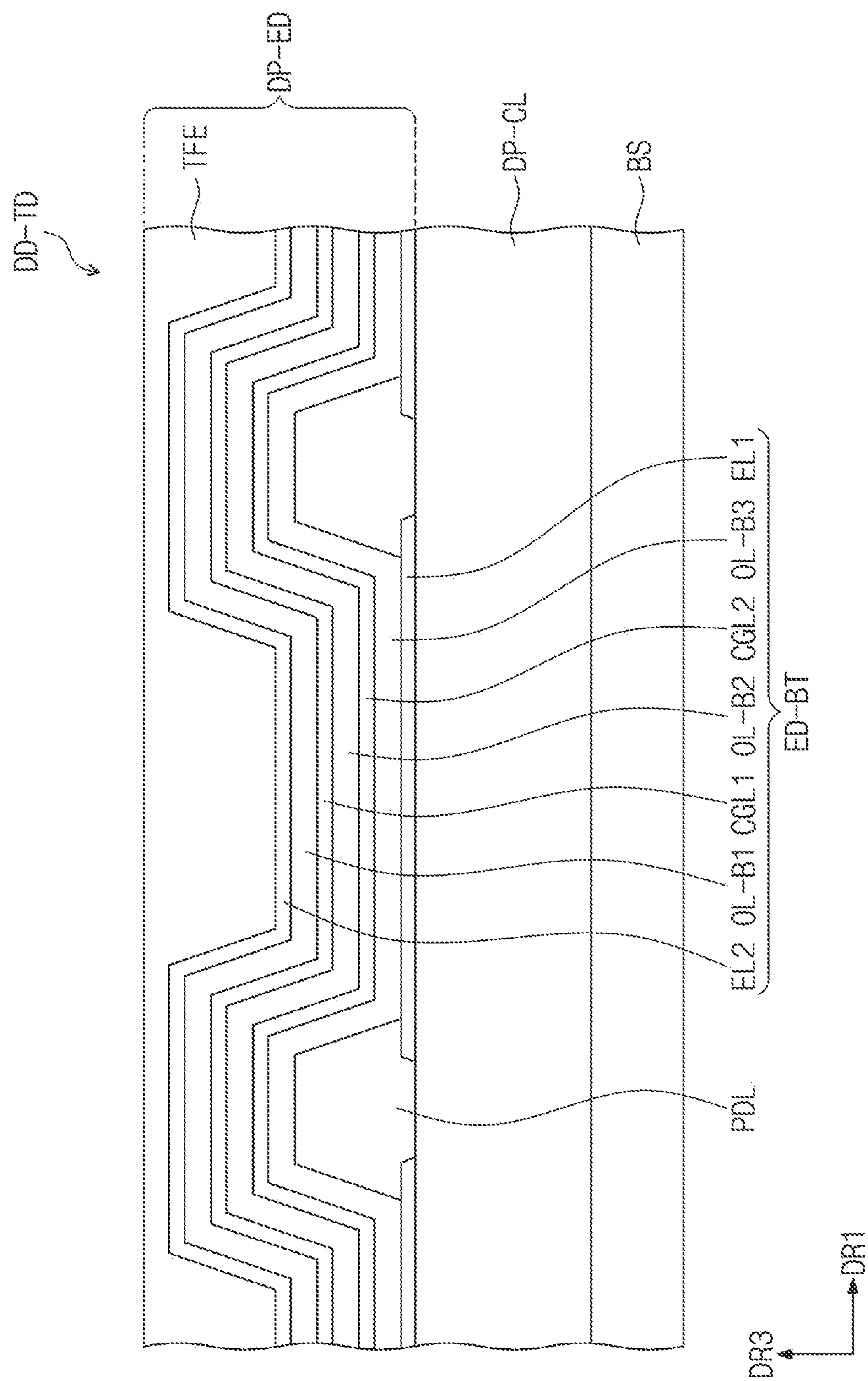
FIG. 8 is a cross-sectional view showing a display apparatus according to an embodiment.

FIG. 8 is a cross-sectional view showing a portion of the display apparatus according to an embodiment. In FIG. 8, the cross-sectional view of a portion corresponding to the display panel DP in FIG. 7 is shown. In a display apparatus DD-TD of an embodiment, the light emitting element ED-BT may include multiple light emitting structures OL-B1, OL-B2 and OL-B3. The light emitting element ED-BT may include oppositely disposed first electrode EL1 and second electrode EL2, and the multiple light emitting structures OL-B1, OL-B2 and OL-B3 stacked in the stated order in a thickness direction between the first electrode EL1 and the second electrode EL2. Each of the light emitting structures OL-B1, OL-B2 and OL-B3 may include an emission layer EML (FIG. 7), and a hole transport region HTR and an electron transport region ETR disposed with the emission layer EML (FIG. 7) therebetween.

For example, the light emitting element ED-BT included in the display apparatus DD-TD of an embodiment may be a light emitting element having a tandem structure including multiple emission layers.

In an embodiment shown in FIG. 8, light emitted from the light emitting structures OL-B1, OL-B2 and OL-B3 may all be blue light (i.e., each structure emits light in the blue wavelength region). However, an embodiment of the present disclosure is not limited thereto, and the wavelength regions of light emitted from the light emitting structures OL-B1, OL-B2 and OL-B3 may be different from each other. For example, the light emitting element ED-BT including the multiple light emitting structures OL-B1, OL-B2 and OL-B3 emitting light in different wavelength regions may be to emit white light (e.g., a combined white light).

Between neighboring light emitting structures OL-B1, OL-B2 and OL-B3, charge generating layers CGL1 and CGL2 may be disposed. The charge generating layers CGL1 and CGL2 may include a p-type or kind charge generating layer and/or an n-type or kind charge generating layer.

In at least one from among the light emitting structures OL-B1, OL-B2 and OL-B3, included in the display apparatus DD-TD of an embodiment, the first compound of an embodiment, and at least one from among the second compound, the third compound and the fourth compound may be included.

Figure 9:
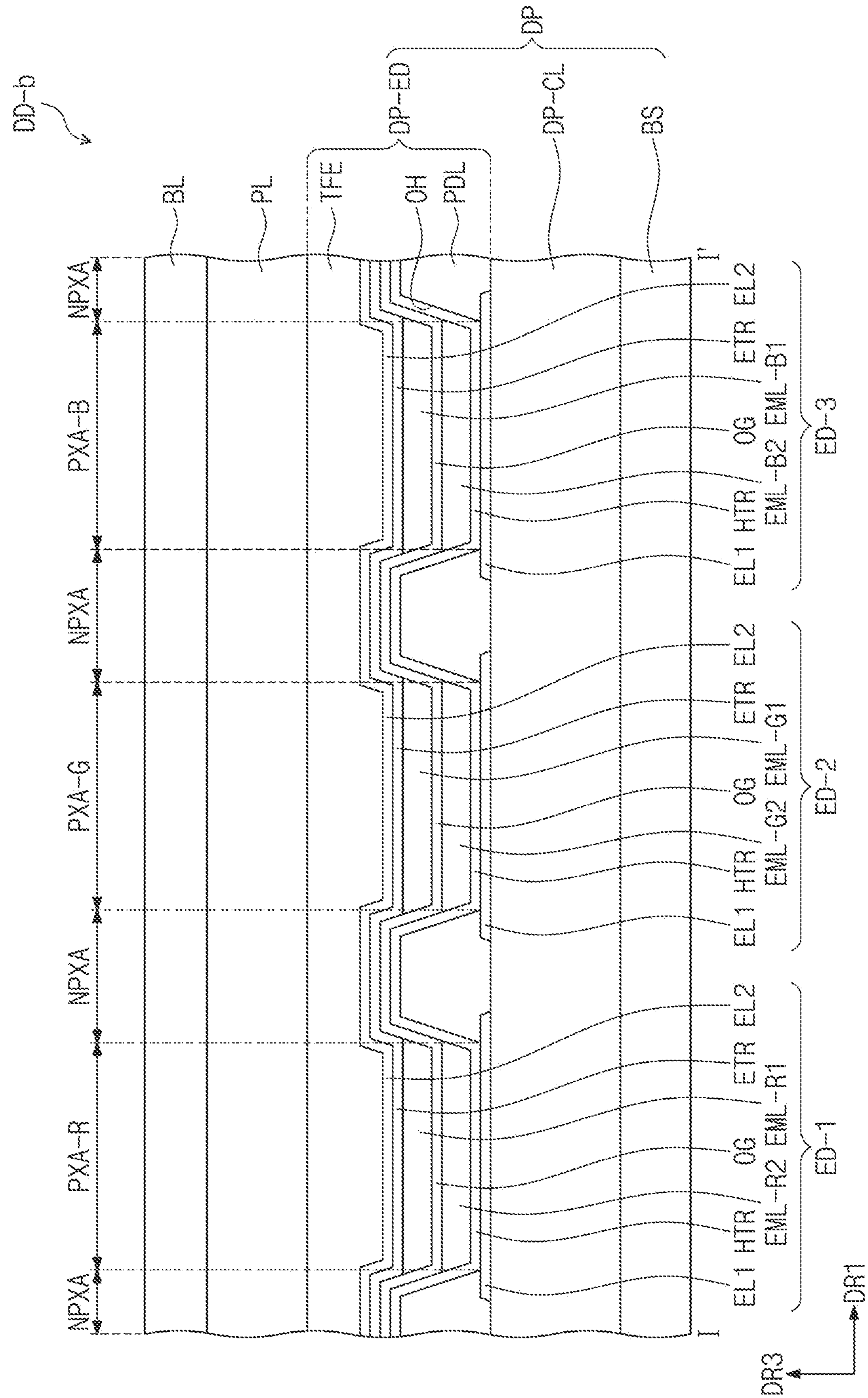
FIG. 9 is a cross-sectional view showing a display apparatus according to an embodiment.

Referring to FIG. 9, a display apparatus DD-b according to an embodiment may include light emitting elements ED-1, ED-2 and ED-3, each formed by stacking two emission layers over each other. Compared to the display apparatus DD of an embodiment, shown in FIG. 2, an embodiment shown in FIG. 9 is different in that the first to third light emitting elements ED-1, ED-2 and ED-3 each include two emission layers stacked in a thickness direction. In the first to third light emitting elements ED-1, ED-2 and ED-3, the two emission layers may be to emit light in substantially the same wavelength region.

The first light emitting element ED-1 may include a first red emission layer EML-R1 and a second red emission layer EML-R2. The second light emitting element ED-2 may include a first green emission layer EML-G1 and a second green emission layer EML-G2. In addition, the third light emitting element ED-3 may include a first blue emission layer EML-B1 and a second blue emission layer EML-B2. Between the first red emission layer EML-R1 and the second red emission layer EML-R2, between the first green emission layer EML-G1 and the second green emission layer EML-G2, and between the first blue emission layer EML-B1 and the second blue emission layer EML-B2, an emission auxiliary part OG may be disposed.

The emission auxiliary part OG may include a single layer or a multilayer. The emission auxiliary part OG may include a charge generating layer. For example, the emission auxiliary part OG may include an electron transport region, a charge generating layer, and a hole transport region stacked in the stated order. The emission auxiliary part OG may be provided as a common layer in all of the first to third light emitting elements ED-1, ED-2 and ED-3. However, an embodiment of the present disclosure is not limited thereto, and the emission auxiliary part OG may be patterned and provided in an opening part OH defined in the pixel definition layer PDL.

The first red emission layer EML-R1, the first green emission layer EML-G1 and the first blue emission layer EML-B1 may be (e.g., may each be) disposed between the electron transport region ETR and the emission auxiliary part OG. The second red emission layer EML-R2, the second green emission layer EML-G2 and the second blue emission layer EML-B2 may be (e.g., may each be) disposed between the emission auxiliary part OG and the hole transport region HTR.

For example, the first light emitting element ED-1 may include a first electrode EL1, a hole transport region HTR, a second red emission layer EML-R2, an emission auxiliary part OG, a first red emission layer EML-R1, an electron transport region ETR, and a second electrode EL2, stacked in the stated order. The second light emitting element ED-2 may include a first electrode EL1, a hole transport region HTR, a second green emission layer EML-G2, an emission auxiliary part OG, a first green emission layer EML-G1, an electron transport region ETR, and a second electrode EL2, stacked in the stated order. The third light emitting element ED-3 may include a first electrode EL1, a hole transport region HTR, a second blue emission layer EML-B2, an emission auxiliary part OG, a first blue emission layer EML-B1, an electron transport region ETR, and a second electrode EL2, stacked in the stated order.

In some embodiments, an optical auxiliary layer PL may be disposed on the display element layer DP-ED. The optical auxiliary layer PL may include a polarization layer. The optical auxiliary layer PL may be disposed on a display panel DP and may control reflected light at the display panel DP by external light. The optical auxiliary layer PL may not be provided in the display apparatus according to an embodiment.

At least one emission layer included in the display apparatus DD-b of an embodiment, shown in FIG. 9, may include the polycyclic compound of an embodiment. For example, at least one from among the first blue emission layer EML-B1 and the second blue emission layer EML-B2 may include the polycyclic compound of an embodiment.

Figure 10:
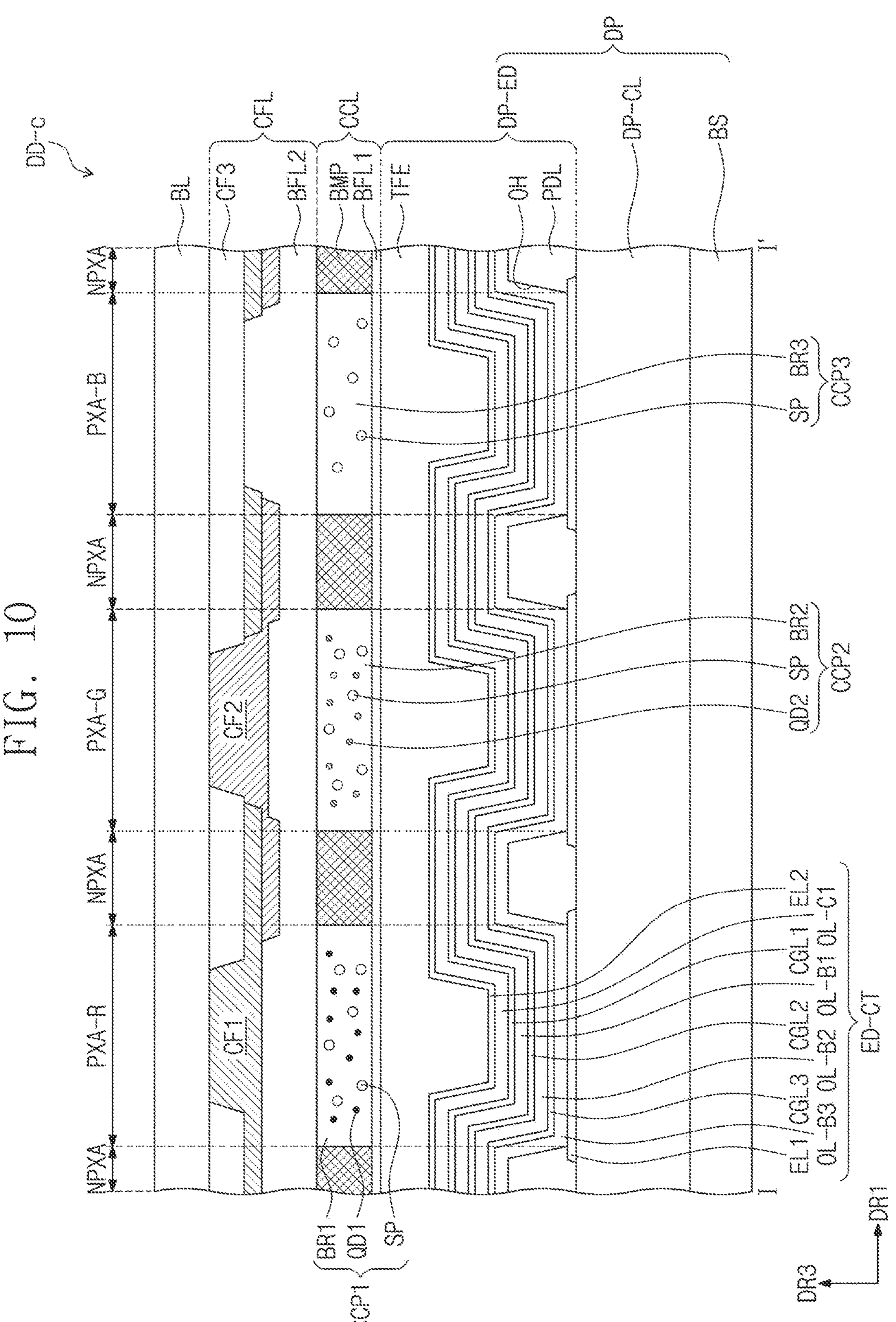
FIG. 10 is a cross-sectional view showing a display apparatus according to an embodiment.

Different from FIG. 8 and FIG. 9, a display apparatus DD-c in FIG. 10 is shown to include four light emitting structures OL-B1, OL-B2, OL-B3 and OL-C1. A light emitting element ED-CT may include oppositely disposed first electrode EL1 and second electrode EL2, and first to fourth light emitting structures OL-B1, OL-B2, OL-B3 and OL-C1 stacked in the stated order in a thickness direction between the first electrode EL1 and the second electrode EL2. Between the first to fourth light emitting structures OL-B1, OL-B2, OL-B3 and OL-C1, charge generating layers CGL1, CGL2 and CGL3 may be disposed. Among the four light emitting structures, the first to third light emitting structures OL-B1, OL-B2 and OL-B3 may be to emit blue light, and the fourth light emitting structure OL-C1 may be to emit green light. However, an embodiment of the present disclosure is not limited thereto, and the first to fourth light emitting structures OL-B1, OL-B2, OL-B3 and OL-C1 may be to emit light of different wavelengths (e.g., different wavelength regions).

Charge generating layers CGL1, CGL2 and CGL3 disposed among neighboring light emitting structures OL-B1, OL-B2, OL-B3 and OL-C1 may include a p-type or kind charge generating layer and/or an n-type or kind charge generating layer.

In at least one from among the light emitting structures OL-B1, OL-B2, OL-B3 and OL-C1, included in the display apparatus DD-c of an embodiment, the above-described first compound may be included, and at least one from among the second compound, the third compound and the fourth compound may also be included.

The light emitting element ED according to an embodiment of the present disclosure may include the first compound of an embodiment in at least one from among a hole transport region HTR, an emission layer EML, and an electron transport region ETR, disposed between a first electrode EL1 and a second electrode EL2, or in a capping layer CPL.

For example, the first compound according to an embodiment may be included in the emission layer EML of the light emitting element ED of an embodiment, and the light emitting element of an embodiment may show long-lifetime characteristics.

The first compound of an embodiment includes a BNB structure in which two boron atoms are bonded focusing on one nitrogen atom (e.g., two boron atoms are bonded to the same nitrogen atom) and has a substituent which may increase oscillator strength (f), and when utilized as a light emitting material, may increase the lifetime (e.g., lifespan) of a light emitting element and improve the efficiency of the light emitting element.

Hereinafter, referring to embodiments (Examples) and comparative embodiments (Comparative Examples), the polycyclic compound utilized as the first compound according to an embodiment and the light emitting element according to an embodiment of the present disclosure will be explained in more detail. In addition, the embodiments (examples) below are illustrations to assist the understanding of the present disclosure, but the scope of the present disclosure is not limited thereto.

EXAMPLES

1. Synthesis of Polycyclic Compounds of Embodiments

First, the synthetic method of the polycyclic compound according to an embodiment will be explained in more detail by illustrating the synthetic methods of Compound A-1, Compound A-20, and Compound B-13. In addition, the synthetic methods of the polycyclic compounds explained hereinafter are embodiments, and the synthetic method of the polycyclic compound according to an embodiment of the present disclosure is not limited to the embodiments below.

(1) Synthesis of Compound A-1

Polycyclic Compound A-1 according to an embodiment may be synthesized, for example, by the steps (acts) of Reaction 1.

[Reaction 1]

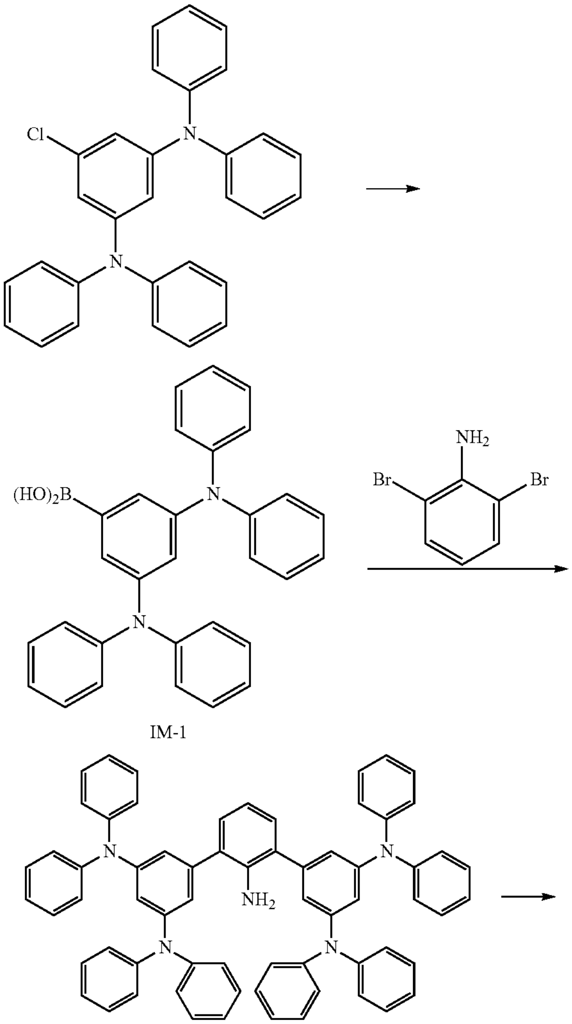

IM-1

IM-2

-continued

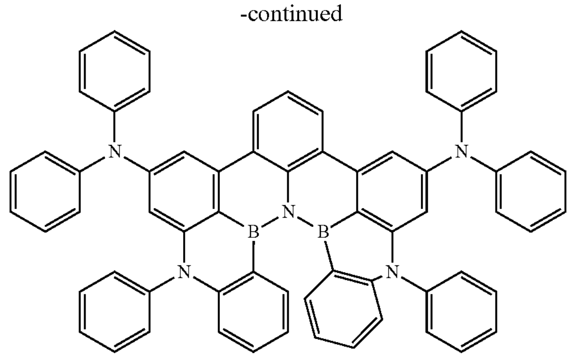

A-1

1) A diethyl ether (250 mL) solution including 5-chloro-N1,N1,N3,N3-tetraphenylbenzene-1,3-diamine (15 g) was cooled to about −78° C., and 46 mL of a 1.60 M, t-BuLi pentane solution was added thereto dropwisely. After stirring at about 0° C. for about 3 hours, the reaction solution was cooled to −78° C. again, and $B(OMe)_3$ (9.3 mL) was added thereto dropwisely. After stirring at room temperature for about 3 hours, the reaction solution was poured into a 1N HCl aqueous solution, and a target material was extracted with diethyl ether, dried over magnesium sulfate and concentrated under a reduced pressure. The mixture thus obtained was purified by silica gel column chromatography to obtain 7.9 g of Intermediate Compound IM-1 (yield 52%).

2) A solution of toluene (100 mL), ethanol (20 mL) and water (20 mL), including Intermediate Compound IM-1 (7.9 g) obtained above, 2,6-dibromoaniline (1.76 g), potassium carbonate (8 g), and $Pd(PPh_3)_4$ (400 mg) was heated and refluxed under heating conditions of about 90° C. for about 3 hours. After cooling to room temperature, the reaction solution was poured into water. A target material was extracted with toluene, dried over magnesium sulfate and concentrated under a reduced pressure. The mixture thus obtained was purified by silica gel column chromatography to obtain 4.2 g of Intermediate Compound IM-2 (yield 65%).

3) An o-dichlorobenzene (50 mL) solution including Intermediate Compound IM-2 (3 g) obtained above was cooled to about 0° C., and $BBr_3$ (1.25 mL) was added thereto dropwisely, followed by heating to about 150° C. and stirring for about 7 hours. After cooling to room temperature, DIPEA was poured into the reaction solution. A target material was extracted with toluene, dried over magnesium sulfate and concentrated under a reduced pressure. The mixture thus obtained was purified by silica gel column chromatography to obtain 2 g of Target Compound A-1 (yield 67%).

In addition, by FAB-MS measurement, the molecular weight of Target Compound A-1 was confirmed to be 930. Target Compound A-1 was additionally subjected to sublimation purification and utilized as a specimen for evaluation.

(2) Synthesis of Compound A-20

Polycyclic Compound A-20 according to an embodiment may be synthesized, for example, by the steps (acts) of Reaction 2.

[Reaction 2]

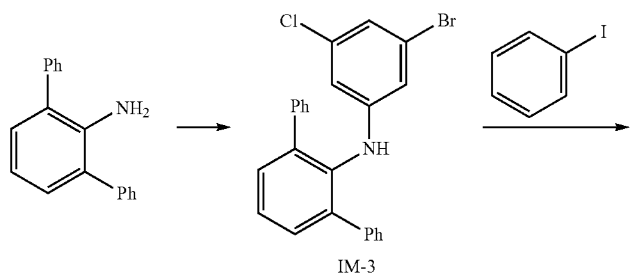

IM-3

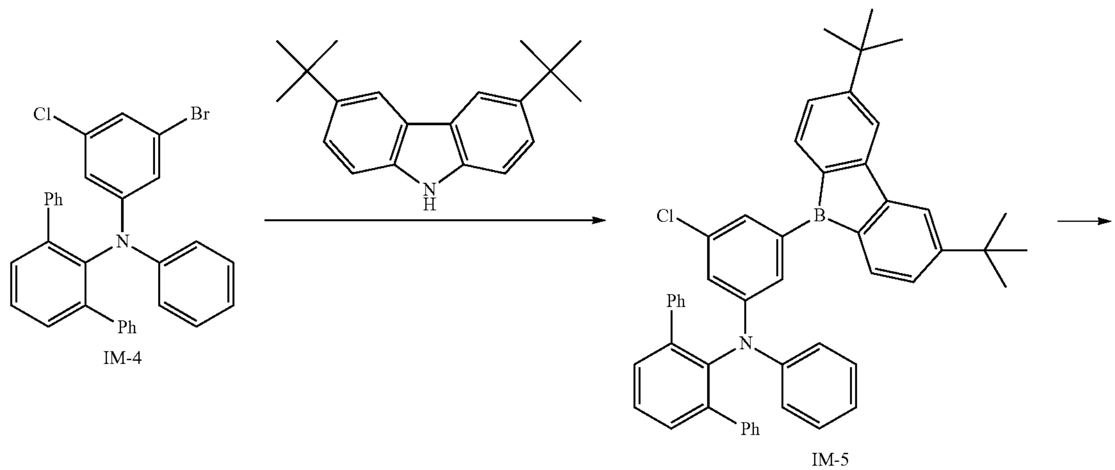

IM-4

IM-5

-continued

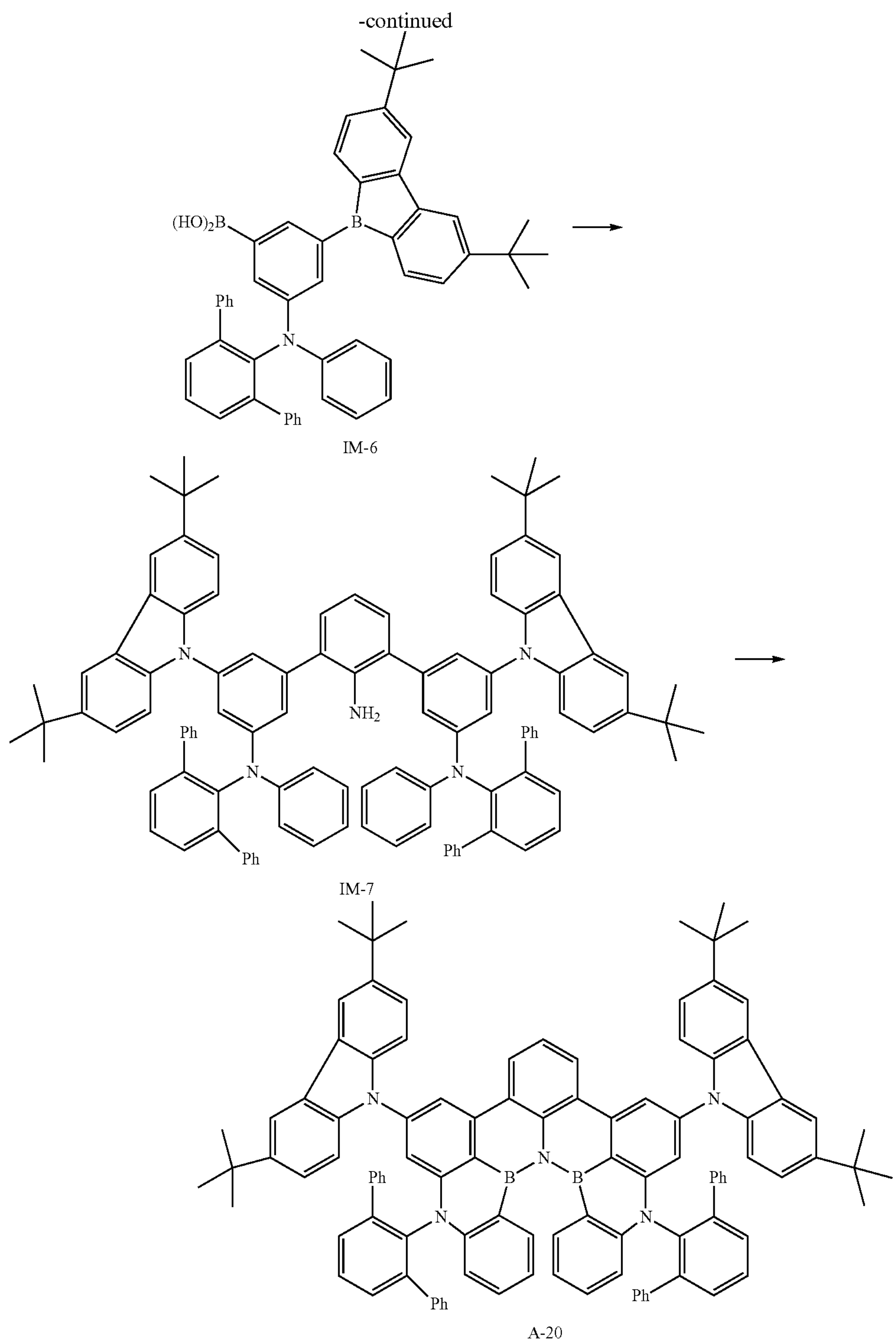

IM-6

IM-7

A-20

1) A toluene (700 mL) solution including 2,6-diphenylaniline (25 g), 1,3-dibromo-5-chlorobenzene (30.3 g), sodium butoxide (15 g), $Pd_2(dba)_3$ (1 g) and XantPhos (1.2 g) was heated and refluxed under oil bath heating conditions for about 2 hours. After cooling to room temperature, the reaction solution was poured into water. A target material was extracted with toluene, dried over magnesium sulfate and concentrated under a reduced pressure. The mixture thus obtained was purified by silica gel column chromatography to obtain 35 g of Intermediate Compound IM-3 (yield 79%).

2) A mixture including Intermediate Compound IM-3 (35 g) obtained above, iodobenzene (400 g), CuI (3.5 g), and potassium carbonate (25 g) was stirred under heating conditions of about 200° C. for about 15 hours. After cooling to room temperature, the reaction solution was poured into water. A target material was extracted with dichloromethane, dried over magnesium sulfate and concentrated under a reduced pressure. The mixture thus obtained was purified by silica gel column chromatography to obtain 27 g of Intermediate Compound IM-4 (yield 65%).

3) A toluene (300 mL) solution including Intermediate Compound IM-4 (27 g), 3,6-di-tert-butyl-9H-carbazole (15 g), sodium butoxide (30 g), $Pd_2(dba)_3$ (0.5 g) and $PH(tBu)_3/BF_4$ (0.6 g) was heated and refluxed under oil bath heating conditions for about 2 hours. After cooling to room temperature, the reaction solution was poured into water. A target material was extracted with toluene, dried over magnesium sulfate and concentrated under a reduced pressure. The mixture thus obtained was purified by silica gel column chromatography to obtain 26 g of Intermediate Compound IM-5 (yield 70%).

4) A diethyl ether (500 mL) solution including Intermediate Compound IM-5 (26 g) obtained above was cooled to about −78° C., and 50 mL of a 1.60 M, t-BuLi pentane solution was added thereto dropwisely. After stirring at about 0° C. for about 3 hours, the reaction solution was cooled to −78° C. again, and $B(OMe)_3$ (10 mL) was added thereto dropwisely. After stirring at room temperature for about 3 hours, the reaction solution was poured into a 1N HCl aqueous solution, and a target material was extracted with diethyl ether, dried over magnesium sulfate and concentrated under a reduced pressure. The mixture thus obtained was purified by silica gel column chromatography to obtain 14.5 g of Intermediate Compound IM-6 (yield 55%).

5) A solution of toluene (120 mL), ethanol (30 mL) and water (30 mL), including Intermediate Compound IM-6 (14.5 g) obtained above, 2,6-dibromoaniline (2 g), potassium carbonate (6.7 g), and $Pd(PPh_3)_4$ (350 mg) was heated and refluxed under heating conditions of about 90° C. for about 3 hours. After cooling to room temperature, the reaction solution was poured into water. A target material was extracted with toluene, dried over magnesium sulfate and concentrated under a reduced pressure. The mixture thus obtained was purified by silica gel column chromatography to obtain 6.1 g of Intermediate Compound IM-7 (yield 53%).

6) An o-dichlorobenzene (50 mL) solution including Intermediate Compound IM-7 (3 g) obtained above was cooled to about 0° C., and $BBr_3$ (1.25 mL) was added thereto dropwisely, followed by heating to about 150° C. and stirring for about 7 hours. After cooling to room temperature, DIPEA was poured into the reaction solution. A target material was extracted with toluene, dried over magnesium sulfate and concentrated under a reduced pressure. The mixture thus obtained was purified by silica gel column chromatography to obtain 1.1 g of Target Compound A-20 (yield 37%).

In addition, by FAB-MS measurement, the molecular weight of Target Compound A-20 was confirmed to be 1454. Target Compound A-20 was additionally subjected to sublimation purification and utilized as a specimen for evaluation.

(3) Synthesis of Compound B-13

Polycyclic Compound B-13 according to an embodiment may be synthesized, for example, by the steps (acts) of Reaction 3.

[Reaction 3]

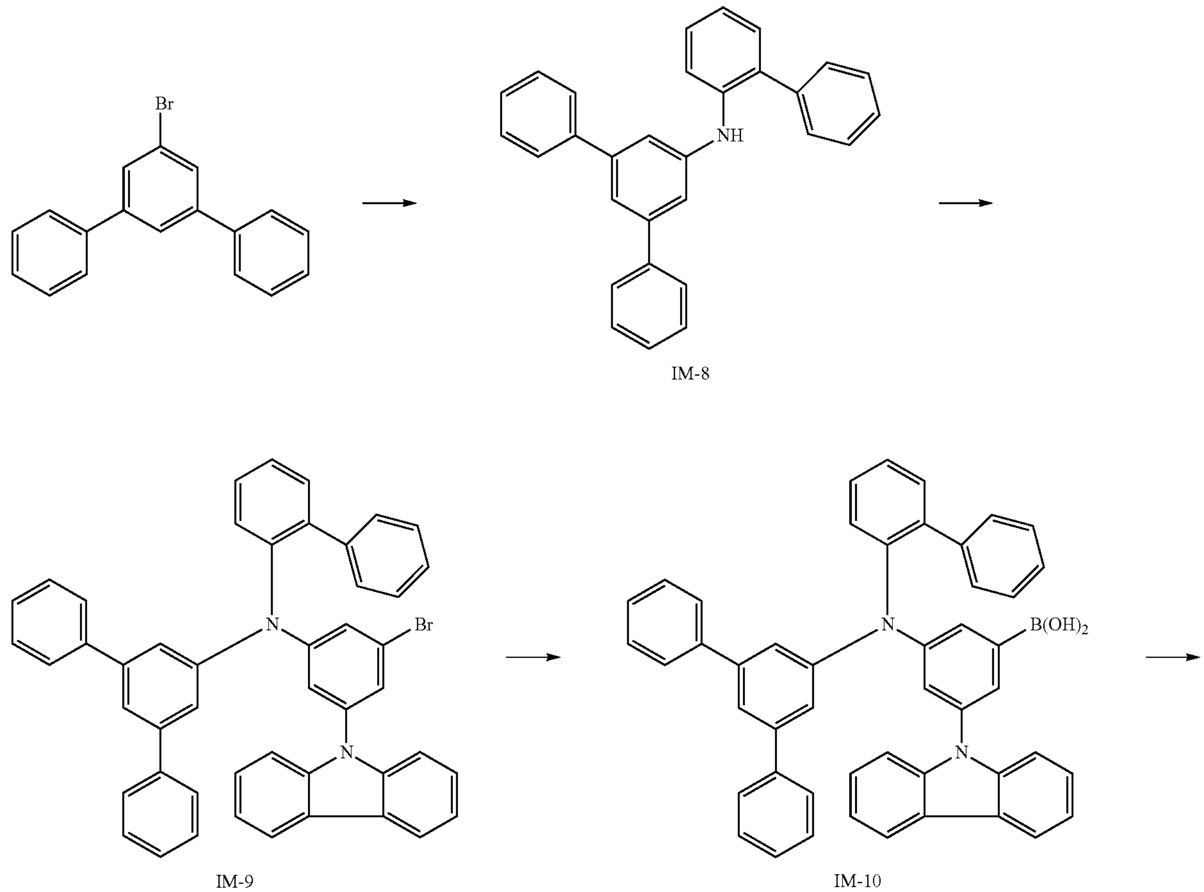

IM-8

IM-9

IM-10

-continued

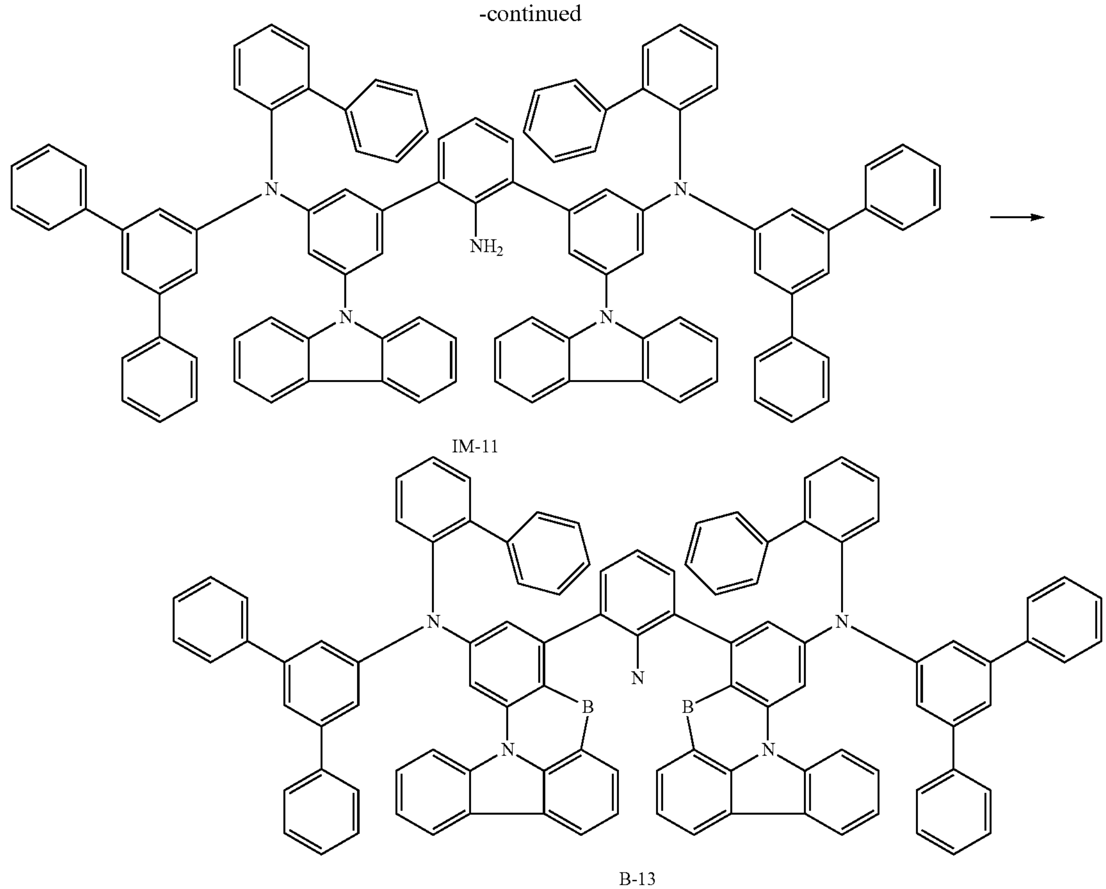

IM-11

B-13

1) A toluene (400 mL) solution including 1-bromo-3,5-diphenylbenzene (25 g), 2-aminobiphenyl (13.7 g), sodium butoxide (23.3 g), $Pd_2(dba)_3$ (0.74 g) and $PH(tBu)_3/BF_4$ (0.94 g) was heated and refluxed under oil bath heating conditions for about 3 hours. After cooling to room temperature, the reaction solution was poured into water. A target material was extracted with toluene, dried over magnesium sulfate and concentrated under a reduced pressure. The mixture thus obtained was purified by silica gel column chromatography to obtain 15 g of Intermediate Compound IM-8 (yield 47%).

2) A toluene (150 mL) solution including Intermediate Compound IM-8 (15 g), 9-(3,5-dibromophenyl)-9H-carbazole (7.7 g), sodium butoxide (8 g), $Pd_2(dba)_3$ (0.65 g) and $PH(tBu)_3/BF_4$ (0.8 g) was heated and refluxed under oil bath heating conditions for about 2 hours. After cooling to room temperature, the reaction solution was poured into water. A target material was extracted with toluene, dried over magnesium sulfate and concentrated under a reduced pressure. The mixture thus obtained was purified by silica gel column chromatography to obtain 8.3 g of Intermediate Compound IM-9 (yield 60%).

3) A diethyl ether (80 mL) solution including Intermediate Compound IM-9 (8.3 g) was cooled to about −78° C., and 18 mL of a 1.60 M, t-BuLi hexane solution was added thereto dropwisely. After stirring at about 0° C. for about 3 hours, the reaction solution was cooled to −78° C. again, and $B(OMe)_3$ (3.2 mL) was added thereto dropwisely. After stirring at room temperature for about 3 hours, the reaction solution was poured to a 1N HCl aqueous solution, and a target material was extracted with diethyl ether, dried over magnesium sulfate and concentrated under a reduced pressure. The mixture thus obtained was purified by silica gel column chromatography to obtain 5 g of Intermediate Compound IM-10 (yield 63%).

4) A solution of toluene (80 mL), ethanol (20 mL) and water (20 mL), including Intermediate Compound IM-10 (5 g) obtained above, 2,6-dibromoaniline (0.9 g), potassium carbonate (3 g), and $Pd(PPh_3)_4$ (200 mg) was heated and refluxed under heating conditions of about 90° C. for about 5 hours. After cooling to room temperature, the reaction solution was poured into water. A target material was extracted with toluene, dried over magnesium sulfate and concentrated under a reduced pressure. The mixture thus obtained was purified by silica gel column chromatography to obtain 3.1 g of Intermediate Compound IM-11 (yield 63%).

5) An o-dichlorobenzene (50 mL) solution including Intermediate Compound IM-11 (3.1 g) obtained above was cooled to about 0° C., and $BBr_3$ (1.5 mL) was added thereto dropwisely, followed by heating to about 150° C. and stirring for about 7 hours. After cooling to room temperature, DIPEA was poured into the reaction solution. A target material was extracted with toluene, dried over magnesium sulfate and concentrated under a reduced pressure. The mixture thus obtained was purified by silica gel column chromatography to obtain 0.8 g of Target Compound B-13 (yield 25%).

In addition, by FAB-MS measurement, the molecular weight of Target Compound B-13 was confirmed to be 1382. Target Compound B-13 was additionally subjected to sublimation purification and was utilized as a specimen for evaluation.

2. Manufacture and Evaluation of Light Emitting Elements

Evaluation on light emitting elements including the compounds of the Examples and Comparative Examples was conducted by a method below. A method for manufacturing a light emitting element for element evaluation is described below.

For example, light emitting elements of Example 1 to Example 31 were manufactured utilizing Example Compounds A-1, A-20 and B-13, respectively, as dopant materials of the emission layers. In addition, Comparative Example 1 to Comparative Example 3 are light emitting elements manufactured utilizing Comparative Compounds R1 to R4, respectively, as dopant materials of the emission layers.

[Example Compounds]

A-1

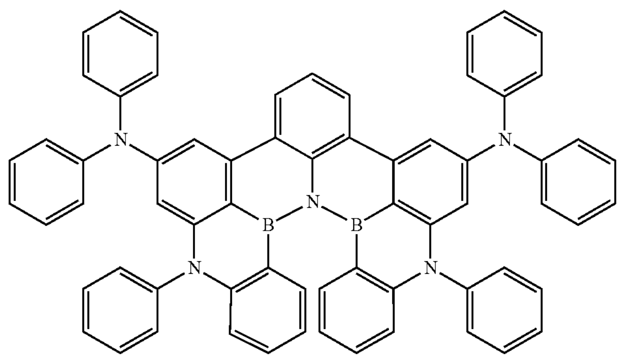

A-20

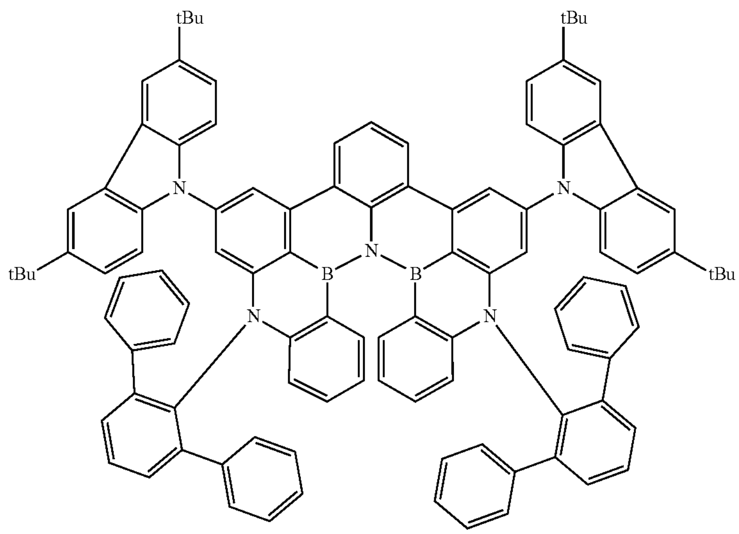

B-13

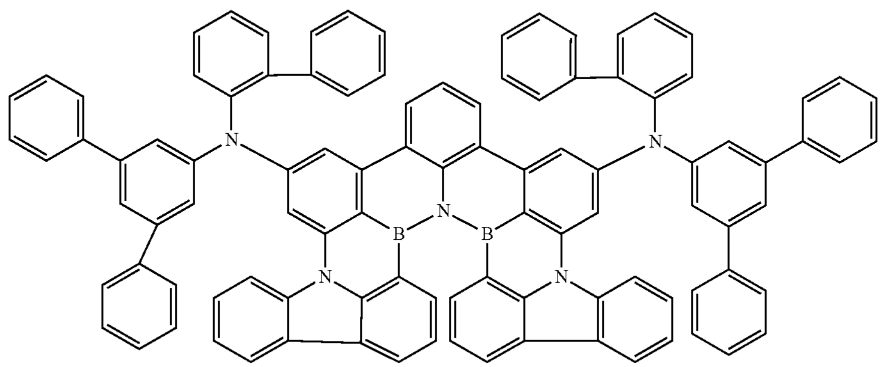

[Comparative Compounds]

R1

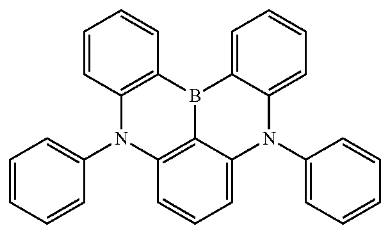

R2

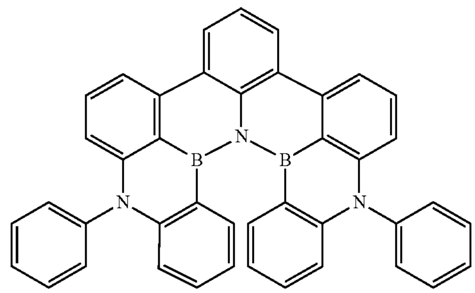

R3

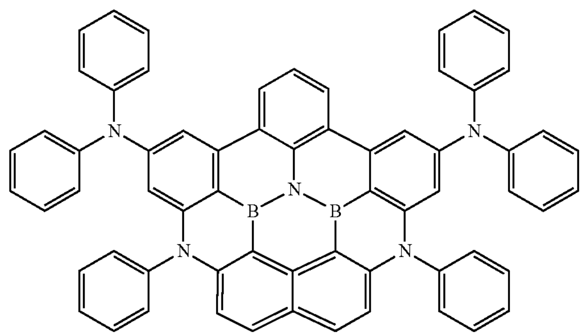

R4

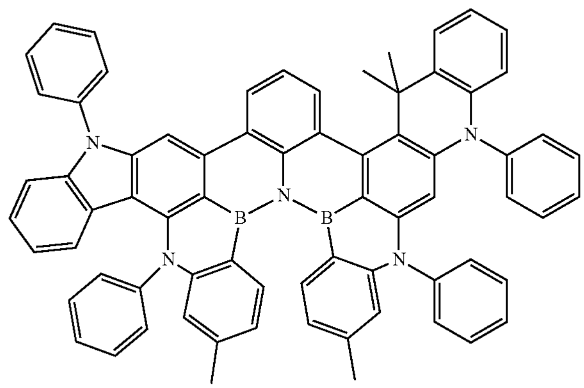

Manufacture of Light Emitting Elements

A first electrode with a thickness of about 150 nm was formed utilizing ITO, a hole injection layer with a thickness of about 10 nm was formed on the first electrode utilizing dipyrazino[2,3-f:2',3'-h] quinoxaline-2,3,6,7,10,11-hexacarbonitrile (HAT-CN), a hole transport layer with a thickness of about 80 nm was formed on the hole injection layer utilizing N,N'-di(1-naphthyl)-N,N'-diphenyl-(1,1'-biphenyl)-4,4'-diamine (α-NPD), an emission auxiliary layer with a thickness of about 5 nm was formed on the hole transport layer utilizing 1,3-bis(N-carbazolyl)benzene (mCP), an emission layer with a thickness of about 20 nm was formed on the emission auxiliary layer utilizing a host (3,3'-di(9H-carbazol-9-yl)-1,1'-biphenyl (mCBP)) doped with 6% of the Example Compound or Comparative Compound, an electron transport layer with a thickness of about 30 nm was formed on the emission layer utilizing 2,2',2''-(1,3,5-benzinetriyl)-tris(1-phenyl-1-H-benzimidazole) (TPBi), an electron injection layer with a thickness of about 0.5 nm was formed on the electron transport layer utilizing LiF, and a second electrode with a thickness of about 100 nm was formed on the electron injection layer utilizing Al. All layers were formed by a deposition method under a vacuum atmosphere.

The materials below utilized for the manufacture of the light emitting elements are suitable materials and were utilized after performing sublimation purification with respect to purchased products.

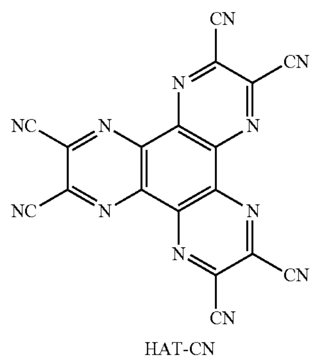

HAT-CN

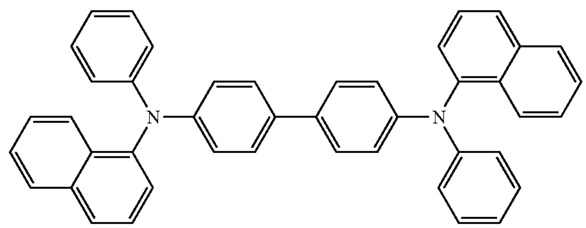

NPD

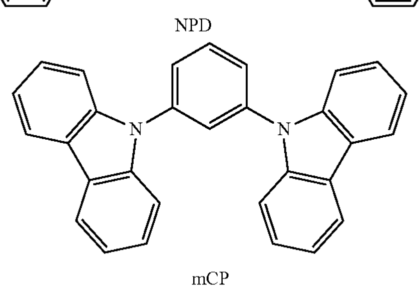

mCP

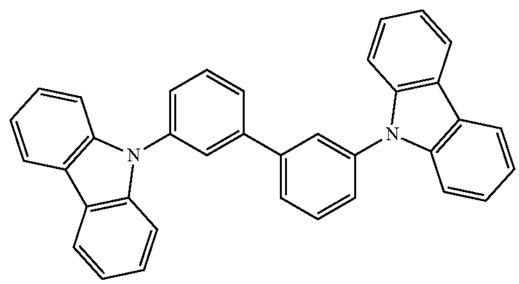

mCBP

-continued

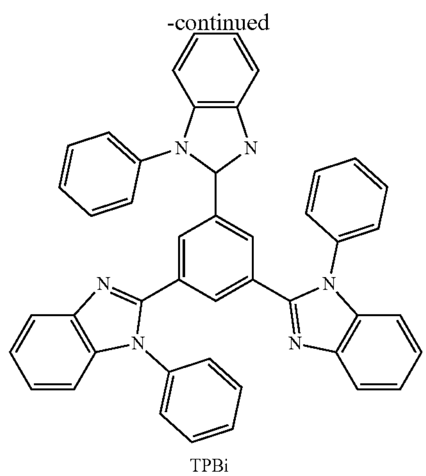

TPBi

Experimental Examples

In the evaluation results for the properties of the Examples and Comparative Examples, the luminance and the emission wavelength at a current density of about 1000 cd/$m^2$ were measured utilizing Keithley MU 236 and a luminance meter of PR650. In addition, the element lifetime was obtained by measuring a time consumed (e.g., taken) to reach about 95% in contrast to an initial luminance, and calculating as a relative lifetime based on the result of Comparative Example 1, and the results are shown. That is, in Table 1, the element lifetime is presented as a relative value utilizing the result of Comparative Example 1 as the 100%. The full width at quarter maximum (FWQM) was measured utilizing FluorEssence software by a fluoromax+ spectrometer apparatus of HORIBA Co., equipped with a xenon light source and a monochromator.

TABLE 1

| Element manufacturing example | Dopant | Emission wavelength (nm) | Full width at quarter maximum (nm) | Element lifetime (%) |
|---|---|---|---|---|
| Example 1 | Example Compound A-1 | 457 | 16 | 123 |
| Example 2 | Example Compound A-20 | 460 | 19 | 165 |
| Example 3 | Example Compound B-13 | 461 | 22 | 184 |
| Comparative Example 1 | Comparative Compound R1 | 454 | 23 | 100 |
| Comparative Example 2 | Comparative Compound R2 | 459 | 25 | 95 |
| Comparative Example 3 | Comparative Compound R3 | 470 | 45 | 112 |
| Comparative Example 4 | Comparative Compound R4 | 473 | 43 | 108 |

Referring to the results of Table 1, it could be confirmed that each of the Examples of the light emitting elements utilizing the polycyclic compounds according to embodiments of the present disclosure as light emitting elements, showed improved element lifetime when compared to the Comparative Examples.

Because the Example Compounds have a BNB plate-type or kind skeleton structure in which two boron atoms are bonded focusing on one nitrogen atom, a polycyclic aromatic ring structure may be stabilized, and multiple resonance effects may be stabilized. Accordingly, when the Example Compounds are utilized as thermally activated delayed fluorescence dopants, the full width at quarter maximum and the wavelength range may be suitable as blue light emitting materials. In addition, because the Example Compounds each have a structure in which a sterically hindered substituent is connected with the core of a fused ring, it could be found that oscillator strength (f) was increased, the material stability was increased, and element lifetime was improved.

In contrast, it could be confirmed that Comparative Compound R1 utilized in Comparative Example 1 does not have a BNB skeleton which constitutes the central skeleton of the Example Compounds, and element properties were degraded in contrast to the Examples.

Comparative Compound R2 utilized in Comparative Example 2 has a BNB skeleton, but does not have a substituent essentially included in each of the Example Compounds (the substituent represented by Formula 2 in the present disclosure). In addition, in Comparative Compound R3 utilized in Comparative Example 3, an $Ar_2$-$Ar_3$ moiety is fused in the polycyclic compound represented by Formula 1 according to the present disclosure. Accordingly, it could be found that both Comparative Example 2 and Comparative Example 3 showed markedly degraded lifetime characteristics in contrast to the Examples. Comparative Example 4 also showed degraded lifetime characteristics in contrast to the Examples.

The light emitting element of an embodiment includes a polycyclic compound of an embodiment and may show high efficiency and may improve lifetime characteristics.

The polycyclic compound of an embodiment may be utilized as a light emitting material for accomplishing improved properties of a light emitting element, with high efficiency and long lifetime.

As used herein, the term “and/or” includes any and all combinations of one or more of the associated listed items. Throughout the disclosure, the expression “at least one of a, b or c”, “at least one selected from a, b, and c”, “at least one selected from the group consisting of a, b, and c”, “at least one from among a, b, and c”, etc., indicates only a, only b, only c, both (e.g., simultaneously) a and b, both (e.g., simultaneously) a and c, both (e.g., simultaneously) b and c, all of a, b, and c, or variations thereof.

The use of “may” when describing embodiments of the present disclosure refers to “one or more embodiments of the present disclosure”.

As used herein, the terms “substantially”, “about”, and similar terms are used as terms of approximation and not as terms of degree, and are intended to account for the inherent deviations in measured or calculated values that would be recognized by those of ordinary skill in the art. “About” or “approximately,” as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” may mean within one or more standard deviations, or within ±30%, 20%, 10%, 5% of the stated value.

Any numerical range recited herein is intended to include all sub-ranges of the same numerical precision subsumed within the recited range. For example, a range of “1.0 to 10.0” is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The display device, and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

Although the embodiments of the present disclosure have been described, it is understood that the present disclosure should not be limited to these embodiments, but various changes and modifications can be made by one ordinary skilled in the art within the spirit and scope of the present disclosure as hereinafter claimed, and equivalents thereof.

What is claimed is:

1. A light emitting element comprising:

a first electrode;

a second electrode on the first electrode; and an emission layer between the first electrode and the second electrode, wherein the emission layer comprises:

a first compound represented by Formula 1; and at least one from among a second compound represented by Formula HT, a third compound represented by Formula ET, and a fourth compound represented by Formula D-1:

[Formula 1]

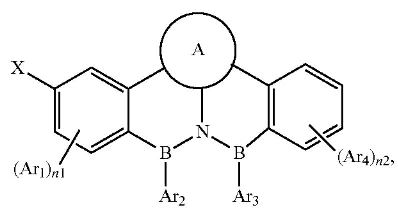

wherein in Formula 1,

X is represented by Formula 2,

A is a substituted or unsubstituted aromatic hydrocarbon ring, or a substituted or unsubstituted aromatic heterocycle, $Ar_1$ is a hydrogen atom, a deuterium atom, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, $Ar_2$ and $Ar_3$ are each independently a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, and a case where $Ar_2$ and $Ar_3$ are combined to form a ring is excluded, $Ar_4$ is a hydrogen atom, a deuterium atom, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, or represented by Formula 2, n1 is an integer of 0 to 3, and n2 is an integer of 0 to 4:

[Formula 2]

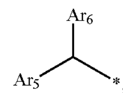

wherein in Formula 2, $Ar_5$ and $Ar_6$ are each independently a substituted or unsubstituted aryl group of 6 to 30 ring-forming carbon atoms, or a substituted or unsubstituted heteroaryl group of 2 to 30 ring-forming carbon atoms, and/or $Ar_5$ and $Ar_6$ are combined with each other to form a ring:

[Formula HT]

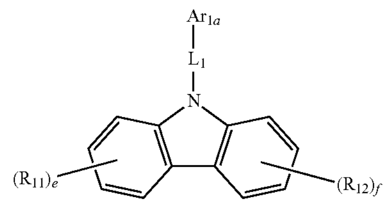

wherein in Formula HT, $L_1$ is a direct linkage, a substituted or unsubstituted arylene group of 6 to 30 ring-forming carbon atoms, or a substituted or unsubstituted heteroarylene group of 2 to 30 ring-forming carbon atoms, $Ar_{1a}$ is a substituted or unsubstituted aryl group of 6 to 30 ring-forming carbon atoms, or a substituted or unsubstituted heteroaryl group of 2 to 30 ring-forming carbon atoms, $R_{11}$ and $R_{12}$ are each independently a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsub stituted heteroaryl group of 2 to 30 ring-forming carbon atoms, and “e” and “f” are each independently an integer of 0 to 4:

[Formula ET]

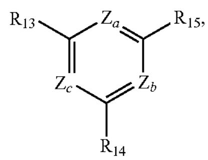

wherein in Formula ET, at least one from among $Z_a$ to $Z_c$ is N, and any remainder thereof are each independently $CR_{16}$, and $R_{13}$ to $R_{16}$ are each independently a hydrogen atom, a deuterium atom, a cyano group, a substituted or unsubstituted silyl group, a substituted or unsubstituted aryl group of 6 to 30 ring-forming carbon atoms, or a substituted or unsubstituted heteroaryl group of 2 to 30 ring-forming carbon atoms:

[Formula D-1]

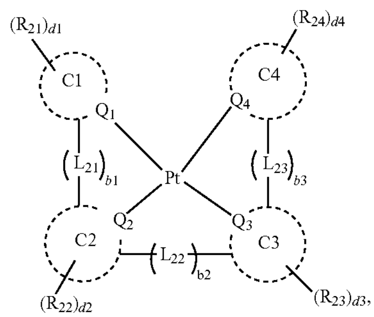

wherein in Formula D-1, $Q_1$ to $Q_4$ are each independently C or N,

C1 to C4 are each independently a substituted or unsubstituted hydrocarbon ring of 5 to 30 ring-forming carbon atoms, or a substituted or unsubstituted heterocycle of 2 to 30 ring-forming carbon atoms, $L_{21}$ to $L_{23}$ are each independently a direct linkage,

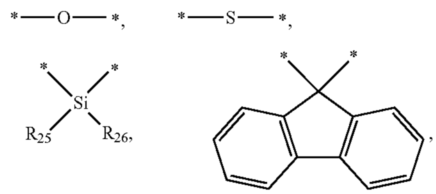

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms, b1 to b3 are each independently 0 or 1, $R_{21}$ to $R_{26}$ are each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 1 to 30 ring-forming carbon atoms, and/or combined with an adjacent group to form a ring, and d1 to d4 are each independently an integer of 0 to 4.

2. The light emitting element of claim 1, wherein n2 is an integer of 2 to 4, and at least one from among multiple $Ar_4$ is represented by Formula 2.

3. The light emitting element of claim 1, wherein X and/or $Ar_4$ represented by Formula 2 is represented by Formula 2-1 or Formula 2-2:

[Formula 2-1]

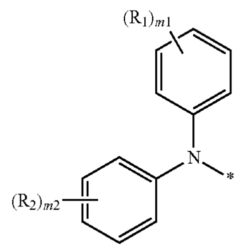

[Formula 2-2]

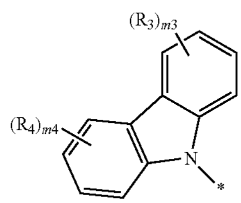

wherein in Formula 2-1 and Formula 2-2, $R_1$ to $R_4$ are each independently a hydrogen atom, a deuterium atom, a substituted or unsubstituted alkyl group of 1 to 20 carbon atoms, or a substituted or unsubstituted aryl group of 6 to 30 ring-forming carbon atoms, m1 and m2 are each independently an integer of 0 to 5, and m3 and m4 are each independently an integer of 0 to 4.

4. The light emitting element of claim 3, wherein $R_1$ to $R_4$ are each independently a hydrogen atom, a deuterium atom, a substituted or unsubstituted t-butyl group, or a substituted or unsubstituted phenyl group.

5. The light emitting element of claim 1, wherein the first compound represented by Formula 1 is represented by Formula 3:

[Formula 3]

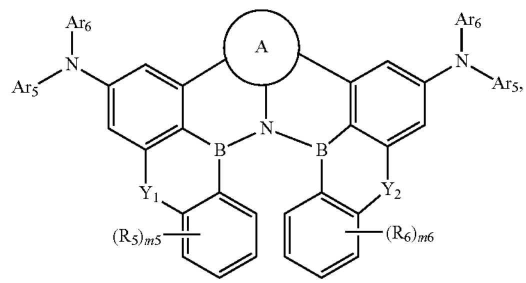

wherein in Formula 3, $Y_1$ and $Y_2$ are each independently O, S, or $NAr_7$, $Ar_7$ is a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, $R_5$ and $R_6$ are each independently a hydrogen atom, a deuterium atom, or a substituted or unsubstituted aryl group of 6 to 30 ring-forming carbon atoms, and/or combined with an adjacent group to form a ring, m5 and m6 are each independently an integer of 0 to 4, A is the same as defined in Formula 1, and $Ar_5$ and $Ar_6$ are the same as defined in Formula 2.

6. The light emitting element of claim 5, wherein $Y_1$ and/or $Y_2$ is $NAr_7$.

7. The light emitting element of claim 5, wherein the first compound represented by Formula 3 is represented by any one from among Formula 3-1 to Formula 3-3:

[Formula 3-1]

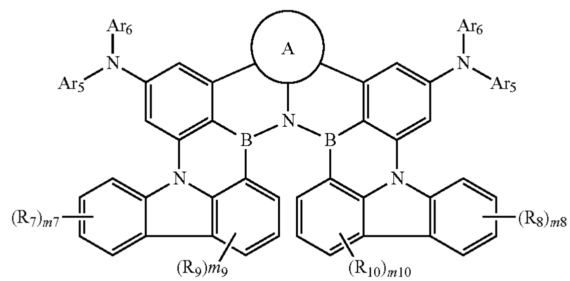

[Formula 3-2]

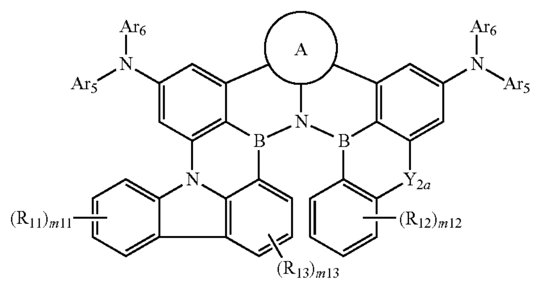

[Formula 3-3]

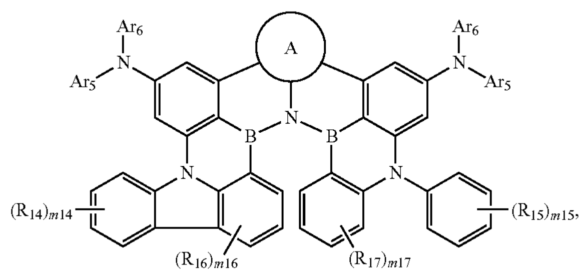

wherein in Formula 3-1 to Formula 3-3, $R_7$ to $R_{17}$ are each independently a hydrogen atom, a deuterium atom, a substituted or unsubstituted alkyl group of 1 to 10 carbon atoms, or a substituted or unsubstituted aryl group of 6 to 15 ring-forming carbon atoms, m7, m8, m11, m12, m16 and m17 are each independently an integer of 0 to 4, m9, m10 and m13 are each independently an integer of 0 to 3, m14 and m15 are each independently an integer of 0 to 5, when any of m7 to m17 are each independently an integer of 2 or more, each of respective multiple $R_7$ to $R_{17}$ are the same or different, A is the same as defined in Formula 1, and $Ar_5$ and $Ar_6$ are the same as defined in Formula 2, and in Formula 3-2, $Y_{2a}$ is S or O.

8. The light emitting element of claim 5, wherein the first compound represented by Formula 3 is represented by Formula 4:

[Formula 4]

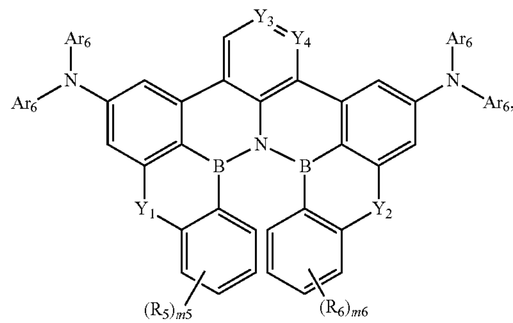

wherein in Formula 4, $Y_3$ and $Y_4$ are each independently $CR_a$ or N, $R_a$ is a hydrogen atom, a deuterium atom, a substituted or unsubstituted aryl group of 6 to 20 ring-forming carbon atoms, or a substituted or unsubstituted heteroaryl group of 2 to 20 ring-forming carbon atoms, and/or combined with an adjacent group to form a ring, $Ar_5$ and $Ar_6$ are the same as defined in Formula 2, and $R_5$, $R_6$, m5, m6, $Y_1$ and $Y_2$ are the same as defined in Formula 3.

9. The light emitting element of claim 8, wherein the first compound represented by Formula 4 is represented by Formula 4-1 or Formula 4-2:

[Formula 4-1]

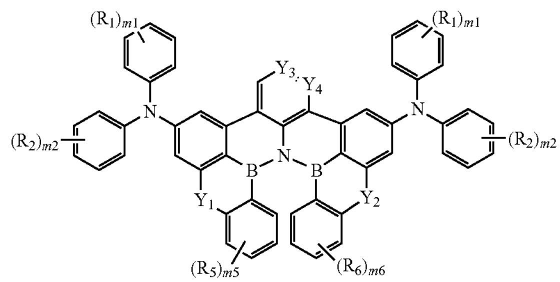

[Formula 4-2]

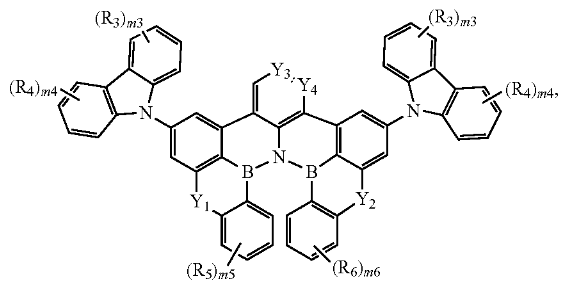

wherein in Formula 4-1 and Formula 4-2, $R_1$ to $R_4$ are each independently a hydrogen atom, a deuterium atom, a substituted or unsubstituted alkyl group of 1 to 20 carbon atoms, or a substituted or unsubstituted aryl group of 6 to 30 ring-forming carbon atoms, m1 and m2 are each independently an integer of 0 to 5, m3 and m4 are each independently an integer of 0 to 4, $R_5$, $R_6$, m5, m6, $Y_1$ and $Y_2$ are the same as defined in Formula 3, and $Y_3$ and $Y_4$ are the same as defined in Formula 4.

10. The light emitting element of claim 1, wherein the emission layer is to emit delayed fluorescence.

11. The light emitting element of claim 1, wherein the emission layer comprises the first compound, the second compound, and the third compound.

12. The light emitting element of claim 1, wherein the emission layer comprises the first compound, the second compound, the third compound, and the fourth compound.

13. The light emitting element of claim 1, wherein the first compound represented by Formula 1 is any one of compounds in Compound Group 1:

[Compound Group 1]

A-1

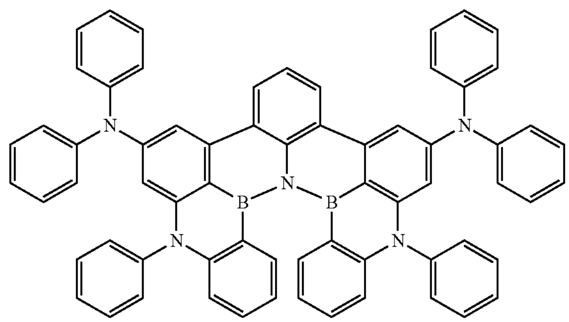

A-2

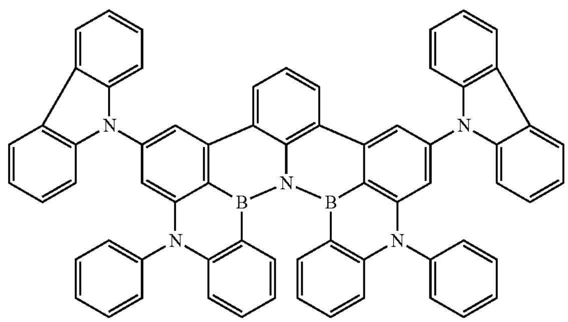

A-3

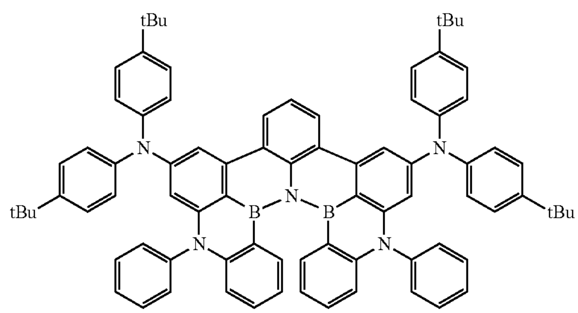

A-4

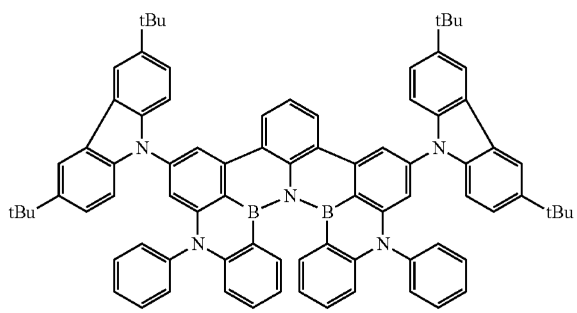

A-5

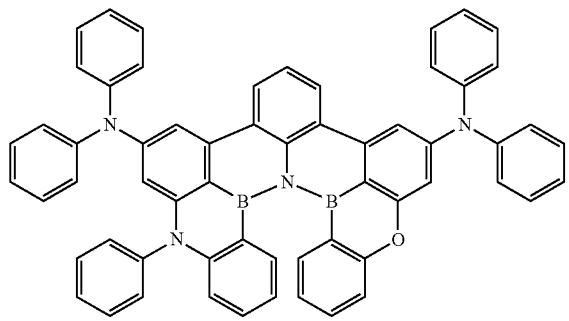

A-6

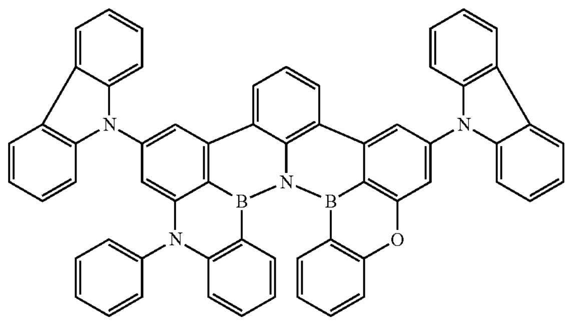

-continued
A-7
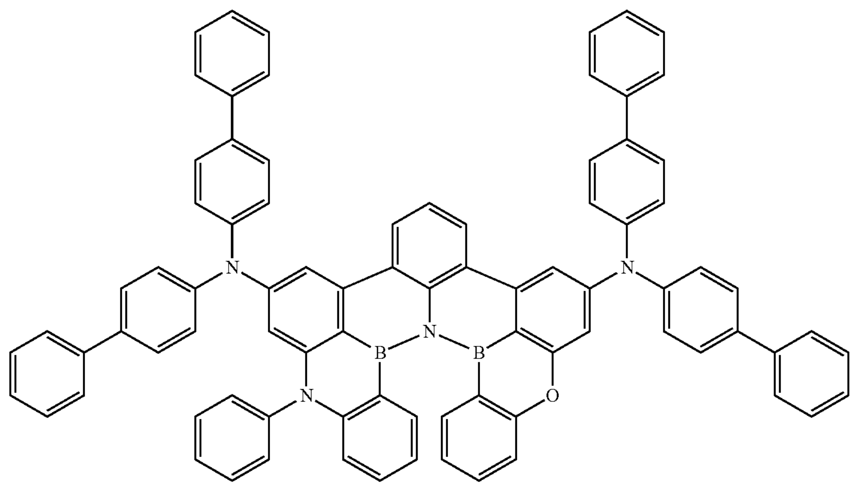
A-8
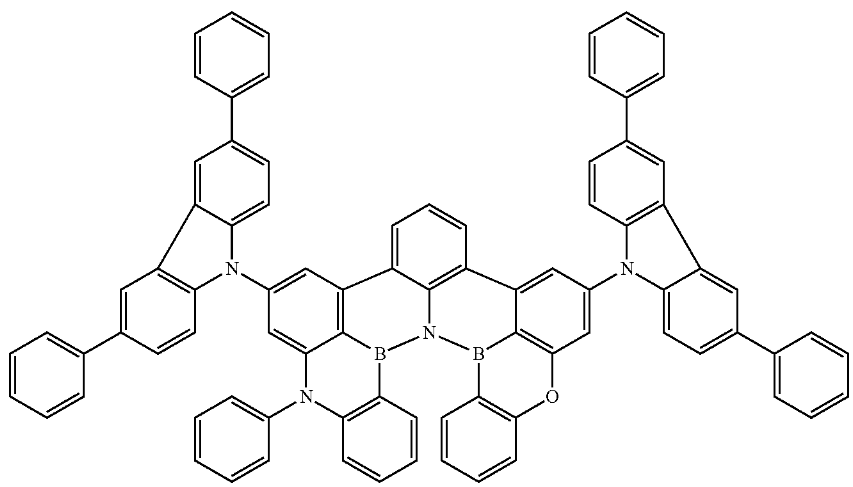
A-9
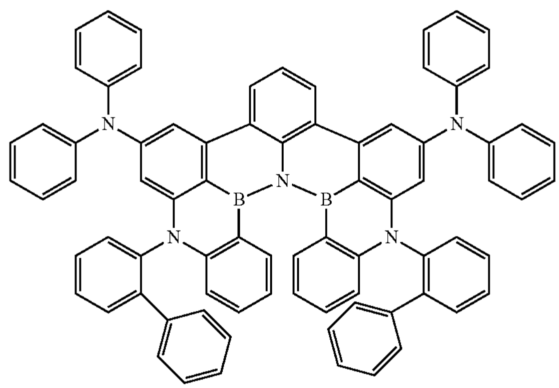
A-10
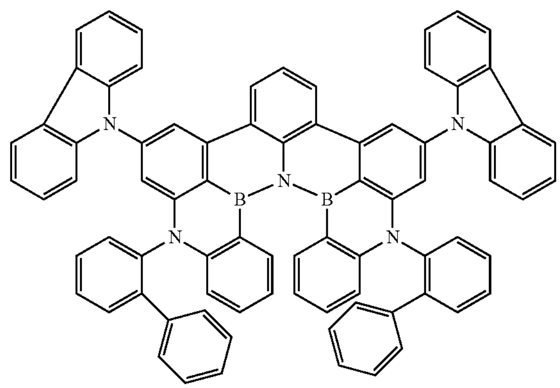

-continued
A-11
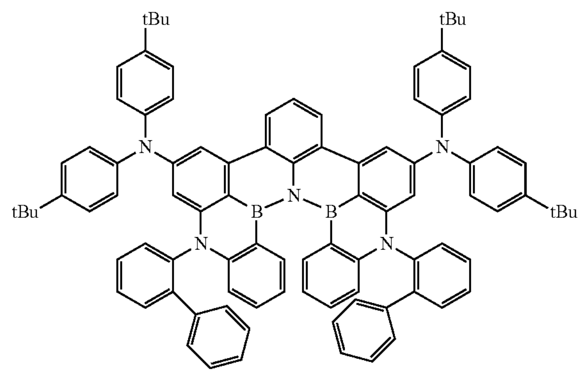
A-12
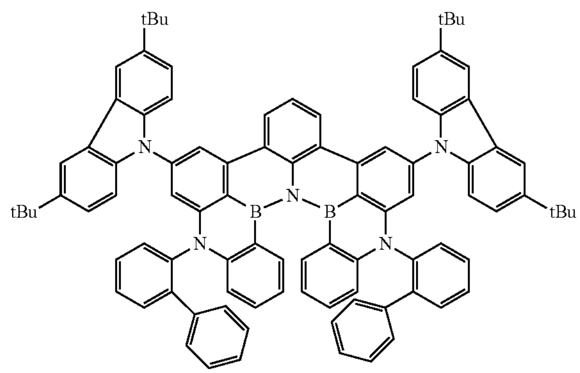
A-13
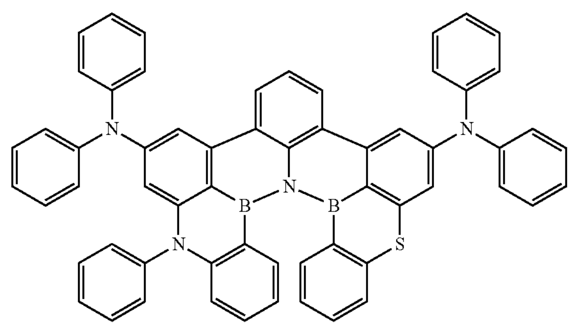
A-14
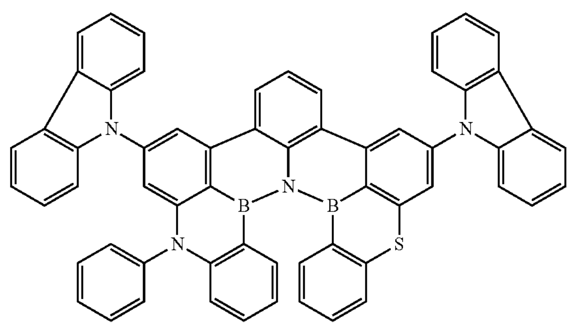
A-15
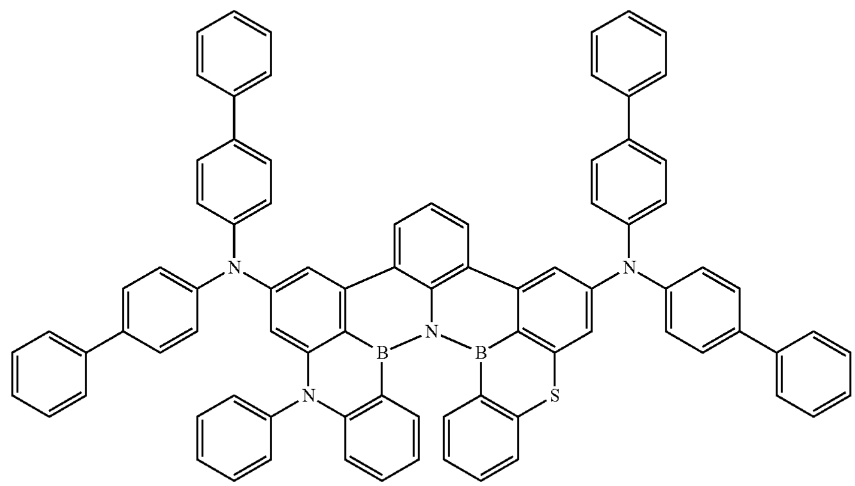

-continued
A-16
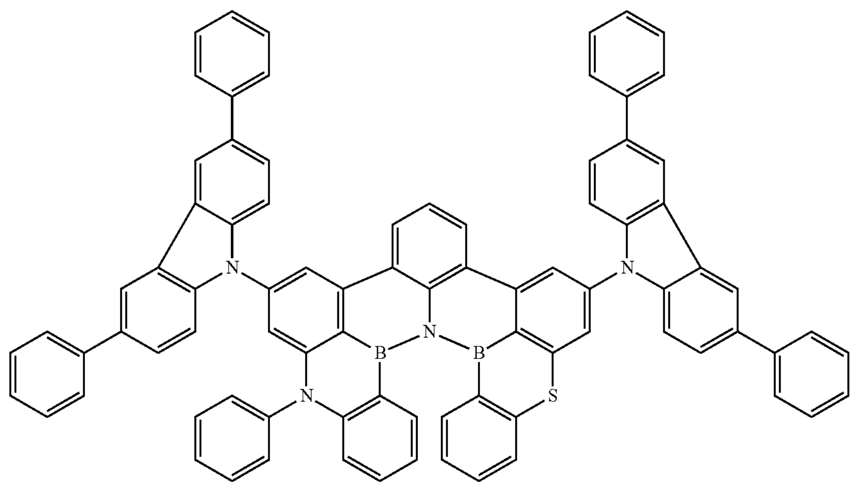
A-17
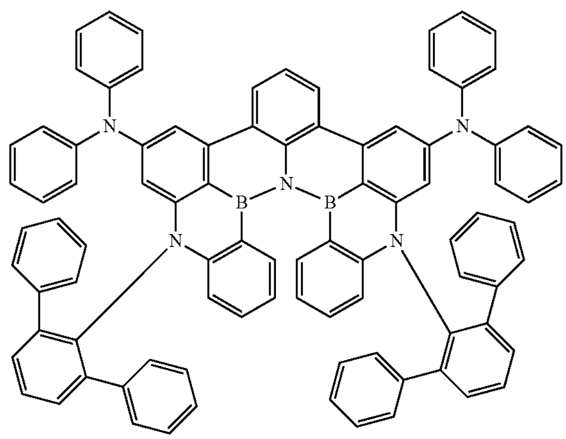
A-18
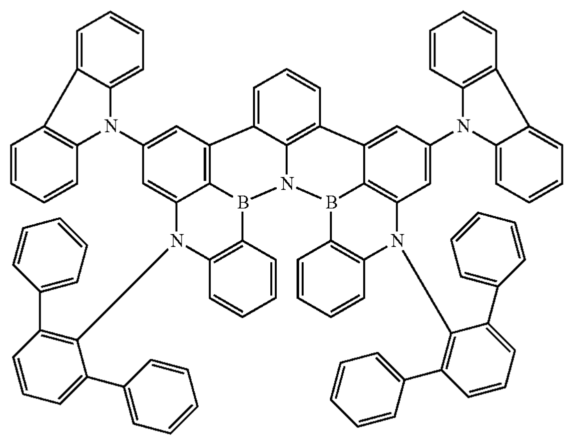
A-19
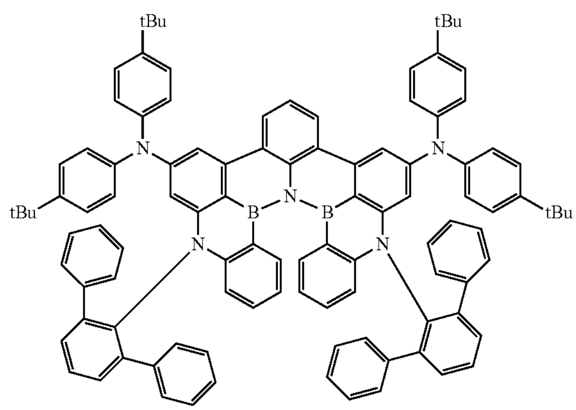
A-20
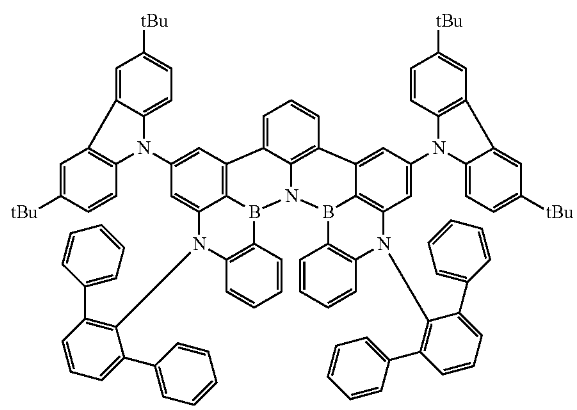

-continued
A-21
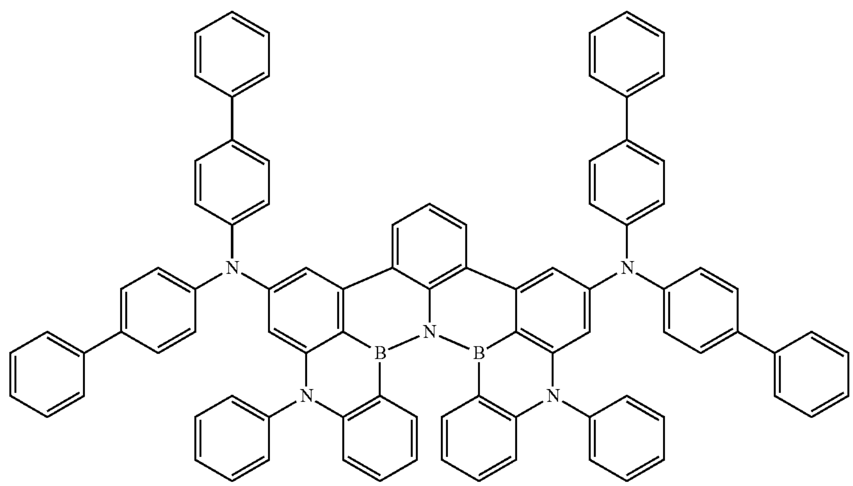
A-22
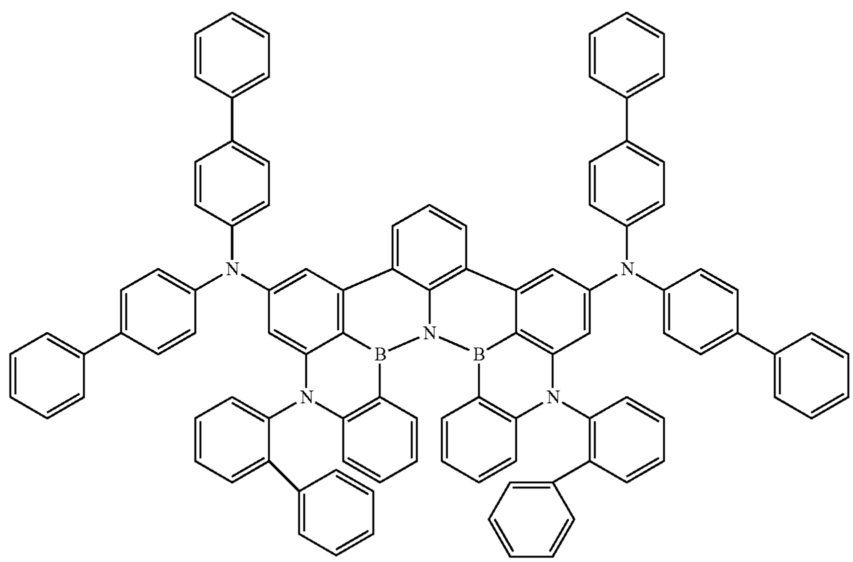
A-23
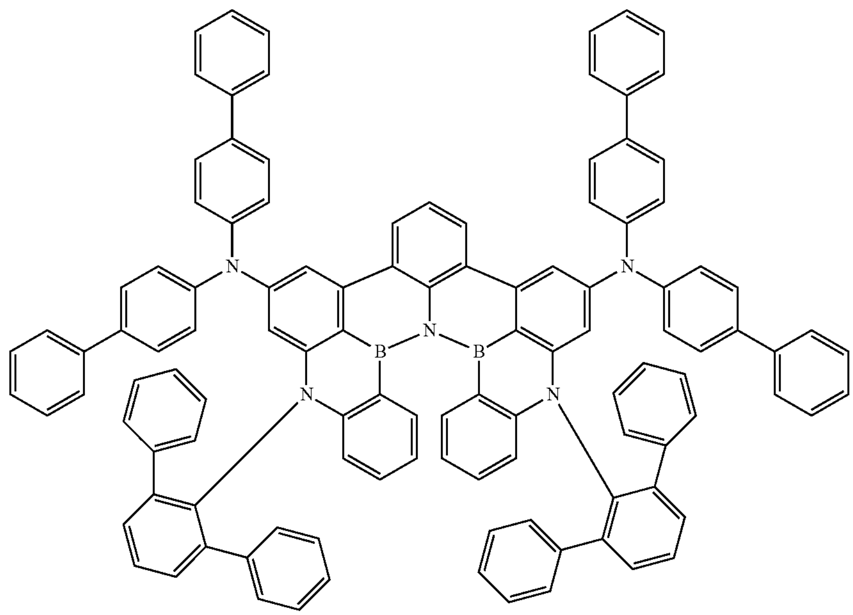

-continued
A-24
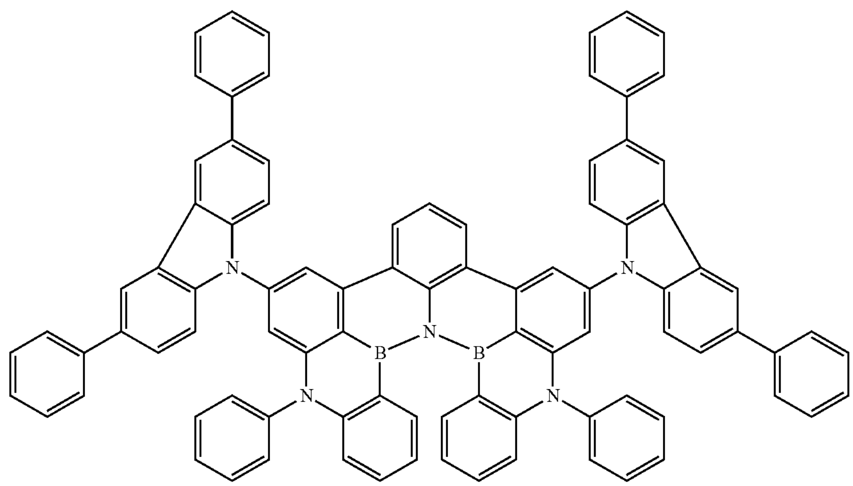
A-25
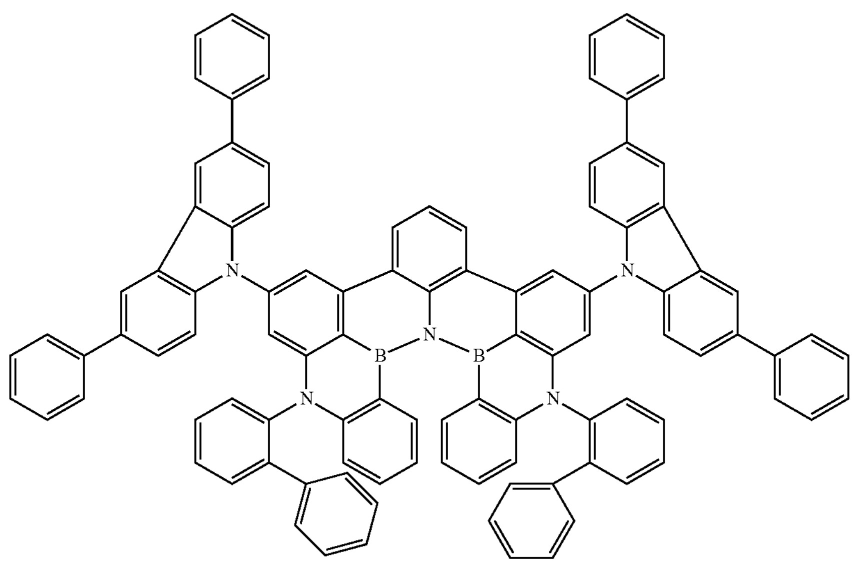
A-26
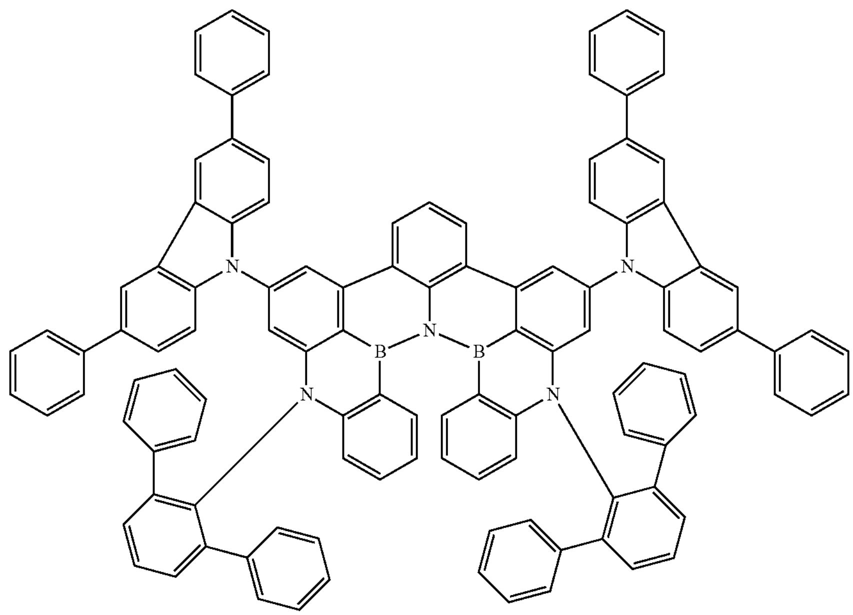

-continued
A-27
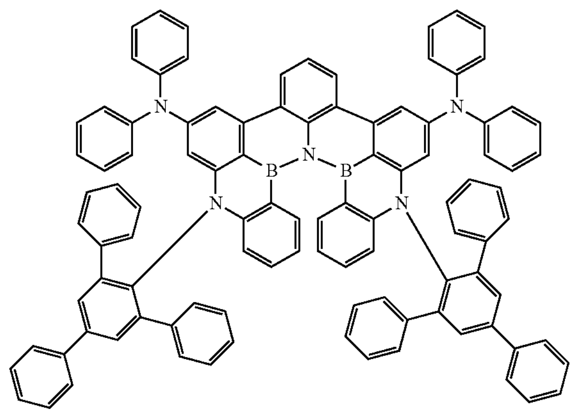
A-28
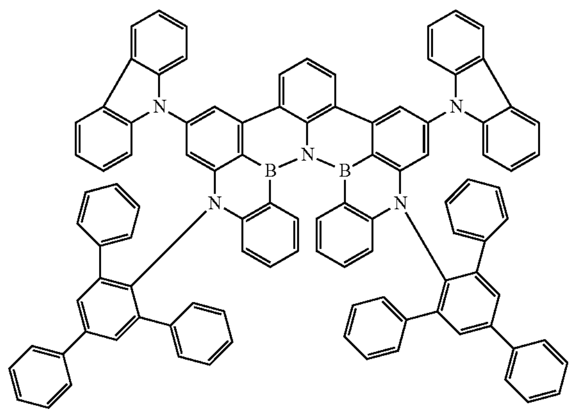
A-29
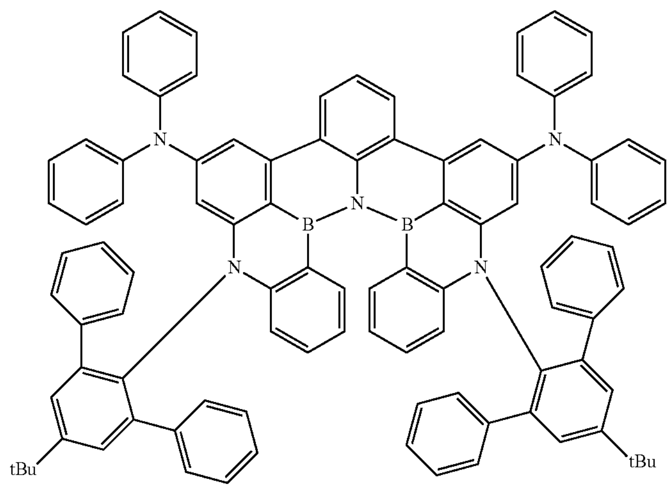
B-1
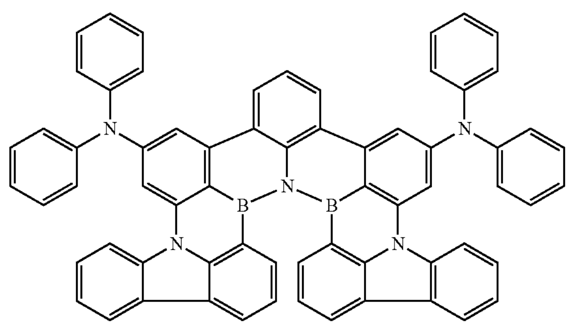
B-2
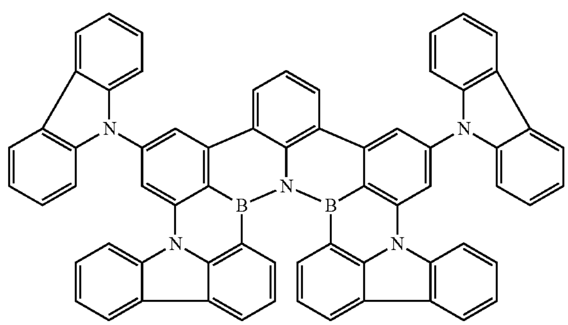

-continued
B-3
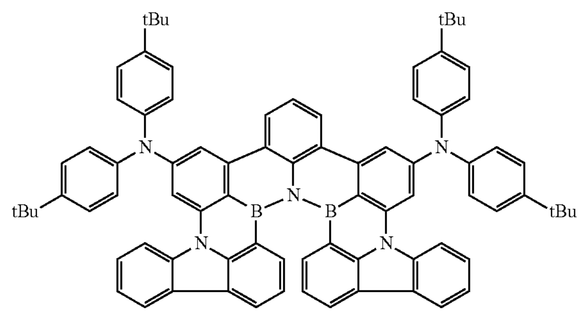
B-4
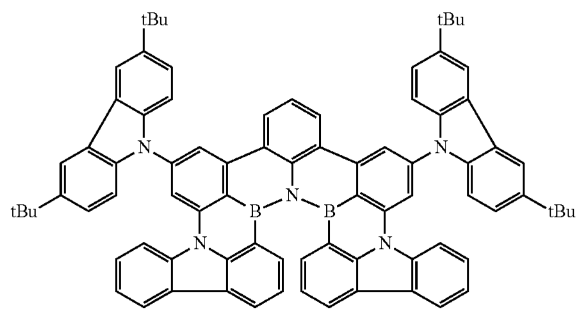
B-5
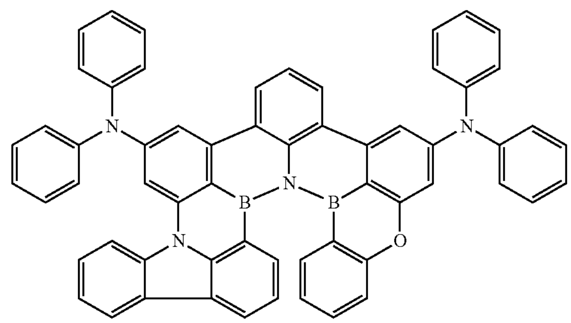
B-6
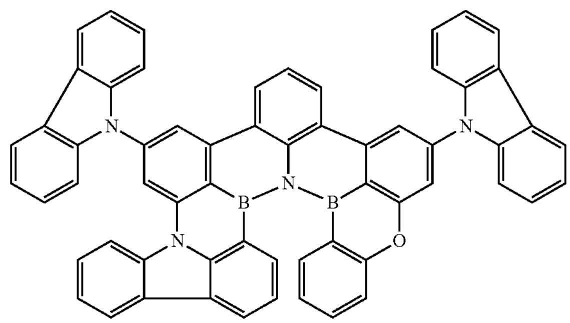
B-7
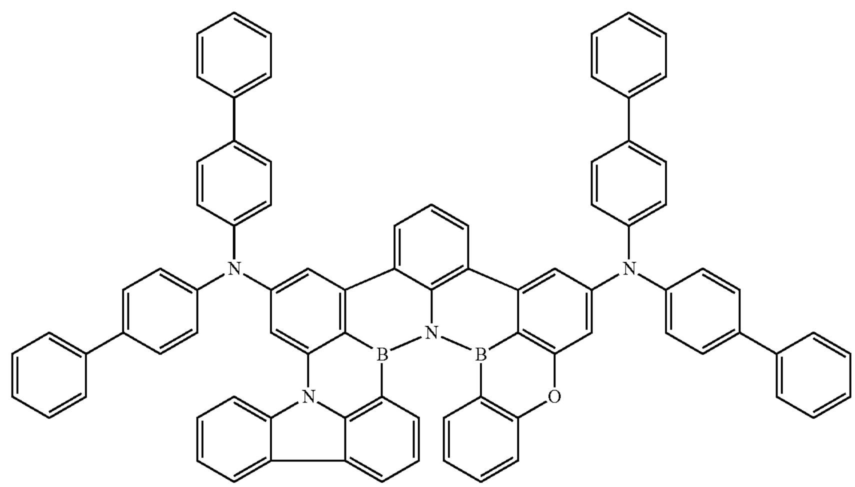
B-8
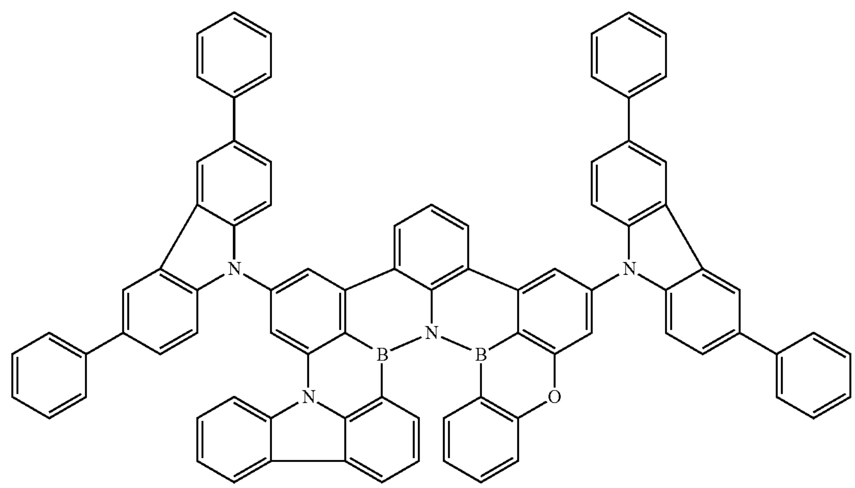

-continued
B-9
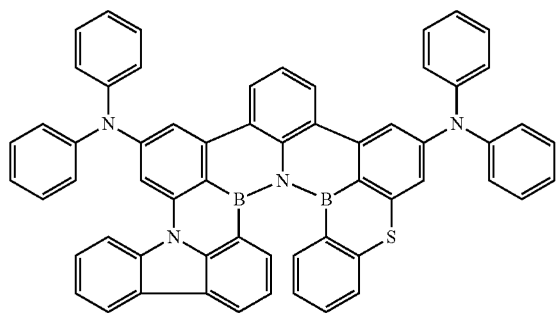
B-10
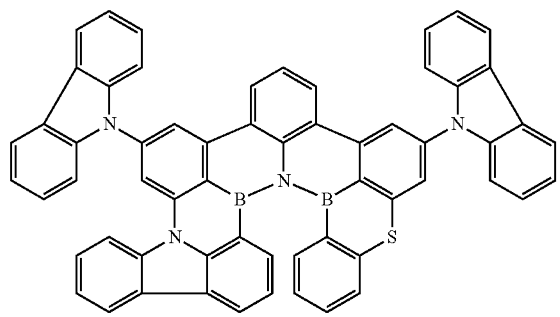
B-11
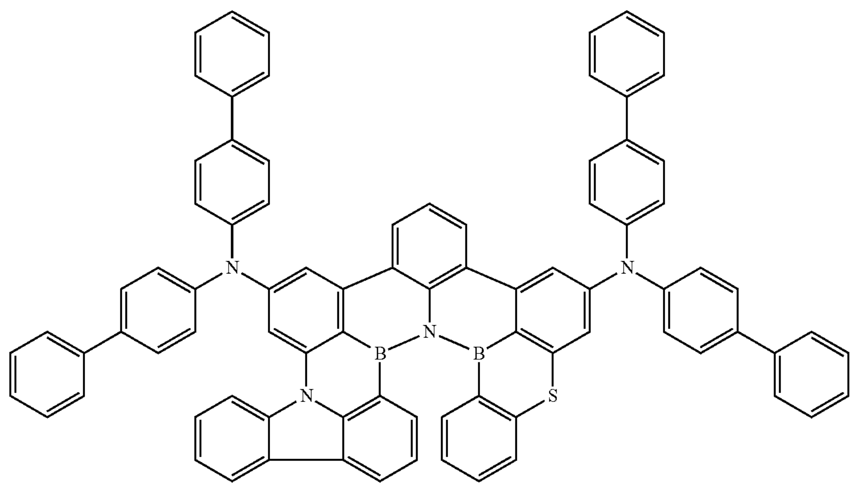
B-12
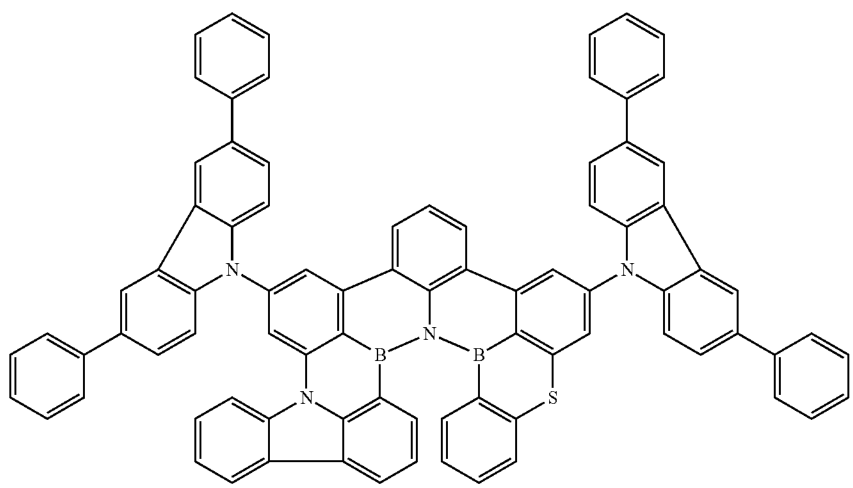

-continued
B-13
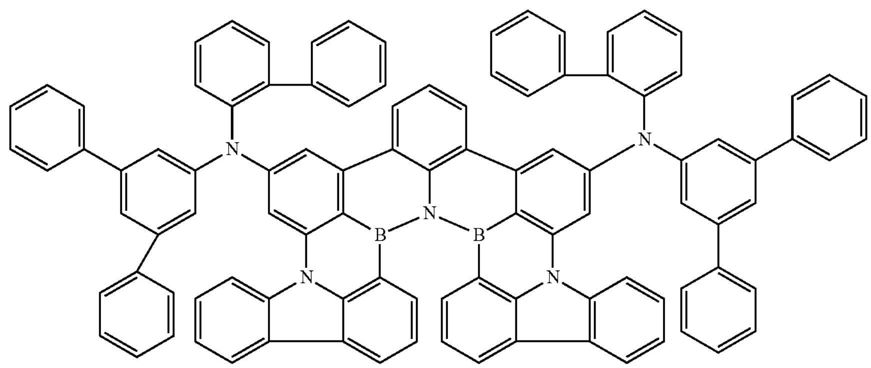
B-14
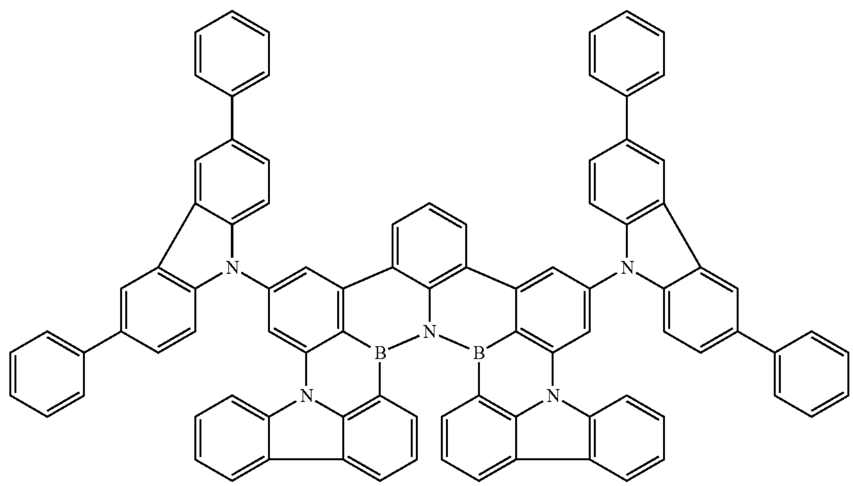
B-15
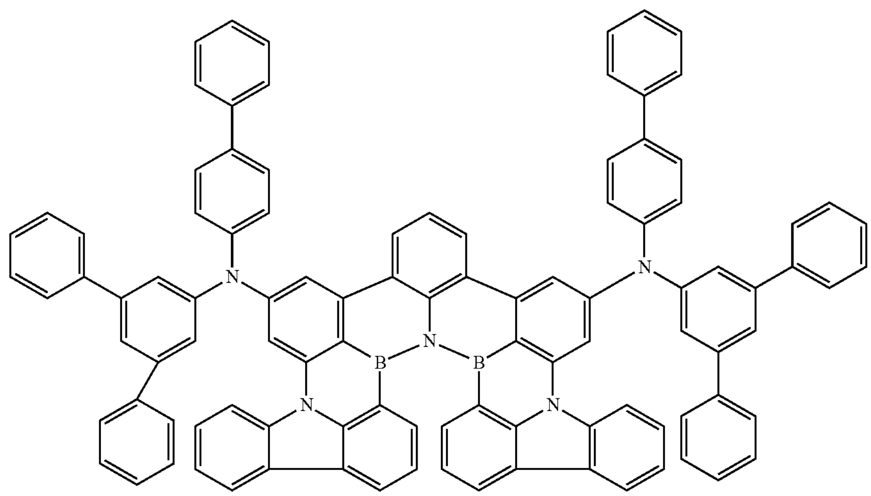

-continued
B-16
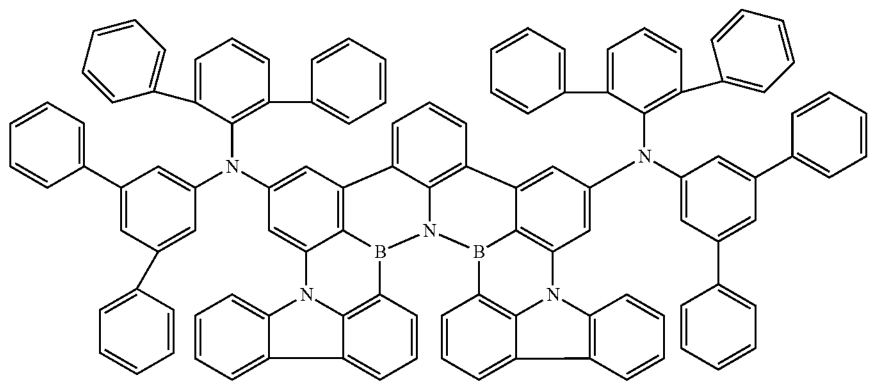
B-17
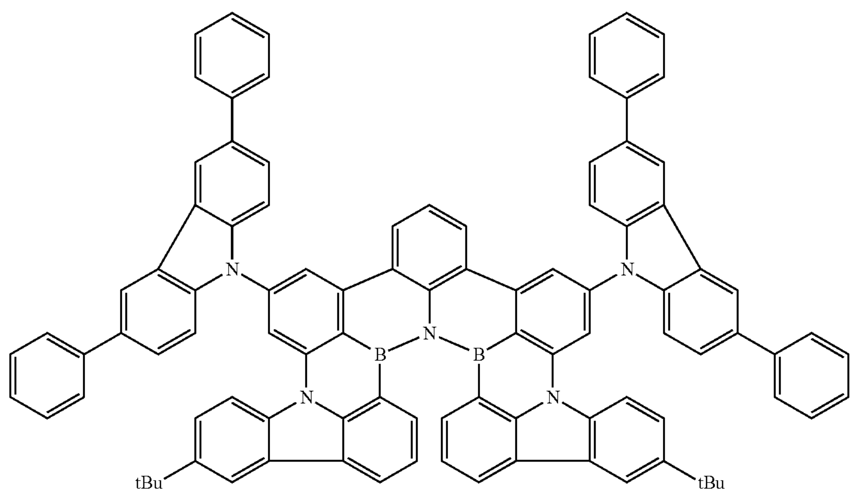
B-18
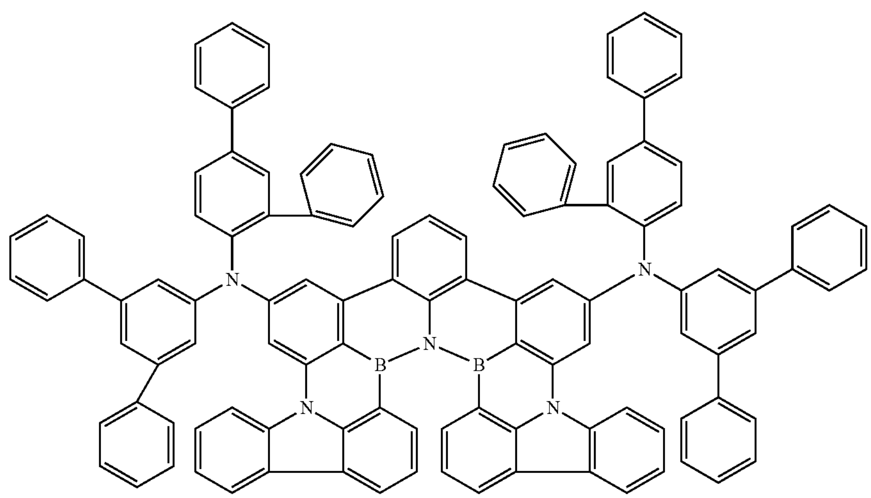

-continued
B-19
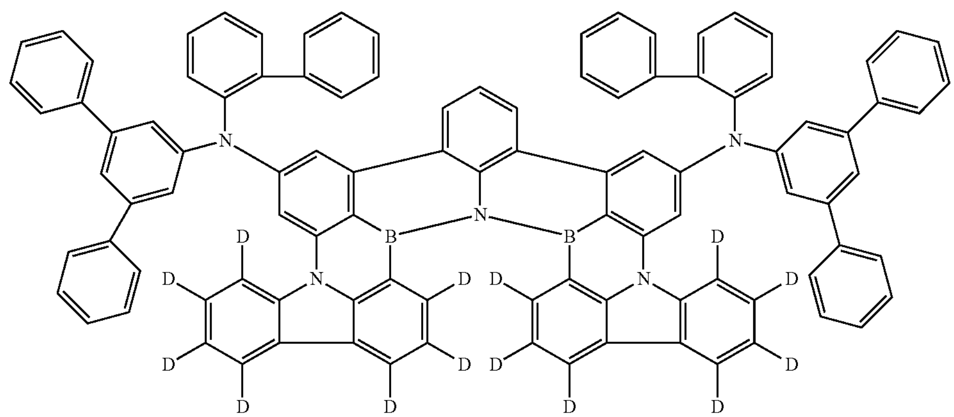
B-20
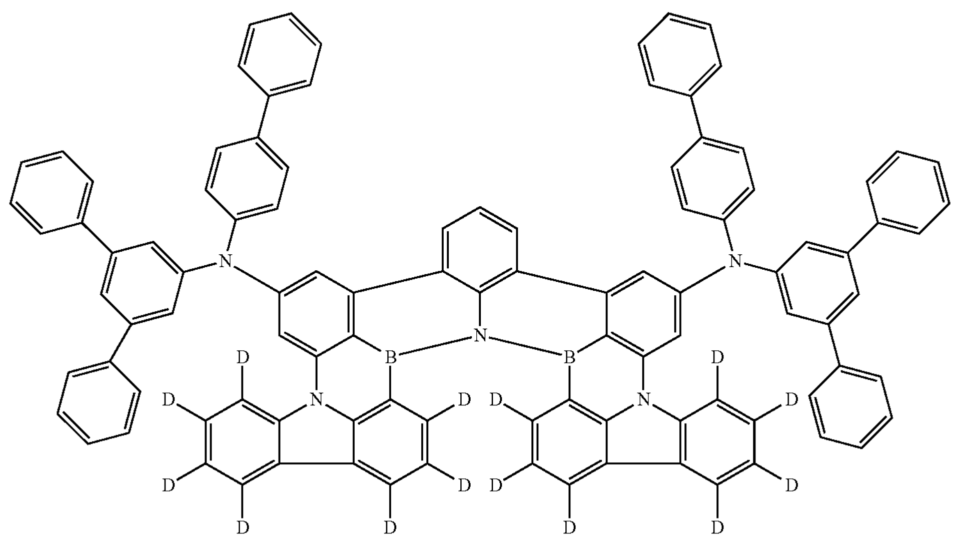
B-21
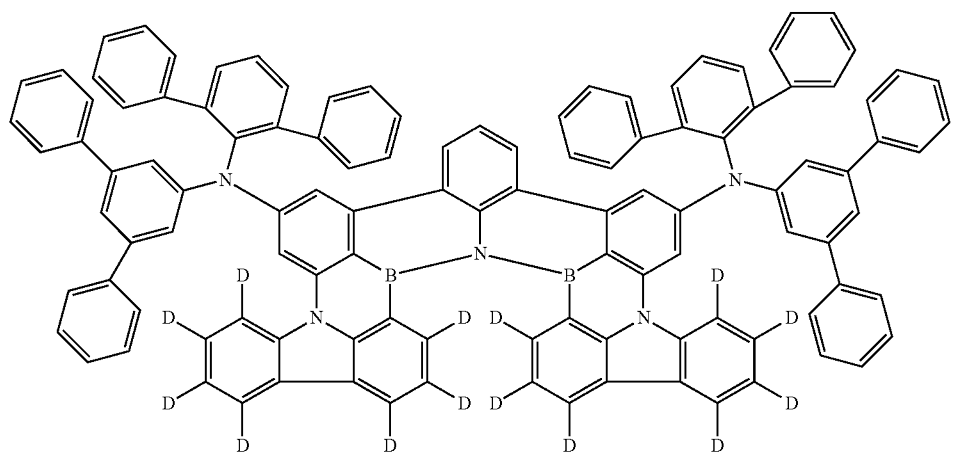

C-1
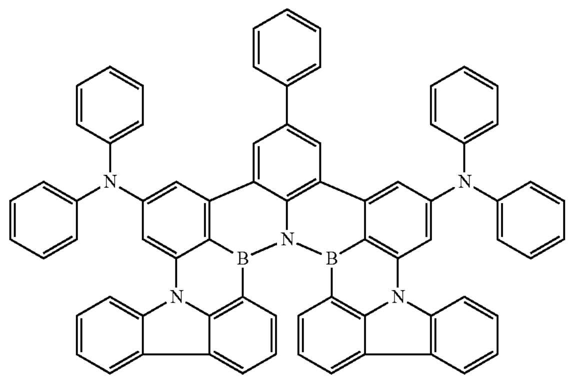
C-2
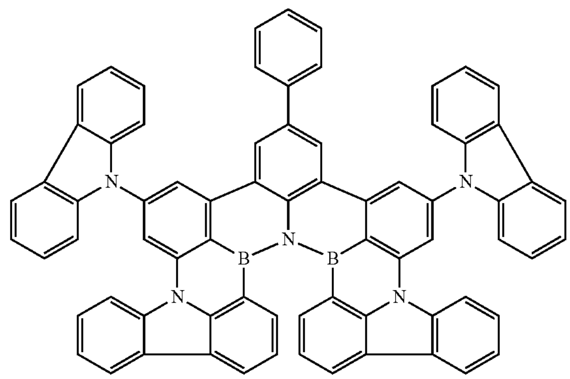
C-3
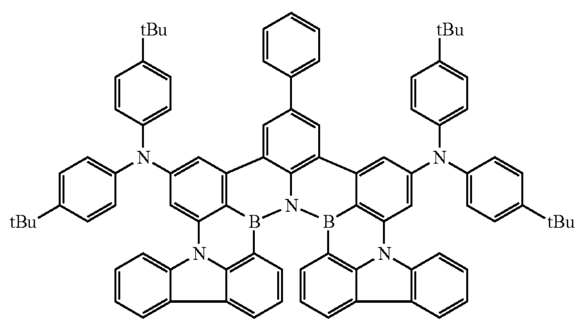
C-4
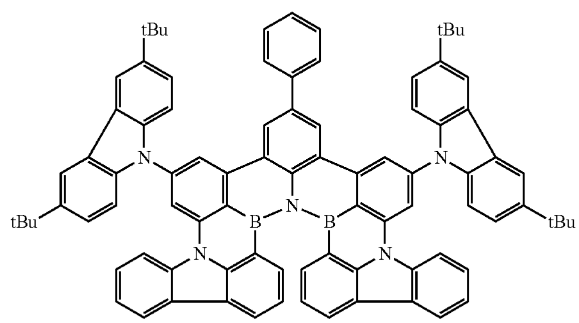
C-5
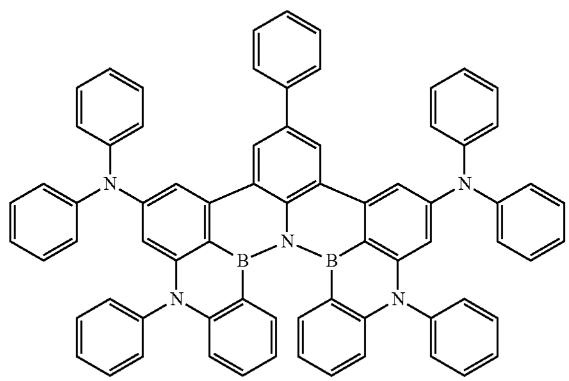
C-6
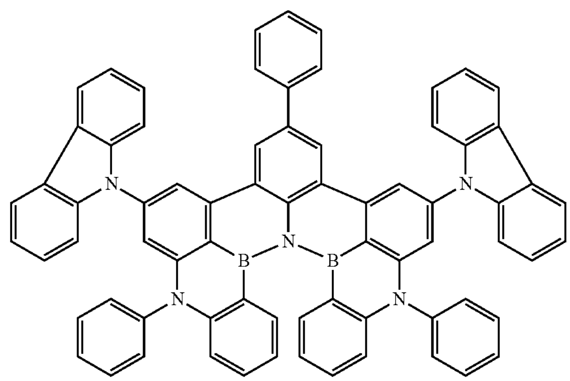
C-7
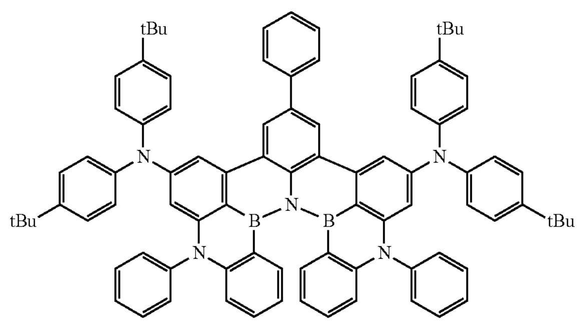
C-8
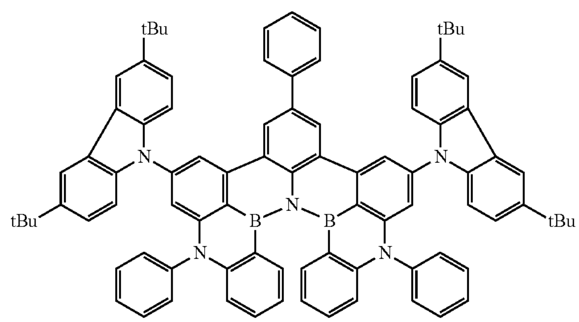

-continued
C-9
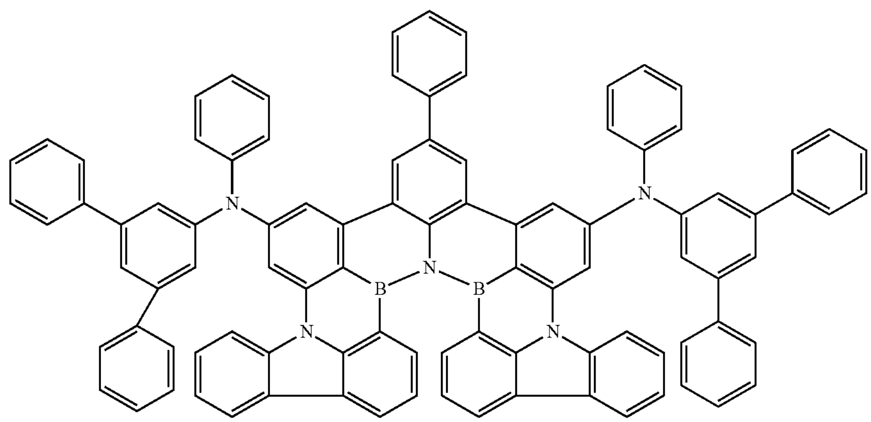
C-10
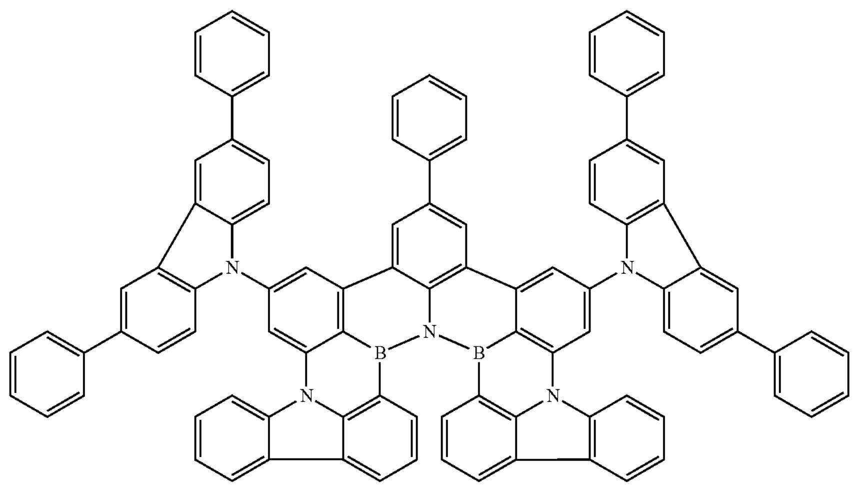
C-11
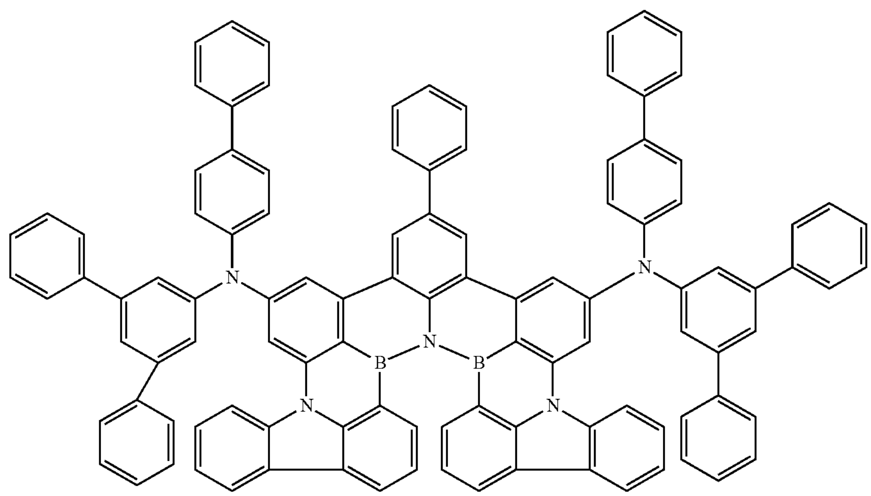

-continued
C-12
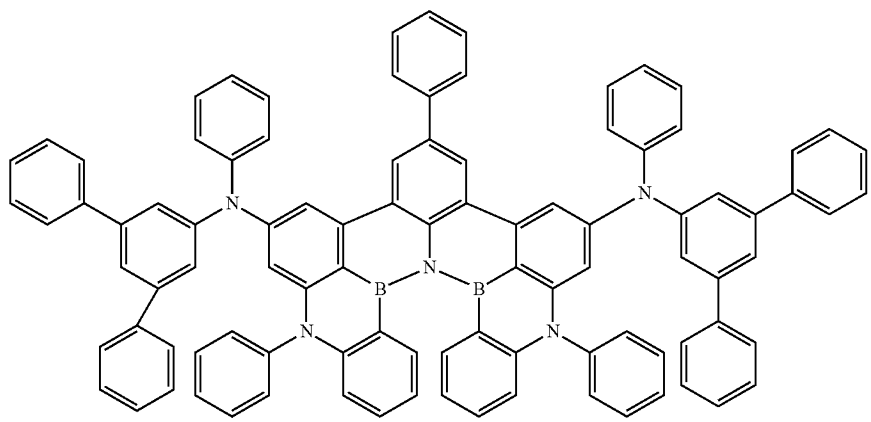
C-13
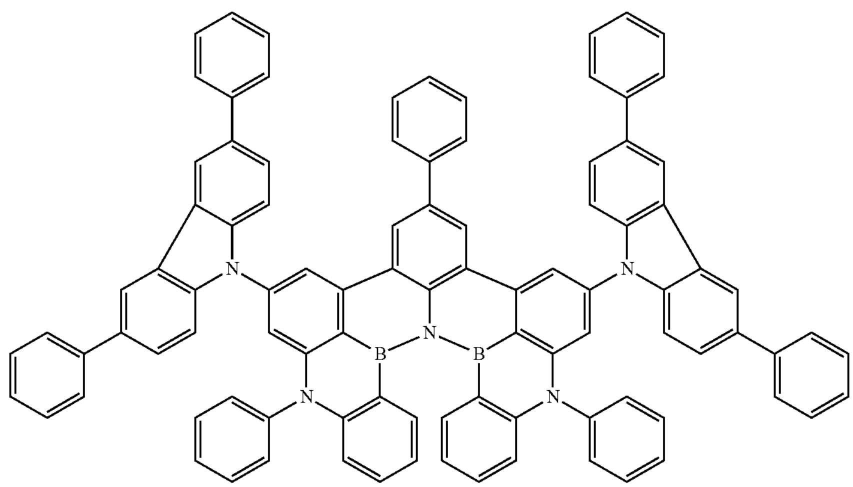
C-14
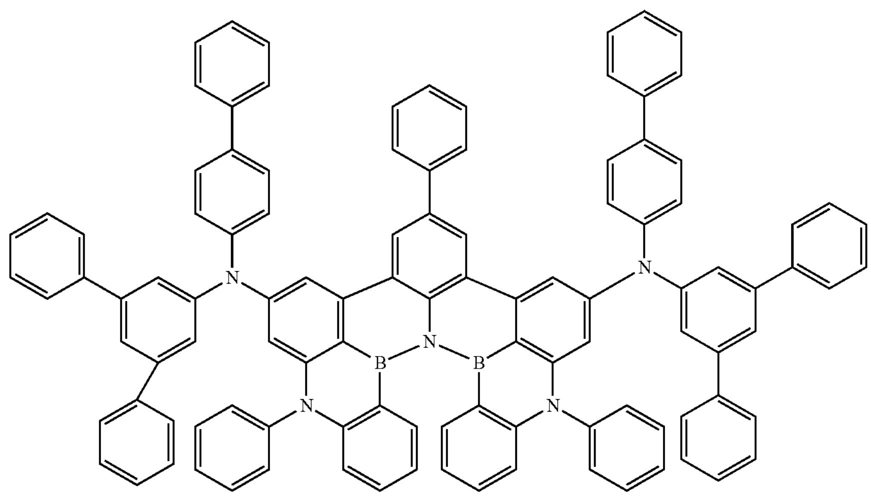

-continued
C-15
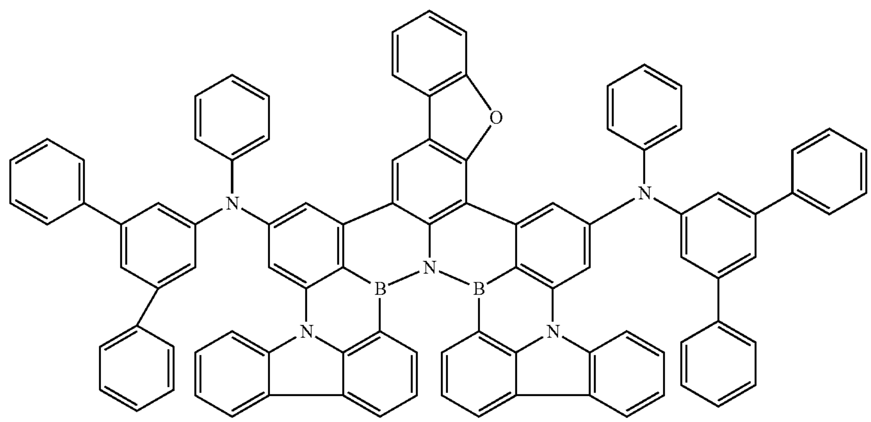
C-16
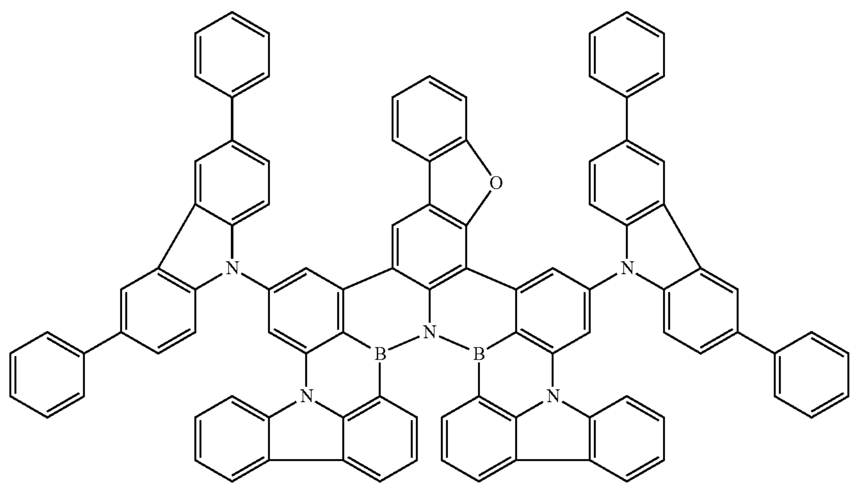
C-17
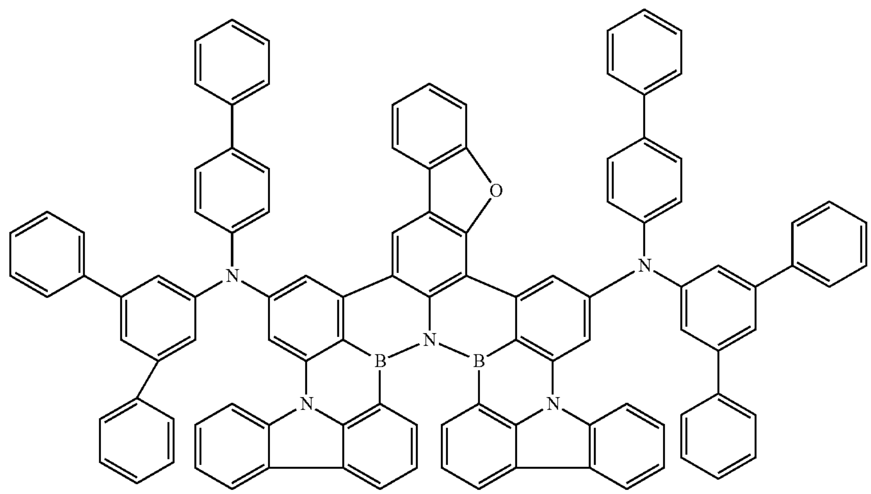

-continued
C-18
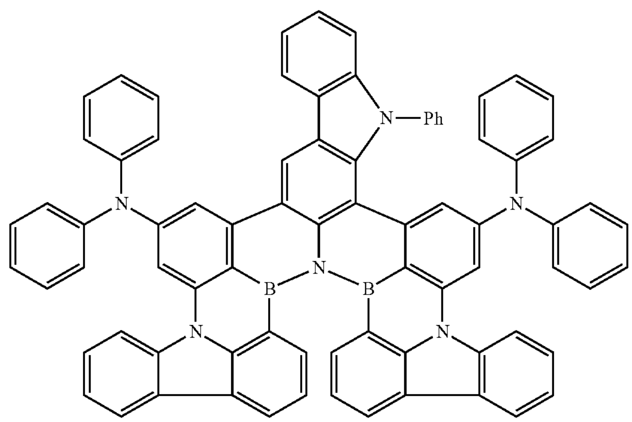
C-19
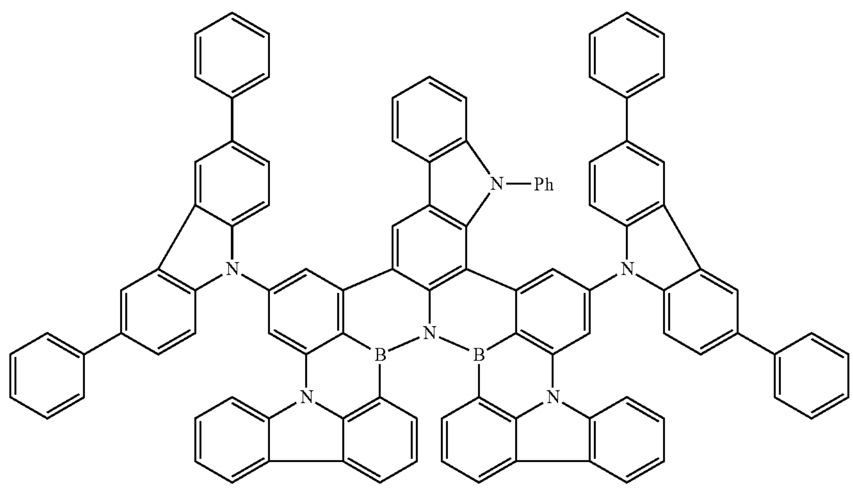
C-20
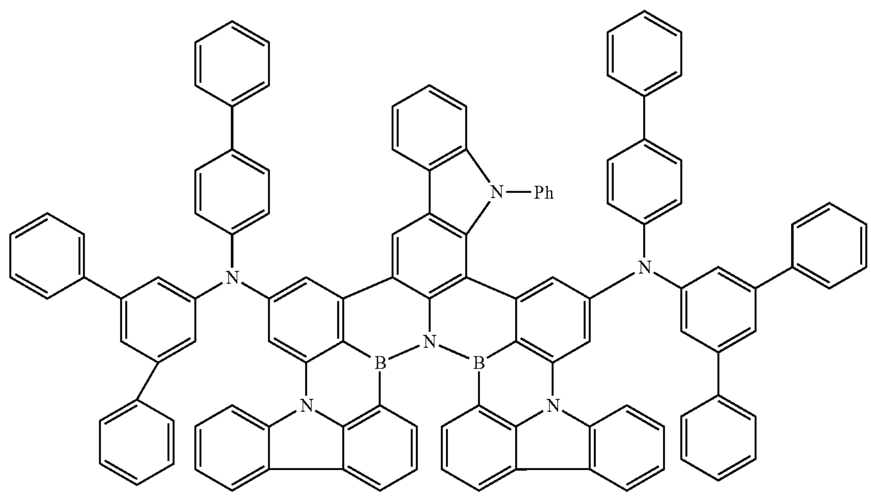

-continued
C-21
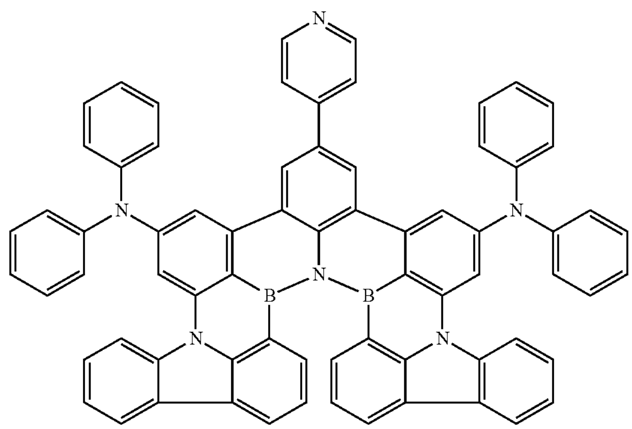
C-22
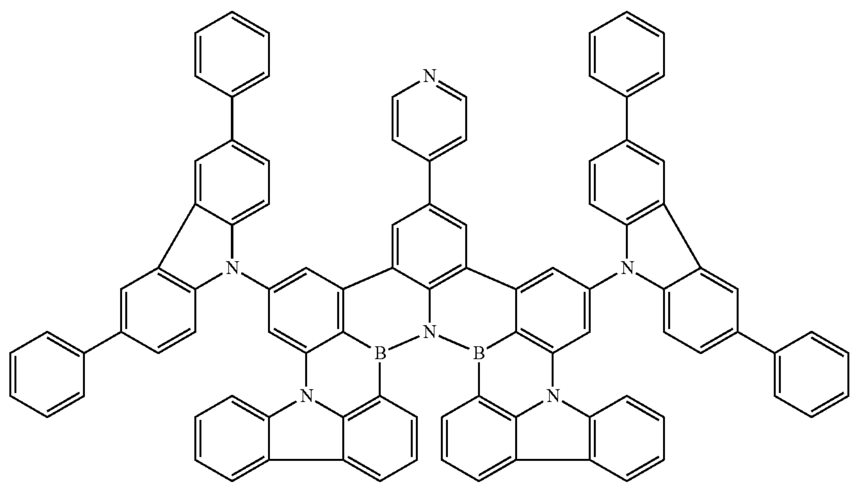
C-23
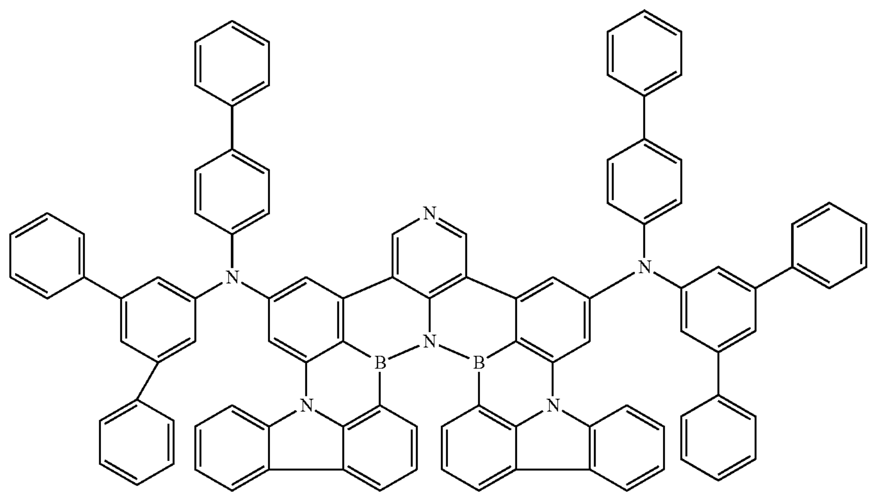
.

14. A polycyclic compound represented by Formula 1:

[Formula 1]

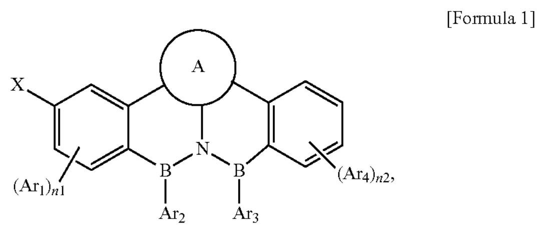

wherein in Formula 1,

X is represented by Formula 2,

A is a substituted or unsubstituted aromatic hydrocarbon ring, or a substituted or unsubstituted aromatic heterocycle, $Ar_1$ is a hydrogen atom, a deuterium atom, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, $Ar_2$ and $Ar_3$ are each independently a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, and a case where $Ar_2$ and $Ar_3$ are combined to form a ring is excluded, $Ar_4$ is a hydrogen atom, a deuterium atom, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, or represented by Formula 2, n1 is an integer of 0 to 3, and n2 is an integer of 0 to 4:

[Formula 2]

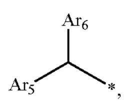

wherein in Formula 2, $Ar_5$ and $Ar_6$ are each independently a substituted or unsubstituted aryl group of 6 to 30 ring-forming carbon atoms, or a substituted or unsubstituted heteroaryl group of 2 to 30 ring-forming carbon atoms, and/or $Ar_5$ and $Ar_6$ are combined with each other to form a ring, and wherein a case where $Ar_1$ and $Ar_5$ are combined to form a ring is excluded, and a case where $Ar_1$ and $Ar_5$ are combined to form a ring is excluded.

15. The polycyclic compound of claim 14, wherein X and/or $Ar_4$ represented by Formula 2 is represented by Formula 2-1 or Formula 2-2:

[Formula 2-1]

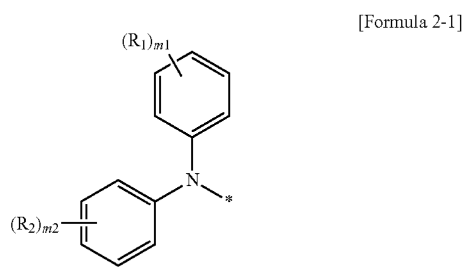

-continued

[Formula 2-2]

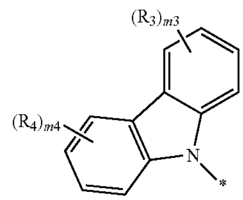

wherein in Formula 2-1 and Formula 2-2, $R_1$ to $R_4$ are each independently a hydrogen atom, a deuterium atom, a substituted or unsubstituted alkyl group of 1 to 20 carbon atoms, or a substituted or unsubstituted aryl group of 6 to 30 ring-forming carbon atoms, m1 and m2 are each independently an integer of 0 to 5, and m3 and m4 are each independently an integer of 0 to 4.

16. The polycyclic compound of claim 14, wherein the polycyclic compound represented by Formula 1 is represented by Formula 3:

[Formula 3]

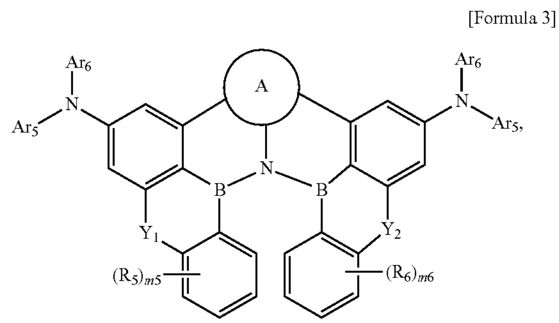

wherein in Formula 3, $Y_1$ and $Y_2$ are each independently O, S, or $NAr_7$, $Ar_7$ is a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, $R_5$ and $R_6$ are each independently a hydrogen atom, a deuterium atom, or a substituted or unsubstituted aryl group of 6 to 30 ring-forming carbon atoms, and/or combined with an adjacent group to form a ring, m5 and m6 are each independently an integer of 0 to 4, A is the same as defined in Formula 1, and $Ar_5$ and $Ar_6$ are the same as defined in Formula 2.

17. The polycyclic compound of claim 16, wherein the polycyclic compound represented by Formula 3 is represented by any one from among Formula 3-1 to Formula 3-3:

[Formula 3-1]

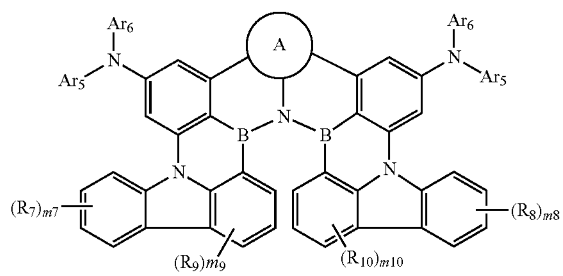

[Formula 3-2]

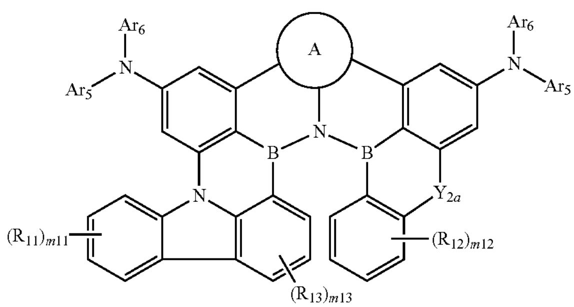

[Formula 3-3]

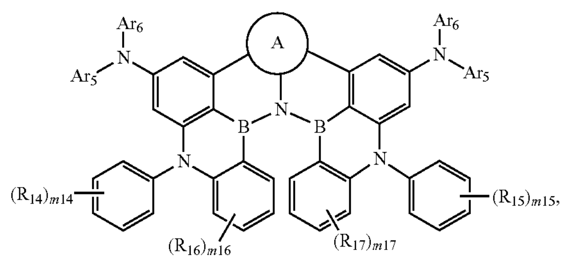

wherein in Formula 3-1 to Formula 3-3, $R_7$ to $R_{17}$ are each independently a hydrogen atom, a deuterium atom, a substituted or unsubstituted alkyl group of 1 to 10 carbon atoms, or a substituted or unsubstituted aryl group of 6 to 15 ring-forming carbon atoms, m7, m8, m11, m12, m16 and m17 are each independently an integer of 0 to 4, m9, m10 and m13 are each independently an integer of 0 to 3, m14 and m15 are each independently an integer of 0 to 5, when any of m7 to m17 are each independently an integer of 2 or more, each of respective multiple $R_7$ to $R_{17}$ are the same or different, A is the same as defined in Formula 1, and $Ar_5$ and $Ar_6$ are the same as defined in Formula 2, and in Formula 3-2, $Y_{2a}$ is S or O.

18. The polycyclic compound of claim 16, wherein the polycyclic compound represented by Formula 3 is represented by Formula 4:

[Formula 4]

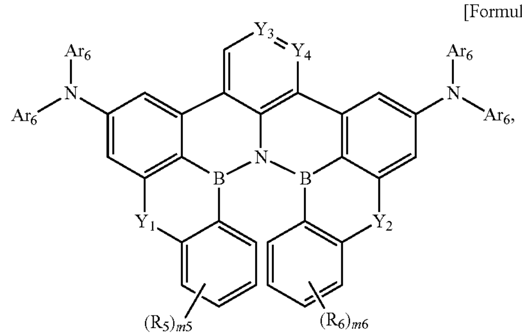

wherein in Formula 4, $Y_3$ and $Y_4$ are each independently $CR_a$ or N, $R_a$ is a hydrogen atom, a deuterium atom, a substituted or unsubstituted aryl group of 6 to 20 ring-forming carbon atoms, or a substituted or unsubstituted heteroaryl group of 2 to 20 ring-forming carbon atoms, and/or combined with an adjacent group to form a ring, $Ar_5$ and $Ar_6$ are the same as defined in Formula 2, and $R_5$, $R_6$, m5, m6, $Y_1$ and $Y_2$ are the same as defined in Formula 3.

19. The polycyclic compound of claim 18, wherein the polycyclic compound represented by Formula 4 is represented by Formula 4-1 or Formula 4-2:

[Formula 4-1]

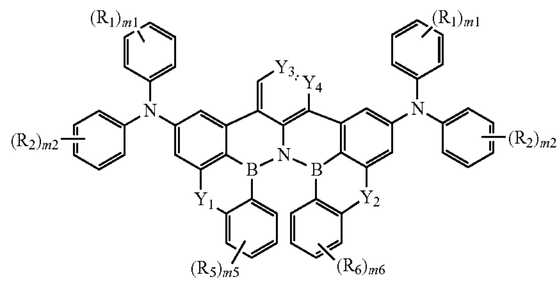

[Formula 4-2]

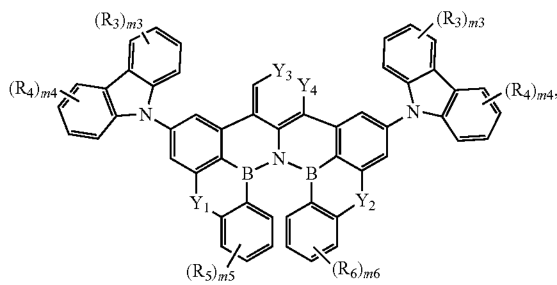

wherein in Formula 4-1 and Formula 4-2, $R_1$ to $R_4$ are each independently a hydrogen atom, a deuterium atom, a substituted or unsubstituted alkyl group of 1 to 20 carbon atoms, or a substituted or unsubstituted aryl group of 6 to 30 ring-forming carbon atoms, m1 and m2 are each independently an integer of 0 to 5, m3 and m4 are each independently an integer of 0 to 4, $R_5$, $R_6$, m5, m6, $Y_1$ and $Y_2$ are the same as defined in Formula 3, and $Y_3$ and $Y_4$ are the same as defined in Formula 4.

20. The polycyclic compound of claim 14, wherein the polycyclic compound represented by Formula 1 is any one of compounds in Compound Group 1:
[Compound Group 1]
A-1
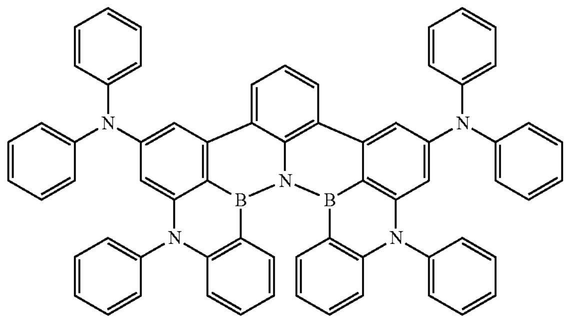
A-2
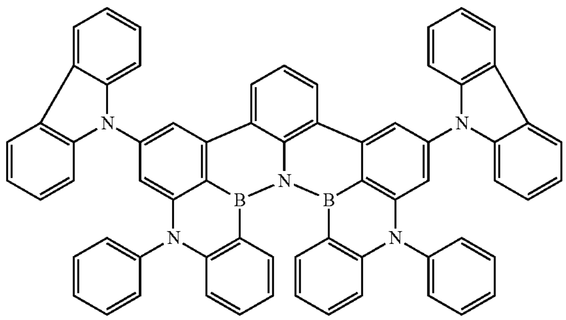
A-3
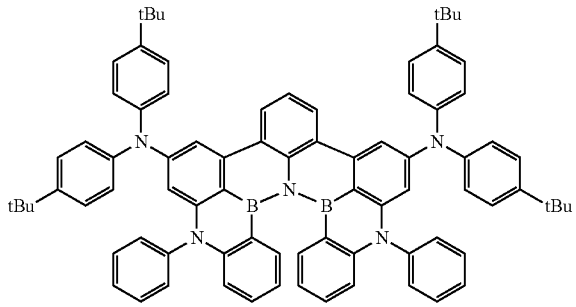
A-4
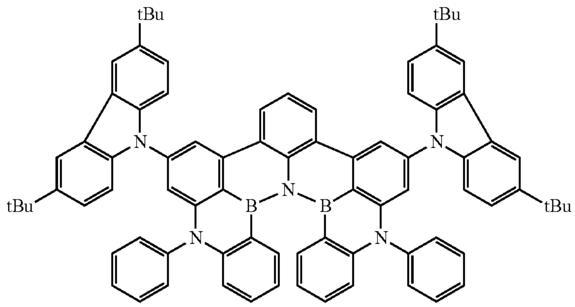
A-5
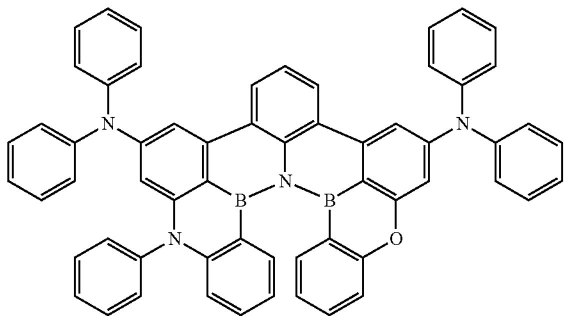
A-6
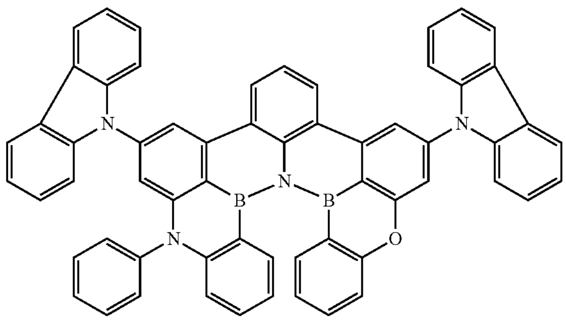
A-7
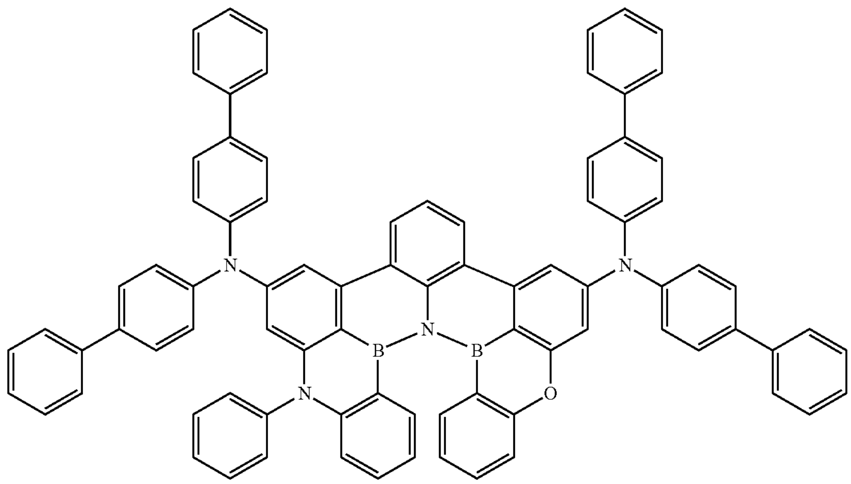

-continued
A-8
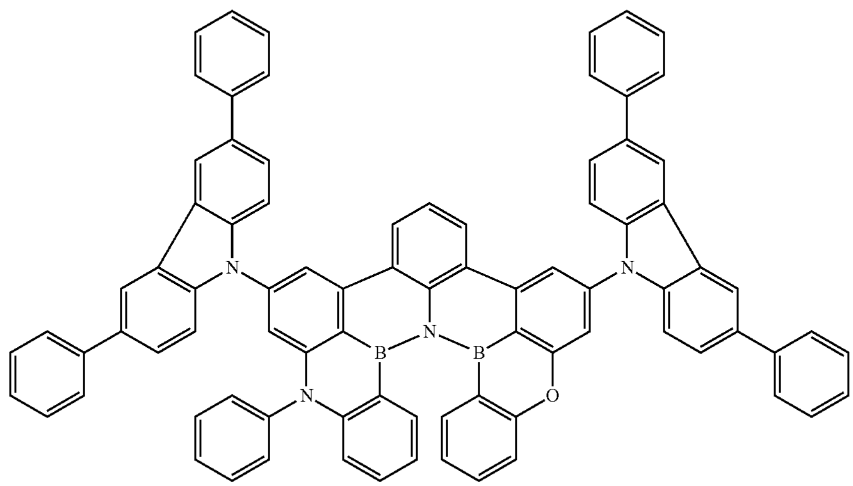
A-9
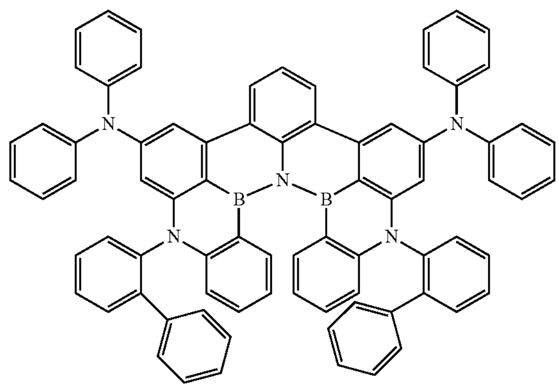
A-10
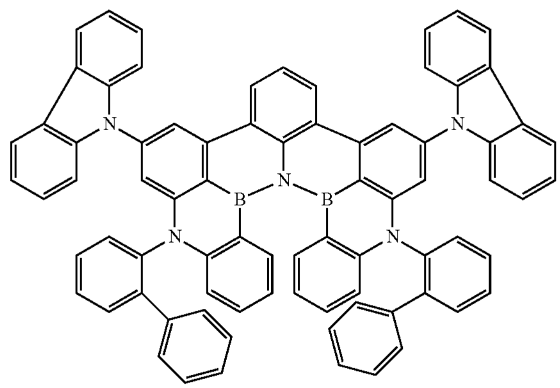
A-11
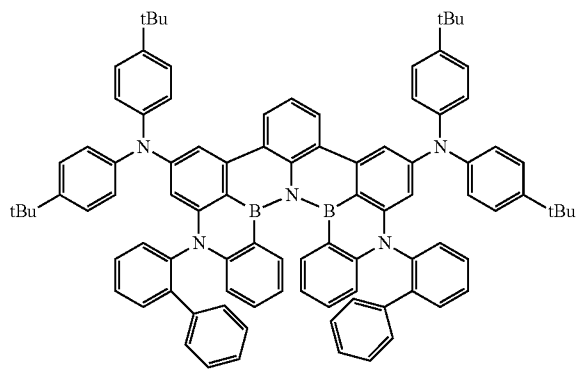
A-12
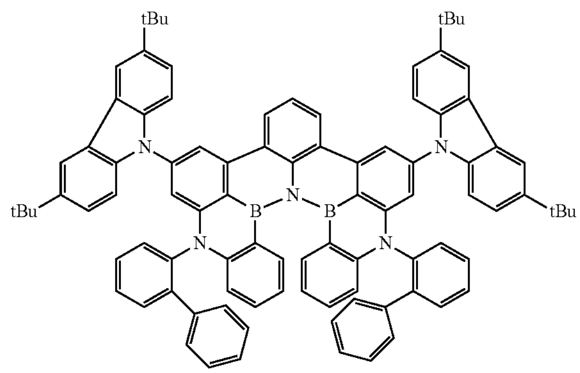
A-13
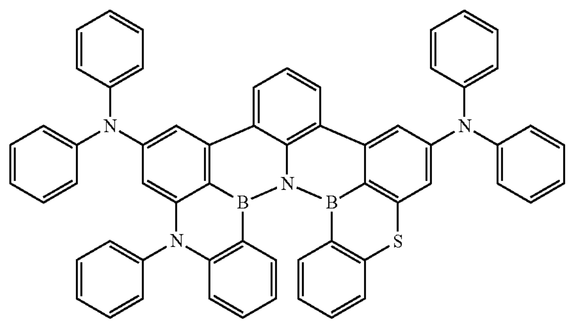
A-14
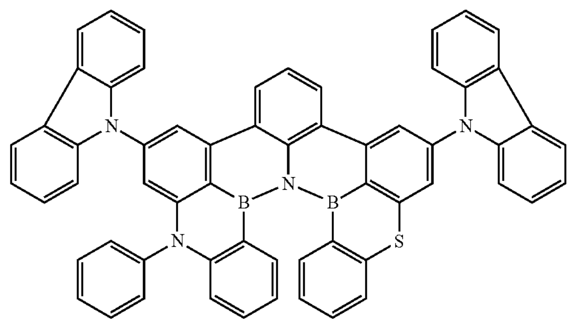

-continued
A-15
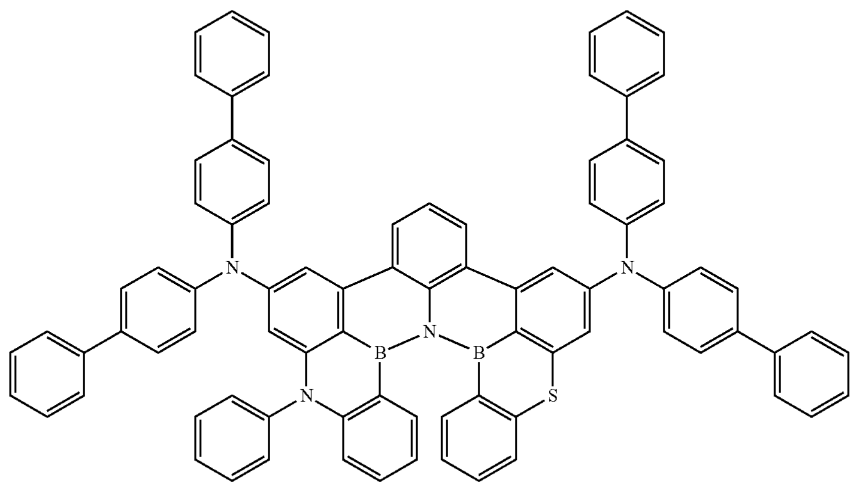
A-16
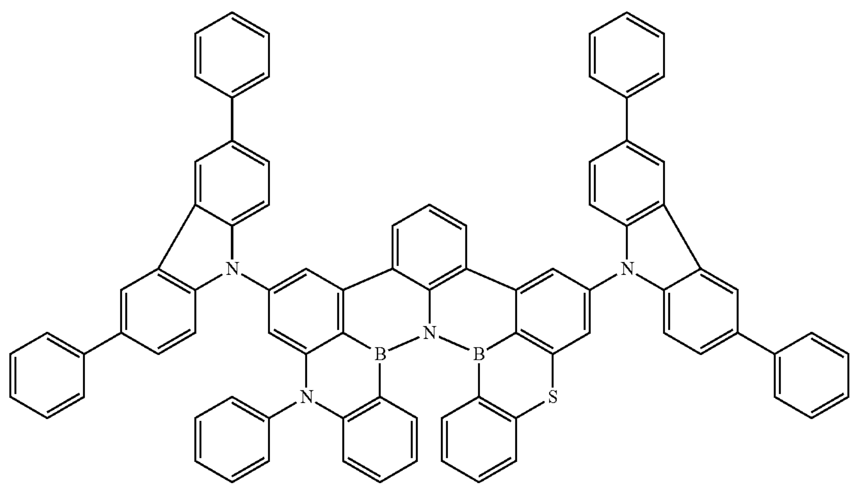
A-17
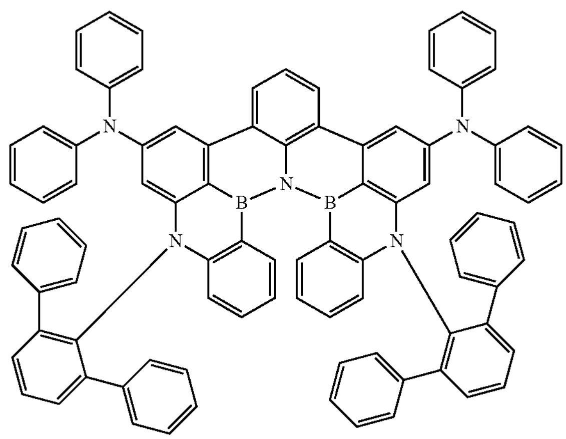
A-18
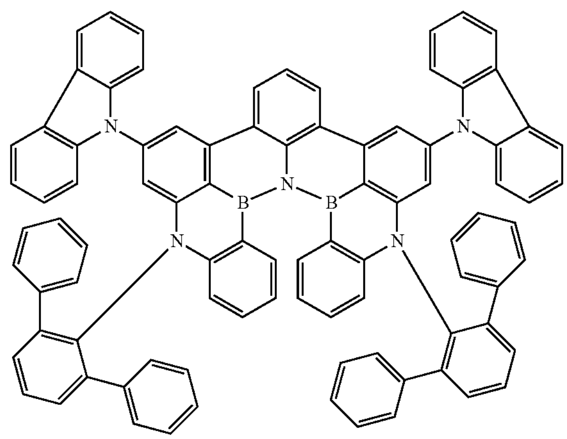

-continued
A-19
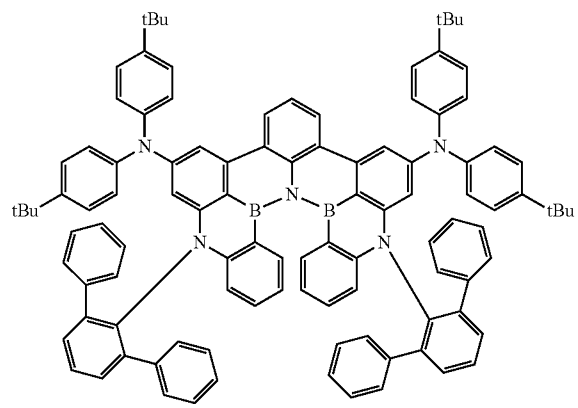
A-20
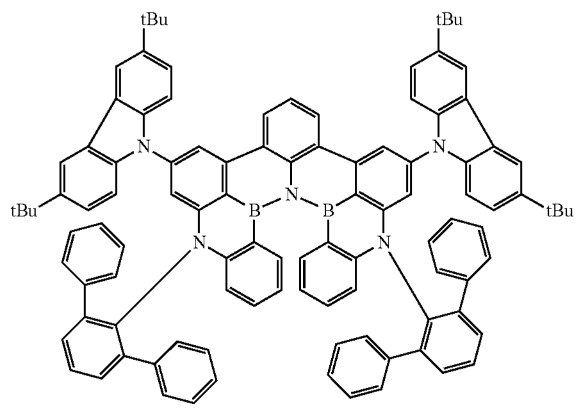
A-21
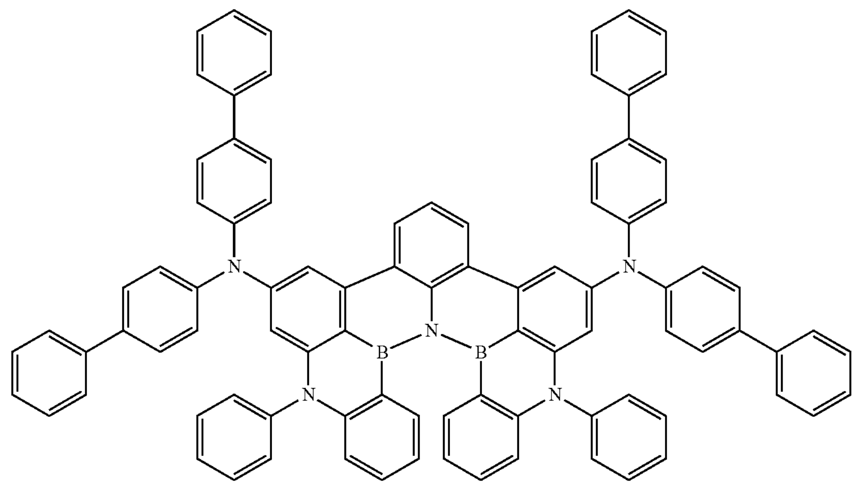
A-22
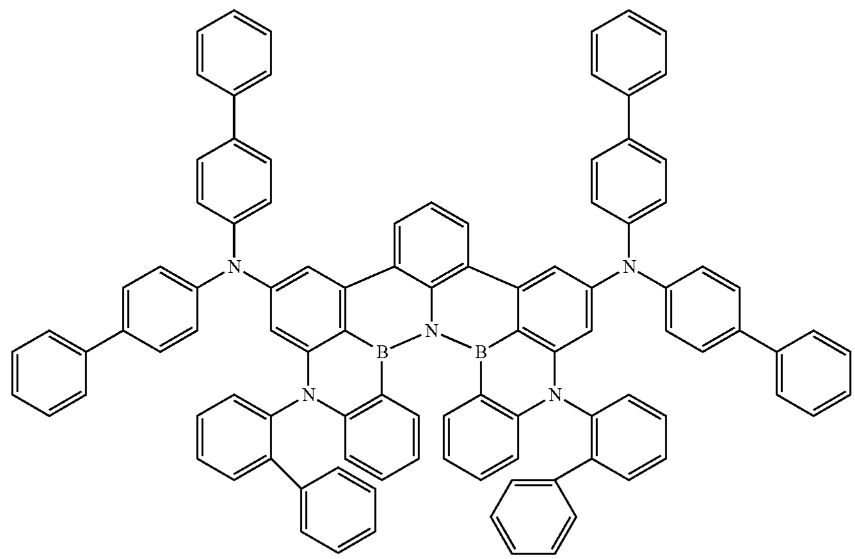

-continued
A-23
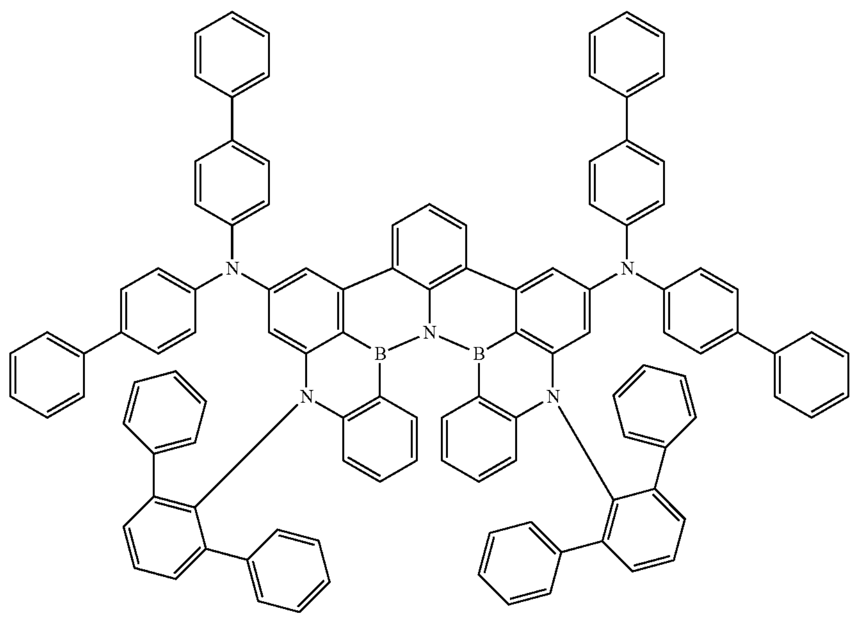
A-24
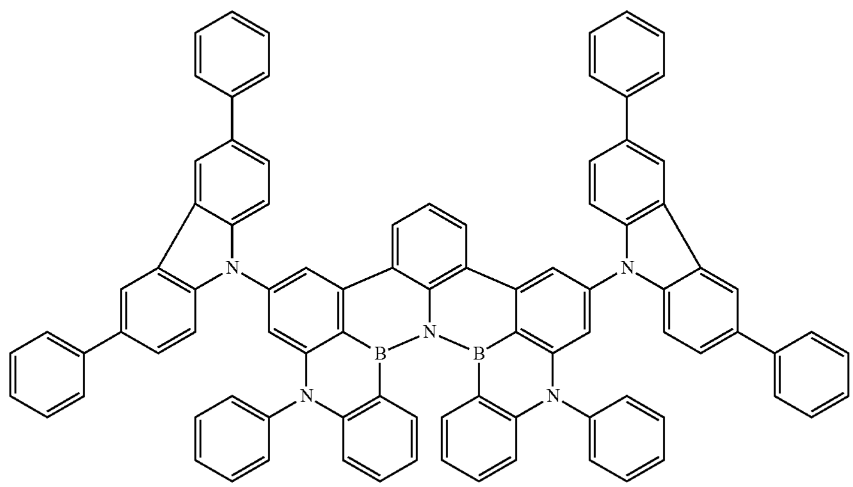
A-25
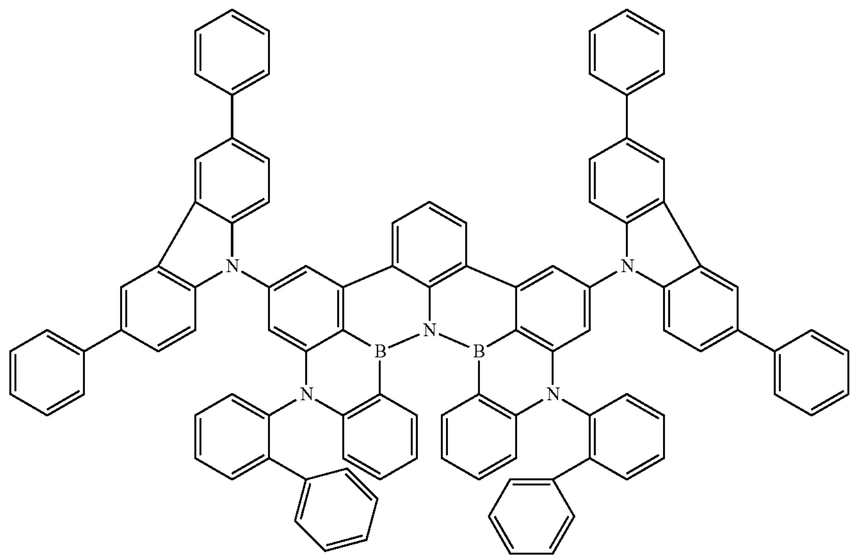

-continued
A-26
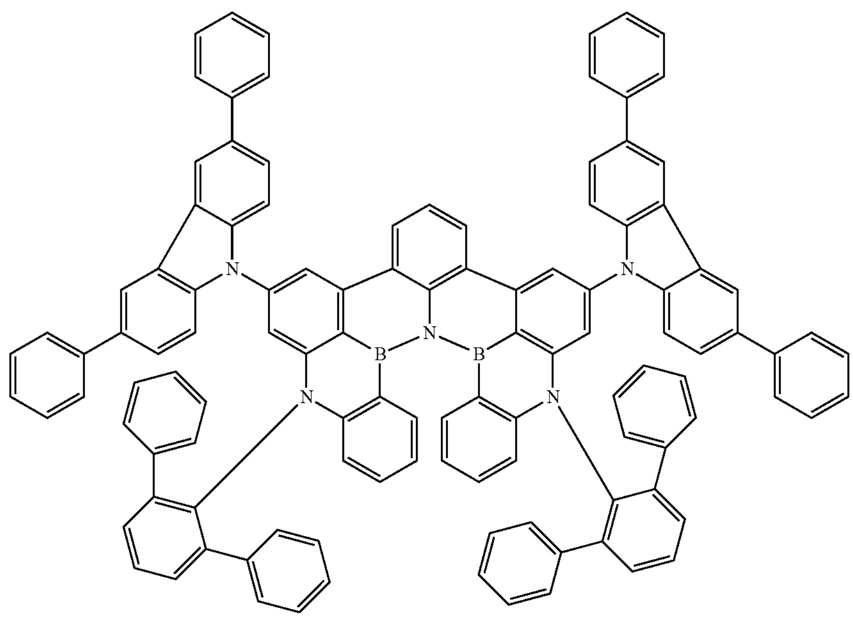
A-27
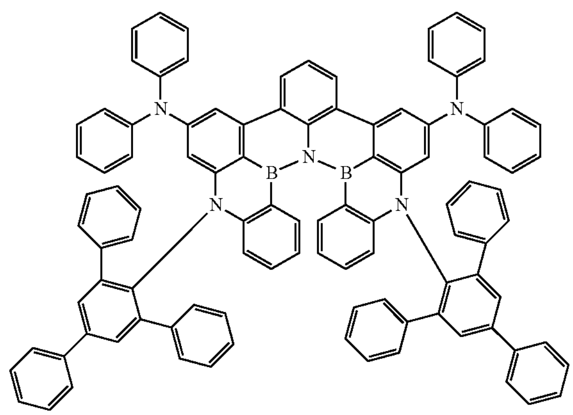
A-28
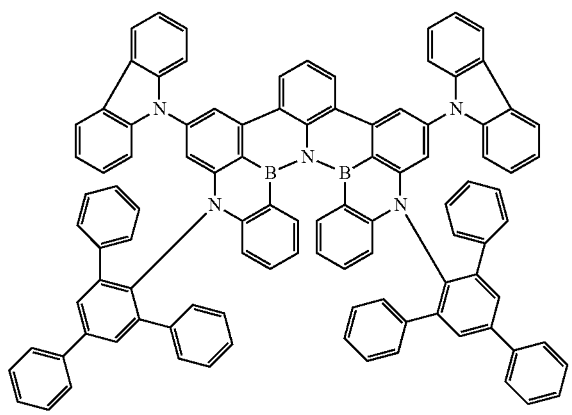
A-29
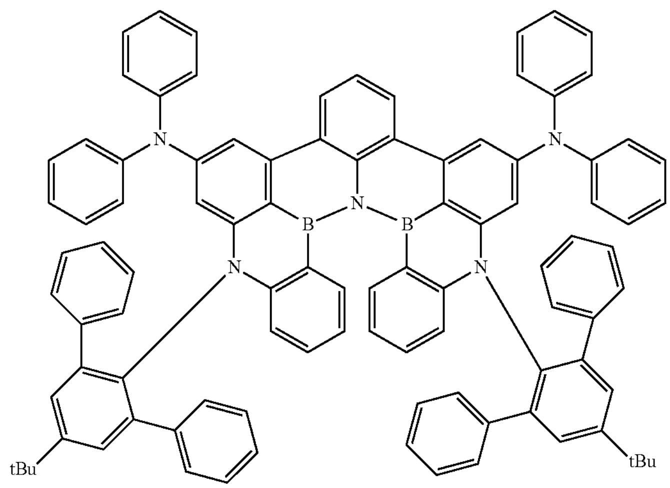

B-1
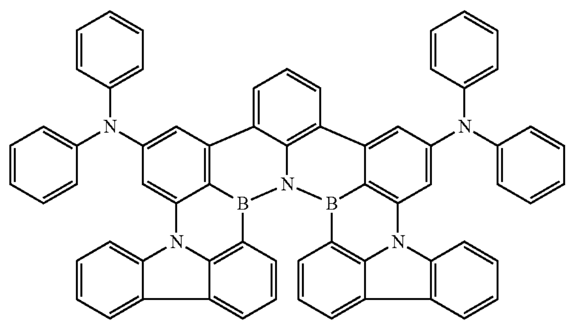
B-2
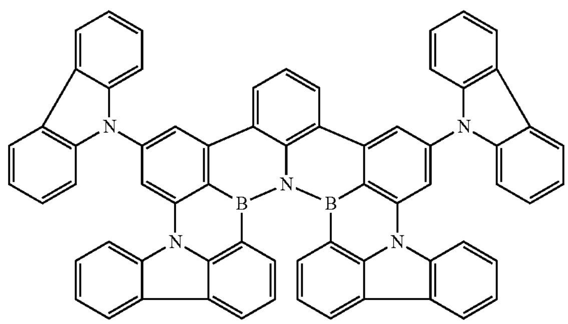
B-3
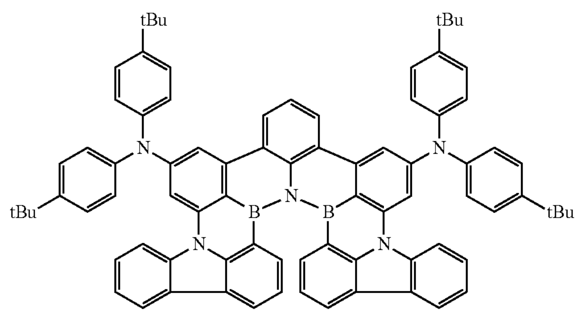
B-4
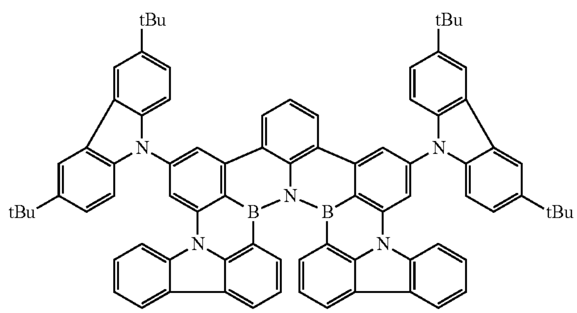
B-5
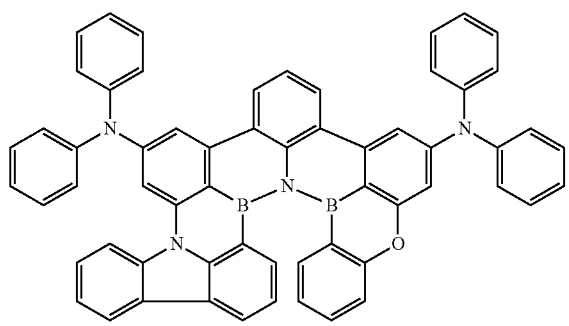
B-6
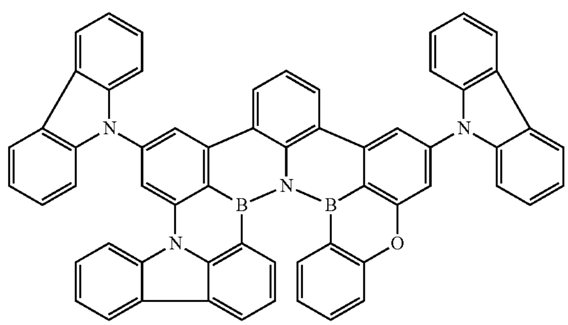
B-7
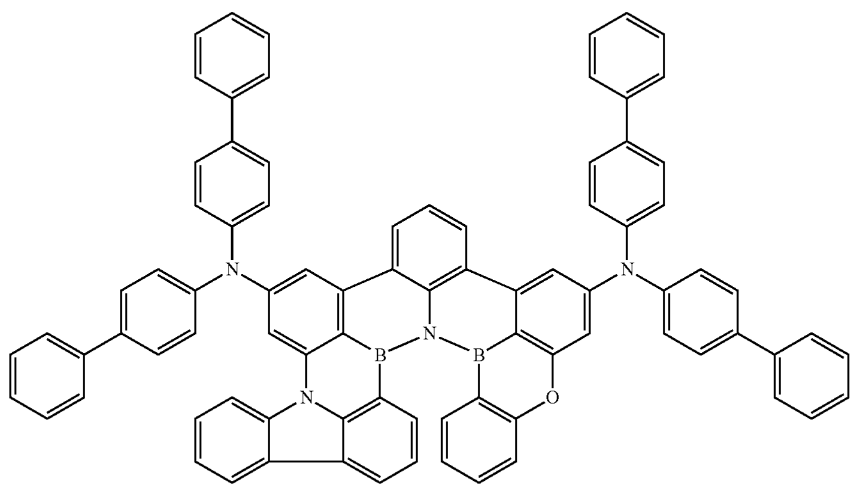

-continued
B-8
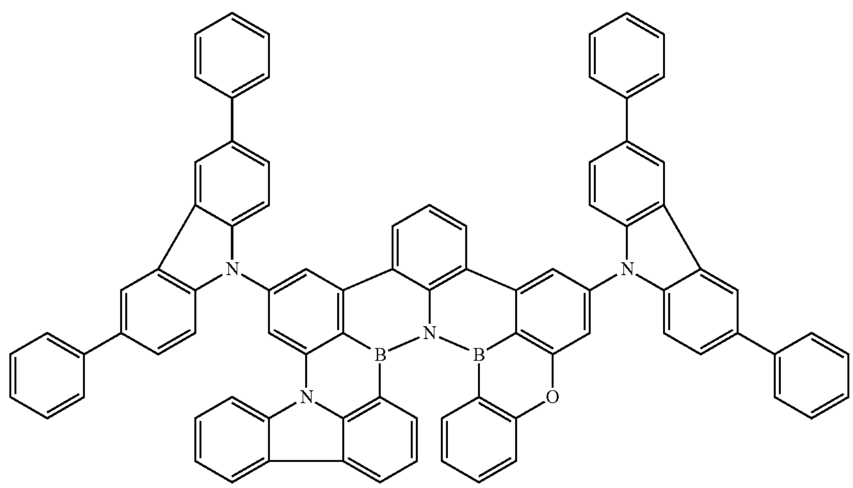
B-9
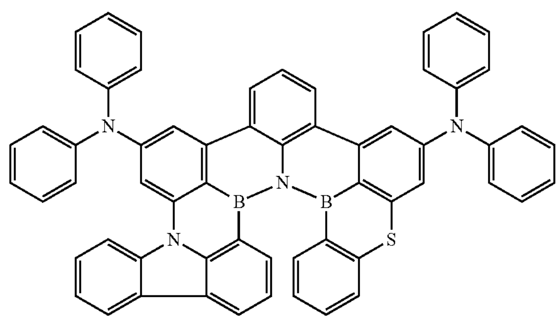
B-10
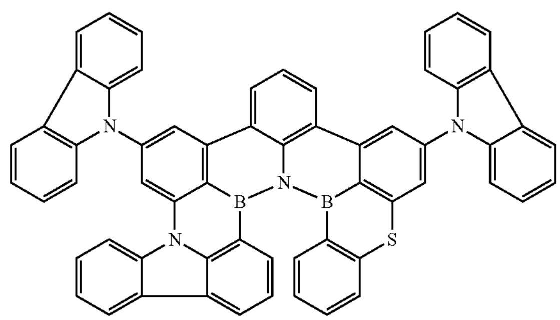
B-11
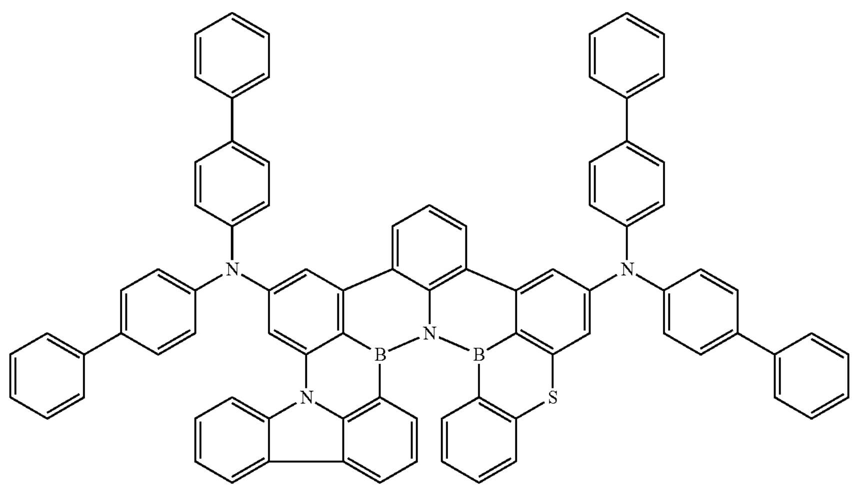

-continued
B-12
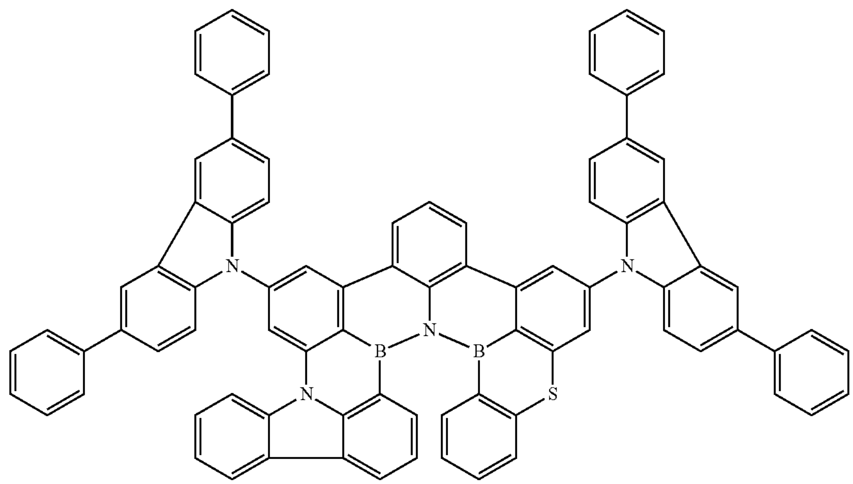
B-13
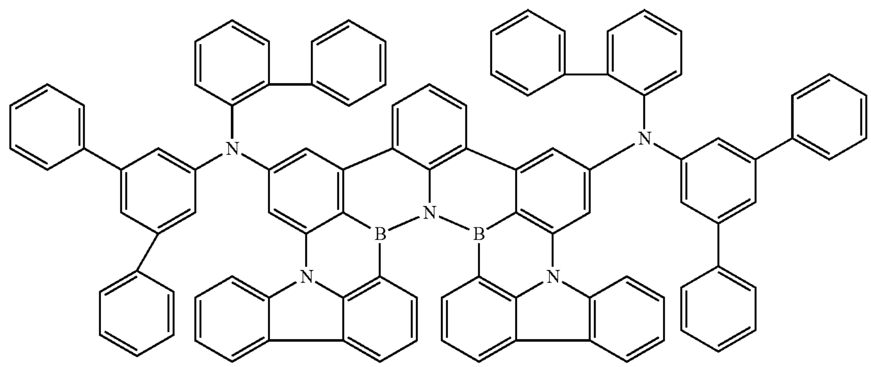
B-14
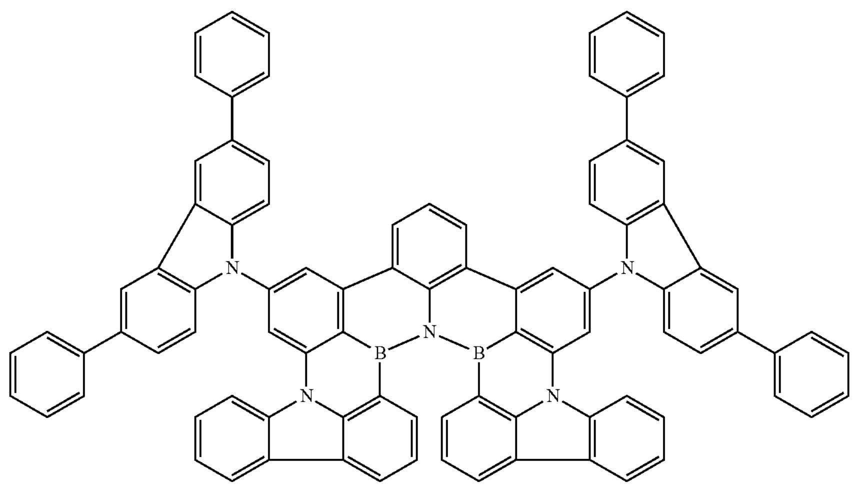

-continued
B-15
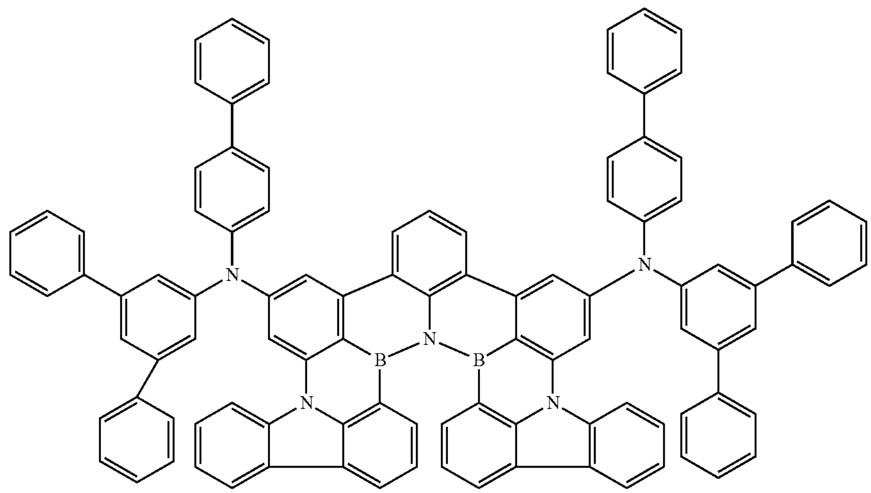
B-16
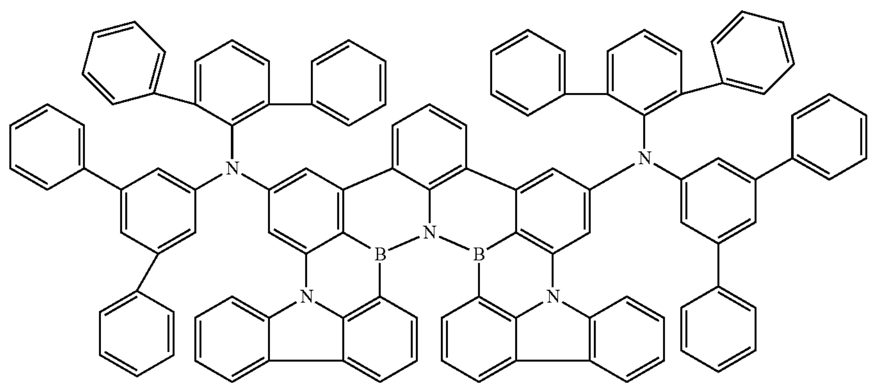
B-17
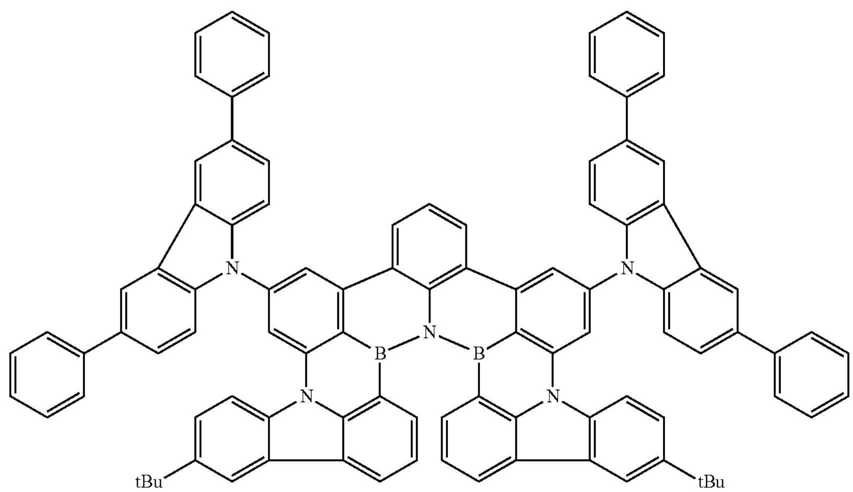

-continued
B-18
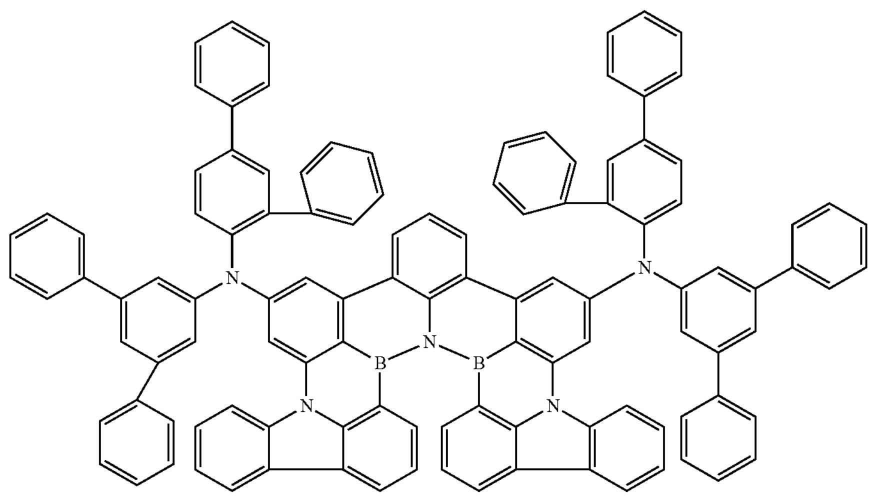
B-19
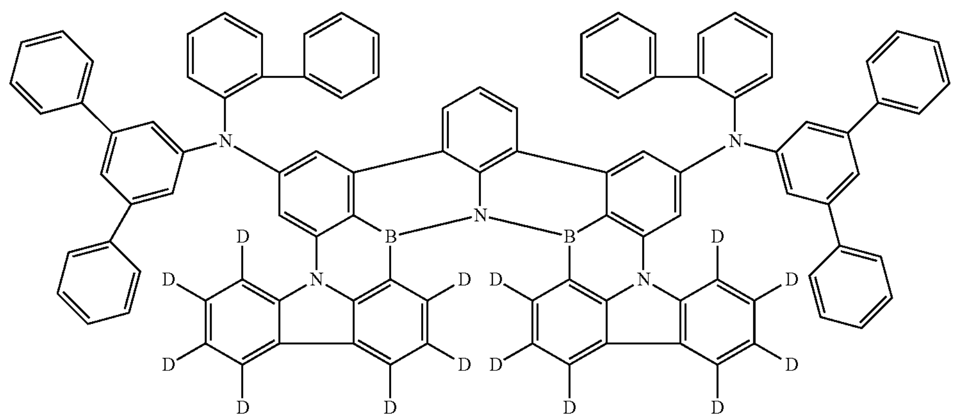
B-20
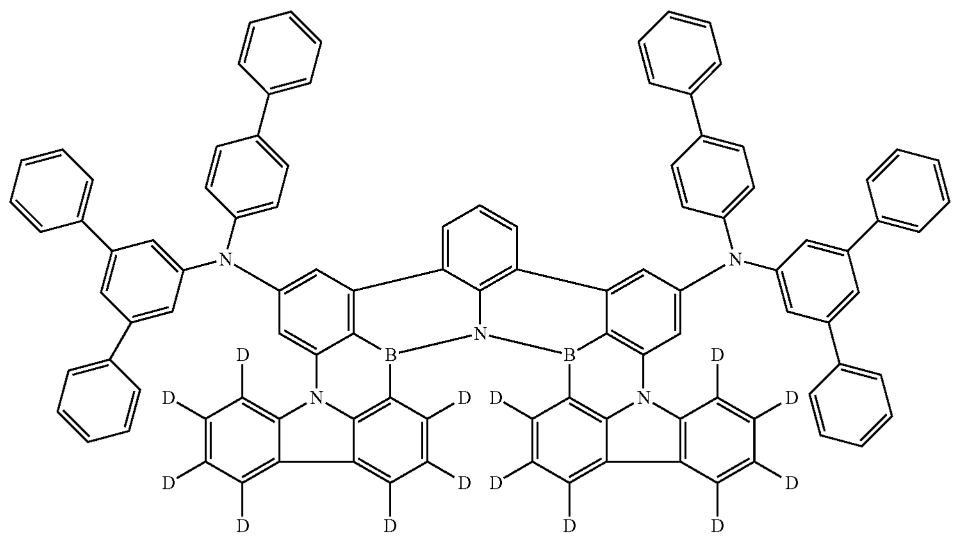

-continued
B-21
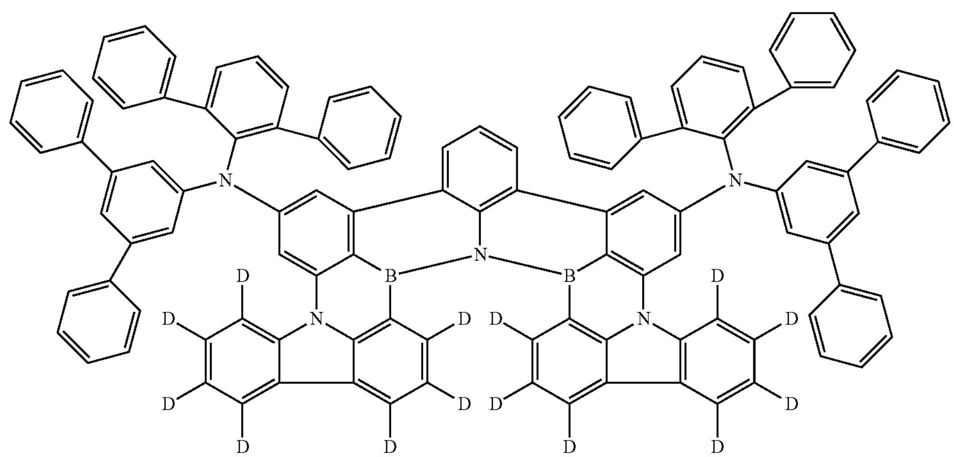
C-1
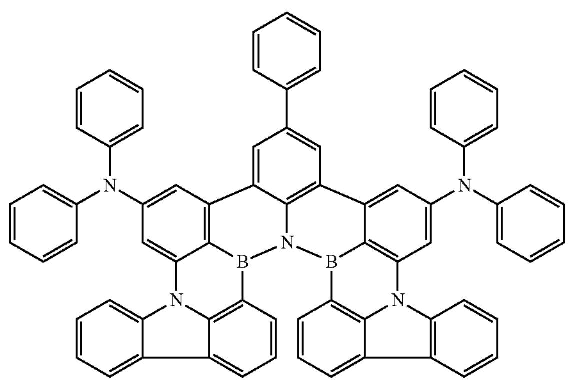
C-2
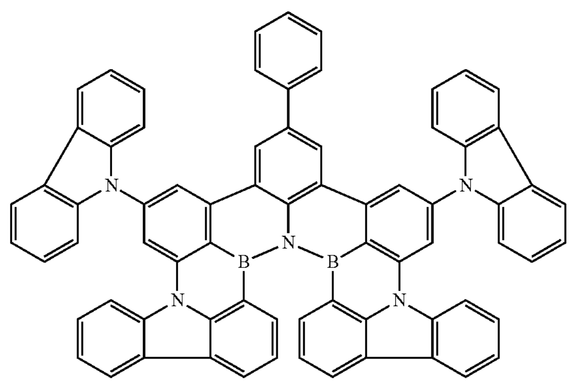
C-3
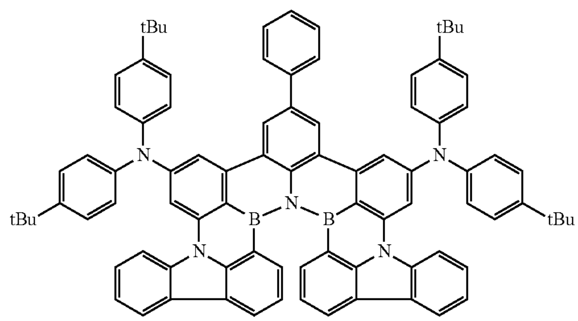
C-4
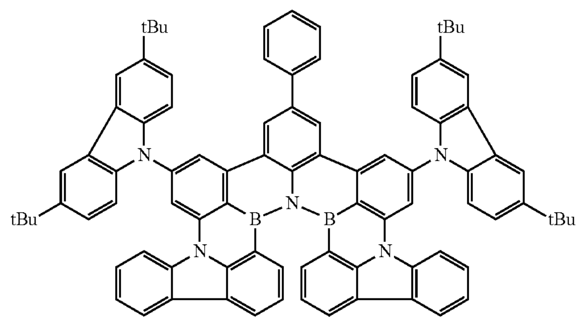

-continued
C-5
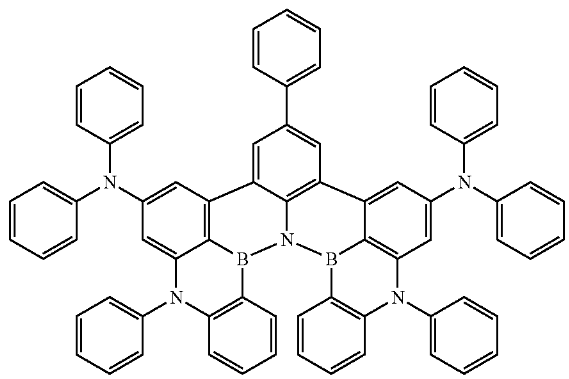
C-6
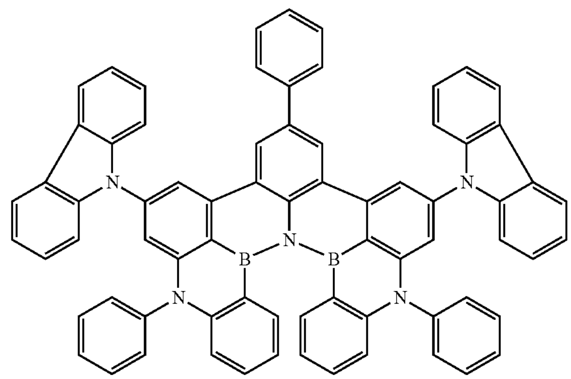
C-7
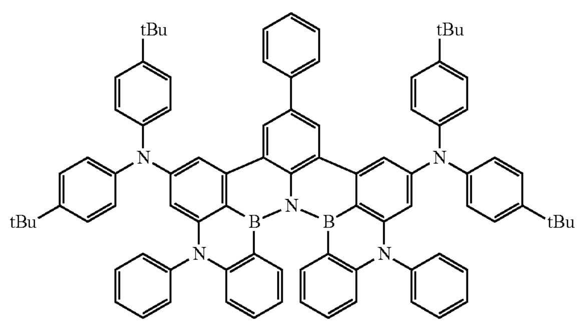
C-8
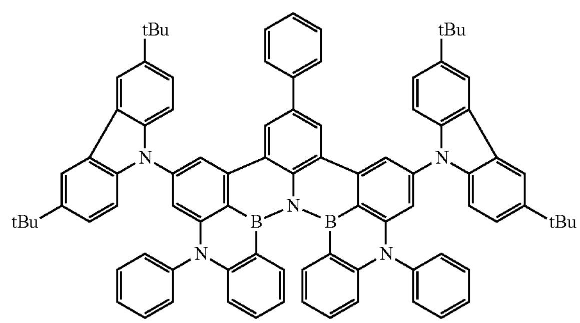
C-9
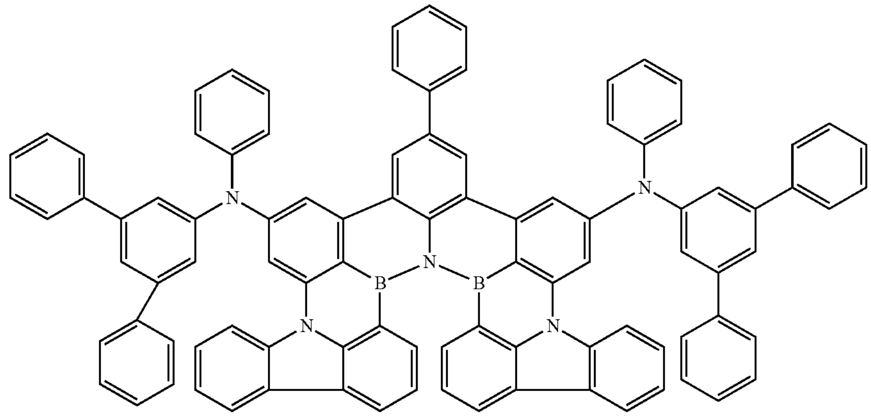
C-10
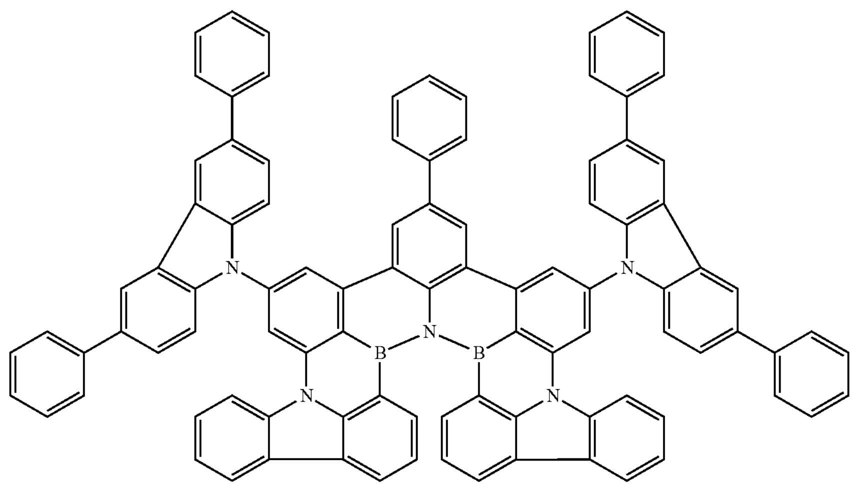

-continued
C-11
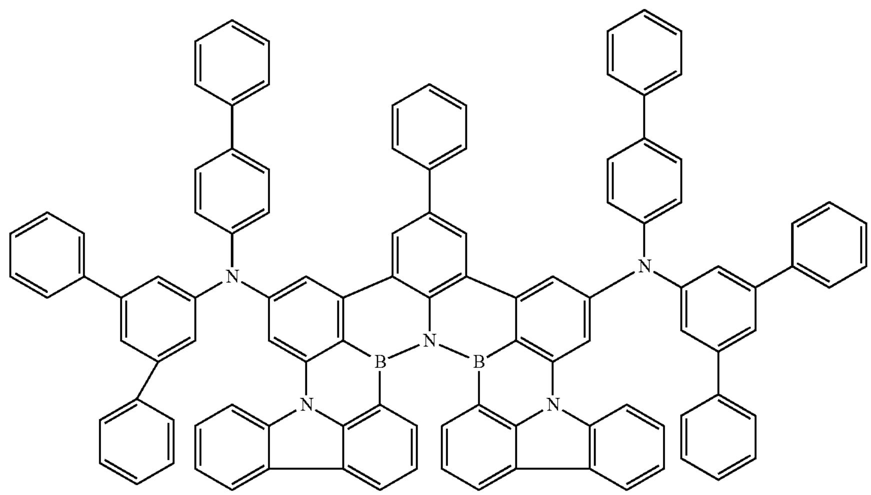
C-12
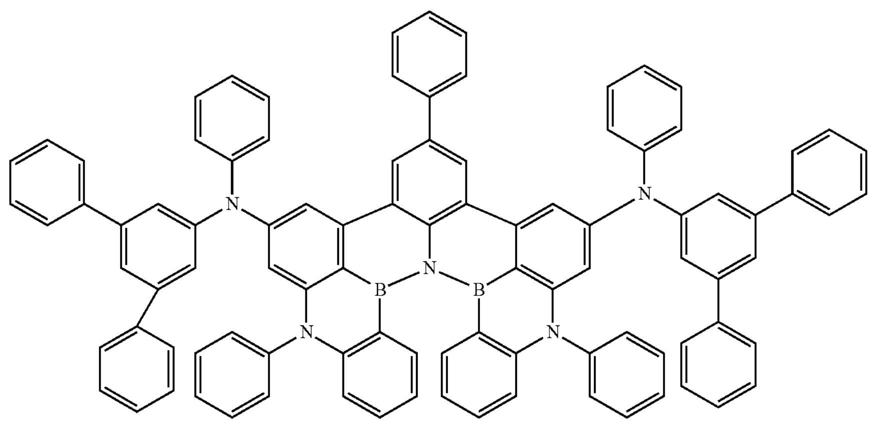
C-13
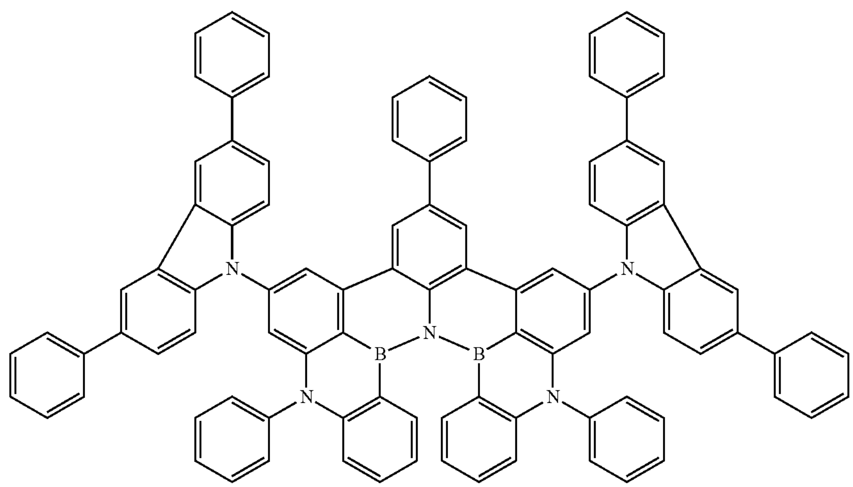

-continued
C-14
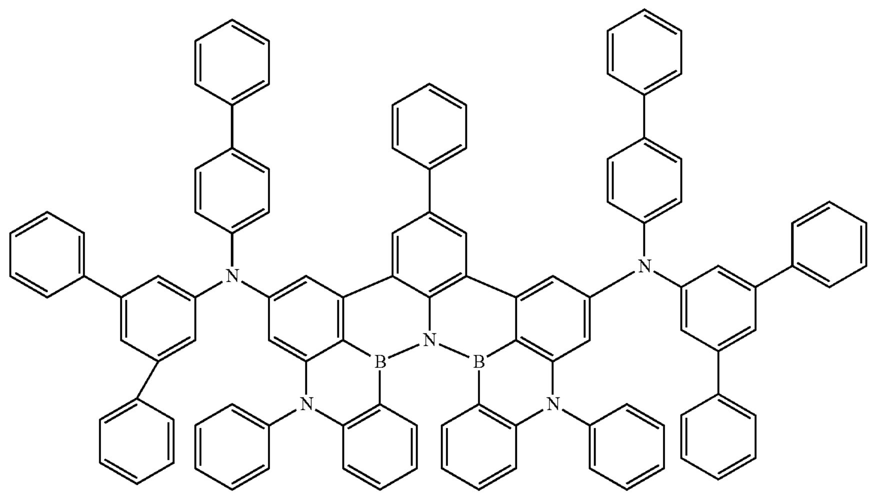
C-15
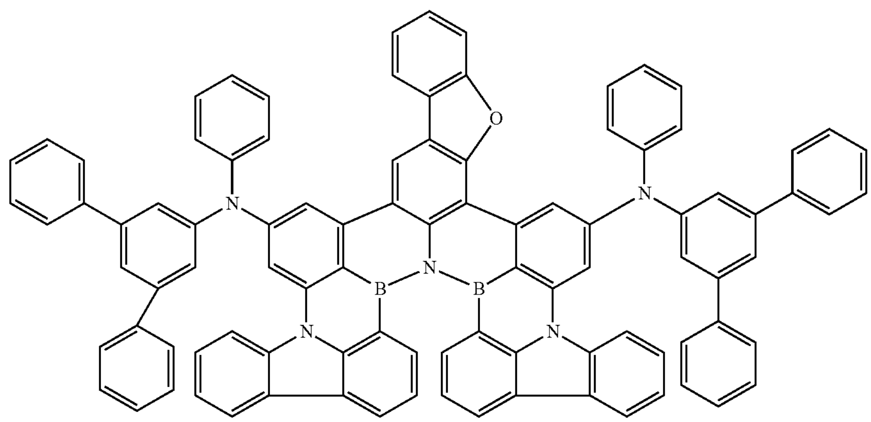
C-16
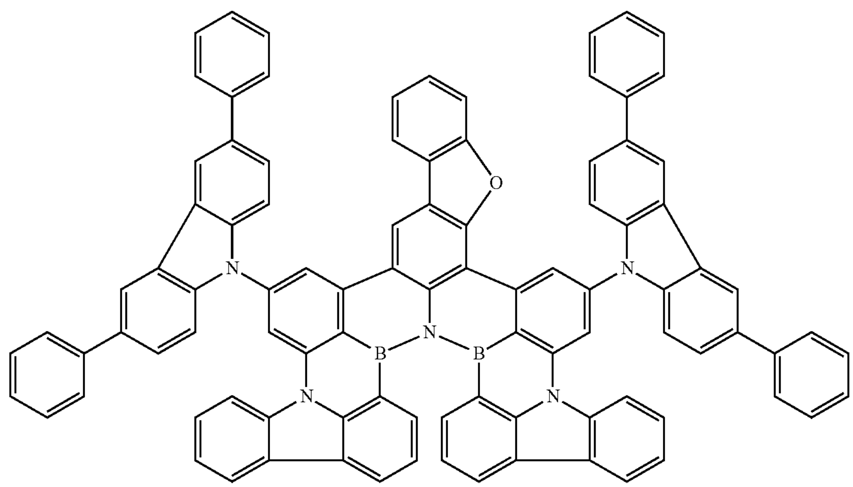

-continued
C-17
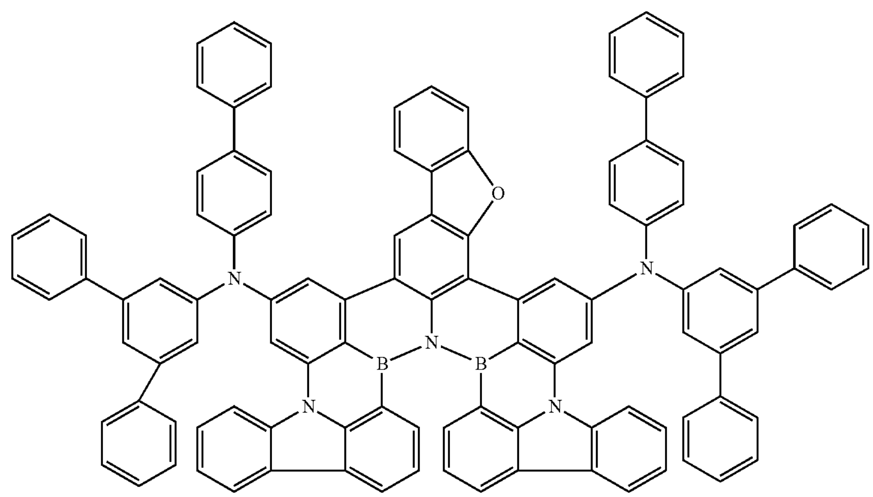
C-18
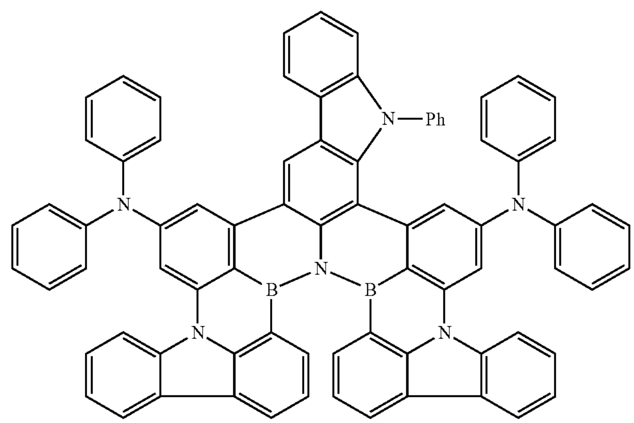
C-19
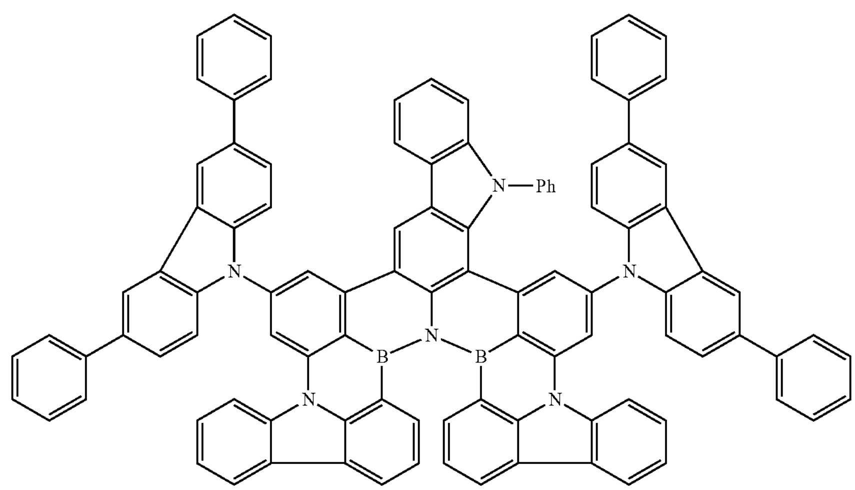

-continued
C-20
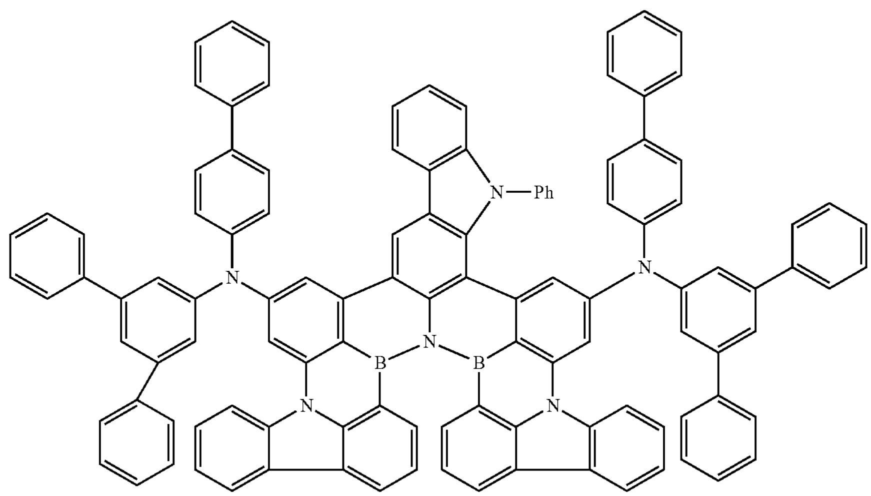
C-21
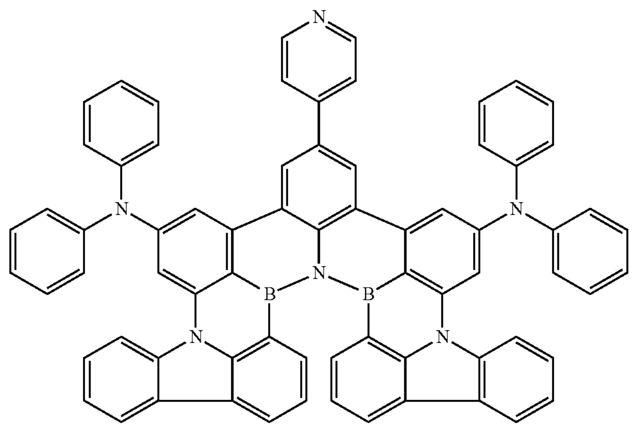
C-22
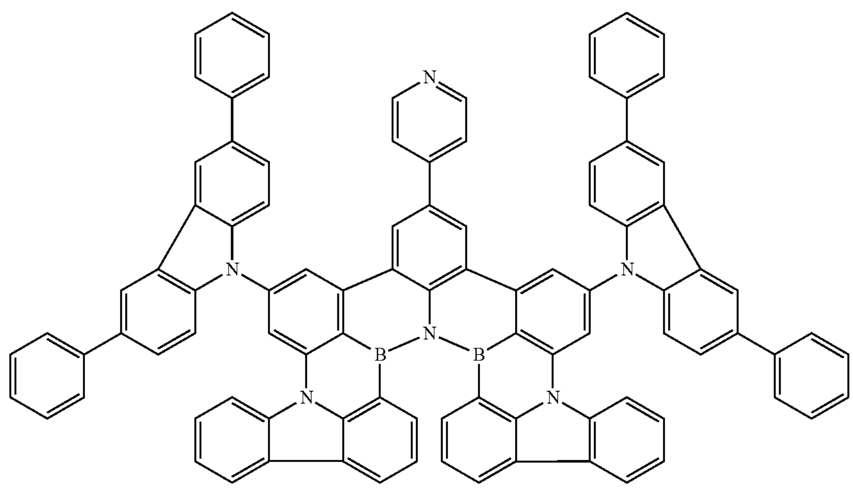

-continued
C-23
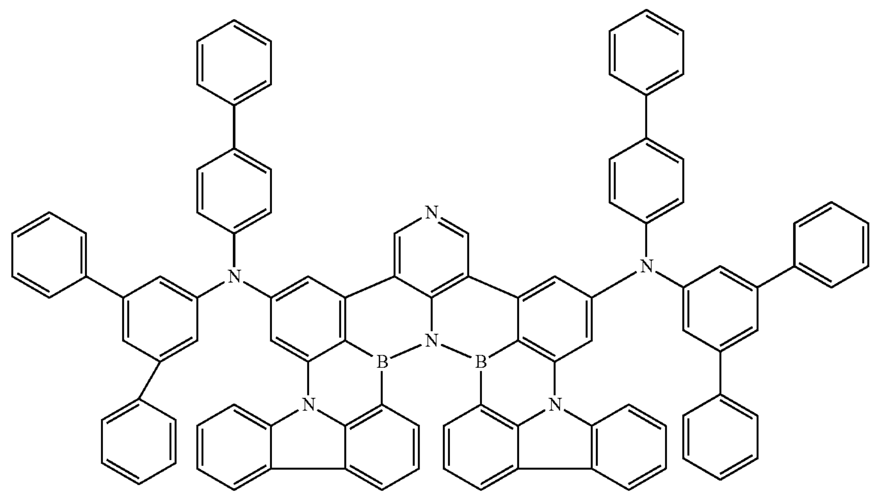
* * * * *